(12) United States Patent
Luo et al.

(10) Patent No.: US 11,295,810 B2
(45) Date of Patent: Apr. 5, 2022

(54) COMBINATIONAL RESISTIVE CHANGE ELEMENTS

(71) Applicant: Nantero, Inc., Woburn, MA (US)

(72) Inventors: Jia Luo, Fremont, CA (US); Lee E. Cleveland, Santa Clara, CA (US); Ton Yan Tony Chan, Santa Clara, CA (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 16/434,813

(22) Filed: Jun. 7, 2019

(65) Prior Publication Data
US 2020/0388331 A1    Dec. 10, 2020

(51) Int. Cl.
| | | |
|---|---|---|
| *G11C 11/00* | (2006.01) | |
| *G11C 11/56* | (2006.01) | |
| *H01L 51/00* | (2006.01) | |
| *H01L 51/05* | (2006.01) | |
| *G11C 13/00* | (2006.01) | |
| *H01L 45/00* | (2006.01) | |
| *H01L 27/24* | (2006.01) | |
| *H01L 27/28* | (2006.01) | |

(52) U.S. Cl.
CPC ........ *G11C 11/5664* (2013.01); *G11C 13/003* (2013.01); *G11C 13/0014* (2013.01); *G11C 13/0069* (2013.01); *H01L 27/2481* (2013.01); *H01L 27/285* (2013.01); *H01L 45/1253* (2013.01); *H01L 45/149* (2013.01); *H01L 51/0046* (2013.01); *H01L 51/0048* (2013.01); *H01L 51/0591* (2013.01); *G11C 13/004* (2013.01); *G11C 13/0004* (2013.01); *G11C 13/0007* (2013.01); *G11C 13/0026* (2013.01); *G11C 13/0028* (2013.01); *G11C 2213/35* (2013.01)

(58) Field of Classification Search
CPC ............ G11C 11/5664; G11C 13/0014; G11C 13/003; G11C 13/0069; G11C 13/0007; G11C 13/0026; G11C 2213/35; G11C 13/0004; G11C 13/0028; G11C 13/004; H01L 27/2481; H01L 27/285; H01L 51/0591; H01L 51/0046; H01L 45/1253; H01L 51/0048; H01L 45/149
USPC ........................................................ 365/148
See application file for complete search history.

(56) References Cited

U.S. PATENT DOCUMENTS

| | | |
|---|---|---|
| 4,979,101 A | 12/1990 | Takahashi |
| 6,134,140 A | 10/2000 | Tanaka et al. |
| 6,473,336 B1 | 10/2002 | Nakajima et al. |
| 6,504,752 B2 | 1/2003 | Ito |
| 6,724,653 B1 | 4/2004 | Iwata et al. |

(Continued)

OTHER PUBLICATIONS

International Search Report for PCT/US2020/035349, dated Aug. 28, 2020, 3 pages.

(Continued)

*Primary Examiner* — Tha-O H Bui
(74) *Attorney, Agent, or Firm* — Nantero, Inc.

(57) ABSTRACT

Combinations of resistive change elements and resistive change element arrays thereof are described. Combinational resistive change elements and combinational resistive change element arrays thereof are described. Devices and methods for programming and accessing combinations of resistive change elements are described. Devices and methods for programming and accessing combinational resistive change elements are described.

24 Claims, 41 Drawing Sheets

(56) References Cited

U.S. PATENT DOCUMENTS

| | | |
|---|---|---|
| 6,879,505 B2 | 4/2005 | Scheuerlein |
| 6,937,505 B2 | 8/2005 | Morikawa |
| 7,301,802 B2 | 11/2007 | Bertin et al. |
| 7,560,724 B2 | 7/2009 | Aratani et al. |
| 7,781,862 B2 | 8/2010 | Bertin et al. |
| 7,835,170 B2 | 11/2010 | Bertin et al. |
| 7,852,114 B2 | 12/2010 | Bertin et al. |
| 8,000,127 B2 | 8/2011 | Hamilton et al. |
| 8,183,665 B2 | 5/2012 | Bertin et al. |
| 8,222,704 B2 | 7/2012 | Manning et al. |
| 8,481,396 B2 | 7/2013 | Xu et al. |
| 8,619,450 B2 | 12/2013 | Hamilton |
| 8,649,206 B2 | 2/2014 | Scheuerlein |
| 8,697,487 B2 | 4/2014 | Ho et al. |
| 8,809,917 B2 | 8/2014 | Bertin et al. |
| 9,000,409 B2 | 4/2015 | Huo et al. |
| 9,070,872 B2 | 6/2015 | Huo et al. |
| 9,263,126 B1 | 2/2016 | Viviani |
| 9,299,430 B1 | 3/2016 | Bertin et al. |
| 9,390,790 B2 | 7/2016 | Bertin et al. |
| 9,406,349 B2 | 8/2016 | Bertin et al. |
| 9,412,447 B1 | 8/2016 | Bertin et al. |
| 9,666,272 B2 | 5/2017 | Viviani |
| 9,715,927 B2 | 7/2017 | Bertin et al. |
| 9,783,255 B2 | 10/2017 | Bertin et al. |
| 9,852,793 B2 | 12/2017 | Bertin et al. |
| 9,917,139 B2 | 3/2018 | Bertin et al. |
| 9,934,848 B2 | 4/2018 | Harvard |
| 9,941,001 B2 | 4/2018 | Harvard |
| 9,947,400 B2 | 4/2018 | Viviani |
| 10,192,619 B2 | 1/2019 | Bertin et al. |
| 10,204,682 B2 | 2/2019 | Bertin et al. |
| 10,249,684 B2 | 4/2019 | Bertin et al. |
| 10,261,861 B2 | 4/2019 | Ning |
| 10,290,349 B2 | 5/2019 | Bertin |
| 2005/0040371 A1 | 2/2005 | Watanabe et al. |
| 2005/0162883 A1* | 7/2005 | Nejad .................... H01L 27/24 365/63 |
| 2006/0197115 A1* | 9/2006 | Toda ........................ G11C 7/18 257/248 |
| 2007/0285967 A1 | 12/2007 | Toda et al. |
| 2008/0002457 A1 | 1/2008 | Toda et al. |
| 2010/0182821 A1 | 7/2010 | Muraoka et al. |
| 2012/0182787 A1* | 7/2012 | Wells ................ G11C 13/0007 365/148 |
| 2013/0043455 A1 | 2/2013 | Bateman |
| 2013/0051114 A1 | 2/2013 | Kim et al. |
| 2013/0210211 A1 | 8/2013 | Vereen et al. |
| 2013/0343114 A1 | 12/2013 | Carter |
| 2014/0166959 A1* | 6/2014 | Bertin ................... H01L 29/861 257/2 |
| 2015/0248931 A1 | 9/2015 | Nazarian |
| 2016/0065218 A1 | 3/2016 | Oda |
| 2016/0233270 A1 | 8/2016 | Takaki et al. |
| 2017/0140816 A1 | 5/2017 | Chevallier et al. |
| 2017/0352413 A1 | 12/2017 | Harvard |
| 2018/0004599 A1 | 1/2018 | Ning |
| 2018/0033483 A1 | 2/2018 | Bertin et al. |
| 2019/0245543 A1 | 8/2019 | Lee et al. |

OTHER PUBLICATIONS

Written Opinion for PCT/US2020/035349, dated Aug. 28, 2020, 8 pages.

\* cited by examiner

| Relational State of S00 | Resistive State of S00a | Resistive State of S00b | Resistive Ratio | Binary Number |
|---|---|---|---|---|
| Low | High (e.g. a resistance on the order of 10MΩ) | Low (e.g. a resistance on the order of 1MΩ) | Approx. 1/11 | 0 |
| High | Low (e.g. a resistance on the order of 1MΩ) | High (e.g. a resistance on the order of 10MΩ) | Approx. 10/11 | 1 |

400

Selecting at least one combination of resistive change elements from a plurality of combinations of resistive change elements, where each resistive change element is adjustable between at least two resistive states  — 402

Applying conditions to inhibit change in relational states of unselected combinations of resistive change elements of the plurality of combinations of resistive change elements  — 404

Applying electrical stimuli to each resistive change element of the at least one combination of resistive change elements to adjust a resistive state of each resistive change element of the at least one combination of resistive change elements to a resistive state of a combination of resistive states for that combination of resistive change elements  — 406

502 — Selecting at least one combination of resistive change elements from a plurality of combinations of resistive change elements, where each resistive change element is adjustable between at least two resistive states

↓

504 — Applying conditions to inhibit change in relational states of unselected combinations of resistive change elements of the plurality of combinations of resistive change elements

↓

506 — Applying an electrical stimulus to each combination of resistive change elements of the at least one combination of resistive change elements such that resistive change elements of each combination of resistive change elements of the at least one combination of resistive change elements form a resistor divider for that combination of resistive change elements

↓

508 — Determining a relational state of each combination of resistive change elements of the at least one combination of resistive change elements based on a resistive ratio of the resistor divider for that combination of resistive change elements

FIG. 5

COMBINATIONAL RESISTIVE CHANGE ELEMENTS

CROSS-REFERENCE OF RELATED CASES

This application is related to the following U.S. Patents, which are assigned to the assignee of the present application, and are hereby incorporated by reference in their entirety:

U.S. Pat. No. 9,406,349, filed on May 2, 2014, entitled Memory Elements and Cross Point Switches and Arrays for Same Using Nonvolatile Nanotube Blocks;

U.S. Pat. No. 9,947,400, filed on Apr. 22, 2016, entitled Methods for Enhanced State Retention Within a Resistive Change Cell;

U.S. Pat. No. 9,917,139, filed on Dec. 20, 2016, entitled Resistive Change Element Array Using Vertically Oriented Bit Lines;

U.S. Pat. No. 10,096,601, filed on Jan. 30, 2018, entitled Stacked Three-Dimensional Arrays of Two Terminal Nanotube Switching Devices; and U.S. Pat. No. 10,204,682, filed on Sep. 18, 2017, entitled Nonvolatile Nanotube Switches and Systems Using Same.

This application is related to the following U.S. Patent Application Publication, which is assigned to the assignee of the present application, and is hereby incorporated by reference in its entirety:

U.S. Patent Application Publication No. 2018/0226578, filed on Apr. 12, 2017, entitled Sealed Resistive Change Elements.

This application is related to the following U.S. Patent Application, which is assigned to the assignee of the present application, and is hereby incorporated by reference in its entirety:

U.S. patent application Ser. No. 15/906,661, filed on Feb. 27, 2018, entitled Resistive Change Element Cells Sharing Selection Devices.

BACKGROUND

Technical Field

The present disclosure generally relates to resistive change elements and resistive change element arrays.

Discussion of Related Art

Any discussion of the related art throughout this specification should in no way be considered as an admission that such art is widely known or forms part of the common general knowledge in the field.

Resistive change devices and arrays, often referred to as resistance RAMS by those skilled in the art, are well known in the semiconductor industry. Such devices and arrays, for example, include, but are not limited to, phase change memory, solid electrolyte memory, metal oxide resistance memory, and carbon nanotube memory such as NRAM®.

Resistive change devices and arrays store information by adjusting a resistive change element, typically comprising some material that can be adjusted between a number of non-volatile resistive states in response to some applied stimuli, within each individual array cell between two or more resistive states. For example, each resistive state within a resistive change element cell can correspond to a data value which can be programmed and read back by supporting circuitry within the device or array.

For example, a resistive change element might be arranged to switch between two resistive states: a low resistive state (which might correspond to a binary number 0) and a high resistive state (which might correspond to a binary number 1). In this way, a resistive change element can be used to store one binary digit (bit) of data.

Or, as another example, a resistive change element might be arranged to switch between four resistive states, so as to store two bits of data. Or a resistive change element might be arranged to switch between eight resistive states, so as to store three bits of data. Or a resistive change element might be arranged to switch between $2^n$ resistive states, so as to store n bits of data.

SUMMARY

The present disclosure provides a combinational resistive change element comprising a first resistive change element where the first resistive change element is adjustable between at least two resistive states, a second resistive change element where the second resistive change element is adjustable between at least two resistive states, a conductive structure providing an electrical communication path between the first resistive change element and the second resistive change element, and where the combinational resistive change element is adjustable between multiple relational states involving ratios of resistances of resistive states of the first resistive change element and the second resistive change element.

According to another aspect of the present disclosure, the combinational resistive change element is capable of storing at least one bit of information as relational states.

According to another aspect of the present disclosure, the combinational resistive change element is capable of storing information as characters of a character set as relational states.

According to another aspect of the present disclosure, possible combinations of resistive states of the first resistive change element and the second resistive change element is a number greater than a number of relational states of the multiple relational states.

According to another aspect of the present disclosure, the multiple relational states also involve sums of resistances of resistive states of the first resistive change element and the second resistive change element.

According to another aspect of the present disclosure, the first resistive change element is shareable with at least one other combinational resistive change element and the second resistive change element is shareable with at least one other combinational resistive change element.

According to another aspect of the present disclosure, the first resistive change element and the second resistive change element are separated a distance of at least a minimum feature size multiplied by three.

According to another aspect of the present disclosure, the first resistive change element and the second resistive change element are located on a same level.

According to another aspect of the present disclosure, the first resistive change element and the second resistive change element are located on different levels.

According to another aspect of the present disclosure, the first resistive change element and the second resistive change element are adjustable between different resistive states at the same time.

According to another aspect of the present disclosure, the first resistive change element and the second resistive change element are adjustable between different resistive states one after the other.

According to another aspect of the present disclosure, the first resistive change element has a first electrode, a second electrode, and a first resistive change material between the first electrode and the second electrode and the second resistive change element has a third electrode, a fourth electrode, and a second resistive change material between the third electrode and the fourth electrode.

According to another aspect of the present disclosure, at least one of the first resistive change material or the second resistive change material comprises a nanotube fabric.

According to another aspect of the present disclosure, at least one of the first resistive change material or the second resistive change material comprises buckyballs.

According to another aspect of the present disclosure, at least one of the first resistive change material or the second resistive change material comprises graphene flakes.

According to another aspect of the present disclosure, at least one of the first resistive change material or the second resistive change material comprises nanocapsules.

According to another aspect of the present disclosure, at least one of the first resistive change material or the second resistive change material comprises nanohorns.

According to another aspect of the present disclosure, the at least two resistive states of the first resistive change element includes a low resistive state and a high resistive state where a resistance of the low resistive state of the first resistive change element is less than a resistance of the high resistive state of the first resistive change element, the at least two resistive states of the second resistive change element includes a low resistive state and a high resistive state where a resistance of the low resistive state of the second resistive change element is less than a resistance of the high resistive state of the second resistive change element.

According to another aspect of the present disclosure, the first resistive change element is adjustable between the low resistive state and the high resistive state by electrical stimuli causing current flow in different directions relative to the first electrode and the second electrode and the second resistive change element is adjustable between the low resistive state and the high resistive state by electrical stimuli causing current flow in different directions relative to the third electrode and the fourth electrode.

The present disclosure provides a combinational resistive change element comprising a first resistive change element, where the first resistive change element is adjustable between at least two resistive states, and where the first resistive change element is shareable with at least one other combinational resistive change element, a second resistive change element, where the second resistive change element is adjustable between at least two resistive states, and where the second resistive change element is shareable with at least one other combinational resistive change element, and a conductive structure providing an electrical communication path between the first resistive change element and the second resistive change element.

According to another aspect of the present disclosure, the first resistive change element and the second resistive change element are separated a distance of at least a minimum feature size multiplied by three.

According to another aspect of the present disclosure, the first resistive change element and the second resistive change element are located on a same level.

According to another aspect of the present disclosure, the first resistive change element and the second resistive change element are located on different levels.

The present disclosure provides a combinational resistive change element array comprising a first plurality of word lines, a second plurality of word lines, a plurality of bit lines, where each bit line in the plurality of bit lines has a segment located below the first plurality of word lines and a segment located above the second plurality of word lines, a plurality of electrical communication conductive structures, where each electrical communication conductive structure in the plurality of electrical communication conductive structures provides an electrical communication path between a segment of a bit line located below the first plurality of word lines and a segment of a bit line located above the second plurality of word lines, a first plurality of resistive change elements, where each resistive change element in the first plurality of resistive change elements is in electrical communication with a bit line in the plurality of bit lines and a word line in the first plurality of word lines, a second plurality of resistive change elements, where each resistive change element in the second plurality of resistive change elements is in electrical communication with a bit line in the plurality of bit lines and a word line in the second plurality of word lines, and where the combinational resistive change element array is configurable to include a plurality of combinational resistive change elements, where each combinational resistive change element includes a resistive change element from the first plurality of resistive change elements, a resistive change element from the second plurality of resistive change elements, and a conductive structure providing an electrical communication path between the resistive change element from the first plurality of resistive change elements and the resistive change element from the second plurality of resistive change elements, where the resistive change element from the first plurality of resistive change elements and the resistive change element from the second plurality of resistive change elements are in electrical communication with a same bit line.

According to another aspect of the present disclosure, the first plurality of resistive change elements is arranged in a matrix and the second plurality of resistive change elements is arranged in a matrix.

According to another aspect of the present disclosure, the resistive change element in the first plurality of resistive change elements and the resistive change element in the second plurality of resistive change elements are located at matching locations in the matrixes.

According to another aspect of the present disclosure, the resistive change element in the first plurality of resistive change elements and the resistive change element in the second plurality of resistive change elements are located at a same column and different rows in the matrixes.

According to another aspect of the present disclosure, the resistive change element in the first plurality of resistive change elements is shareable with at least one other combinational resistive change element and the resistive change element in the second plurality of resistive change elements is shareable with at least one other combinational resistive change element.

According to another aspect of the present disclosure, at least one resistive change element in the first plurality of resistive change elements is shared between at least two combinational resistive change elements in the plurality of combinational resistive change elements.

According to another aspect of the present disclosure, at least one resistive change element in the second plurality of resistive change elements is shared between at least two combinational resistive change elements in the plurality of combinational resistive change elements.

According to another aspect of the present disclosure, at least one resistive change element in the first plurality of resistive change elements is shared between at least two combinational resistive change elements in the plurality of combinational resistive change elements and at least one resistive change element in the second plurality of resistive change elements is shared between at least two combinational resistive change elements in the plurality of combinational resistive change elements.

According to another aspect of the present disclosure, a number of resistive change elements in the first plurality of resistive change elements and a number of resistive change elements in the second plurality of resistive change elements are the same.

According to another aspect of the present disclosure, a number of resistive change elements in the first plurality of resistive change elements and a number of resistive change elements in the second plurality of resistive change elements are different.

According to another aspect of the present disclosure, a number of resistive change elements in the first plurality of resistive change elements and a number of resistive change elements in the second plurality of resistive change elements are greater than a number of combinational resistive change elements in the plurality of combinational resistive change elements.

According to another aspect of the present disclosure, the first plurality of resistive change elements and the second plurality of resistive change elements are located on the same level.

According to another aspect of the present disclosure, the first plurality of resistive change elements and the second plurality of resistive change elements are located on the different levels.

The present disclosure provides a combinational resistive change element array comprising a first plurality of word lines, a second plurality of word lines, a first plurality of bit lines, a second plurality of bit lines, where each word line in the first plurality of word lines includes a segment located above segments of bit lines in the first plurality of bit lines and a segment located below segments of bit lines in the second plurality of bit lines, where each word line in the second plurality of word lines includes a segment located below segments of bit lines in the first plurality of bit lines and a segment located above segments of bit lines the second plurality of bit lines, where each bit line in the first plurality of bit lines includes a segment located below segments of word lines in the first plurality of word lines and a segment located above segments of word lines in the second plurality of word lines, where each bit line in the second plurality of bit lines includes a segment located above segments of word lines in the first plurality of word lines and a segment located below segments of word line in the second plurality of word lines, a first plurality of electrical communication conductive structures where each electrical communication conductive structure in the first plurality of electrical communication conductive structures provides an electrical communication path between a segment of a word line located above segments of bit lines in the first plurality of bit lines and a segment of a word line located below segments of bit lines in the second plurality of bit lines, a second plurality of electrical communication conductive structures where each electrical communication conductive structure in the second plurality of electrical communication conductive structures provides an electrical communication path between a segment of a word line located below segments of bit lines in the first plurality of bit lines and a segment of a word line located above segments of bit lines in the second plurality of bit lines, a third plurality of electrical communication conductive structures where each electrical communication conductive structure in the third plurality of electrical communication conductive structures provides an electrical communication path between a segment of a bit line located below segments of word lines in the first plurality of word lines and a segment of a bit line located above segments of word lines in the second plurality of word lines, a fourth plurality of electrical communication conductive structures where each electrical communication conductive structure in the fourth plurality of electrical communication conductive structures provides an electrical communication path between a segment of a bit line located above segments of word lines in the first plurality of word lines and a segment of a bit line located below segments of word lines in the second plurality of word lines, a first plurality of resistive change elements, where each resistive change element in the first plurality of resistive change elements is in electrical communication with a bit line in the first plurality of bit lines and a word line in the first plurality of word lines, a second plurality of resistive change elements, where each resistive change element in the second plurality of resistive change elements is in electrical communication with a bit line in the first plurality of bit lines and a word line in the second plurality of word lines, a third plurality of resistive change elements, where each resistive change element in the third plurality of resistive change elements is in electrical communication with a bit line in the second plurality of bit lines and a word line in the second plurality of word lines, a fourth plurality of resistive change elements, where each resistive change element in the fourth plurality of resistive change elements is in electrical communication with a bit line in the second plurality of bit lines and a word line in the first plurality of word lines, where the combinational resistive change element array is configurable to include at least one of a first plurality of combinational resistive change elements, a second plurality of combinational resistive change elements, a third plurality of combinational resistive change elements, or a fourth plurality of combinational resistive change elements, where each combinational resistive change element in the first plurality of combinational resistive change elements includes a resistive change element from the first plurality of resistive change elements, a resistive change element from the second plurality of resistive change elements, and a conductive structure providing an electrical communication path between the resistive change element from the first plurality of resistive change elements and the resistive change element from the second plurality of resistive change elements, and where the resistive change element from the first plurality of resistive change elements and the resistive change element from the second plurality of resistive change elements are in electrical communication with a same bit line, where each combinational resistive change element in the second plurality of combinational resistive change elements includes a resistive change element from the third plurality of resistive change elements, a resistive change element from the fourth plurality of resistive change elements, and a conductive structure providing an electrical communication path between the resistive change element from the third plurality of resistive change elements and the resistive change element from the fourth plurality of resistive change elements, and where the resistive change element from the third plurality of resistive change elements and the resistive change element from the fourth plurality of resistive change elements are in electrical communication with a same bit line, where each combinational resistive change element in the third plurality of combinational resistive change elements includes a resistive change element from the first plurality of resistive change elements, a resistive change element from the fourth plurality of resistive change elements, and a conductive structure providing an electrical communication path between the resistive change element from the first plurality of resistive change elements and the resistive change element from the fourth plurality of resistive change elements, and where the resistive change element from the first plurality of resistive change elements and the resistive change element from the fourth plurality of resistive change elements are in electrical communication with a same word line, and where each combinational resistive change element in the fourth plurality of combinational resistive change elements includes a resistive change element from the second plurality of resistive change elements, a resistive change element from the third plurality of resistive change elements, a conductive structure providing an electrical communication path between the resistive change element from the second plurality of resistive change elements and the resistive change element from the third plurality of resistive change elements, and where the resistive change element from the second plurality of resistive change elements and the resistive change element from the third plurality of resistive change elements are in electrical communication with a same word line.

The present disclosure provides a device comprising a resistive change element array including a plurality of resistive change elements, where the resistive change element array is configurable to include a plurality of combinations of resistive change elements, and where each combination of resistive change elements includes two resistive change elements, and circuitry for writing data to the resistive change element array and reading data from the resistive change element array, wherein the circuitry comprises a control logic storing a correspondence for configuring the resistive change element array to include a plurality of combinations of resistive change elements, where each combination of resistive change elements is adjustable between multiple relational states involving ratios of resistances of resistive states of the resistive change elements of the combination of resistive change elements.

According to another aspect of the present disclosure, the resistive change elements in the plurality of resistive change elements are phase change resistive change elements.

According to another aspect of the present disclosure, the resistive change elements in the plurality of resistive change elements are metal oxide resistive change elements.

According to another aspect of the present disclosure, each resistive change element in the plurality of resistive change elements has a first electrode, a second electrode, and a resistive change material between the first electrode and the second electrode.

According to another aspect of the present disclosure, each resistive change element in the plurality of resistive change elements is adjustable between at least two resistive states.

According to another aspect of the present disclosure, the at least two resistive states includes a low resistive state and a high resistive state, where a resistance of the low resistive state is less than a resistance of the high resistive state.

According to another aspect of the present disclosure, each resistive change element in the plurality of resistive change elements is adjustable between the low resistive state and the high resistive state by electrical stimuli causing current flow in different directions relative to the first electrode and the second electrode.

According to another aspect of the present disclosure, each resistive change element in the plurality of resistive change elements is adjustable between the low resistive state and the high resistive state by electrical stimuli causing current flow in a same direction relative to the first electrode and the second electrode.

According to another aspect of the present disclosure, the resistive change material comprises a nanotube fabric.

According to another aspect of the present disclosure, the resistive change material comprises buckyballs.

According to another aspect of the present disclosure, the resistive change material comprises graphene flakes.

According to another aspect of the present disclosure, the resistive change material comprises nanocapsules.

According to another aspect of the present disclosure, the resistive change material comprises nanohorns.

Other features and advantages of the present disclosure will become apparent from the following description, which is provided below in relation to the accompanying drawings.

BRIEF DESCRIPTION OF DRAWINGS

FIG. 3H-1 illustrates a first part of a simplified schematic diagram of an exemplary architecture for programming and accessing at least one combinational resistive change element in a combinational resistive change element array having two sections where word line driver circuits and bit line driver circuits are fifth driver circuits and sense devices are sense amplifiers.

FIG. 3H-2 illustrates a second part of a simplified schematic diagram of an exemplary architecture for programming and accessing at least one combinational resistive change element in a combinational resistive change element array having two sections where word line driver circuits and bit line driver circuits are fifth driver circuits and sense devices are sense amplifiers.

FIG. 3I-1 illustrates a first part of a simplified schematic diagram of an exemplary architecture for programming and accessing at least one combinational resistive change element in a combinational resistive change element array having two sections where word line driver circuits and bit line driver circuits are fifth driver circuits and sense devices are inverters.

FIG. 3I-2 illustrates a second part of a simplified schematic diagram of an exemplary architecture for programming and accessing at least one combinational resistive change element in a combinational resistive change element array having two sections where word line driver circuits and bit line driver circuits are fifth driver circuits and sense devices are inverters.

FIG. 3J-1 illustrates a first part of a simplified schematic diagram of the exemplary architecture of FIGS. 3H-1 and 3H-2 showing current flow through a combinational resistive change element array during a PROGRAMMING operation to adjust a relational state of a combinational resistive change element S11 to a low relational state.

FIG. 3J-2 illustrates a second part of a simplified schematic diagram of the exemplary architecture of FIGS. 3H-1 and 3H-2 showing current flow through a combinational resistive change element array during a PROGRAMMING operation to adjust a relational state of a combinational resistive change element S11 to a low relational state.

FIG. 3K-1 illustrates a first part of a simplified schematic diagram of the exemplary architecture of FIGS. 3H-1 and 3H-2 showing current flow through a combinational resistive change element array during a PROGRAMMING operation to adjust a relational state of a combinational resistive change element S11 to a high relational state.

FIG. 3K-2 illustrates a second part of a simplified schematic diagram of the exemplary architecture of FIGS. 3H-1 and 3H-2 showing current flow through a combinational resistive change element array during a PROGRAMMING operation to adjust a relational state of a combinational resistive change element S11 to a high relational state.

FIG. 3L-1 illustrates a first part of a simplified schematic diagram of the exemplary architecture of FIGS. 3H-1 and 3H-2 showing current flow through a combinational resistive change element array during a READ operation of a combinational resistive change element S11, when the combinational resistive change element S11 has a low relational state.

FIG. 3L-2 illustrates a second part of a simplified schematic diagram of the exemplary architecture of FIGS. 3H-1 and 3H-2 showing current flow through a combinational resistive change element array during a READ operation of a combinational resistive change element S11, when the combinational resistive change element S11 has a low relational state.

FIG. 3M-1 illustrates a first part of a simplified schematic diagram of the exemplary architecture of FIGS. 3H-1 and 3H-2 showing current flow through a combinational resistive change element array during a READ operation of a combinational resistive change element S11, when the combinational resistive change element S11 has a high relational state.

FIG. 3M-2 illustrates a second part of a simplified schematic diagram of the exemplary architecture of FIGS. 3H-1 and 3H-2 showing current flow through a combinational resistive change element array during a READ operation of a combinational resistive change element S11, when the combinational resistive change element S11 has a high relational state.

FIG. 3N-1 illustrates a first part of a simplified schematic diagram of the exemplary architecture of FIGS. 3H-1 and 3H-2 showing current flow through a combinational resistive change element array during a SET VERIFY operation of a combinational resistive change element S11, when the combinational resistive change element S11 has a low relational state.

FIG. 3N-2 illustrates a second part of a simplified schematic diagram of the exemplary architecture of FIGS. 3H-1 and 3H-2 showing current flow through a combinational resistive change element array during a SET VERIFY operation of a combinational resistive change element S11, when the combinational resistive change element S11 has a low relational state.

FIG. 3O-1 illustrates a first part of a simplified schematic diagram of the exemplary architecture of FIGS. 3H-1 and 3H-2 showing current flow through a combinational resistive change element array during a RESET VERIFY operation of a combinational resistive change element S11, when the combinational resistive change element S11 has a high relational state.

FIG. 3O-2 illustrates a second part of a simplified schematic diagram of the exemplary architecture of FIGS. 3H-1 and 3H-2 showing current flow through a combinational resistive change element array during a RESET VERIFY operation of a combinational resistive change element S11, when the combinational resistive change element S11 has a high relational state.

FIG. 4 illustrates a flow chart showing a method for programming at least one combination of resistive change elements.

FIG. 5 illustrates a flow chart showing a method for accessing at least one combination of resistive change elements.

FIG. 6B-1 illustrates a first part of a simplified schematic diagram of the combinational resistive change element array of FIG. 6A.

FIG. 6B-2 illustrates a second part of a simplified schematic diagram of the combinational resistive change element array of FIG. 6A.

FIG. 6C-1 illustrates a first part of a simplified schematic diagram of an exemplary architecture for programming and accessing at least one combinational resistive change element in a combinational resistive change element array having four sections, where the at least one combinational resistive change element has resistive change elements in electrical communication with the same bit line.

FIG. 6C-2 illustrates a second part of a simplified schematic diagram of an exemplary architecture for programming and accessing at least one combinational resistive change element in a combinational resistive change element array having four sections, where the at least one combinational resistive change element has resistive change elements in electrical communication with the same bit line.

FIG. 6D-1 illustrates a first part of a simplified schematic diagram of an exemplary architecture for programming and accessing at least one combinational resistive change element in a combinational resistive change element array having four sections, where the at least one combinational resistive change element has resistive change elements in electrical communication with the same bit line or the at least one combinational resistive change element has resistive change elements in electrical communication with the same word line.

FIG. 6D-2 illustrates a second part of a simplified schematic diagram of an exemplary architecture for programming and accessing at least one combinational resistive change element in a combinational resistive change element array having four sections, where the at least one combinational resistive change element has resistive change elements in electrical communication with the same bit line or the at least one combinational resistive change element has resistive change elements in electrical communication with the same word line.

DETAILED DESCRIPTION

Figure 1:
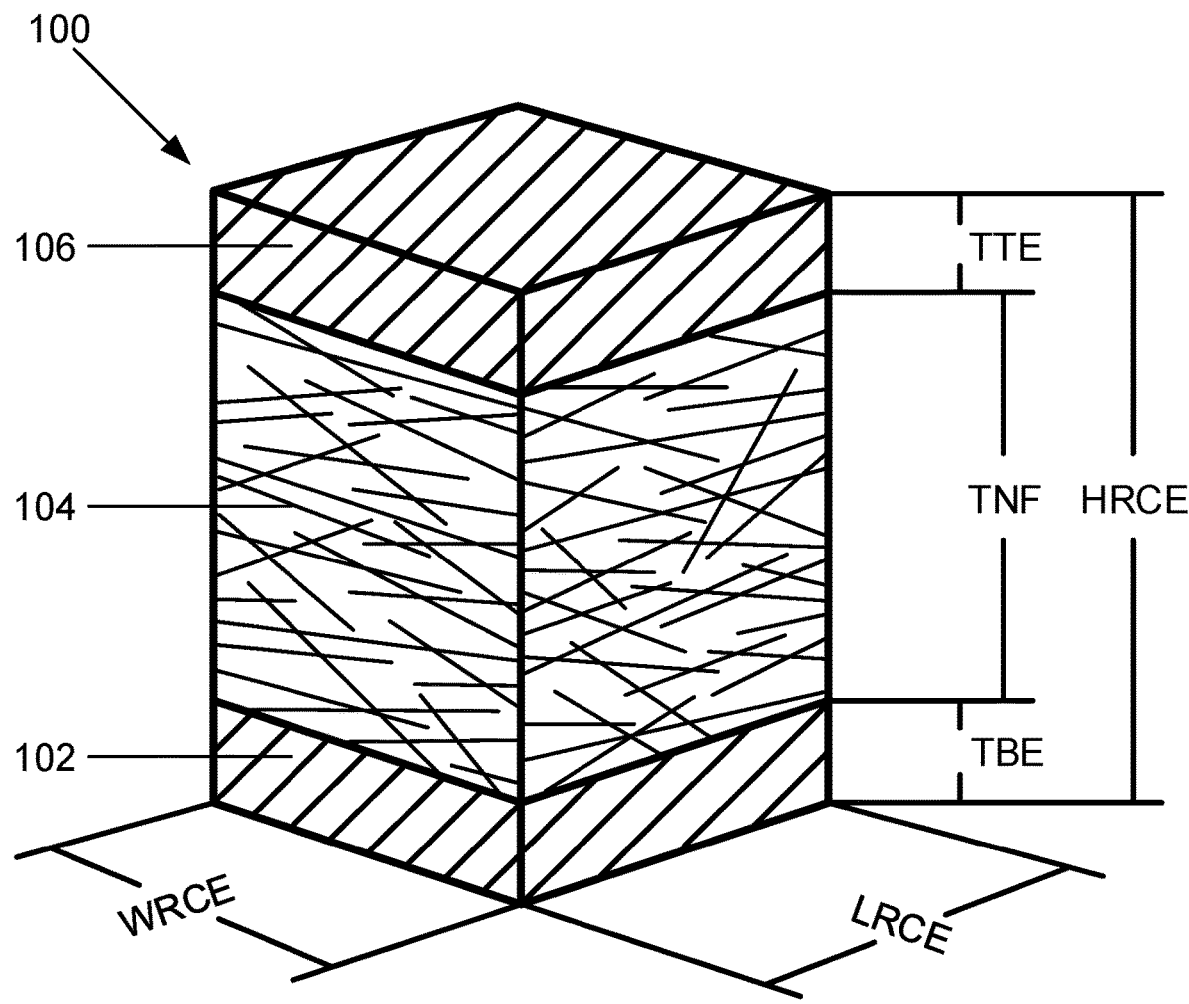
FIG. 1 illustrates a three-dimensional view of a resistive change element.

The present disclosure provides combinations of resistive change elements that can store information as relational states. The present disclosure also provides combinational resistive change elements that can store information as relational states. A relational state as used herein can be, for example, a mathematical ratio of resistances; a mathematical ratio of resistances and another parameter such as a sum of resistances; a mathematical ratio of resistances and another parameter such as an amount of current; or other combinations that include a ratio of resistances. Such relational states are relational because they involve a ratio of resistances. The present disclosure additionally provides resistive change element arrays configurable to include a plurality of combinations of resistive change elements and combinational resistive change element arrays configurable to include a plurality of combinational resistive change elements. The present disclosure further provides devices and methods for programming combinations of resistive change elements and devices and methods for programming combinational resistive change elements. The present disclosure also provides devices and methods for accessing combinations of resistive change elements through a variety of operations, such as read operations, set verify operations, reset verify operations, and other types of operations and devices and methods for accessing combinational resistive change elements through a variety of operations, such as read operations, set verify operations, reset verify operations, and other types of operations. It is noted that while the present disclosure provides some examples of resistive change elements including nanotube fabrics or other carbon allotropes as resistive change materials the present disclosure is not limited to resistive change elements including nanotube fabrics or other carbon allotropes as resistive change materials and that the present disclosure is applicable to other types of resistive change elements such as phase change, metal oxide, and solid electrolyte.

The term electrical communication is used in this disclosure to refer to a connection that allows electrical signals to flow either directly or indirectly from one component to another. The direct flow of electrical signals from one component to another does not preclude intervening passive devices that do not generate electric energy such as resistors, capacitors, and inductors. Also, the direct flow of electrical signals from one component to another does not preclude intervening interconnecting structures, such as plugs, filled vias, and studs. Further, the direct flow of electrical signals from one component to another does not preclude intervening layers, such as barrier metal layers. The indirect flow of electrical signals from one component to another does not preclude intervening active devices such as transistors. Further, the terms bit line, source line, and word line are not limited to referring to the array lines designated below, but rather, the terms bit line, source line, and word line can be used to refer to array lines that differ from the designations below.

Combinations of resistive change elements that can store information as relational states and resistive change element arrays thereof can be operated with low power, few errors, and in some configurations at high speeds. Combinations of resistive change elements that can store information as relational states and resistive change element arrays thereof are well suited for use as non-volatile memory devices for storing data within electronic devices, such as cell phones, digital cameras, solid state hard drives, and computers. However, the use of combinations of resistive change elements that can store information as relational states and resistive change element arrays thereof is not limited to memory applications. Combinations of resistive change elements that can store information as relational states and resistive change element arrays thereof as well as the advanced architectures taught by the present disclosure could also be used within analog circuitry, logic devices, or other devices. For example, combinations of resistive change elements that can store information as relational states and resistive change element arrays thereof are well suited for use in applications that use more than two states such as artificial intelligence and neural networks.

Combinational resistive change elements and combinational resistive change element arrays thereof can be operated at high speed, with low power, and few errors. Combinational resistive change elements and combinational resistive change element arrays thereof are well suited for use as non-volatile memory devices for storing data within electronic devices, such as cell phones, digital cameras, solid state hard drives, and computers. However, the use of combinational resistive change elements and combinational resistive change element arrays thereof is not limited to memory applications. Combinational resistive change elements and combinational resistive change element arrays thereof as well as the advanced architectures taught by the present disclosure could also be used within analog circuitry, logic devices, or other devices. For example, combinational resistive change elements and combinational resistive change element arrays thereof are well suited for use in applications that use more than two states such as artificial intelligence and neural networks.

A combination of resistive change elements stores information as relational states that correspond with combinations of resistive states stored in at least two resistive change elements of the combination of resistive change elements. For example, a combination of resistive change elements including two resistive change elements stores information as relational states that correspond with combinations of resistive states of the two resistive change elements. As discussed below, relational states of combinations of resistive change elements are non-volatile because resistive states of resistive change elements of combinations of resistive change elements are non-volatile. Also, as discussed below, a combination of resistive change elements can include resistive change elements that are in electrical communication. Additionally, as discussed below, a combination of resistive change elements is not limited to resistive change elements that are in electrical communication. Further, as discussed below, a combination of resistive change elements can be adjusted (programmed) between at least two combinations of resistive states of resistive change elements that correspond with relational states. For example, a combination of resistive change elements including two resistive change elements can be adjusted between a first combination of resistive states of the two resistive change elements that corresponds with a first relational state and a second combination of resistive states of the two resistive change elements that corresponds with a second relational state. Further, as discussed below, a combination of resistive change elements can be accessed to determine a relational state of the combination of resistive change elements. For example, a combination of resistive change elements including two resistive change elements that are in electrical communication can be accessed in a manner such that the two resistive change elements form a resistive divider for determining a relational state of the combination of resistive change elements. For example, a combination of resistive change elements including two resistive change elements can be accessed in a manner such that the resistances of the two resistive change elements are used to form a calculated resistive divider for determining a relational state of the combination of resistive change elements.

A combinational resistive change element stores information as relational states that correspond with combinations of resistive states stored in at least two resistive change elements that are in electrical communication of the combinational resistive change element. For example, a combinational resistive change element having two resistive change elements that are in electrical communication and spread out among two sections of a combinational resistive change element array stores information as relational states that correspond with combinations of resistive states of the two resistive change elements. As discussed below, relational states of combinational resistive change elements are non-volatile because resistive states of resistive change elements of combinational resistive change elements are non-volatile. Also, as discussed below, a combinational resistive change element can be adjusted (programmed) between at least two combinations of resistive states of resistive change elements that correspond with relational states. For example, a combinational resistive change element having two resistive change elements that are in electrical communication and spread out among two sections of a combinational resistive change element array can be adjusted between a first combination of resistive states of the two resistive change elements that corresponds with a first relational state and a second combination of resistive states of the two resistive change elements that corresponds with a second relational state. Further, as will be discussed below, a combinational resistive change element can be accessed to determine a relational state of the combinational resistive change element. For example, a combinational resistive change element having two resistive change elements that are in electrical communication and spread out among two sections of a combinational resistive change element array can be accessed in a manner such that the two resistive change elements form a resistive divider for determining a relational state of the combinational resistive change element.

Referring now to FIG. 1, a three-dimensional view of an exemplary resistive change element 100 is illustrated. The resistive change element 100 includes a bottom electrode 102, a resistive change material 104, and a top electrode 106. A nanotube fabric serves as the resistive change material 104. The bottom electrode 102 is in contact with the resistive change material 104 and the top electrode 106 is in contact with the resistive change material 104. Alternatively, the resistive change element 100 can include at least one intervening layer located between the bottom electrode 102 and the resistive change material 104, at least one intervening layer located between the resistive change material 104 and the top electrode 106, or at least one intervening layer located between the bottom electrode 102 and the resistive change material 104 and at least one intervening layer located between the resistive change material 104 and the top electrode 106. Alternatively, the bottom electrode 102 can be omitted from the resistive change element 100, the top electrode 106 can be omitted from the resistive change element 100, or the bottom electrode 102 and the top electrode 106 can be omitted from the resistive change element 100. Alternatively, the resistive change material 104 can comprise another resistive change material such as other carbon allotropes such as Buckyballs, graphene flakes, nanocapsules, and nanohorns.

The exemplary resistive change element 100 has a substantially square horizontal cross-sectional shape. The resistive change element 100 has a length LRCE, a width WRCE, and a height HRCE, where the length LRCE is approximately equal to 1 F, the width WRCE is approximately equal to 1 F, and the height HRCE is approximately equal to the sum of the thicknesses of the bottom electrode 102, the resistive change material 104, and the top electrode 106. The height HRCE of the resistive change element 100 is typically larger than 1 F, however, the height HRCE of the resistive change element 100 can be scaled, such that the height HRCE approaches 1 F. F represents a minimum feature size. Alternatively, the resistive change element 100 can have a length LRCE larger than 1 F, a width WRCE larger than 1 F, and/or a height HRCE larger than 1 F. Alternatively, the resistive change element 100 may have a non-square horizontal cross-sectional shape, such as a substantially rectangular horizontal cross-sectional shape other than a substantially square horizontal cross-sectional shape, a substantially circular horizontal cross-sectional shape, a substantially oval horizontal cross-sectional shape, a substantially triangular horizontal cross-sectional shape, a substantially trapezoidal horizontal cross-sectional shape, an irregular horizontal cross-sectional shape, and a non-uniform horizontal cross-sectional shape where different sections of the resistive change element 100 can have different dimensions. The bottom electrode 102, the resistive change material 104, and the top electrode 106 have substantially square horizontal cross-sectional shapes because the resistive change element 100 has a substantially square horizontal cross-sectional shape. The bottom electrode 102 has a length dimension approximately equal to 1 F, a width dimension approximately equal to 1 F, and a thickness TBE. The resistive change material 104 has a length dimension approximately equal to 1 F, a width dimension approximately equal to 1 F, and a thickness TNF. The top electrode 106 has a length dimension approximately equal to 1 F, a width dimension approximately equal to 1 F, and a thickness TTE. It is noted that the resistive change element 100 can be considered to have a substantially square horizontal cross-sectional shape when the resistive change element 100 has a horizontal cross-sectional shape that is exactly a square and when the resistive change element 100 has a horizontal cross-sectional shape that is not exactly a square due to variations caused by the fabrication process. It is further noted that when the resistive change element 100 has a non-uniform horizontal cross-sectional shape where different sections of the resistive change element 100 can have different dimensions, the bottom electrode, the resistive change material, and the top electrode can have different shapes.

The resistive change element 100 can be adjusted (programmed) between two non-volatile resistive states, a low resistive state, for example a resistance on the order of 1 MΩ (also referred to as a SET state), and a high resistive state, for example a resistance on the order of 10 MΩ (also referred to as a RESET state), by applying electrical stimuli to the resistive change element 100. As discussed below, when the resistive change element 100 is adjusted (programmed) between resistive states in a bidirectional manner, the resistive change element 100 is adjusted (programmed) between resistive states by electrical stimuli that cause current flow in different directions relative to the top electrode 106 and the bottom electrode 102. Also, as discussed below, when the resistive change element 100 is adjusted (programmed) between resistive states in a unidirectional manner, the resistive change element 100 is adjusted (programmed) between resistive states by electrical stimuli that cause current flow in the same direction relative to the top electrode 106 and the bottom electrode 102. Alternatively, the resistive change element 100 can be adjusted (programmed) between more than two non-volatile resistive states, where each non-volatile resistive state corresponds with a different resistance value, by applying electrical stimuli to the resistive change element 100.

When the resistive change element 100 is adjusted (programmed) between resistive states in a bidirectional manner, the resistive change element 100 can be adjusted to the low resistive state by an electrical stimulus that causes current flow from the bottom electrode 102 to the top electrode 106 and can be adjusted to the high resistive state by an electrical stimulus that causes current flow from the top electrode 106 to the bottom electrode 102. A bidirectional SET electrical stimulus of one or more programming pulses of specific voltages, specific currents, and/or specific pulse widths is applied to the resistive change element 100 to adjust a resistive state of the resistive change element 100 to the low resistive state. The bidirectional SET electrical stimulus causes current flow from the bottom electrode 102 to the top electrode 106 of the resistive change element 100. The specific voltages, specific currents, and/or specific pulse widths of the one or more programming pulses of the bidirectional SET electrical stimulus can be adjusted as required by the needs of a specific application. For example, the specific voltages, specific currents, and/or specific pulse widths of the bidirectional SET electrical stimulus can be adjusted based on various parameters such as, resistance values of the resistive states, dimensions of the resistive change element, materials of the resistive change element, location of the resistive change element, configuration of a combinational resistive change element, configuration of a combinational resistive change element array, and/or configuration of resistive change element array. A bidirectional RESET electrical stimulus of one or more programming pulses of specific voltages, specific currents, and/or specific pulse widths is applied to the resistive change element 100 to adjust a resistive state of the resistive change element 100 to the high resistive state. The bidirectional RESET electrical stimulus causes current flow from the top electrode 106 to the bottom electrode 102 of the resistive change element 100. The specific voltages, specific currents, and/or specific pulse widths of the one or more programming pulses of the bidirectional RESET electrical stimulus can be adjusted as required by the needs of a specific application. For example, the specific voltages, currents, and/or pulse widths of the bidirectional RESET electrical stimulus can be adjusted based on various parameters such as, resistance values of the resistive states, dimensions of the resistive change element, materials of the resistive change element, location of the resistive change element, configuration of a combinational resistive change element, configuration of a combinational resistive change element array, and/or configuration of a resistive change element array. Also, the bidirectional SET electrical stimulus can be a pulse train, as described in U.S. Pat. No. 9,947,400, applied to the resistive change element 100 to adjust a resistive state of the resistive change element 100 to the low resistive state and the bidirectional RESET electrical stimulus can be a pulse train, as described in U.S. Pat. No. 9,947,400, applied to the resistive change element 100 to adjust a resistive state of the resistive change element 100 to the high resistive state.

When the resistive change element 100 is adjusted (programmed) between resistive states in a unidirectional manner, the resistive change element 100 can be adjusted between the low resistive state and the high resistive state by electrical stimuli that cause current flow in the same direction relative to the top electrode 106 and the bottom electrode 102. A unidirectional SET electrical stimulus of one or more programming pulses of specific voltages, specific currents, and/or specific pulse widths is applied to the resistive change element 100 to adjust a resistive state of the resistive change element 100 to the low resistive state. The unidirectional SET electrical stimulus causes current flow from the bottom electrode 102 to the top electrode 106 of the resistive change element 100. Alternatively, the unidirectional SET electrical stimulus causes current flow from the top electrode 106 to the bottom electrode 102 of the resistive change element 100. The specific voltages, specific currents, and/or specific pulse widths of the one or more programming pulses of the unidirectional SET electrical stimulus can be adjusted as required by the needs of a specific application. For example, the specific voltages, specific currents, and/or specific pulse widths of the unidirectional SET electrical stimulus can be adjusted based on various parameters such as, resistance values of the resistive states, dimensions of the resistive change element, materials of the resistive change element, location of the resistive change element, configuration of a combinational resistive change element, configuration of a combinational resistive change element array, and/or configuration of a resistive change element array. A unidirectional RESET electrical stimulus of one or more programming pulses of specific voltages, specific currents, and/or specific pulse widths is applied to the resistive change element 100 to adjust a resistive state of the resistive change element 100 to the high resistive state. The unidirectional RESET electrical stimulus causes current flow from the bottom electrode 102 to the top electrode 106 of the resistive change element 100. Alternatively, the unidirectional RESET electrical stimulus causes current flow from the top electrode 106 to the bottom electrode 102 of the resistive change element 100. The specific voltages, specific currents, and/or specific pulse widths of the one or more programming pulses of the unidirectional RESET electrical stimulus can be adjusted as required by the needs of a specific application. For example, the specific voltages, specific currents, and/or specific pulse widths of the unidirectional RESET electrical stimulus can be adjusted based on various parameters such as, resistance values of the resistive states, dimensions of the resistive change element, materials of the resistive change element, location of the resistive change element, configuration of a combinational resistive change element, configuration of a combinational resistive change element array, and/or configuration of a resistive change element array. Also, the unidirectional SET electrical stimulus can be a pulse train, as described in U.S. Pat. No. 9,947,400, applied to the resistive change element 100 to adjust a resistive state of the resistive change element 100 to the low resistive state and the unidirectional RESET electrical stimulus can be a pulse train, as described in U.S. Pat. No. 9,947,400, applied to the resistive change element 100 to adjust a resistive state of the resistive change element 100 to the high resistive state. It is noted that when the unidirectional SET electrical stimulus causes current flow from the bottom electrode 102 to the top electrode 106, the unidirectional RESET electrical stimulus causes current flow from the bottom electrode 102 to the top electrode 106. It is noted that when the unidirectional SET electrical stimulus causes current flow from the top electrode 106 to the bottom electrode 102, the unidirectional RESET electrical stimulus causes current flow from the top electrode 106 to the bottom electrode 102.

Figure 2A:
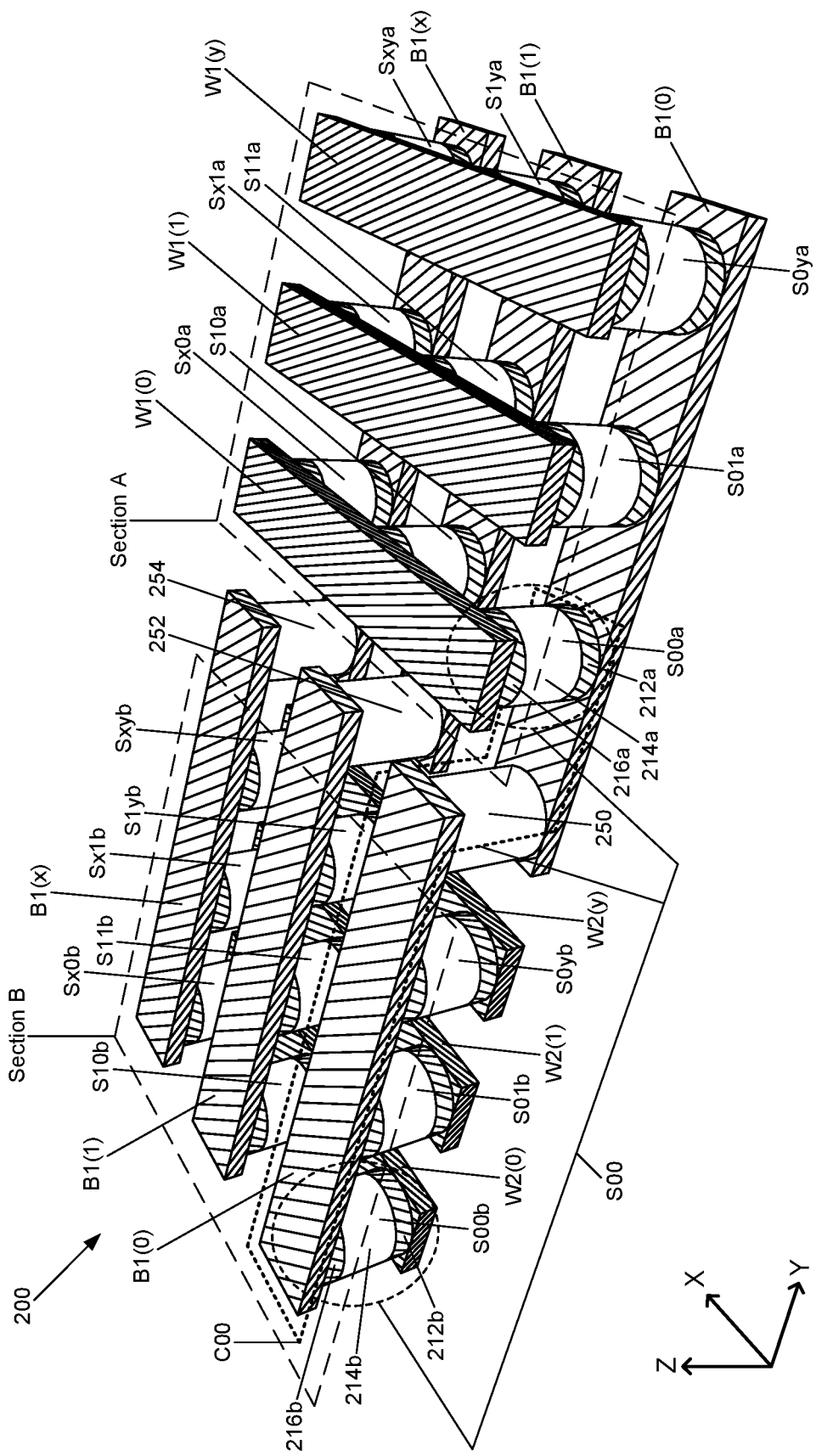
FIG. 2A illustrates a three-dimensional view of a combinational resistive change element array having two sections.

Referring now to FIG. 2A, a three-dimensional view of an exemplary combinational resistive change element array 200 is illustrated. The combinational resistive change element array 200 includes a plurality of resistive change elements S00a-S$xya$ located in section A of the combinational resistive change element array 200 and a plurality of resistive change elements S00b-S$xyb$ located in section B of the combinational resistive change element array 200. The combinational resistive change element array 200 also includes a first plurality of word lines W1(0)-W1($y$), a second plurality of word lines W2(0)-W2($y$), a plurality of bit lines B1(0)-B1($x$) where each bit line in the plurality of bit lines B1(0)-B1($x$) has a segment located below the first plurality of word lines W1(0)-W1($y$) and a segment located above the second plurality of word lines W2(0)-W2($y$), and a plurality of electrical communication conductive structures 250, 252, 254 where each electrical communication conductive structure in the plurality of electrical communication conductive structures 250, 252, 254 provides an electrical communication path between a segment of a bit line located below the first plurality of word lines W1(0)-W1($y$) to a segment of a bit line located above the second plurality of word lines W2(0)-W2($y$). The first plurality of word lines W1(0)-W1($y$) are in electrical communication with the plurality of resistive change elements S00a-S$xya$ located in section A, the second plurality of word lines W2(0)-W2($y$) are in electrical communication with the plurality of resistive change elements S00b-S$xyb$ located in section B, and the plurality of bit lines B1(0)-B1($x$) are in electrical communication with to the plurality of resistive change elements S00a-S$xya$ located in section A and the plurality of resistive change elements S00b-S$xyb$ located is section B.

The combinational resistive change element array 200 is configurable to include a plurality of combinational resistive change elements where each combinational resistive change element includes a resistive change element from the plurality of resistive change elements S00a-S$xya$ located in section A, a resistive change element from the plurality of resistive change elements S00b-S$xyb$ located in section B where the resistive change element from the plurality of resistive change elements S00a-S$xya$ located in section A and the resistive change element from the plurality of resistive change elements S00b-S$xyb$ located in section B are in electrical communication with to the same bit line, and a conductive structure providing an electrical communication path between the resistive change element from the plurality of resistive change elements S00a-S$xya$ located in section A and the resistive change element from the plurality of resistive change elements S00b-S$xyb$ located in section B. The resistive change element from the plurality of resistive change elements S00a-S$xya$ located in section A and the resistive change element from the plurality of resistive change elements S00b-S$xyb$ located in section B are in electrical communication with the same bit line so that the bit line can provide access to a node between the resistive change elements. The conductive structure includes a portion of a bit line from the resistive change element from the plurality of resistive change elements S00a-Sxya located in section A to an electrical communication conductive structure from the plurality of electrical communication conductive structures 250, 252, 254, the electrical communication conductive structure, and a portion of the bit line from the electrical communication conductive structure to the resistive change element from the plurality of resistive change elements S00b-Sxyb located in section B. Thus, the conductive structure has a structure that varies based on the way the combinational resistive change element array 200 is configured to include a plurality of combinational resistive change elements because the portion of a bit line from the resistive change element from the plurality of resistive change elements S00a-Sxya located in section A to an electrical communication conductive structure from the plurality of electrical communication conductive structures 250, 252, 254, the electrical communication conductive structure, and the portion of the bit line from the electrical communication conductive structure to the resistive change element from the plurality of resistive change elements S00b-Sxyb located in section B vary based on resistive change elements included in a combinational resistive change element.

The combinational resistive change element array 200 can be configured to include a plurality of combinational resistive change elements using a correspondence where each combinational resistive change element includes a resistive change element from the plurality of resistive change elements S00a-Sxya located in section A and a resistive change element from the plurality of resistive change elements S00b-Sxyb located in section B in electrical communication with the same bit line. For example, the combinational resistive change element array 200 can be configured to include a plurality of combinational resistive change elements using a correspondence where each combinational resistive change element includes a resistive change element from the plurality of resistive change elements S00a-Sxya located in section A and a resistive change element from the plurality of resistive change elements S00b-Sxyb located in section B where the resistive change elements are located at matching locations in matrixes. For example, the combinational resistive change element array 200 can be configured to include a plurality of combinational resistive change elements using a correspondence where each combinational resistive change element includes a resistive change element from the plurality of resistive change elements S00a-Sxya located in section A and a resistive change element from the plurality of resistive change elements S00b-Sxyb located in section B where the resistive change elements are located at the same column and different rows in matrixes.

The correspondence for configuring the combinational resistive change element array 200 to include a plurality of combinational resistive change elements can stored be in software, hardware, or a combination of software and hardware. The correspondence for configuring the combinational resistive change element array 200 to include a plurality of combinational resistive change elements is typically stored in support circuitry for the combinational resistive change element array 200. For example, for software on chip, the correspondence for configuring the combinational resistive change element array 200 to include a plurality of combinational resistive change elements can be stored in software controllable control logic, such as a controller and a microcontroller, located on chip. For example, for hardware on chip, the correspondence for configuring the combinational resistive change element array 200 to include a plurality of combinational resistive change elements can be stored in hardware, such as registers and multiplexers, located on chip. For example, for software off chip, the correspondence for configuring the combinational resistive change element array 200 to include a plurality of combinational resistive change elements can be stored in software controllable control logic, such as a controller, a microcontroller, and a processor, located off chip.

Additionally, the combinational resistive change element array 200 can be configured to include a plurality of combinational resistive change elements using a correspondence where combinational resistive change elements share resistive change elements. A resistive change element is shared between combinational resistive change elements when the resistive change element is included in more than one combinational resistive change element. For example, a resistive change element is shared between a first combinational resistive change element and a second combinational resistive change element when the resistive change element is included in both the first combinational resistive change element and the second combinational resistive change element. Sharing resistive change elements between combinational resistive change elements can increase memory density of a combinational resistive change element array because fewer resistive change elements are required for combinational resistive change elements when combinational resistive change elements share resistive change elements. For example, when two combinational resistive change elements that each include two resistive change elements share a resistive change element the two combinational resistive change elements include a total of three resistive change elements, whereas, when two combinational resistive change elements that each include two resistive change elements do not share a resistive change element, the two combinational resistive change elements include a total of four resistive change elements.

Further, the combinational resistive change element array 200 can be initially configured using a correspondence, and subsequently the combinational resistive change element array 200 can be reconfigured using a different correspondence. Additionally, the combinational resistive change element array 200 can be reconfigured multiple times using different correspondences. For example, the combinational resistive change element array 200 can be configured using a correspondence, the correspondence can be updated to replace defective resistive change elements and the combinational resistive change element array 200 can be reconfigured using an updated version of the correspondence. For example, the combinational resistive change element array 200 can be configured using a correspondence specifying each combinational resistive change element includes a resistive change element from the plurality of resistive change elements S00a-Sxya located in section A and a resistive change element from the plurality of resistive change elements S00b-Sxyb located in section B where the resistive change elements are located at matching locations in matrixes and the combinational resistive change element array 200 can be reconfigured using a correspondence where each combinational resistive change element includes a resistive change element from the plurality of resistive change elements S00a-Sxya located in section A and a resistive change element from the plurality of resistive change elements S00b-Sxyb located in section B where the resistive change elements are located at the same column and different rows in matrixes.

Also, the combinational resistive change element array 200 can be reconfigured using a different correspondence to increase the amount of information that can be stored in the combinational resistive change element array 200. For example, the combinational resistive change element array 200 can be configured using a correspondence specifying each combinational resistive change element includes one resistive change element from the plurality of resistive change elements S00a-Sxya located in section A matched with one resistive change element from the plurality of resistive change elements S00b-Sxyb located in section B and the combinational resistive change element array 200 can be reconfigured using a correspondence where combinational resistive change elements share resistive change elements.

Additionally, the combinational resistive change element array 200 can be reconfigured using a different correspondence to decrease the amount of information that can be stored in the combinational resistive change element array 200. For example, the combinational resistive change element array 200 can be configured using where combinational resistive change elements share resistive change elements and the combinational resistive change element array 200 can be reconfigured using a correspondence specifying each combinational resistive change element includes one resistive change element from the plurality of resistive change elements S00a-Sxya located in section A matched with one resistive change element from the plurality of resistive change elements S00b-Sxyb located in section B.

The combinational resistive change element array 200 is discussed below being configured to include a plurality of combinational resistive change elements S00-Sxy using a correspondence where each combinational resistive change element in the plurality of combinational resistive change elements S00-Sxy includes a resistive change element from the plurality of resistive change elements S00a-Sxya located in section A and a resistive change element from the plurality of resistive change elements S00b-Sxyb located in section B at matching locations in matrixes. Additionally, each combinational resistive change element in the plurality of combinational resistive change elements S00-Sxy includes a conductive structure providing an electrical communication path between the resistive change elements included in the combinational resistive change element. FIG. 2A shows the combinational resistive change element S00 including the resistive change element S00a, the resistive change element S00b, and a conductive structure C00, however, for clarity the resistive change elements and the conductive structures included in the other combinational resistive change elements in the plurality of combinational resistive change elements S00-Sxy are not highlighted in FIG. 2A. The conductive structure C00 includes a portion of the bit line B1(0) from the resistive change element S00a to the electrical communication conductive structure 250, the electrical communication conductive structure 250, and a portion of the bit line B1(0) from the electrical communication conductive structure 250 to the resistive change element S00b. It is noted that, as similarly discussed above, each conductive structure has a structure that varies based on the resistive change elements included in the combinational resistive change element.

As shown in FIG. 2A, the plurality of resistive change elements S00a-Sxya located in section A of the combinational resistive change element array 200 is arranged in a N×N matrix and the plurality of resistive change elements S00b-Sxyb located in section B of the combinational resistive change element array 200 is arranged in a N×N matrix, where N is a positive integer. The numbering convention for the plurality of resistive change elements S00a-Sxya located in section A includes a column number followed by a row number indicating the location of the resistive change element in the N×N matrix followed by the letter a indicating the resistive change element is located in section A. The numbering convention for the plurality of resistive change elements S00b-Sxyb located in section B includes a column number followed by a row number indicating the location of the resistive change element in the N×N matrix followed by the letter b indicating the resistive change element is located in section B. The column numbers and the row numbers for the plurality of resistive change elements S00a-Sxya located in section A begin with column number 0 and row number 0 in the top left corner of the N×N matrix. The column numbers and the row numbers for the plurality of resistive change elements S00b-Sxyb located in section B begin with column number 0 and row number 0 in the top left corner of the N×N matrix. It is noted that the numbering convention for the plurality of combinational resistive change elements S00-Sxy indicates the resistive change elements included in a combinational resistive change element because the reference number for the combinational resistive change element, the reference number for the resistive change element from the plurality of resistive change elements S00a-Sxya located in section A, and the reference number for the resistive change element from the plurality of resistive change elements S00b-Sxyb located in section B share the same column number and row number. It is also noted that although the plurality of resistive change elements S00a-Sxya located in section A and the plurality of resistive change elements S00b-Sxyb located in section B are arranged in square N×N matrixes, where N is a positive integer, each plurality of resistive change elements can be arranged in other layouts such as rectangular N×M matrixes, where N and M are different positive integers.

The number of resistive change elements in the plurality of resistive change elements S00a-Sxya located in section A can be greater than the number of combinational resistive change elements S00-Sxy and the number of resistive change elements in the plurality of resistive change elements S00b-Sxyb located in section B can be greater than the number of combinational resistive change elements S00-Sxy. For example, the number of resistive change elements in the plurality of resistive change elements S00a-Sxya located in section A can be greater than the number of combinational resistive change elements S00-Sxy and the number of resistive change elements in the plurality of resistive change elements S00b-Sxyb located in section B can be greater than the number of combinational resistive change elements S00-Sxy so that resistive change elements are available to replace defective resistive change elements. It is noted that the number of resistive change elements in the plurality of resistive change elements S00a-Sxya located in section A can differ from the number of resistive change elements in the plurality of resistive change elements S00b-Sxyb located in section B.

In the example of FIG. 2A, the plurality of resistive change elements S00a-Sxya located in section A and the plurality of resistive change elements S00b-Sxyb located in section B are located on the same level and, as discussed in more detail below, the resistive change elements in both pluralities of resistive change elements have substantially the same structure. The plurality of combinational resistive change elements S00-Sxy have substantially similar electrical characteristics because the resistive change elements in both pluralities of resistive change elements have substantially the same structure. Additionally, the plurality of combinational resistive change elements S00-S$xy$ can have reduced variations in electrical characteristics among the combinational resistive change elements because resistive change elements located on the same level can be fabricated by the same process steps and can be fabricated at the same time. Further, the plurality of combinational resistive change elements S00-S$xy$ can be easier to fabricate than resistive change element cells having resistive change elements located on multiple levels because resistive change elements located on the same level can be fabricated by the same process steps and can be fabricated at the same time. For example, when each resistive change element in the plurality of resistive change elements S00$a$-S$xya$ located in section A has a top electrode, a nanotube fabric, and a bottom electrode, and each resistive change element in the plurality of resistive change elements S00$b$-S$xyb$ located in section B has a top electrode, a nanotube fabric, and a bottom electrode, material for the bottom electrodes of the resistive change elements can be deposited by the same process step or the same process steps, material for the nanotube fabric of the resistive change elements can be deposited by the same process step or the same process steps and, and material for the top electrodes of the resistive change elements can be deposited by the same process step or the same process steps. However, the plurality of resistive change elements S00$a$-S$xya$ located in section A and the plurality of resistive change elements S00$b$-S$xyb$ located in section B are not limited to being located on the same level. Additionally, resistive change elements in the plurality of resistive change elements S00$a$-S$xya$ located in section A are not limited to being located on the same level and resistive change elements in the plurality of resistive change elements S00$b$-S$xyb$ located in section B are not limited to being located on the same level. Also, the plurality of resistive change elements S00$a$-S$xya$ located in section A and the plurality of resistive change elements S00$b$-S$xyb$ located in section B are not limited to having substantially the same structure. Further, the plurality of combinational resistive change elements S00-S$xy$ are not limited to combinational resistive change elements having two resistive change elements with substantially the same structure and located on the same level but rather the plurality of combinational resistive change elements S00-S$xy$ can include combinational resistive change elements having resistive change elements with different structures and/or resistive change elements located on different levels.

Referring to FIG. 2A, each resistive change element in the plurality of resistive change elements S00$a$-S$xya$ located in section A has the same structure, and thus, the discussion below of resistive change element S00$a$ is applicable to each resistive change element in the plurality of resistive change elements S00$a$-S$xya$ located in section A. Resistive change element S00$a$ includes a bottom electrode 212$a$, a resistive change material 214$a$, and a top electrode 216$a$. A nanotube fabric serves as the resistive change material 214$a$. The bottom electrode 212$a$ is in contact with the resistive change material 214$a$ and the top electrode 216$a$ is in contact with the resistive change material 214$a$. Alternatively, the resistive change element S00$a$ can include at least one intervening layer located between the bottom electrode 212$a$ and the resistive change material 214$a$, at least one intervening layer located between the resistive change material 214$a$ and the top electrode 216$a$, or at least one intervening layer located between the bottom electrode 212$a$ and the resistive change material 214$a$ and at least one intervening layer located between the resistive change material 214$a$ and the top electrode 216$a$. Alternatively, the bottom electrode 212$a$ can be omitted from the resistive change element S00$a$, the top electrode 216$a$ can be omitted from the resistive change element S00$a$, or the bottom electrode 212$a$ and the top electrode 216$a$ can be omitted from the resistive change element S00$a$. Alternatively, the resistive change material 214$a$ can comprise another resistive change material such as other carbon allotropes such as Buckyballs, graphene flakes, nanocapsules, and nanohorns.

As shown in the example of FIG. 2A, the resistive change element S00$a$ may have a substantially circular horizontal cross-sectional shape. Alternatively, the resistive change element S00$a$ may have a non-circular horizontal cross-sectional shape, such as a substantially rectangular horizontal cross-sectional shape, a substantially oval horizontal cross-sectional shape, a substantially triangular horizontal cross-sectional shape, a substantially trapezoidal horizontal cross-sectional shape, an irregular horizontal cross-sectional shape, and a non-uniform horizontal cross-sectional shape where different sections of the resistive change element S00$a$ can have different dimensions. The bottom electrode 212$a$, the resistive change material 214$a$, and the top electrode 216$a$ have substantially circular horizontal cross-sectional shapes because the resistive change element S00$a$ has a substantially circular horizontal cross-sectional shape. It is noted that the resistive change element S00$a$ can be considered to have a substantially circular horizontal cross-sectional shape when the resistive change element S00$a$ has a horizontal cross-sectional shape that is exactly a circle and when the resistive change element S00$a$ has a horizontal cross-sectional shape that is not exactly a circle due to variations caused by the fabrication process. It is further noted that when the resistive change element S00$a$ has a non-uniform horizontal cross-sectional shape where different sections of the resistive change element S00$a$ can have different dimensions, the bottom electrode 212$a$, the resistive change material 214$a$, and the top electrode 216$a$ can have different shapes.

Referring to FIG. 2A, each resistive change element in the plurality of resistive change elements S00$b$-S$xyb$ located in section B has the same structure, and thus, the discussion below of resistive change element S00$b$ is applicable to each resistive change element in the plurality of resistive change elements S00$b$-S$xyb$ located in section B. Resistive change element S00$b$ includes a bottom electrode 212$b$, a resistive change material 214$b$, and a top electrode 216$b$. A nanotube fabric serves as the resistive change material 214$b$. The bottom electrode 212$b$ is in contact with the resistive change material 214$b$ and the top electrode 216$b$ is in contact with the resistive change material 214$b$. Alternatively, the resistive change element S00$b$ can include at least one intervening layer located between the bottom electrode 212$b$ and the resistive change material 214$b$, at least one intervening layer located between the resistive change material 214$b$ and the top electrode 216$b$, or at least one intervening layer located between the bottom electrode 212$b$ and the resistive change material 214$b$ and at least one intervening layer located between the resistive change material 214$b$ and the top electrode 216$b$. Alternatively, the bottom electrode 212$b$ can be omitted from the resistive change element S00$b$, the top electrode 216$b$ can be omitted from the resistive change element S00$b$, or the bottom electrode 212$b$ and the top electrode 216$b$ can be omitted from the resistive change element S00$b$. Alternatively, the resistive change material 214$b$ can comprise another resistive change material such as other carbon allotropes such as Buckyballs, graphene flakes, nanocapsules, and nanohorns.

As shown in the example of FIG. 2A, the resistive change element S00b may have a substantially circular horizontal cross-sectional shape. Alternatively, the resistive change element S00b may have a non-circular horizontal cross-sectional shape, such as a substantially rectangular horizontal cross-sectional shape, a substantially oval horizontal cross-sectional shape, a substantially triangular horizontal cross-sectional shape, a substantially trapezoidal horizontal cross-sectional shape, an irregular horizontal cross-sectional shape, and a non-uniform horizontal cross-sectional shape where different sections of the resistive change element S00b can have different dimensions. The bottom electrode 212b, the resistive change material 214b, and the top electrode 216b have substantially circular horizontal cross-sectional shapes because the resistive change element S00b has a substantially circular horizontal cross-sectional shape. It is noted that the resistive change element S00b can be considered to have a substantially circular horizontal cross-sectional shape when the resistive change element S00b has a horizontal cross-sectional shape that is exactly a circle and when the resistive change element S00b has a horizontal cross-sectional shape that is not exactly a circle due to variations caused by the fabrication process. It is further noted that when the resistive change element S00b has a non-uniform horizontal cross-sectional shape where different sections of the resistive change element S00b can have different dimensions, the bottom electrode 212b, the resistive change material 214b, and the top electrode 216b can have different shapes.

As shown in FIG. 2A, the word lines in the first plurality of word lines $W1(0)$-$W1(y)$ may be arranged generally along the X-axis and generally in parallel with respect to each other. The word lines in the second plurality of word lines $W2(0)$-$W2(y)$ may be arranged generally along the X-axis and generally in parallel with respect to each other. The bit lines in the plurality of bit lines $B1(0)$-$B1(x)$ may be arranged generally along the Y-axis and generally in parallel with respect to each other. As discussed above, each bit line in the plurality of bit lines $B1(0)$-$B1(x)$ has a segment located below the first plurality of word lines $W1(0)$-$W1(y)$ and a segment located above the second plurality of word lines $W2(0)$-$W2(y)$. The segments of the bit lines located below the first plurality of word lines $W1(0)$-$W1(y)$ may be generally orthogonal to the word lines in the first plurality of word lines $W1(0)$-$W1(y)$ and the segments of the bit lines located above the second plurality of word lines $W2(0)$-$W2(y)$ may be generally orthogonal to the word lines in the second plurality of word lines $W2(0)$-$W2(y)$. It is noted that the word lines in the first plurality of word lines $W1(0)$-$W1(y)$ are described as being generally in parallel with respect to each other, the word lines in the second plurality of word lines $W2(0)$-$W2(y)$ are described as being generally in parallel with respect to each other, and the bit lines in the plurality of bit lines $B1(0)$-$B1(x)$ are described as being generally in parallel with respect to each other to allow for variations from exactly parallel due to the fabrication process.

As shown in FIG. 2A, each resistive change element in the plurality of resistive change elements S00a-Sxya located in section A may be located where a word line in the first plurality of word lines $W1(0)$-$W1(y)$ crosses a bit line in the plurality of bit lines $B1(0)$-$B1(x)$. The top electrode of each resistive change element in the plurality of resistive change elements S00a-Sxya located in section A is in electrical communication with a word line in the first plurality of word lines $W1(0)$-$W1(y)$ and the bottom electrode of each resistive change element in the plurality of resistive change elements S00a-Sxya located in section A is in electrical communication with a bit line in the plurality of bit lines $B1(0)$-$B1(x)$. Neighboring resistive change elements in the plurality of resistive change elements S00a-Sxya located in section A are separated by a distance of approximately 1 F, however, neighboring resistive change elements are not limited to being separated by a distance of approximately 1 F and neighboring resistive change elements can be separated by a distance greater than approximately 1 F. Each resistive change element in the plurality of resistive change elements S00b-Sxyb located in section B may be located where a bit line in the plurality of bit lines $B1(0)$-$B1(x)$ crosses a word line in the second plurality of word lines $W2(0)$-$W2(y)$. The top electrode of each resistive change element in the plurality of resistive change elements S00b-Sxyb located in section B is in electrical communication with a bit line in the plurality of bit lines $B1(0)$-$B1(x)$ and the bottom electrode of each resistive change element in the plurality of resistive change elements S00b-Sxyb located in section B is in electrical communication with a word line in the second plurality of word lines $W2(0)$-$W2(y)$. Neighboring resistive change elements in the plurality of resistive change elements S00b-Sxyb located in section B are separated by a distance of approximately 1 F, however, neighboring resistive change elements are not limited to being separated by a distance of approximately 1 F and neighboring resistive change elements can be separated by a distance greater than approximately 1 F. It is noted that intervening interconnecting structures, such as plugs, filled vias, and studs, can be located between the resistive change elements in the plurality of resistive change elements S00a-Sxya located in section A and word lines in the first plurality of word lines $W1(0)$-$W1(y)$ and/or intervening interconnecting structures, such as plugs, filled vias, and studs, can be located between the resistive change elements in the plurality of resistive change elements S00a-Sxya located in section A and bit lines in the plurality of bit lines $B1(0)$-$B1(x)$. It is noted that intervening interconnecting structures, such as plugs, filled vias, and studs, can be located between the resistive change elements in the plurality of resistive change elements S00b-Sxyb located in section B and bit lines in the plurality of bit lines $B1(0)$-$B1(x)$ and/or intervening interconnecting structures, such as plugs, filled vias, and studs, can be located between the resistive change elements in the plurality of resistive change elements S00b-Sxyb located in section B and the second plurality of word lines $W2(0)$-$W2(y)$. It is further noted that intervening layers, such as barrier metal layers that provide a barrier to metal migration, can be included to provide a barrier to metal migration from the first plurality of word lines $W1(0)$-$W1(y)$, the second plurality of word lines $W2(0)$-$W2(y)$, and/or the plurality of bit lines $B1(0)$-$B1(x)$.

As shown in FIG. 2A, each electrical communication conductive structure in the plurality of electrical communication conductive structures 250, 252, 254 may have a substantially circular horizontal cross-sectional shape. Alternatively, each electrical communication conductive structure 250, 252, 254 may have a non-circular horizontal cross-sectional shape, such as a substantially rectangular horizontal cross-sectional shape, a substantially oval horizontal cross-sectional shape, a substantially triangular horizontal cross-sectional shape, a substantially trapezoidal horizontal cross-sectional shape, an irregular horizontal cross-sectional shape, and a non-uniform horizontal cross-sectional shape where different sections of each electrical communication conductive structure 250, 252, 254 can have different dimensions. It is noted that electrical communication conductive structures 250, 252, 254 in the plurality of electrical communication conductive structures 250, 252, 254 can be considered to have substantially circular horizontal cross-sectional shapes when electrical communication conductive structures have horizontal cross-sectional shapes that are exactly circles and when electrical communication conductive structures 250, 252, 254 have horizontal cross-sectional shapes that are not exactly circles due to variations caused by the fabrication process.

Each electrical communication conductive structure in the plurality of electrical communication conductive structures 250, 252, 254 may have a height approximately equal to the height of the resistive change element S00a, the height of the resistive change element S00b, or both the height of the resistive change element S00a and the height of the resistive change element S00b when the height of the resistive change element S00a and the height of the resistive change element S00b are the same height. For example, when each electrical communication conductive structure in the plurality of electrical communication conductive structures 250, 252, 254 has one section with a height approximately equal to the height of resistive change element S00b, each electrical communication conductive structure in the plurality of electrical communication conductive structures 250, 252, 254 has a height approximately equal to the height of resistive change element S00b. For example, when each electrical communication conductive structure in the plurality of electrical communication conductive structures 250, 252, 254 has multiple sections where the sum of the height of the multiple sections is approximately equal to the height of resistive change element S00b, each electrical communication conductive structure in the plurality of electrical communication conductive structures 250, 252, 254 has a height approximately equal to the height of resistive change element S00b.

However, each electrical communication conductive structure in the plurality of electrical communication conductive structures 250, 252, 254 is not limited to having a height approximately equal to the height of the resistive change element S00a, the height of the resistive change element S00b, or both the height of the resistive change element S00a and the height of the resistive change element S00b when the height of the resistive change element S00a and the height of the resistive change element S00b are the same height and that each electrical communication conductive structure in the plurality of electrical communication conductive structures 250, 252, 254 may have a height different from a height approximately equal to the height of the resistive change element S00a and a height approximately equal to the height of the resistive change element S00b. For example, when intervening interconnecting structures are located between the resistive change elements in the plurality of resistive change elements S00a-S$xya$ and word lines in the first plurality of word lines W1(0)-W1($y$), intervening interconnecting structures are located between the resistive change elements in the plurality of resistive change elements S00b-S$xyb$ and bit lines in the plurality of bit lines B1(0)-B1($x$), the intervening interconnecting structures have the same height, the plurality of resistive change elements S00a-S$xya$ and the plurality of resistive change elements S00b-S$xyb$ have the same height, and each electrical communication conductive structure in the plurality of electrical communication conductive structures 250, 252, 254 has one section with a height approximately equal to the sum of the height of an intervening interconnecting structure and the height of the resistive change element S00b, each electrical communication conductive structure in the plurality of electrical communication conductive structures 250, 252, 254 has a height approximately equal to the sum of the height of an intervening interconnecting structure and the height of the resistive change element S00b. For example, when intervening interconnecting structures are located between the resistive change elements in the plurality of resistive change elements S00a-S$xya$ and word lines in the first plurality of word lines W1(0)-W1($y$), intervening interconnecting structures are located between the resistive change elements in the plurality of resistive change elements S00b-S$xyb$ and bit lines in the plurality of bit lines B1(0)-B1($x$), the intervening interconnecting structures have the same height, the plurality of resistive change elements S00a-S$xya$ and the plurality of resistive change elements S00b-S$xyb$ have the same height, and each electrical communication conductive structure in the plurality of electrical communication conductive structures 250, 252, 254 has multiple sections where the sum of the height of the multiple sections is approximately equal to the sum of the height of an intervening interconnecting structure and the height of the resistive change element S00b, each electrical communication conductive structure in the plurality of electrical communication conductive structures 250, 252, 254 has a height approximately equal to the sum of the height of an intervening interconnecting structure and the height of the resistive change element S00b.

The resistive change elements in row 0 of the plurality of resistive change elements S00a-S$xya$ located in section A are separated from the plurality of electrical communication conductive structures 250, 252, 254 by a distance of approximately 1 F. However, the resistive change elements in row 0 of the plurality of resistive change elements S00a-S$xya$ located in section A are not limited to being separated from the plurality of electrical communication conductive structures 250, 252, 254 by a distance of approximately 1 F and the resistive change elements in row 0 of the plurality of resistive change elements S00a-S$xya$ located in section A can be separated from the plurality of electrical communication conductive structures 250, 252, 254 by a distance greater than approximately 1 F. The resistive change elements in row y of the plurality of resistive change elements S00b-S$xyb$ located in section B are separated from the plurality of electrical communication conductive structures 250, 252, 254 by a distance of approximately 1 F. However, the resistive change elements in row y of the plurality of resistive change elements S00b-S$xyb$ located in section B are not limited to being separated from the plurality of electrical communication conductive structures 250, 252, 254 by a distance of approximately 1 F and the resistive change elements in row y of the plurality of resistive change elements S00b-S$xyb$ located in section B can be separated from the plurality of electrical communication conductive structures 250, 252, 254 by a distance greater than approximately 1 F. Thus, the resistive change elements in row 0 of the plurality of resistive change elements S00a-S$xya$ located in section A are separated from the resistive change elements in row y of the plurality of resistive change elements S00b-S$xyb$ located in section B by a distance of approximately 3 F because a distance of approximately 1 F separates the resistive change elements in row 0 of the plurality of resistive change elements S00a-S$xya$ located in section A from the plurality of electrical communication conductive structures 250, 252, 254, the diameter of each electrical communication conductive structure 250, 252, 254 is at least approximately equal to the minimum feature size in a given dimension of 1 F, and a distance of approximately 1 F separates the plurality of electrical communication conductive structures 250, 252, 254 from the resistive change elements in row y of the plurality of resistive change elements S00b-Sxyb located in section B. Therefore, each combinational resistive change element in the plurality of combinational resistive change elements S00-Sxy includes two resistive change elements that are separated by approximately 3 F.

The regions around the plurality of resistive change elements S00a-Sxya located in section A, the plurality of resistive change elements S00b-Sxyb located in section B, the first plurality of word lines W1(0)-W1(y), the second plurality of word lines W2(0)-W2(y), the plurality of bit lines B1(0)-B1(x), and the plurality of electrical communication conductive structures 250, 252, 254 can be filled with a dielectric. Further, the plurality of resistive change elements S00a-Sxya located in section A and the plurality of resistive change elements S00b-Sxyb located in section B can be sealed by thin dielectric sidewall films, as described in U.S. Patent Application Publication No. 2018/0226578, prior to filling the regions around the plurality of resistive change elements S00a-Sxya located in section A and the plurality of resistive change elements S00b-Sxyb located in section B with a dielectric.

Storing information as relational states of a combinational resistive change element is discussed below. The discussion below of storing information as relational states of a combinational resistive change element is applicable to each combinational resistive change element of the plurality of combinational resistive change elements S00-Sxy in the combinational resistive change element array 200. Additionally, the discussion below of storing information as relational states of a combinational resistive change element is applicable to combinational resistive change elements of other configurations of the combinational resistive change element array 200 and combinational resistive change elements of other combinational resistive change element arrays, such as combinational resistive change element array 600. Further, the discussion below of storing information as relational states of a combinational resistive change element is applicable to combinations of resistive change elements that can store information as relational states.

A relational state of a combinational resistive change element corresponds with a specified combination of resistive states of resistive change elements of the combinational resistive change element. A relational state of a combinational resistive change element is non-volatile because resistive states of resistive change elements of the combinational resistive change element are non-volatile. For storing information in the form of binary numbers, relational states of a combinational resistive change element also correspond with binary numbers and in this way a combinational resistive change element can be used to store at least one bit of information. For storing information in forms other than binary numbers, relational states of a combinational resistive change element also correspond with characters, such as numbers, letters, symbols, and operators, of a character set and in this way a combinational resistive change element can be used to store information in forms other than binary numbers. It is noted that a circuit designer can specify combinations of resistive states of resistive change elements that correspond with relational states of a combinational resistive change element and the circuit designer can specify relational states of a combinational resistive change element that correspond with binary numbers or characters of a character set. It is also noted that each possible combination of resistive states of resistive change elements may not correspond with a relational state of a combinational resistive change element because some combinations of resistive states of resistive change elements cannot be easily identified and/or some combinations of resistive states of resistive change elements are not needed to store information. It is further noted that combinational resistive change elements adjustable (programmable) between more than two relational states are well suited for use in applications that use more than two states such as neural networks and artificial intelligence.

For example, a combinational resistive change element having a first resistive change element that can be adjusted between a low resistive state of 1MΩ and a high resistive state of 10 MΩ and a second resistive change element that can be adjusted between a low resistive state of 1 MΩ and a high resistive state of 10 MΩ is adjustable between four possible combinations of resistive states of the resistive change elements; a first combination where the first resistive change element has a low resistive state and the second resistive change element has a low resistive state, a second combination where the first resistive change element has a high resistive state and the second resistive change element has a low resistive state, a third combination where the first resistive change element has a low resistive state and the second resistive change element has a high resistive state, and a fourth combination where the first resistive change element has a high resistive state and the second resistive change element has a high resistive state. In the above example, when the combinational resistive change element is accessed in a manner such that the first resistive change element and the second resistive change element form a resistive divider, the first combination has a resistive ratio of ratio =1 MΩ/(1 MΩ+1 MΩ)=½, the second combination has a resistive ratio of ratio =1 MΩ/(10 MΩ+1 MΩ)=1/11, the third combination has a resistive ratio of ratio =10 MΩ/(1 MΩ+10 MΩ)=10/11, and the fourth combination has a resistive ratio of ratio =10 MΩ/(10 MΩ+10 MΩ)=½. Further, in the above example, when the combinational resistive change element is accessed in a manner such that the first resistive change element and the second resistive change element form a resistive divider, the first combination has a sum of resistances of the first resistive change element and the second resistive change element of Rsum=1 MΩ+1 MΩ=2 MΩ, the second combination has a sum of resistances of the first resistive change element and the second resistive change element of Rsum=10 MΩ+1 MΩ=11 MΩ, the third combination has a sum of resistances of the first resistive change element and the second resistive change element of Rsum=1 MΩ+10 MΩ=11 MΩ, and the fourth combination has a sum of resistances of the first resistive change element and the second resistive change element of Rsum=10 MΩ+1 MΩ=11 MΩ.

In the above example, when a relational state is determined based on a resistive ratio of a resistive divider, the second combination can correspond with a relational state, the third combination can correspond with a relational state, and one of the first combination and the fourth combination can correspond with a relational state. When a relational state is determined based on a resistive ratio of a resistive divider, a circuit designer typically would not specify the first combination to correspond with a relational state and the fourth combination to correspond with a relational state because the first combination and the fourth combination have the same resistive ratio. For storing information as binary numbers the circuit designer would specify one relational state corresponds with a 0 and one relational state corresponds with a 1 and in this way a combinational resistive change element can be used to store one bit of information. For storing information as characters of a set of three characters the circuit designer would specify one relational state corresponds with a first character, one relational state corresponds with a second character, and one relational state corresponds with a third character and in this way a combinational resistive change element can be used to store information in forms other than binary numbers.

In the above example, when a relational state is determined based on a resistive ratio of a resistive divider and a sum of resistances of the first resistive change element and the second resistive change element, the first combination can correspond with a relational state, the second combination can correspond with a relational state, the third combination can correspond with a relational state, and the fourth combination can correspond with a relational state. When a relational state is determined based on a resistive ratio of a resistive divider and a sum of resistances of the first resistive change element and the second resistive change element, a circuit designer can specify the first combination to correspond with a relational state and the fourth combination to correspond with a relational state because, although the first combination and the fourth combination have the same resistive ratio, the first combination and the fourth combination have different sums of resistances. For storing information as binary numbers using four relational states the circuit designer would specify one relational state corresponds with a 00, one relational state corresponds with a 01, one relational state corresponds with a 10, and one relational state corresponds with a 11 and in this way a combinational resistive change element can be used to store two bits of information. For storing information as characters of a set of four characters the circuit designer would specify one relational state corresponds with a first character, one relational state corresponds with a second character, one relational state corresponds with a third character, and one relational state corresponds with a fourth character and in this way a combinational resistive change element can be used to store information in forms other than binary numbers.

For example, a combinational resistive change element having a first resistive change element that can be adjusted between a low resistive state of 1 M$\Omega$, an intermediate resistive state of 5 M$\Omega$, and a high resistive state of 10 M$\Omega$ and a second resistive change element that can be adjusted between a low resistive state of 1 M$\Omega$, an intermediate resistive state of 5 M$\Omega$, and a high resistive state of 10 M$\Omega$ is adjustable between nine possible combinations of resistive states of the resistive change elements; a first combination where the first resistive change element has a low resistive state and the second resistive change element has a low resistive state, a second combination where the first resistive change element has an intermediate resistive state and the second resistive change element has a low resistive state, a third combination where the first resistive change element has a high resistive state and the second resistive change element has a low resistive state, a fourth combination where the first resistive change element has a low resistive state and the second resistive change element has an intermediate resistive state, a fifth combination where the first resistive change element has an intermediate resistive state and the second resistive change element has an intermediate resistive state, a sixth combination where the first resistive change element has a high resistive state and the second resistive change element has an intermediate resistive state, a seventh combination where the first resistive change element has a low resistive state and the second resistive change element has a high resistive state, an eighth combination where the first resistive change element has an intermediate resistive state and the second resistive change element has a high resistive state, and a ninth combination where the first resistive change element has a high resistive state and the second resistive change element has a high resistive state. In the above example, when the combinational resistive change element is accessed in a manner such that the first resistive change element and the second resistive change element form a resistive divider, the first combination has a resistive ratio of ratio=1 M$\Omega$/(1 M$\Omega$+1 M$\Omega$)=½, the second combination has a resistive ratio of ratio=1 M$\Omega$/(5 M$\Omega$+1 M$\Omega$)=⅙, the third combination has a resistive ratio of ratio=1 M$\Omega$/(10 M$\Omega$+1 M$\Omega$)=1/11, the fourth combination has a resistive ratio of ratio=5 M$\Omega$/(1 M$\Omega$+5 M$\Omega$)=⅚, the fifth combination has a resistive ratio of ratio=5 M$\Omega$/(5 M$\Omega$+5 M$\Omega$)=½, the sixth combination has a resistive ratio of ratio=5 M$\Omega$/(1 M$\Omega$+10 M$\Omega$+5 M$\Omega$)=⅓, the seventh combination has a resistive ratio of ratio=10 M$\Omega$/(1 M$\Omega$+10 M$\Omega$)=10/11, the eighth combination has a resistive ratio of ratio=10 M$\Omega$/(5 M$\Omega$+10 M$\Omega$)=⅔, and the ninth combination has a resistive ratio of ratio=10 M$\Omega$/(10 M$\Omega$+10 M$\Omega$)=½. Further, in the above example, when the combinational resistive change element is accessed in a manner such that the first resistive change element and the second resistive change element form a resistive divider, the first combination has a sum of resistances of the first resistive change element and the second resistive change element of Rsum=1 M$\Omega$+1 M$\Omega$=2 M$\Omega$, the second combination has a sum of resistances of the first resistive change element and the second resistive change element of Rsum=5 M$\Omega$+1 M$\Omega$=6 M$\Omega$, the third combination has a sum of resistances of the first resistive change element and the second resistive change element of Rsum=10 M$\Omega$+1 M$\Omega$=11 M$\Omega$, the fourth combination has a sum of resistances of the first resistive change element and the second resistive change element of Rsum=1 M$\Omega$+5 M$\Omega$=6 M$\Omega$, the fifth combination has a sum of resistances of the first resistive change element and the second resistive change element of Rsum=5 M$\Omega$+5 M$\Omega$=10 M$\Omega$, the sixth combination has a sum of resistances of the first resistive change element and the second resistive change element of Rsum=10 M$\Omega$+5 M$\Omega$=15 M$\Omega$, the seventh combination has a sum of resistances of the first resistive change element and the second resistive change element of Rsum=1 M$\Omega$+10 M$\Omega$=11 M$\Omega$, the eighth combination has a sum of resistances of the first resistive change element and the second resistive change element of Rsum=5 M$\Omega$+10 M$\Omega$=15 M$\Omega$, and the ninth combination has a sum of resistances of the first resistive change element and the second resistive change element of Rsum=10 M$\Omega$+10 M$\Omega$=20 M$\Omega$.

In the above example, when a relational state is determined based on a resistive ratio of a resistive divider, the second combination can correspond with a relational state, the third combination can correspond with a relational state, the fourth combination can correspond with a relational state, the sixth combination can correspond with a relational state, the seventh combination can correspond with a relational state, the eighth combination can correspond with a relational state, and one of the first combination, the fifth combination, and the ninth combination can correspond with a relational state. When a relational state is determined based on a resistive ratio of a resistive divider, a circuit designer typically would not specify the first combination to correspond with a relational state, the fifth combination to correspond with a relational state, and the ninth combination to correspond with a relational state because the first combination, the fifth combination, and the ninth combination have the same resistive ratio. For storing information as binary numbers using four relational states the circuit designer would specify one relational state corresponds with a 00, one relational state corresponds with a 01, one relational state corresponds with a 10, and one relational state corresponds with a 11 and in this way a combinational resistive change element can be used to store two bits of information. For storing information as characters of a set of seven characters the circuit designer would specify one relational state corresponds with a first character, one relational state corresponds with a second character, one relational state corresponds with a third character, one relational state corresponds with a fourth character, one relational state corresponds with a fifth character, one relational state corresponds with a sixth character, and one relational state corresponds with a seventh character and in this way a combinational resistive change element can be used to store information in forms other than binary numbers.

In the above example, when a relational state is determined based on a resistive ratio of a resistive divider and a sum of resistances of the first resistive change element and the second resistive change element, the first combination can correspond with a relational state, the second combination can correspond with a relational state, the third combination can correspond with a relational state, the fourth combination can correspond with a relational state, the fifth combination can correspond with a relational state, the sixth combination can correspond with a relational state, the seventh combination can correspond with a relational state, the eighth combination can correspond with a relational state, and the ninth combination can correspond with a relational state. When a relational state is determined based on a resistive ratio of a resistive divider and a sum of resistances of the first resistive change element and the second resistive change element, a circuit designer can specify the first combination to correspond with a relational state, the fifth combination to correspond with a relational state, and the ninth combination to correspond with a relational state because, although the first combination, the fifth combination, and the ninth combination have the same resistive ratio, the first combination, the fifth combination, and the ninth combination have different sums of resistances. For storing information as binary numbers using eight relational states the circuit designer would specify one relational state corresponds with a 000, one relational state corresponds with a 001, one relational state corresponds with a 010, one relational state corresponds with a 011, one relational state corresponds with a 100, one relational state corresponds with a 101, one relational state corresponds with a 110, one relational state corresponds with a 111 and in this way a combinational resistive change element can be used to store three bits of information. For storing information as characters of a set of nine characters the circuit designer would specify one relational state corresponds with a first character, one relational state corresponds with a second character, one relational state corresponds with a third character, one relational state corresponds with a fourth character, one relational state corresponds with a fifth character, one relational state corresponds with a sixth character, one relational state corresponds with a seventh character, one relational state corresponds with a eighth character, one relational state corresponds with a ninth character and in this way a combinational resistive change element can be used to store information in forms other than binary numbers.

In some instances, the number of bits of information that can be stored by a combinational resistive change element having two resistive change elements is greater than the total number of bits of information that can be separately stored by two resistive change elements. The maximum number of bits of information that can be stored by a combinational resistive change element having two resistive change elements can be approximated by the following equation Maximum Number of Bits=$\text{Log}_2$(Number of Possible Combinations of Resistive States) with the maximum number of bits being rounded down to the closest integer. For example, the maximum number of bits that can be stored by a combinational resistive change element having two resistive change elements adjustable between six resistive states and the combinational resistive change element adjustable between thirty six combinations of resistive states can be approximated by $\text{Log}_2(36)$=5.17 rounded down to 5 bits. For example, the total number of bits that can be separately stored by two resistive change elements adjustable between six resistive states is four bits with each resistive change element separately storing two bits. Further, when a relational state of a combinational resistive change element having two resistive change elements is determined based on a resistive ratio of a resistive divider, the maximum number of bits of information that can be stored by the combinational resistive change element can be approximated by the following equation Maximum Number of Bits=$\text{Log}_2$(Number of Possible Combinations of Resistive States with Different Resistive Ratios) with the maximum number of bits being rounded down to the closest integer. For example, when a relational state of a combinational resistive change element having two resistive change elements adjustable between seven resistive states and the combinational resistive change element adjustable between at least thirty two possible combinations of resistive states with different resistive ratios is determined based on a resistive ratio of a resistive divider, the maximum number of bits that can be stored by the combinational resistive change element can be approximated by $\text{Log}_2(32)$=5 bits. For example, the total number of bits that can be separately stored by two resistive change elements adjustable between seven resistive states is four bits with each resistive change element separately storing two bits.

Referring to the plurality of combinational resistive change elements S00-S$xy$ of the combinational resistive change element array 200, each combinational resistive change element in the plurality of combinational resistive change elements S00-S$xy$ has a similar structure, and thus, the discussion below of the combinational resistive change element S00 is applicable to each combinational resistive change element in the plurality of combinational resistive change elements S00-S$xy$. As discussed above, the combinational resistive change element S00 includes the resistive change element S00$a$, the resistive change element S00$b$, and the conductive structure C00. The resistive change element S00$a$ can be adjusted (programmed) between two non-volatile resistive states, a low resistive state (also referred to as a SET state), for example a resistance on the order of 1 MΩ, and a high resistive state (also referred to as a RESET state), for example a resistance on the order of 10 MΩ. The resistive change element S00$b$ can be adjusted (programmed) between two non-volatile resistive states, a low resistive state (also referred to as a SET state), for example a resistance on the order of 1 MΩ, and a high resistive state (also referred to as a RESET state), for example a resistance on the order of 10 MΩ. Thus, the combinational resistive change element S00 can be adjusted between four possible combinations of resistive states of the resistive change element S00$a$ and the resistive change element S00$b$; a first combination where the resistive change element S00a has a low resistive state and the resistive change element S00b has a low resistive state, a second combination where the resistive change element S00a has a high resistive state and the resistive change element S00b has a low resistive state, a third combination where the resistive change element S00a has a low resistive state and the resistive change element S00b has a high resistive state, and a fourth combination where the resistive change element S00a has a high resistive state and the resistive change element S00b has a high resistive state. Alternatively, the resistive change element S00a can be adjusted (programmed) between more than two non-volatile resistive states where each non-volatile resistive state corresponds with a different resistance value, the resistive change element S00b can be adjusted (programmed) between more than two non-volatile resistive states where each non-volatile resistive state corresponds with a different resistance value, and the combinational resistive change element S00 can be adjusted between more than four possible combinations of resistive states of the resistive change element S00a and the resistive change element S00b.

A low relational state of the combinational resistive change element S00 is specified to correspond with the second combination where the resistive change element S00a has a high resistive state and the resistive change element S00b has a low resistive state. A high relational state of the combinational resistive change element S00 is specified to correspond with the third combination where the resistive change element S00a has a low resistive state and the resistive change element S00b has a high resistive state. The low relational state and the high relational state are non-volatile because the resistive states of the resistive change elements S00a and the resistive states of the resistive change elements S00b are non-volatile. Thus, the combinational resistive change element S00 can be adjusted between two non-volatile relational states, a low relational state and a high relational state, that each correspond with a specified combination of resistive states of the resistive change element S00a and the resistive change element S00b. For storing information in the form of binary numbers, the low relational state of the combinational resistive change element S00 also corresponds with a 0 and the high relational state of the combinational resistive change element S00 also corresponds with a 1 and in this way the combinational resistive change element S00 can store one bit of information. It is noted that although the combinational resistive change element S00 is discussed as being adjusted between two non-volatile relational states, a low relational state and a high relational state, the combinational resistive change element S00 can be adjusted between a number of non-volatile relational states up to a number of non-volatile relational states equal to a number of possible combinations of resistive states of the resistive change element S00a and the resistive change element S00b.

When the resistive change element S00a is adjusted (programmed) between resistive states in a bidirectional manner, the resistive change element S00a is adjusted to the low resistive state (also referred to as a SET state) by an electrical stimulus that causes current flow from the bottom electrode 212a to the top electrode 216a and is adjusted to the high resistive state (also referred to as a RESET state) by an electrical stimulus that causes current flow from the top electrode 216a to the bottom electrode 212a. As similarly discussed above with respect to when the resistive change element 100 is adjusted (programmed) between resistive states in a bidirectional manner, the resistive change element S00a is adjusted to the low resistive state by applying a bidirectional SET electrical stimulus to the resistive change element S00a and is adjusted to the high resistive state by applying a bidirectional RESET electrical stimulus to the resistive change element S00a. When the resistive change element S00b is adjusted (programmed) between resistive states in a bidirectional manner, the resistive change element S00b is adjusted to the low resistive state (also referred to as a SET state) by an electrical stimulus that causes current flow from the bottom electrode 212b to the top electrode 216b and is adjusted to the high resistive state (also referred to as a RESET state) by an electrical stimulus that causes current flow from the top electrode 216b to the bottom electrode 212b. As similarly discussed above with respect to when the resistive change element 100 is adjusted (programmed) between resistive states in a bidirectional manner, the resistive change element S00b is adjusted to the low resistive state by applying a bidirectional SET electrical stimulus to the resistive change element S00b and is adjusted to the high resistive state by applying a bidirectional RESET electrical stimulus to the resistive change element S00b.

Figure 2B:
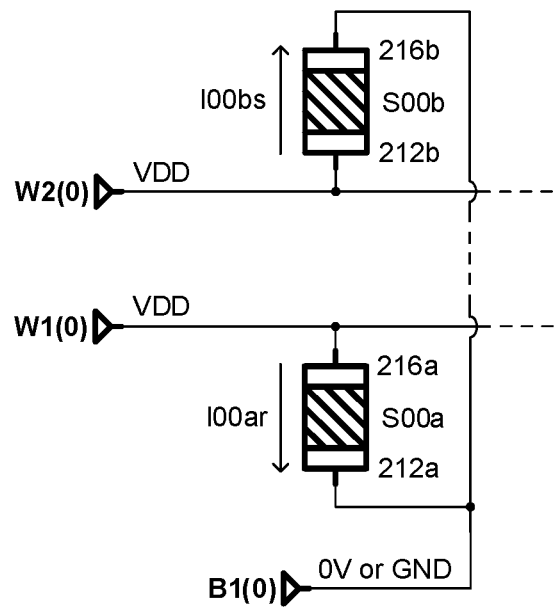
FIG. 2B illustrates a simplified schematic diagram showing current flow, ignoring leakage currents, through a combinational resistive change element S00 from the combinational resistive change element array of FIG. 2A when applying an electrical stimulus to adjust a relational state of the combinational resistive change element S00 to a low relational state.

Referring now to FIG. 2B, a simplified schematic diagram showing current flow, ignoring leakage currents, through the combinational resistive change element S00 when applying a bidirectional RESET electrical stimulus to the resistive change element S00a and a bidirectional SET electrical stimulus to the resistive change element S00b is illustrated. As discussed above, the combinational resistive change element S00 has a low relational state that corresponds with the second combination of resistive states, where the resistive change element S00a has a high resistive state and the resistive change element S00b has a low resistive state. Thus, the combinational resistive change element S00 is adjusted (programmed) to the low relational state by applying a bidirectional RESET electrical stimulus to the resistive change element S00a to adjust a resistive state of the resistive change element S00a to a high resistive state and a bidirectional SET electrical stimulus to the resistive change element S00b to adjust a resistive state of the resistive change element S00b to a low resistive state. It is noted that the other combinational resistive change elements in the combinational resistive change element array 200 are not shown in the simplified schematic diagram so that current flow can be shown with greater clarity.

FIG. 2B shows the bidirectional RESET electrical stimulus being applied to the resistive change element S00a and the bidirectional SET electrical stimulus being applied to the resistive change element S00b at the same time by driving the word line W1(0) to a system voltage VDD, the word line W2(0) to the system voltage VDD, and the bit line B1(0) to 0 volts or ground. FIG. 2B also shows a current I00ar flowing from the top electrode 216a to the bottom electrode 212a of the resistive change element S00a and a current I00bs flowing from the bottom electrode 212b to the top electrode 216b of the resistive change element S00b. Alternatively, the bidirectional RESET electrical stimulus can be applied to the resistive change element S00a and the bidirectional SET electrical stimulus can be applied to the resistive change element S00b one after the other, for example, by driving the word line W1(0) to the system voltage VDD, the word line W2(0) to 0 volts or ground, and the bit line B1(0) to 0 volts or ground and then driving the word line W1(0) to 0 volts or ground, the word line W2(0) to the system voltage VDD, and the bit line B1(0) to 0 volts or ground. It is noted that the word line W1(0), the word line W2(0), and the bit line B1(0) can be driven to the desired voltages by the driver circuits discussed below with respect to FIGS. 3C-3G or other driver circuits. It is also noted that the system voltage VDD is a design variable selected by a circuit designer. It is further noted that although the word line W1(0), the word line W2(0), and the bit line B1(0) are discussed above as being driven to 0 volts or ground for applying a bidirectional SET electrical stimulus and a bidirectional RESET electrical stimulus, the word line W1(0), the word line W2(0), and the bit line B1(0) are not limited to being driven to 0 volts or ground and that the circuit designer can select other voltage levels, such as a voltage level less than 0 volts and a voltage level greater than 0 volts.

For example, when the system voltage VDD is 2.7 volts, a bidirectional RESET electrical stimulus is a pulse with a voltage of 2.7 volts and a pulse width of 1 µs, and a bidirectional SET electrical stimulus is a pulse with a voltage of 2.7 volts and a pulse width of 1 µs, the bidirectional RESET electrical stimulus is applied to the resistive change element S00a and the bidirectional SET electrical stimulus is applied to the resistive change element S00b at the same time by driving the word line W1(0) to a system voltage VDD, the word line W2(0) to the system voltage VDD, and the bit line B1(0) to 0 volts or ground. For example, when the system voltage VDD is 2.7 volts, a bidirectional RESET electrical stimulus is a pulse with voltage of 2.7 volts and a pulse width of 1 µs, and a bidirectional SET electrical stimulus is a pulse with voltage of 2.7 volts and a pulse width of 1 µs, the bidirectional RESET electrical stimulus is applied to the resistive change element S00a and the bidirectional SET electrical stimulus is applied to the resistive change element S00b one after the other by driving the word line W1(0) to the system voltage VDD, the word line W2(0) to 0 volts or ground, and the bit line B1(0) to 0 volts or ground to apply the bidirectional RESET electrical stimulus to the resistive change element S00a, and then driving the word line W1(0) to 0 volts or ground, the word line W2(0) to the system voltage VDD, and the bit line B1(0) to 0 volts or ground to apply the bidirectional SET electrical stimulus to the resistive change element S00b. Of course, the disclosure is not limited to these exemplary values.

Figure 2C:
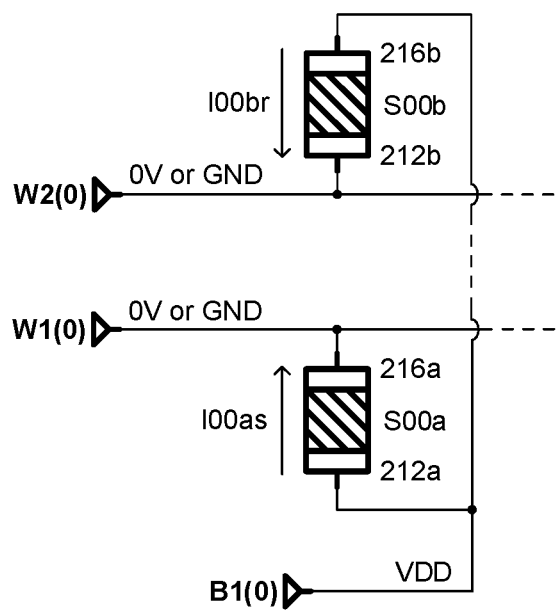
FIG. 2C illustrates a simplified schematic diagram showing current flow, ignoring leakage currents, through a combinational resistive change element S00 from the combinational resistive change element array of FIG. 2A when applying an electrical stimulus to adjust a relational state of the combinational resistive change element S00 to a high relational state.

Referring now to FIG. 2C, a simplified schematic diagram showing current flow, ignoring leakage currents, through the combinational resistive change element S00 when applying a bidirectional SET electrical stimulus to the resistive change element S00a and a bidirectional RESET electrical stimulus to the resistive change element S00b is illustrated. As discussed above, the combinational resistive change element S00 has a high relational state that corresponds with the third combination of resistive states, where the resistive change element S00a has a low resistive state and the resistive change element S00b has a high resistive state. Thus, the combinational resistive change element S00 is adjusted (programmed) to the high relational state by applying a bidirectional SET electrical stimulus to the resistive change element S00a to adjust a resistive state of the resistive change element S00a to a low resistive state and a bidirectional RESET electrical stimulus to the resistive change element S00b to adjust a resistive state of the resistive change element S00b to a high resistive state. It is noted that the other combinational resistive change elements in the combinational resistive change element array 200 are not shown in the simplified schematic diagram so that current flow can be shown with greater clarity.

FIG. 2C shows the bidirectional SET electrical stimulus being applied to the resistive change element S00a and the bidirectional RESET electrical stimulus being applied to the resistive change element S00b at the same time by driving the word line W1(0) to 0 volts or ground, the word line W2(0) to 0 volts or ground, and the bit line B1(0) to the system voltage VDD. FIG. 2C also shows a current I00as flowing from the bottom electrode 212a to the top electrode 216a of the resistive change element S00a and a current I00br flowing from the top electrode 216b to the bottom electrode 212b of the resistive change element S00b. Alternatively, the bidirectional SET electrical stimulus can be applied to the resistive change element S00a and the bidirectional RESET electrical stimulus can be applied to the resistive change element S00b one after the other, for example, by driving the word line W1(0) to 0 volts or ground, the word line W2(0) to the system voltage VDD, and the bit line B1(0) to the system voltage VDD and then driving the word line W1(0) to the system voltage VDD, the word line W2(0) to 0 volts or ground, and the bit line B1(0) to the system voltage VDD. It is noted that the word line W1(0), the word line W2(0), and the bit line B1(0) can be driven to the desired voltages by the driver circuits discussed below with respect to FIGS. 3C-3G or other driver circuits. It is also noted that the system voltage VDD is a design variable selected by a circuit designer. It is further noted that although the word line W1(0), the word line W2(0), and the bit line B1(0) are discussed above as being driven to 0 volts or ground for applying a bidirectional SET electrical stimulus and a bidirectional RESET electrical stimulus, the word line W1(0), the word line W2(0), and the bit line B1(0) are not limited to being driven to 0 volts or ground and that the circuit designer can select other voltage levels, such as a voltage level less than 0 volts and a voltage level greater than 0 volts.

For example, when the system voltage VDD is 2.7 volts, a bidirectional SET electrical stimulus is a pulse with a voltage of 2.7 volts and a pulse width of 1 µs, and a bidirectional RESET electrical stimulus is a pulse with a voltage of 2.7 volts and a pulse width of 1 µs, the bidirectional SET electrical stimulus is applied to the resistive change element S00a and the bidirectional RESET electrical stimulus is applied to the resistive change element S00b at the same time by driving the word line W1(0) to 0 volts or ground, the word line W2(0) to 0 volts or ground, and the bit line B1(0) to the system voltage VDD. For example, when the system voltage VDD is 2.7 volts, a bidirectional SET electrical stimulus is a pulse with a voltage of 2.7 volts and a pulse width of 1 µs, and a bidirectional RESET electrical stimulus is a pulse with a voltage of 2.7 volts and a pulse width of 1 µs, the bidirectional SET electrical stimulus is applied to the resistive change element S00a and the bidirectional RESET electrical stimulus is applied to the resistive change element S00b one after the other by driving the word line W1(0) to 0 volts or ground, the word line W2(0) to the system voltage VDD, and the bit line B1(0) to the system voltage VDD to apply the bidirectional SET electrical stimulus to the resistive change element S00a, and then driving the word line W1(0) to the system voltage VDD, the word line W2(0) to 0 volts or ground, and the bit line B1(0) to the system voltage VDD to apply the bidirectional RESET electrical stimulus to the resistive change element S00b. Of course, the disclosure is not limited to these exemplary values.

Figures 2D, 2E:
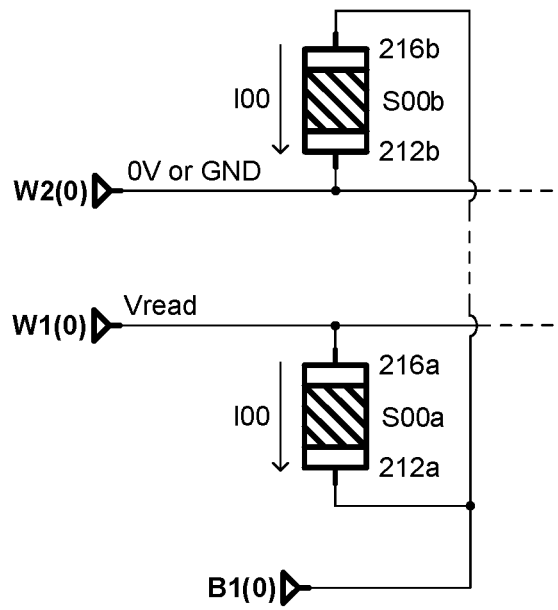
FIG. 2D illustrates a simplified schematic diagram showing current flow, ignoring leakage currents, through a combinational resistive change element S00 from the combinational resistive change element array of FIG. 2A when applying an electrical stimulus to the combinational resistive change element S00 such that a resistive change element S00a and a resistive change element S00b form a resistive divider.
FIG. 2E is a table listing exemplary values for a combinational resistive change element S00 from the combinational resistive change element array of FIG. 2A.

Referring now to FIG. 2D, a simplified schematic diagram showing current flow, ignoring leakage currents, through the combinational resistive change element S00 when applying an electrical stimulus to the combinational resistive change element S00 such that the resistive change element S00a and the resistive change element S00b form a resistive divider is illustrated. FIG. 2D shows an electrical stimulus being applied to the combinational resistive change element S00 such that the resistive change element S00a and the resistive change element S00b form a resistive divider by driving the word line W1(0) to a read voltage Vread and the word line W2(0) to 0 volts or ground. FIG. 2D also shows a current I00 flowing from the top electrode 216a to the bottom electrode 212a of the resistive change element S00a and the current I00 flowing from the top electrode 216b to the bottom electrode 212b of the resistive change element S00b. The other combinational resistive change elements in the combinational resistive change element array 200 are not shown in the simplified schematic diagram so that current flow can be shown with greater clarity. It is noted that the word line W1(0) and the word line W2(0) can be driven to the desired voltages by the driver circuits discussed below with respect to FIGS. 3C-3G or other driver circuits. It is also noted that although the read voltage Vread is discussed as having a voltage of 1 volt, the read voltage Vread is not limited to having a voltage level of 1 volt and that a circuit designer can select other voltage levels for the read voltage Vread, such as a voltage level greater than 1 volt and a voltage level less than 1 volt. It is further noted that although the word line W2(0) is discussed above as being driven to 0 volts or ground for applying an electrical stimulus to the combinational resistive change element S00 such that the resistive change element S00a and the resistive change element S00b form a resistive divider, the word line W2(0) is not limited to being driven to 0 volts or ground and that the circuit designer can select other voltage levels, such as a voltage level less than 0 volts and a voltage level greater than 0 volts.

For example, when the read voltage Vread is 1.2 volts and an electrical stimulus applied to the combinational resistive change element S00 such that the resistive change element S00a and the resistive change element S00b form a resistive divider is a pulse with a voltage of 1.2 volts and a pulse width of 3 µs, the electrical stimulus is applied to the combinational resistive change element S00 by driving the word line W1(0) to the read voltage Vread and the word line W2(0) to 0 volts or ground. Of course, the disclosure is not limited to these exemplary values. It is noted that, in the above example, the pulse width of the electrical stimulus can be adjusted based on the parasitics in the combinational resistive change element array.

When an electrical stimulus is applied to the combinational resistive change element S00 such that the resistive change element S00a and the resistive change element S00b form a resistive divider as shown in FIG. 2D, a resistive ratio of the resistive divider can be approximated by the following equation resistive ratio=(RS00b/(RS00a+RS00b)), where RS00a is the resistance of the resistive change element S00a and RS00b is the resistance of the resistive change element S00b. The resistive change element S00a is a top resistive change element in the resistive divider and the resistive change element S00b is a bottom resistive change element in the resistive divider because the electrical stimulus is applied to the combinational resistive change element S00 by driving the word line W1(0) to the read voltage Vread and the word line W2(0) to 0 volts or ground. It is noted that when an electrical stimulus is applied to the combinational resistive change element S00 such that the resistive change element S00a and the resistive change element S00b form a resistive divider by driving the word line W1(0) to 0 volts or ground and the word line W2(0) to a read voltage Vread, the resistive change element S00a is a bottom resistive change element in the resistive divider and the resistive change element S00b is a top resistive change element in the resistive divider.

Additionally, when an electrical stimulus is applied to the combinational resistive change element such that the resistive change element S00a and the resistive change element S00b form a resistive divider as shown in FIG. 2D, a voltage VB1(0) on the bit line B1(0), ignoring leakage currents, can be approximated using the resistive ratio of the resistive divider formed by the resistive change element S00a and the resistive change element S00b and the read voltage Vread as VB1(0)=Vread (RS00b/(RS00a+RS00b)). As shown by this equation, the voltage VB1(0) on the bit line B1(0) changes when the resistance of resistive change element S00a and/or the resistance of resistive change element S00b changes because the read voltage Vread is generally constant.

Further, when an electrical stimulus is applied to the combinational resistive change element S00 such that the resistive change element S00a and the resistive change element S00b form a resistive divider as shown in FIG. 2D, the same amount of current, ignoring leakage currents, flows through the resistive change element S00a and the resistive change element S00b. Also, when an electrical stimulus is applied to the combinational resistive change element S00 such that the resistive change element S00a and the resistive change element S00b form a resistive divider as shown in FIG. 2D, the resistance RS00 of the combinational resistive change element S00 can be approximated as RS00=RS00a+RS00b, where RS00a is the resistance of the resistive change element S00a and RS00b is the resistance of the resistive change element S00b. Thus, the amount of the current I00, ignoring leakage currents, can be approximated using Ohm's Law as I00=Vread/RS00, where RS00 is the resistance of the combinational resistive change element S00.

For example, when the combinational resistive change element S00 has a low relational state, the resistive change element S00a has a high resistive state of 10 MΩ, the resistive change element S00b has a low resistive state of 1 MΩ, the word line W1(0) is driven to a read voltage Vread of 1 volt, and the word line W2(0) is driven to 0 volts or ground, a resistive ratio of a resistive divider formed by the resistive change element S00a and the resistive change element S00b can be approximated as resistive ratio=(RS00b/(RS00a+RS00b))=(1 MΩ/(10 MΩ+1 MΩ))=1/11, a voltage VB1(0) on the bit line B1(0) can be approximated as VB1(0)=1V(1 MΩ/(10 MΩ+1 MΩ))=1/11V, and an amount of the current I00, ignoring leakage currents, can be approximated using Ohm's Law as I00=1 V/11 MΩ=1/11 µA.

For example, when the combinational resistive change element S00 has a high relational state, the resistive change element S00a has a low resistive state of 1 MΩ, the resistive change element S00b has a high resistive state of 10 MΩ, the word line W1(0) is driven to a read voltage Vread of 1 volt, and the word line W2(0) is driven to 0 volts or ground, a resistive ratio of a resistive divider formed by the resistive change element S00a and the resistive change element S00b can be approximated as resistive ratio=(RS00b/(RS00a+RS00b))=(10 MΩ/(1 MΩ+10 MΩ))=10/11, a voltage VB1(0) on the bit line B1(0) can be approximated as VB1(0)=1V(10 MΩ/(1 MΩ+10 MΩ))=10/11V, and an amount of the current I00, ignoring leakage currents, can be approximated using Ohm's Law as I00=1 V/11 MΩ=1/11 µA.

Referring now to FIG. 2E, a table listing exemplary values for the combinational resistive change element S00 is illustrated. The table lists a relational state of the combinational resistive change element S00 in a first column, a resistive state and an exemplary resistance of the resistive change element S00a that correspond with a relational state in a second column, a resistive state and an exemplary resistance of the resistive change element S00b that correspond with a relational state in a third column, an approximate resistive ratio of a resistive divider that corresponds with a relational state in a fourth column where the resistive divider is formed by the resistive change element S00$a$ as a top resistive change element and the resistive change element S00$b$ as a bottom resistive change element, and a binary number that corresponds with a relational state in a fifth column. The first row of the table lists exemplary values for when the combinational resistive change element S00 has a low relational state and the second row of the table lists exemplary values for when the combinational resistive change element S00 has a high relational state.

Combinational resistive change elements can have substantial tolerance to variations in environment conditions, such as temperature, because, although resistances of individual resistive change elements can change due to environment conditions, the resistive ratios of the combinational resistive change elements remain generally constant. For example, when a combinational resistive change element has a low relational state with a first resistive change element having a resistance of 10 M$\Omega$, a second resistive change element having a resistance of 1 M$\Omega$, and resistive ratio of ratio=1 M$\Omega$/(10 M$\Omega$+1 M$\Omega$)=0.0909 is exposed to environment conditions that cause the resistance of the first resistive change element to increase by 10% to 11 M$\Omega$ and the resistance of the second resistive change element to increase by 10% to 1.1 M$\Omega$, the resistive ratio of the combinational resistive change element remains constant at ratio=1.1 M$\Omega$/(11 M$\Omega$+1.1 M$\Omega$)=0.0909. For example, when a combinational resistive change element has a low relational state with a first resistive change element having a resistance of 10 M$\Omega$, a second resistive change element having a resistance of 1 M$\Omega$, and resistive ratio of ratio=1 M$\Omega$/(10 M$\Omega$+1 M$\Omega$)=0.0909 is exposed to environment conditions that cause the resistance of the first resistive change element to decrease by 10% to 9 M$\Omega$ and the resistance of the second resistive change element to decrease by 10% to 0.9 M$\Omega$, the resistive ratio of the combinational resistive change element remains constant at ratio=0.9 M$\Omega$/(9 M$\Omega$+0.9 M$\Omega$)=0.0909.

Figure 3A:
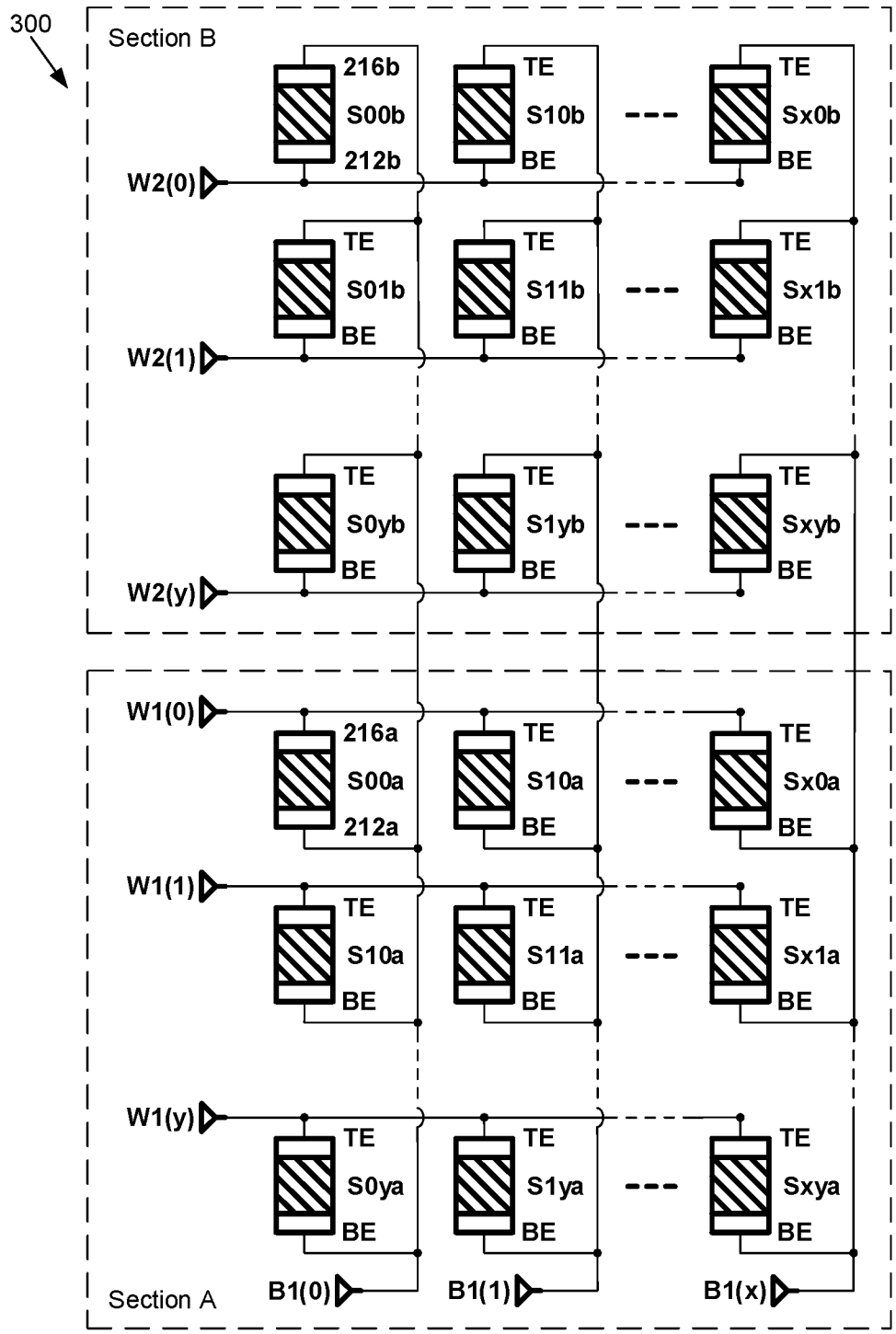
FIG. 3A illustrates a simplified schematic diagram of the combinational resistive change element array of FIG. 2A.

Referring now to FIG. 3A, a simplified schematic diagram of the exemplary combinational resistive change element array of FIG. 2A is illustrated as exemplary combinational resistive change element array 300. The top electrodes TE and the bottom electrodes BE of the resistive change elements in the plurality of resistive change elements S00$a$-S$xy$$a$ located in section A other than the top electrode 216$a$ and the bottom electrode 212$a$ of the resistive change element S00$a$ are labeled in the simplified schematic diagram of FIG. 3A using the reference characters TE and BE. The top electrodes TE and the bottom electrodes BE of the resistive change elements in the plurality of resistive change elements S00$b$-S$xy$$b$ located in section B other than the top electrode 216$b$ and the bottom electrode 212$b$ of the resistive change element S00$b$ are labeled in the simplified schematic diagram of FIG. 3A using the reference characters TE and BE. Additionally, the simplified schematic of FIG. 3A shows the resistive change material located between the top electrode TE and the bottom electrode BE for each resistive change element. Further, the plurality of electrical communication conductive structures 250, 252, 254 are shown in the simplified schematic diagram of FIG. 3A as being incorporated into the plurality of bit lines B1(0)-B1($x$).

Figure 3B:
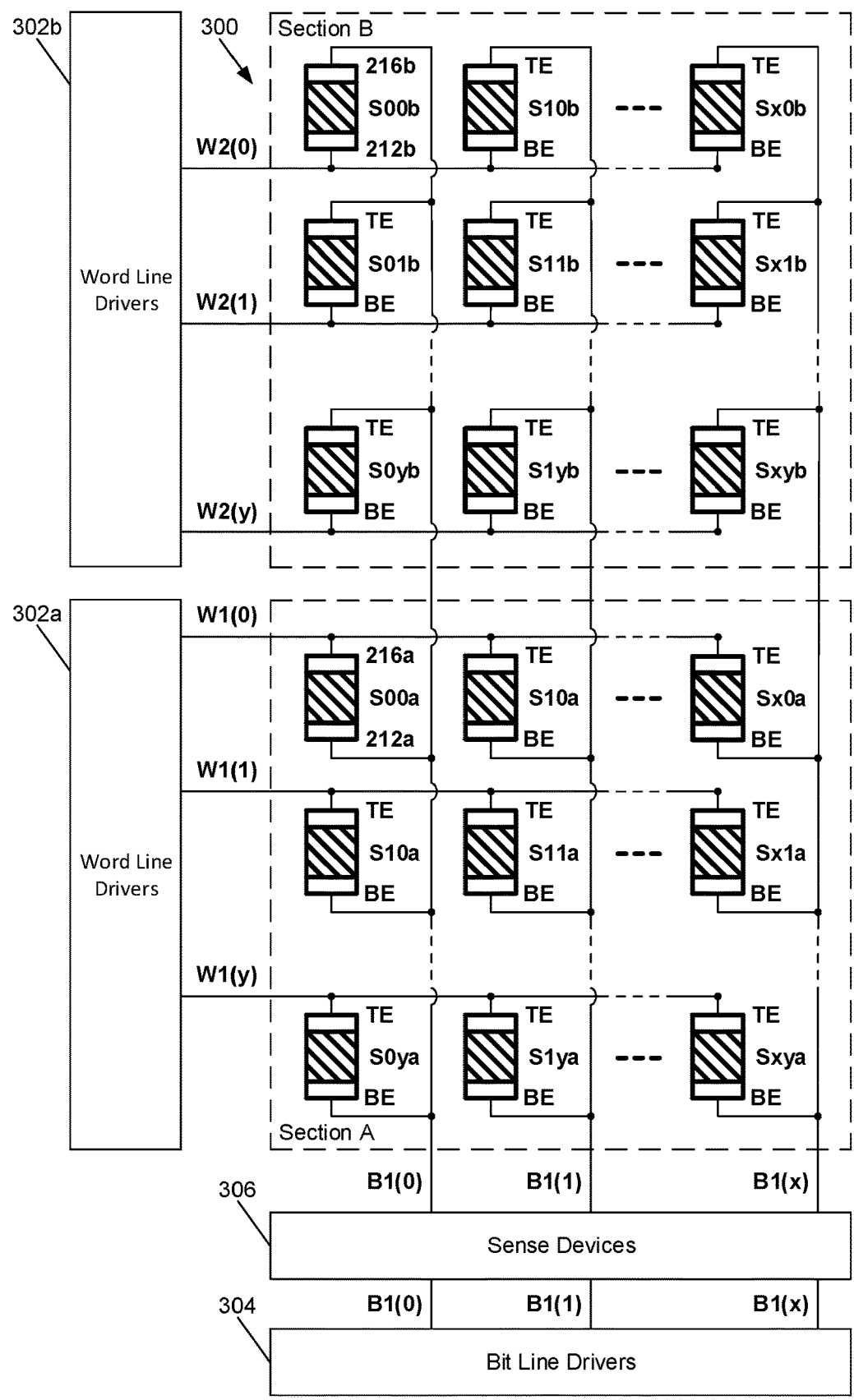
FIG. 3B illustrates a simplified schematic diagram of an exemplary architecture for programming and accessing at least one combinational resistive change element in a combinational resistive change element array having two sections.

Referring now to FIG. 3B, an exemplary architecture for programming and accessing at least one combinational resistive change element in the combinational resistive change element array 300 is illustrated in a simplified schematic diagram. The exemplary architecture includes the combinational resistive change element array 300, a first plurality of word line driver circuits 302$a$ in electrical communication with the first plurality of word lines W1(0)-W1($x$), a second plurality of word line driver circuits 302$b$ in electrical communication with the second plurality of word lines W2(0)-W2($x$), a plurality of bit line driver circuits 304 in electrical communication with the plurality of bit lines B1(0)-B1($x$), and a plurality of sense devices 306 in electrical communication with the plurality of bit lines B1(0)-B1($x$). Exemplary driver circuits for the first plurality of word line driver circuits 302$a$, the second plurality of word lines driver circuits 302$b$, and the plurality of bit line driver circuits 304 are discussed below with respect to FIGS. 3C-3G. However, driver circuits for the first plurality of word line driver circuits 302$a$, the second plurality of word lines driver circuits 302$b$, and the plurality of bit line driver circuits 304 are not limited to the exemplary driver circuits discussed below with respect to FIGS. 3C-3G and the driver circuits for the first plurality of word line driver circuits 302$a$, the second plurality of word lines driver circuits 302$b$, and the plurality of bit line driver circuits 304 can be other driver circuits. The plurality of sense devices 306 can be components that generate an output voltage based on at least one input voltage, such as sense amplifiers, differential amplifiers, inverters, and analog to digital converters. Alternatively, the plurality of sense devices 306 can be omitted from the exemplary architecture and the plurality of bit lines B1(0)-B1($x$) can be in electrical communication with a logic circuit or a control circuit such as a processor, a controller, and a microcontroller.

PROGRAMMING operations, READ operations, SET VERIFY operations, and RESET VERIFY operations of individual combinational resistive change elements in the combinational resistive change element array 300 can be performed by driving voltages on the first plurality of word lines W1(0)-W1($y$), the second plurality of word lines W2(0)-W2($y$), and the plurality of bit lines B1(0)-B1($x$) as required for PROGRAMMING operations, READ operations, SET VERIFY operations, and RESET VERIFY operations of individual combinational resistive change elements. Additionally, PROGRAMMING operations, READ operations, SET VERIFY operations, and RESET VERIFY operations of combinational resistive change elements having resistive change elements in electrical communication with the same word line in the first plurality of word lines W1(0)-W1($y$) and resistive change elements in electrical communication with the same word line in the second plurality of word lines W2(0)-W2($y$) can be performed at the same time by driving voltages on the first plurality of word lines W1(0)-W1($y$), the second plurality of word lines W2(0)-W2($y$), and the plurality of bit lines B1(0)-B1($x$) as required for performing PROGRAMMING operations, READ operations, SET VERIFY operations, and RESET VERIFY operations of the combinational resistive change elements at the same time.

Figure 3C:
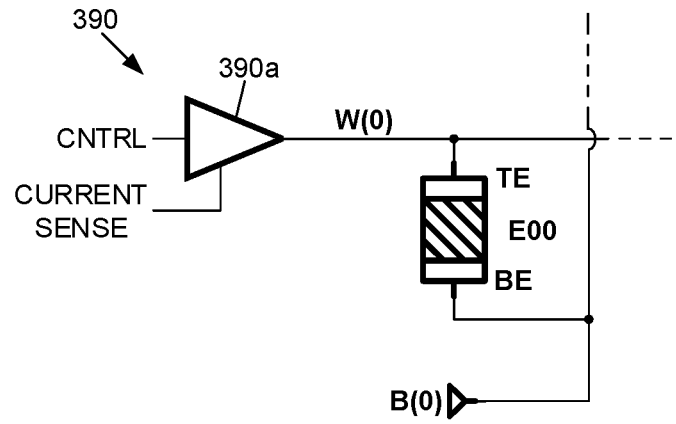
FIG. 3C illustrates a simplified schematic diagram of an exemplary first driver circuit that can be used for driving a word line or a bit line of a resistive change element array.

FIG. 3C shows a simplified schematic diagram of an exemplary first driver circuit 390 in electrical communication with a word line W(0) of a resistive change element array represented by the word line W(0), a bit line B(0), and a resistive change element E00 having a top electrode TE in electrical communication with the word line W(0), a bottom electrode BE in electrical communication with the bit line B(0), and a resistive change material between the top electrode TE and the bottom electrode BE. The first driver circuit 390 includes a programmable voltage source 390$a$ responsive to a control signal CNTRL supplied by a control circuit such as a processor, a controller, and a microcontroller. The control signal CNTRL can be based on a software algorithm executed by the control circuit. The programmable voltage source 390a also provides a feedback signal CURRENT SENSE indicating the current the programmable voltage source 390a is supplying during operation. The first driver circuit 390 can also include additional components not shown in FIG. 3C, such a resistor for limiting current flow from the programmable voltage source 390a. It is noted that although the first driver circuit 390 is shown in FIG. 3C in electrical communication with the word line W(0), the first driver circuit 390 can be in electrical communication with the word line W(0) or the bit line B(0) and that the first driver circuit 390 can be used for driving a word line or a bit line of a resistive change element array.

Figure 3D:
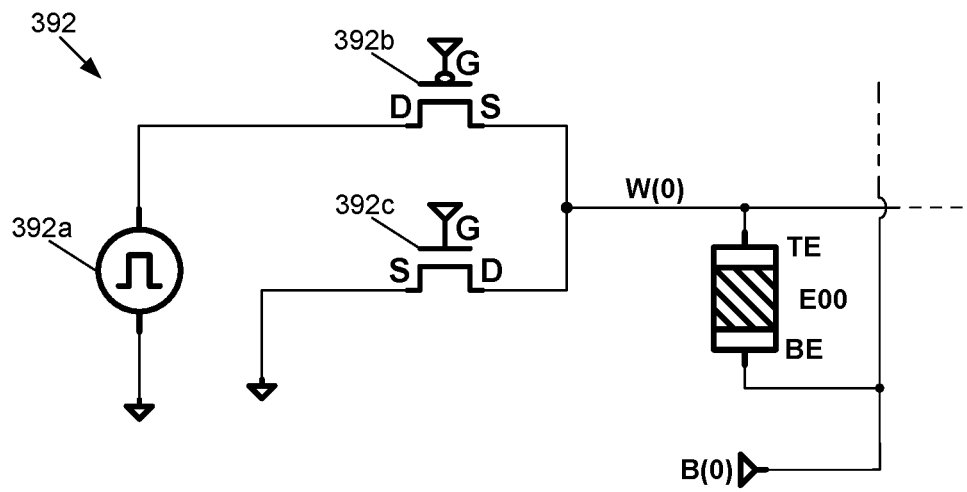
FIG. 3D illustrates a simplified schematic diagram of an exemplary second driver circuit that can be used for driving a word line or a bit line of a resistive change element array.

FIG. 3D shows a simplified schematic diagram of an exemplary second driver circuit 392 in electrical communication with a word line W(0) of a resistive change element array represented by the word line W(0), a bit line B(0), and a resistive change element E00 having a top electrode TE in electrical communication with the word line W(0), a bottom electrode BE in electrical communication with the bit line B(0), and a resistive change material between the top electrode TE and the bottom electrode BE. The second driver circuit 392 includes a pulse generator 392a, a p-channel metal oxide semiconductor field effect transistor 392b, also referred to as a PMOS transistor, having a drain terminal, a gate terminal, and a source terminal, and a n-channel metal oxide semiconductor field effect transistor 392c, also referred to as a NMOS transistor, having a drain terminal, a gate terminal, and a source terminal. It is noted that although the second driver circuit 392 is shown in FIG. 3D in electrical communication with to the word line W(0), the second driver circuit 392 can be in electrical communication with the word line W(0) or the bit line B(0) and that the second driver circuit 392 can be used for driving a word line or a bit line of a resistive change element array. It is also noted that depending on voltage levels being used, an NMOS transistor can be included in place of the PMOS transistor 392b and/or a PMOS transistor can be included in place of the NMOS transistor 392c. It is further noted that second driver circuit 392 can include other types of field effect transistors, such as carbon nanotube field effect transistors (CNTFETs), SiGe FETs, fully-depleted silicon-on-insulator FETs, or multiple gate field effect transistors such as FinFETs, in place of the PMOS transistor 392b and/or the NMOS transistor 392c.

The pulse generator 392a is in electrical communication with the drain terminal of the PMOS transistor 392b and the source terminal of the PMOS transistor 392b is in electrical communication with the word line W(0). The gate terminal of the PMOS transistor 392b is in electrical communication with a circuit, such as a control circuit, a decoder, a buffer, or a latch, that supplies a signal for controlling current flow through the PMOS transistor 392b. The drain terminal of the NMOS transistor 392c is in electrical communication with the word line W(0), the gate terminal of the NMOS transistor 392c is in electrical communication with a circuit, such as a control circuit, a decoder, a buffer, or a latch, that supplies a signal for controlling current flow through the NMOS transistor 392c, and the source terminal of the NMOS transistor 392c is in electrical communication with a power supply, a voltage source, a driver circuit or other device that supplies ground or 0 volts. The second driver circuit 392 can also include additional components not shown in FIG. 3D, such a resistor for limiting current flow from the pulse generator 392a. Additionally, when a plurality of second driver circuits are included in a circuit or an architecture, each second driver circuit in the plurality of second driver circuits is not required to include a pulse generator but rather multiple second driver circuits can include the same pulse generator by providing an electrical communication path between a drain terminal of a PMOS transistor of each second driver circuit in the multiple second driver circuits and the same pulse generator or all second driver circuits can include the same pulse generator by providing an electrical communication path between a drain terminal of a PMOS transistor of each second driver circuit in all second driver circuits and the same pulse generator.

Figure 3E:
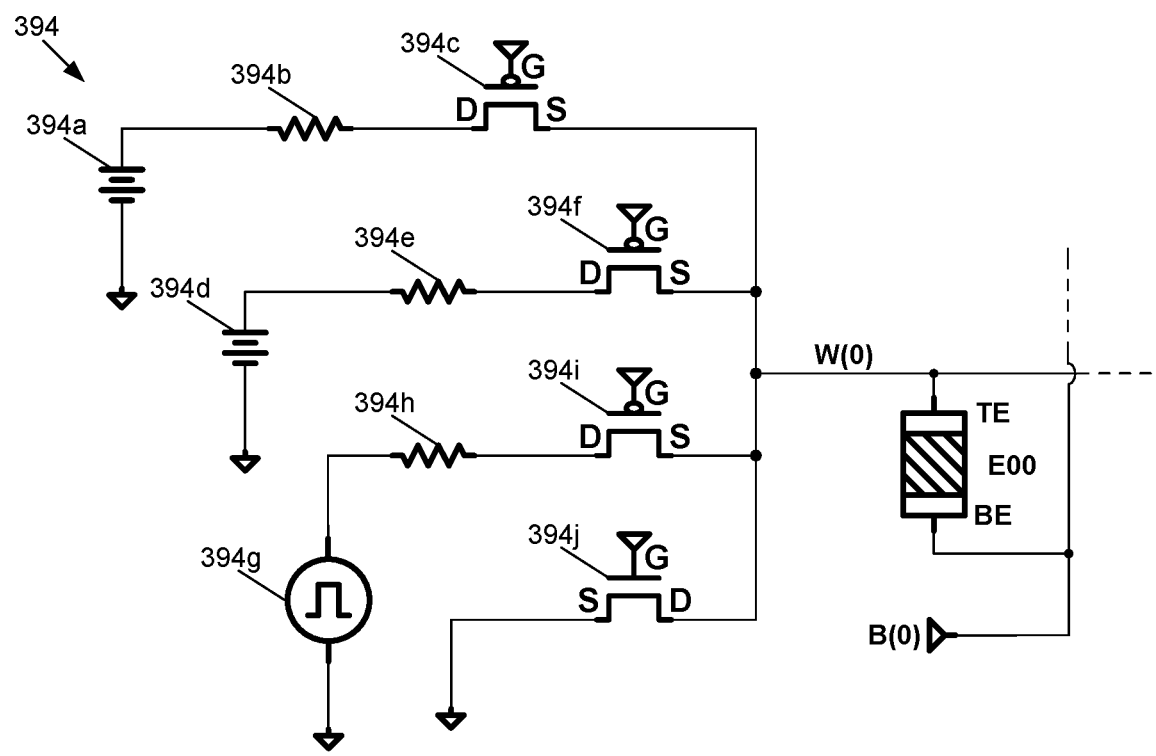
FIG. 3E illustrates a simplified schematic diagram of an exemplary third driver circuit that can be used for driving a word line or a bit line of a resistive change element array.

FIG. 3E shows a simplified schematic diagram of an exemplary third driver circuit 394 in electrical communication with a word line W(0) of a resistive change element array represented by the word line W(0), a bit line B(0), and a resistive change element E00 having a top electrode TE in electrical communication with the word line W(0), a bottom electrode BE in electrical communication with the bit line B(0), and a resistive change material between the top electrode TE and the bottom electrode BE. The third driver circuit 394 includes a first fixed voltage power supply 394a, a first resistor 394b having a first terminal and a second terminal, a first PMOS transistor 394c having a drain terminal, a gate terminal, and a source terminal, a second fixed voltage power supply 394d, a second resistor 394e having a first terminal and a second terminal, a second PMOS transistor 394f having a drain terminal, a gate terminal, and a source terminal, a pulse generator 394g, a third resistor 394h having a first terminal and a second terminal, a third PMOS transistor 394i having a drain terminal, a gate terminal, and a source terminal, and a NMOS transistor 394j having a drain terminal, a gate terminal, and a source terminal. It is noted that although the third driver circuit 394 is shown in FIG. 3E in electrical communication with the word line W(0), the third driver circuit 394 can be in electrical communication with the word line W(0) or the bit line B(0) and that the third driver circuit 394 can be used for driving a word line or a bit line of a resistive change element array. It is also noted that depending on voltage levels being used, a NMOS transistor can be included in place of the first PMOS transistor 394c, a NMOS transistor can be included in place of the second PMOS transistor 394f, a NMOS transistor can be included in place of the third PMOS transistor 394i, and/or a PMOS transistor can be included in place of the NMOS transistor 394j. It is further noted that third driver circuit 394 can include other types of field effect transistors, such as carbon nanotube field effect transistors (CNTFETs), SiGe FETs, fully-depleted silicon-on-insulator FETs, or multiple gate field effect transistors such as FinFETs, in place of the first PMOS transistor 394c, the second PMOS transistor 394f, the third PMOS transistor 394i, and/or the NMOS transistor 394j.

The first fixed voltage power supply 394a is in electrical communication with the first terminal of the first resistor 394b, the second terminal of the first resistor 394b is in electrical communication with the drain terminal of the first PMOS transistor 394c, and the source terminal of the first PMOS transistor 394c is in electrical communication with to the word line W(0). The gate terminal of the first PMOS transistor 394c is in electrical communication with a circuit, such as a control circuit, a decoder, a buffer, or a latch, that supplies a signal for controlling current flow through the first PMOS transistor 394c. The second fixed voltage power supply 394d is in electrical communication with the first terminal of the second resistor 394e, the second terminal of the second resistor 394e is in electrical communication with the drain terminal of the second PMOS transistor 394f, and the source terminal of the second PMOS transistor 394f is in electrical communication with to the word line W(0). The gate terminal of the second PMOS transistor 394f is in electrical communication with a circuit, such as a control circuit, a decoder, a buffer, or a latch, that supplies a signal for controlling current flow through the second PMOS transistor 394f. The pulse generator 394g is in electrical communication with the first terminal of the third resistor 394h, the second terminal of the third resistor 394h is in electrical communication with the drain terminal of the third PMOS transistor 394i, and the source terminal of the third PMOS transistor 394i is in electrical communication with the word line W(0). The gate terminal of the third PMOS transistor 394i is in electrical communication with a circuit, such as a control circuit, a decoder, a buffer, or a latch, that supplies a signal for controlling current flow through the third PMOS transistor 394i. The drain terminal of the NMOS transistor 394j is in electrical communication with the word line W(0), the gate terminal of the NMOS transistor 394j is in electrical communication with a circuit, such as a control circuit, a decoder, a buffer, or a latch, that supplies a signal for controlling current flow through the NMOS transistor 394j, and the source terminal of the NMOS transistor 394j is in electrical communication with a power supply, a voltage source, a driver circuit or other device that supplies ground or 0 volts. It is noted that the first resistor 394b is used for limiting current flow from the first fixed voltage power supply 394a, the second resistor 394e is used for limiting current flow from the second fixed voltage power supply 394d, and the third resistor 394h is used for limiting current flow from the pulse generator 394g. It is also noted that the third driver circuit 394 can also include additional components not shown in FIG. 3E and can omit components shown in FIG. 3E such as the first resistor 394b, the second resistor 394e, and/or the third resistor 394h.

Additionally, when a plurality of third driver circuits are included in a circuit or an architecture, each third driver circuit in the plurality of third driver circuits is not required to include a first fixed voltage power supply and a first resistor for limiting current flow from the first fixed voltage power supply, a second fixed voltage power supply and a second resistor for limiting current flow from the second fixed voltage power supply, and a pulse generator and a third resistor for limiting current flow from the pulse generator. Instead, multiple third driver circuits can include the same first fixed voltage power supply and the same first resistor, the same second fixed voltage power supply and the same second resistor, and the same pulse generator and the same third resistor by providing an electrical communication path between a drain terminal of a PMOS transistor of each third driver circuit in the multiple third driver circuits and the same first resistor, providing an electrical communication path between a drain terminal of a PMOS transistor of each third driver circuit in the multiple third driver circuits and the same second resistor, and providing an electrical communication path between a drain terminal of a PMOS transistor of each third driver circuit in the multiple third driver circuits and the same third resistor. Alternatively, all third driver circuits can be in electrical communication with the same first fixed voltage power supply and the same first resistor, the same second fixed voltage power supply and the same second resistor, and the same pulse generator and the same third resistor by providing an electrical communication path between a drain terminal of a PMOS transistor of each third driver circuit in all third driver circuits and the same first resistor, providing an electrical communication path between a drain terminal of a PMOS transistor of each third driver circuit in all third driver circuits and the same second resistor, and providing an electrical communication path between a drain terminal of a PMOS transistor of each third driver circuit in all third driver circuits and the same third resistor.

Figure 3F:
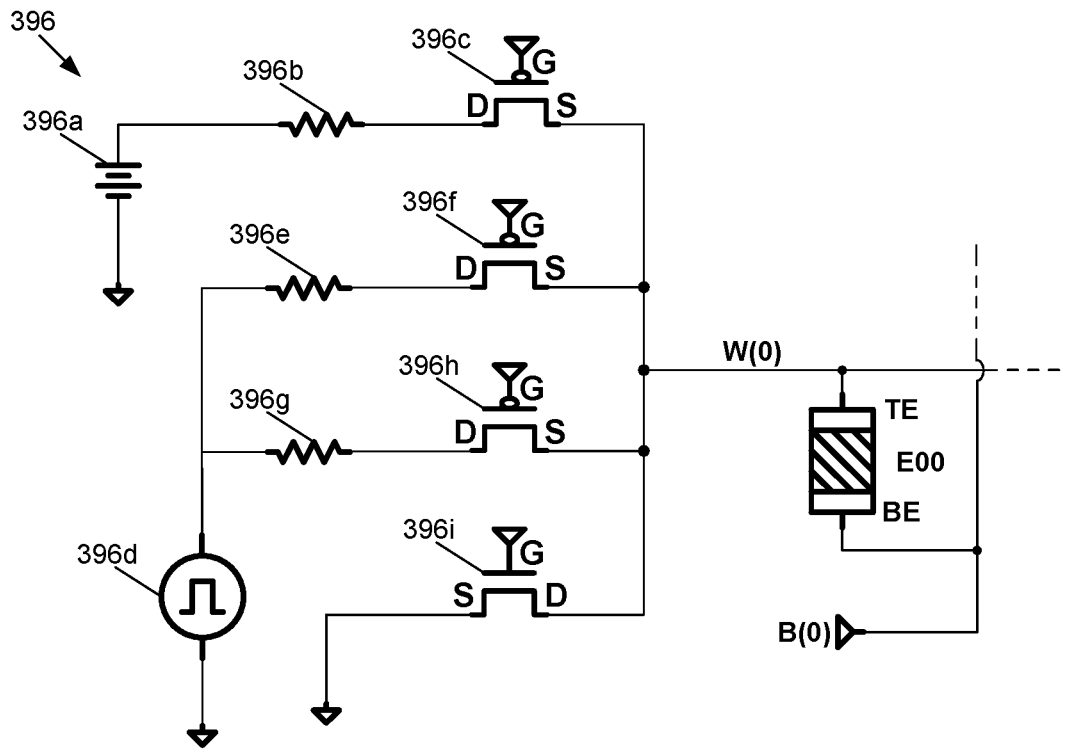
FIG. 3F illustrates a simplified schematic diagram of an exemplary fourth driver circuit that can be used for driving a word line or a bit line of a resistive change element array.

FIG. 3F shows a simplified schematic diagram of an exemplary fourth driver circuit 396 in electrical communication with a word line W(0) of a resistive change element array represented by the word line W(0), a bit line B(0), and a resistive change element E00 having a top electrode TE in electrical communication with the word line W(0), a bottom electrode BE in electrical communication with the bit line B(0), and a resistive change material between the top electrode TE and the bottom electrode BE. The fourth driver circuit 396 includes a fixed voltage power supply 396a, a first resistor 396b having a first terminal and a second terminal, a first PMOS transistor 396c having a drain terminal, a gate terminal, and a source terminal, a pulse generator 396d, a second resistor 396e having a first terminal and a second terminal, a second PMOS transistor 396f, having a drain terminal, a gate terminal, and a source terminal, a third resistor 396g having a first terminal and a second terminal, a third PMOS transistor 396h having a drain terminal, a gate terminal, and a source terminal, and a NMOS transistor 396i having a drain terminal, a gate terminal, and a source terminal. It is noted that although the fourth driver circuit 396 is shown in FIG. 3F in electrical communication with the word line W(0), the fourth driver circuit 396 can be in electrical communication with the word line W(0) or the bit line B(0) and that the fourth driver circuit 396 can be used for driving a word line or a bit line of a resistive change element array. It is also noted that depending on voltage levels being used, an NMOS transistor can be included in place of the first PMOS transistor 396c, an NMOS transistor can be included in place of the second PMOS transistor 396f, a NMOS transistor can be included in place of the third PMOS transistor 396h, and/or a PMOS transistor can be included in place of the NMOS transistor 396i. It is further noted that fourth driver circuit 396 can include other types of field effect transistors, such as carbon nanotube field effect transistors (CNTFETs), SiGe FETs, fully-depleted silicon-on-insulator FETs, or multiple gate field effect transistors such as FinFETs, in place of the first PMOS transistor 396c, the second PMOS transistor 396f, the third PMOS transistor 396h, and/or the NMOS transistor 396i.

The fixed voltage power supply 396a is in electrical communication with the first terminal of the first resistor 396b, the second terminal of the first resistor 396b is in electrical communication with the drain terminal of the first PMOS transistor 396c, and the source terminal of the first PMOS transistor 396c is in electrical communication with the word line W(0). The gate terminal of the first PMOS transistor 396c is in electrical communication with a circuit, such as a control circuit, a decoder, a buffer, or a latch, that supplies a signal for controlling current flow through the first PMOS transistor 396c. The pulse generator 396d is in electrical communication with the first terminal of the second resistor 396e and the first terminal of the third resistor 396g. The second terminal of the second resistor 396e is in electrical communication the drain terminal of the second PMOS transistor 396f and the source terminal of the second PMOS transistor 396f is in electrical communication with the word line W(0). The gate terminal of the second PMOS transistor 396f is in electrical communication with a circuit, such as a control circuit, a decoder, a buffer, or a latch, that supplies a signal for controlling current flow through the second PMOS transistor 396f. The second terminal of the third resistor 396g is in electrical communication with the drain terminal of the third PMOS transistor 396h and the source terminal of the third PMOS transistor 396h is in electrical communication with the word line W(0). The gate terminal of the third PMOS transistor 396h is in electrical communication with a circuit, such as a control circuit, a decoder, a buffer, or a latch, that supplies a signal for controlling current flow through the third PMOS transistor 396h. The drain terminal of the NMOS transistor 396i is in electrical communication with the word line W(0), the gate terminal of the NMOS transistor 396i is in electrical communication with a circuit, such as a control circuit, a decoder, a buffer, or a latch, that supplies a signal for controlling current flow through the NMOS transistor 396i, and the source terminal of the NMOS transistor 396i is in electrical communication with a power supply, a voltage source, a driver circuit or other device that supplies ground or 0 volts. It is noted that the first resistor 396b is used for limiting current flow from the fixed voltage power supply 396a, the second resistor 396e is used for limiting current flow from the pulse generator 396d, and the third resistor 396g is used for limiting current flow from the pulse generator 396d. It is also noted that the second resistor 396e and the third resistor 396g have different resistances. It is further noted that the fourth driver circuit 396 can also include additional components not shown in FIG. 3F and can omit components shown in FIG. 3F such as the first resistor 396b, the second resistor 396e, and/or the third resistor 396g.

Additionally, when a plurality of fourth driver circuits are included in a circuit or an architecture, each fourth driver circuit in the plurality of fourth driver circuits is not required to include a fixed voltage power supply and a first resistor for limiting current flow from the fixed voltage power supply and a pulse generator and a second resistor for limiting current flow from the pulse generator and a third resistor for limiting current flow from the pulse generator. Instead, multiple fourth driver circuits can include the same fixed voltage power supply and the same first resistor and the same pulse generator and the same second resistor and the same third resistor by providing an electrical communication path between a drain terminal of a PMOS transistor of each fourth driver circuit in the multiple fourth driver circuits and the same first resistor, providing an electrical communication path between a drain terminal of a PMOS transistor of each fourth driver circuit in the multiple fourth driver circuits and the same second resistor, and providing an electrical communication path between a drain terminal of a PMOS transistor of each fourth driver circuit in the multiple fourth driver circuits and the same third resistor. Alternatively, all fourth driver circuits can be in electrical communication with the same fixed voltage power supply and the same first resistor and the same pulse generator and the same second resistor and the same third resistor by providing an electrical communication path between a drain terminal of a PMOS transistor of each fourth driver circuit in all fourth driver circuits and the same first resistor, providing an electrical communication path between a drain terminal of a PMOS transistor of each fourth driver circuit in all fourth driver circuits and the same second resistor, and providing an electrical communication path between a drain terminal of a PMOS transistor of each fourth driver circuit in all fourth driver circuits and the same third resistor.

Figure 3G:
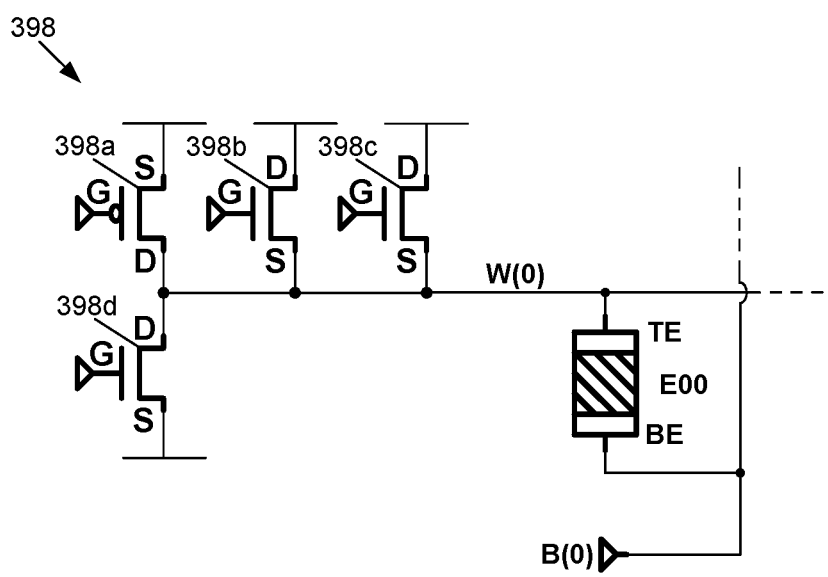
FIG. 3G illustrates a simplified schematic diagram of an exemplary fifth driver circuit that can be used for driving a word line or a bit line of a resistive change element array.

FIG. 3G shows a simplified schematic diagram of an exemplary fifth driver circuit 398 in electrical communication with a word line W(0) of a resistive change element array represented by the word line W(0), a bit line B(0), and a resistive change element E00 having a top electrode TE in electrical communication with the word line W(0), a bottom electrode BE in electrical communication with the bit line B(0), and a resistive change material between the top electrode TE and the bottom electrode BE. The fifth driver circuit 398 includes a PMOS transistor 398a having a drain terminal, a gate terminal, and a source terminal, a first NMOS transistor 398b having a drain terminal, a gate terminal, and a source terminal, a second NMOS transistor 398c having a drain terminal, a gate terminal, and a source terminal, and a third NMOS transistor 398d having a drain terminal, a gate terminal, and a source terminal. It is noted that although the fifth driver circuit 398 is shown in FIG. 3G in electrical communication with the word line W(0), the fifth driver circuit 398 can be in electrical communication with the word line W(0) or the bit line B(0) and that the fifth driver circuit 398 can be used for driving a word line or a bit line of a resistive change element array. It is also noted that depending on voltage levels being used, an NMOS transistor can be included in place of the PMOS transistor 398a, a PMOS transistor can be included in place of the first NMOS transistor 398b, a PMOS transistor can be included in place of the second NMOS transistor 398c, and/or a PMOS transistor can be included in place of the third NMOS transistor 398d. It is further noted that fifth driver circuit 398 can include other types of field effect transistors, such as carbon nanotube field effect transistors (CNTFETs), SiGe FETs, fully-depleted silicon-on-insulator FETs, or multiple gate field effect transistors such as FinFETs, in place of the PMOS transistor 398a, the first NMOS transistor 398b, the second NMOS transistor 398c, and/or the third NMOS transistor 398d.

The drain terminal of the PMOS transistor 398a is in electrical communication with the word line W(0), the gate terminal of the PMOS transistor 398a is in electrical communication with a circuit, such as a control circuit, a decoder, a buffer, or a latch, that supplies a signal for controlling current flow through the PMOS transistor 398a, and the source terminal of the PMOS transistor 398a is in electrical communication with a power supply, a voltage source, a driver circuit, or other device that supplies a desired voltage. The drain terminal of the first NMOS transistor 398b is in electrical communication with a power supply, a voltage source, a driver circuit, or other device that supplies a desired voltage, the gate terminal of the first NMOS transistor 398b is in electrical communication with a circuit, such as a control circuit, a decoder, a buffer, or a latch, that supplies a signal for controlling current flow through the first NMOS transistor 398b, and the source terminal of the first NMOS transistor 398b is in electrical communication with the word line W(0). The drain terminal of the second NMOS transistor 398c is in electrical communication with a power supply, a voltage source, a driver circuit, or other device that supplies a desired voltage, the gate terminal of the second NMOS transistor 398c is in electrical communication with a circuit, such as a control circuit, a decoder, a buffer, or a latch, that supplies a signal for controlling current flow through the second NMOS transistor 398c, and the source terminal of the second NMOS transistor 398c is in electrical communication with the word line W(0). The drain terminal of the third NMOS transistor 398d is in electrical communication with the word line W(0), the gate terminal of the third NMOS transistor 398d is in electrical communication with a circuit, such as a control circuit, a decoder, a buffer, or a latch, that supplies a signal for controlling current flow through the third NMOS transistor 398d, and the source terminal of the third NMOS transistor 398d is in electrical communication with a power supply, a voltage source, a driver circuit or other device that supplies ground or 0 volts. It is noted that the fifth driver circuit 398 can include additional components not shown in FIG. 3G, such as at least one resistor for limiting current flow and can omit components shown in FIG. 3G such as the PMOS transistor 398a, the first NMOS transistor 398b, the second NMOS transistor 398c, and/or the third NMOS transistor 398d.

Figures 1, 3H:
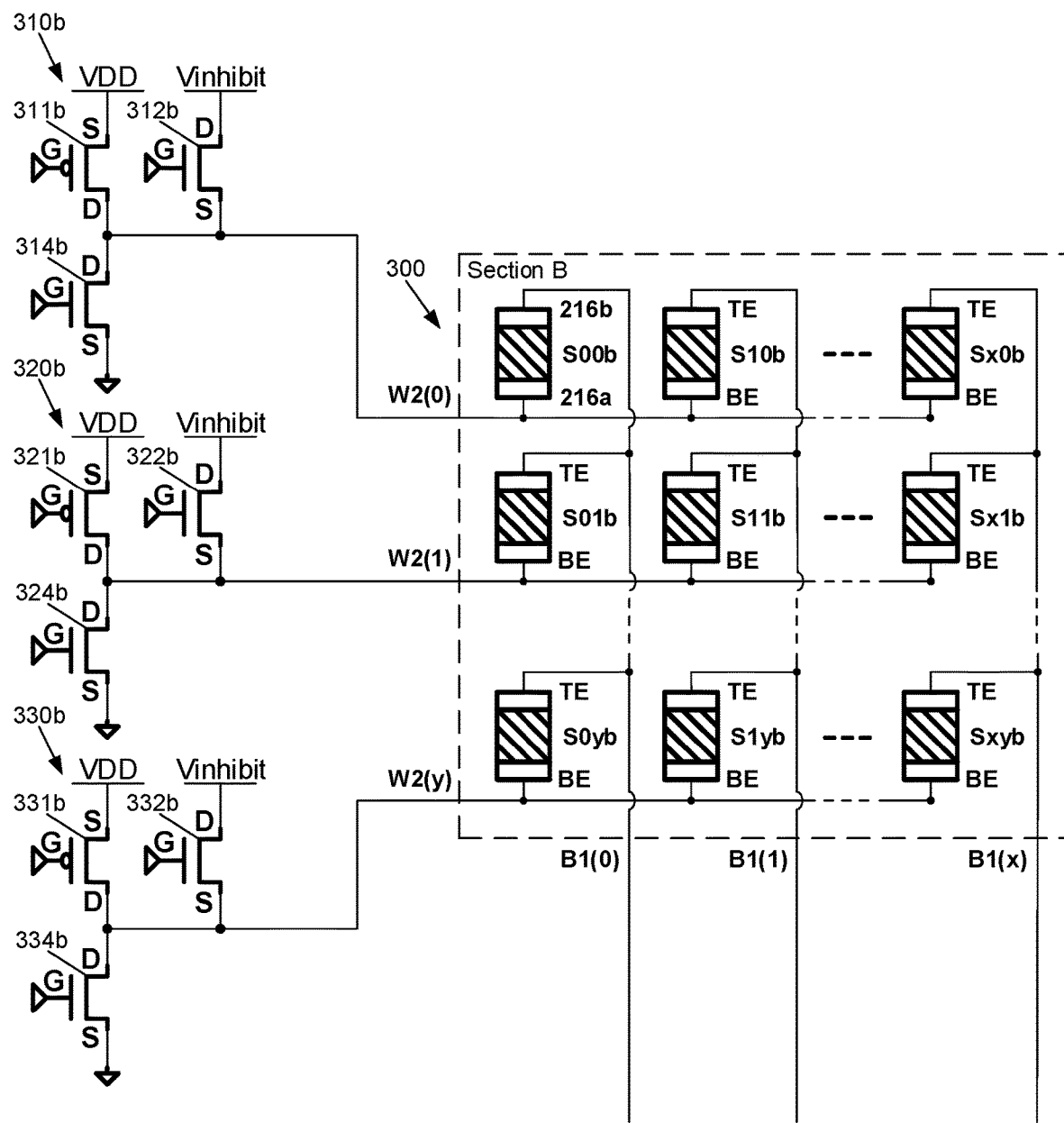
Figures 2, 3H:
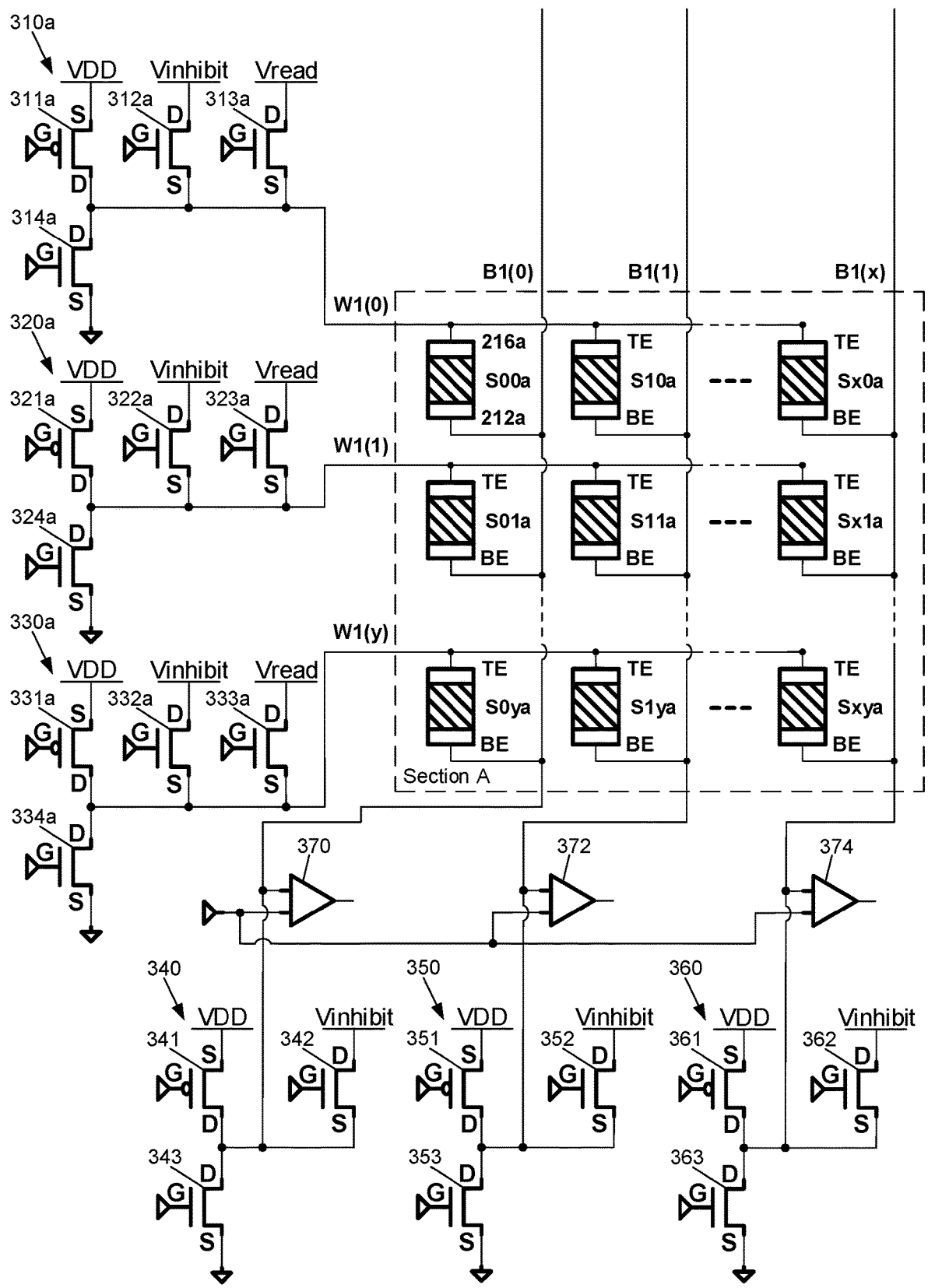

The exemplary architecture for programming and accessing at least one combinational resistive change element in the combinational resistive change element array 300 will be discussed below with the first plurality of word line driver circuits 302a being fifth driver circuits as discussed above with respect to FIG. 3G, the second plurality of word line driver circuits 302b being fifth driver circuits as discussed above with respect to FIG. 3G, the plurality of bit line driver circuits 304 being fifth driver circuits as discussed above with respect to FIG. 3G, and the plurality of sense devices 306 being sense amplifiers, inverters, or omitted from the exemplary architecture. However, other driver circuits could be used in the exemplary architecture. Referring now to FIGS. 3H-1 and 3H-2, the exemplary architecture for programming and accessing at least one combinational resistive change element in the combinational resistive change element array 300 is illustrated with word line driver circuits 310a, 320a, 330a included in the first plurality of word line driver circuits 302a, word line driver circuits 310b, 320b, 330b included in the second plurality of word line driver circuits 302b, bit line driver circuits 340, 350, 360 included in the plurality of bit line driver circuits 304, and sense amplifiers 370, 372, 374 included in the plurality of sense devices 306. The exemplary architecture shown in FIGS. 3H-1 and 3H-2 can include additional components not shown in FIGS. 3H-1 and 3H-2, such as resistors, amplifiers, and inverters. For example, the exemplary architecture shown in FIGS. 3H-1 and 3H-2 can include amplifiers for increasing small signals. Alternatively, as shown in the exemplary architecture of FIGS. 3I-1 and 3I-2, the plurality of sense devices 306 can be a plurality of inverters 380, 382, 384.

Each word line driver circuit 310a, 320a, 330a in the first plurality of word line driver circuits 302a is in electrical communication with a word line in the first plurality of word lines W1(0)-W1(y). Each word line driver circuit 310a, 320a, 330a in the first plurality of word line driver circuits 302a includes a PMOS transistor 311a, 321a, 331a having a drain terminal, a gate terminal, and a source terminal, a first NMOS transistor 312a, 322a, 332a having a drain terminal, a gate terminal, and a source terminal, a second NMOS transistor 313a, 323a, 333a having a drain terminal, a gate terminal, and a source terminal, and a third NMOS transistor 314a, 324a, 334a having a drain terminal, a gate terminal, and a source terminal. It is noted that depending on the voltage levels being used NMOS transistors can be included in place of the PMOS transistors 311a, 321a, 331a, PMOS transistors can be included in place of the first NMOS transistors 312a, 322a, 332a, PMOS transistors can be included in place of the second NMOS transistors 313a, 323a, 333a, and PMOS transistors can be included in place of the third NMOS transistors 314a, 324a, 334a. It is also noted that the word line driver circuits 310a, 320a, 330a in the first plurality of word line driver circuits 302a can include other types of field effect transistors, such as carbon nanotube field effect transistors (CNTFETs), SiGe FETs, fully-depleted silicon-on-insulator FETs, or multiple gate field effect transistors such as FinFETs, in place of the PMOS transistors 311a, 321a, 331a, the first NMOS transistors 312a, 322a, 332a, the second NMOS transistors 313a, 323a, 333a, and/or the third NMOS transistors 314a, 324a, 334a. It is further noted that when field effect transistors that do not require a semiconductor substrate are used this enables the field effect transistors to be fabricated on insulator material, and additionally, enables the field effect transistors to be stacked to reduce the amount of chip area consumed by the first plurality of word line driver circuits.

The drain terminal of each PMOS transistor 311a, 321a, 331a is in electrical communication with a word line in the first plurality of word lines W1(0)-W1(y), the gate terminal of each PMOS transistor 311a, 321a, 331a is in electrical communication with a circuit, such as a decoder, a buffer, a latch, or a control circuit, that supplies signals for controlling current flow through each PMOS transistor 311a, 321a, 331a, and the source terminal of each PMOS transistor 311a, 321a, 331a is in electrical communication with a power supply, a voltage source, a driver circuit, or other device that supplies the system voltage VDD. The drain terminal of each first NMOS transistor 312a, 322a, 332a is in electrical communication with a power supply, a voltage source, a driver circuit, or other device that supplies an inhibit voltage Vinhibit, the gate terminal of each first NMOS transistor 312a, 322a, 332a is in electrical communication with a circuit, such as a decoder, a buffer, a latch, or a control circuit, that supplies signals for controlling current flow through each first NMOS transistor 312a, 322a, 332a, and the source terminal of each first NMOS transistor 312a, 322a, 332a is in electrical communication with a word line in the first plurality of word lines W1(0)-W1(y). The drain terminal of each second NMOS transistor 313a, 323a, 333a is in electrical communication with a power supply, a voltage source, a driver circuit, or other device that supplies the read voltage Vread, the gate terminal of each second NMOS transistor 313a, 323a, 333a is in electrical communication with a circuit, such as a decoder, a buffer, a latch, or a control circuit, that supplies signals for controlling current flow through each second NMOS transistor 313a, 323a, 333a, and the source terminal of each second NMOS transistor 313a, 323a, 333a is in electrical communication with a word line in the first plurality of word lines W1(0)-W1(y). The drain terminal of each third NMOS transistor 314a, 324a, 334a is in electrical communication with a word line in the first plurality of word lines W1(0)-W1(y), the gate terminal of each third NMOS transistor 314a, 324a, 334a is in electrical communication with a circuit, such as a decoder, a buffer, a latch, or a control circuit, that supplies signals for controlling current flow through each fourth NMOS transistor 314a, 324a, 334a, and the source terminal of each fourth NMOS transistor 314a, 324a, 334a is in electrical communication with a power supply, a voltage source, a driver circuit or other device that supplies ground or 0 volts.

Each word line driver circuit 310b, 320b, 330b in the second plurality of word line driver circuits 302b is in electrical communication with a word line in the second plurality of word lines W2(0)-W2(y). Each word line driver circuit 310b, 320b, 330b in the second plurality of word line driver circuits 302b includes a PMOS transistor 311b, 321b, 331b having a drain terminal, a gate terminal, and a source terminal, a first NMOS transistor 312b, 322b, 332b having a drain terminal, a gate terminal, and a source terminal, and a second NMOS transistor 314b, 324b, 334b having a drain terminal, a gate terminal, and a source terminal. It is noted that depending on the voltage levels being used NMOS transistors can be included in place of the PMOS transistors 311b, 321b, 331b, PMOS transistors can be included in place of the first NMOS transistors 312b, 322b, 332b, and PMOS transistors can be included in place of the second NMOS transistors 314b, 324b, 334b. It is also noted that the word line driver circuits 310b, 320b, 330b in the second plurality of word line driver circuits 302b can include other types of field effect transistors, such as carbon nanotube field effect transistors (CNTFETs), SiGe FETs, fully-depleted silicon-on-insulator FETs, or multiple gate field effect transistors such as FinFETs, in place of the PMOS transistors 311b, 321b, 331b, the first NMOS transistors 312b, 322b, 332b, and/or the second NMOS transistors 314b, 324b, 334b. It is further noted that when field effect transistors that do not require a semiconductor substrate are used this enables the field effect transistors to be fabricated on insulator material, and additionally, enables the field effect transistors to be stacked to reduce the amount of chip area consumed by the second plurality of word line driver circuits.

The drain terminal of each PMOS transistor 311b, 321b, 331b is in electrical communication with a word line in the second plurality of word lines W2(0)-W2(y), the gate terminal of each PMOS transistor 311b, 321b, 331b is in electrical communication with a circuit, such as a decoder, a buffer, a latch, or a control circuit, that supplies signals for controlling current flow through each PMOS transistor 311b, 321b, 331b, and the source terminal of each PMOS transistor 311b, 321b, 331b, is in electrical communication with a power supply, a voltage source, a driver circuit, or other device that supplies the system voltage VDD. The drain terminal of each first NMOS transistor 312b, 322b, 332b is in electrical communication with a power supply, a voltage source, a driver circuit, or other device that supplies the inhibit voltage Vinhibit, the gate terminal of each first NMOS transistor 312b, 322b, 332b is in electrical communication with a circuit, such as a decoder, a buffer, a latch, or a control circuit, that supplies signals for controlling current flow through each first NMOS transistor 312b, 322b, 332b, and the source terminal of each first NMOS transistor 312b, 322b, 332b is in electrical communication with a word line in the second plurality of word lines W2(0)-W2(y). The drain terminal of each second NMOS transistor 314b, 324b, 334b is in electrical communication with a word line in the second plurality of word lines W2(0)-W2(y), the gate terminal of each second NMOS transistor 314b, 324b, 334b is in electrical communication with a circuit, such as a decoder, a buffer, a latch, or a control circuit, that supplies signals for controlling current flow through each second NMOS transistor 314b, 324b, 334b, and the source terminal of each second NMOS transistor 314b, 324b, 334b is in electrical communication with a power supply, a voltage source, a driver circuit or other device that supplies ground or 0 volts.

Each bit line driver circuit 340, 350, 360 in the plurality of bit line driver circuits 304 is in electrical communication with a bit line in the plurality of bit lines B1(0)-B1(x). Each bit line driver circuit 340, 350, 360 in the plurality of bit line driver circuits 304 includes a PMOS transistor 341, 351, 361 having a drain terminal, a gate terminal, and a source terminal, a first NMOS transistor 342, 352, 362 having a drain terminal, a gate terminal, and a source terminal, and a second NMOS transistor 343, 353, 363 having a drain terminal, a gate terminal, and a source terminal. It is noted that depending on the voltage levels being used NMOS transistors can be included in place of the PMOS transistors 341, 351, 361, PMOS transistors can be included in place of the first NMOS transistors 342, 352, 362, and PMOS transistors can be included in place of the second NMOS transistors 343, 353, 363. It is also noted that the bit line driver circuits 340, 350, 360 in the plurality of bit line driver circuits 304 can include other types of field effect transistors, such as carbon nanotube field effect transistors (CNTFETs), SiGe FETs, fully-depleted silicon-on-insulator FETs, or multiple gate field effect transistors such as FinFETs, in place of the PMOS transistors 341, 351, 361, the first NMOS transistors 342, 352, 362, and/or the second NMOS transistors 343, 353, 363. It is further noted that when field effect transistors that do not require a semiconductor substrate are used this enables the field effect transistors to be fabricated on insulator material, and additionally, enables the field effect transistors to be stacked to reduce the amount of chip area consumed by the plurality of bit line driver circuits.

The drain terminal of each PMOS transistor 341, 351, 361 is in electrical communication with a bit line in the plurality of bit lines B1(0)-B1(x), the gate terminal of each PMOS transistor 341, 351, 361 is in electrical communication a circuit, such as a decoder, a buffer, a latch, or a control circuit, that supplies signals for controlling current flow through each PMOS transistor 341, 351, 361, and the source terminal of each PMOS transistor 341, 351, 361 is in electrical communication with a power supply, a voltage source, a driver circuit, or other device that supplies the system voltage VDD. The drain terminal of each first NMOS transistor 342, 352, 362 is in electrical communication with a power supply, a voltage source, a driver circuit, or other device that supplies the inhibit voltage Vinhibit, the gate terminal of each first NMOS transistor 342, 352, 362 is in electrical communication with a circuit, such as a decoder, a buffer, a latch, or a control circuit, that supplies signals for controlling current flow through each first NMOS transistor 342, 352, 362, and the source terminal of each first NMOS transistor 342, 352, 362 is in electrical communication with a bit line in the plurality of bit lines B1(0)-B1(x). The drain terminal of each second NMOS transistor 343, 353, 363 is in electrical communication with a bit line in the plurality of bit lines B1(0)-B1(x), the gate terminal of each second NMOS transistor 343, 353, 363 is in electrical communication with a circuit, such as a decoder, a buffer, a latch, or a control circuit, that supplies signals for controlling current flow through each second NMOS transistor 343, 353, 363, and the source terminal of each second NMOS transistor 343, 353, 363 is in electrical communication with a power supply, a voltage source, a driver circuit or other device that supplies ground or 0 volts.

Each sense amplifier 370, 372, 374 in the plurality of sense devices 306 has a first input terminal, a second input terminal, and an output terminal. The first input terminal of each sense amplifier 370, 372, 374 is in electrical communication with a bit line in the plurality of bit lines B1(0)-B1(x). The second input terminal of each sense amplifier 370, 372, 374 is in electrical communication with a power supply, a voltage source, a driver circuit, a resistive divider, a control circuit such as a processor, a controller, and a microcontroller, or other device that supplies a voltage indicative of a boundary resistive ratio. The output terminal of each sense amplifier 370, 372, 374 is in electrical communication with a bus, a buffer, a level shift circuit, or a control circuit such as a processor, a controller, and a microcontroller. Alternatively, as shown in the exemplary architecture of FIGS. 3I-1 and 3I-2, the plurality of sense devices 306 can be a plurality of inverters 380, 382, 384 where each inverter in the plurality of sense devices 306 has an input terminal in electrical communication with a bit line in the plurality of bit lines B1(0)-B1(x) and output terminal in electrical communication with a bus, a buffer, a level shift circuit, or a control circuit such as a processor, a controller, and a microcontroller.

The exemplary architecture shown in FIGS. 3H-1 and 3H-2 is discussed below with respect to PROGRAMMING operations, READ operations, SET VERIFY operations, and RESET VERIFY operations. PROGRAMMING operations of combinational resistive change elements in the exemplary architecture of FIGS. 3H-1 and 3H-2 are discussed below with respect to FIGS. 3J-1 and 3J-2 that show current flow during a PROGRAMMING operation to adjust a relational state of combinational resistive change element S11 to a low relational state and FIGS. 3K-1 and 3K-2 that show current flow during a PROGRAMMING operation to adjust a relational state of combinational resistive change element S11 to a high relational state. READ operations of combinational resistive change elements in the exemplary architecture of FIGS. 3H-1 and 3H-2 are discussed below with respect to FIGS. 3L-1 and 3L-2 that show current flow during a READ operation of combinational resistive change element S11 when combinational resistive change element S11 has a low relational state and FIGS. 3M-1 and 3M-2 that show current flow during a READ operation of combinational resistive change element S11 when combinational resistive change element S11 has a high relational state. SET VERIFY operations of combinational resistive change elements in the exemplary architecture of FIGS. 3H-1 and 3H-2 are discussed below with respect to FIGS. 3N-1 and 3N-2 that show current flow during a SET VERIFY operation of combinational resistive change element S11. RESET VERIFY operations of combinational resistive change elements in the exemplary architecture of FIGS. 3H-1 and 3H-2 are discussed below with respect to FIGS. 3O-1 and 3O-2 that show current flow during a RESET VERIFY operation of combinational resistive change element S11.

A PROGRAMMING operation of a combinational resistive change element that is programmable between a low relational state (corresponding, typically, to a binary number 0) and a high relational state (corresponding, typically, to a binary number 1) is an operation to adjust a relational state of the combinational resistive change element to a low relational state or a high relational state. A READ operation of a combinational resistive change element that is programmable between a low relational state and a high relational state is an operation to determine whether the combinational resistive change element has a low relational state (corresponding, typically, to a binary number 0) or a high relational state (corresponding, typically, to a binary number 1). Additionally, a READ operation is used to describe an operation where a relational state of at least one combinational resistive change element is determined without significantly altering the relational state. A SET VERIFY operation of a combinational resistive change element that is programmable between a low relational state and a high relational state is an operation to determine whether the combinational resistive change element has a low relational state (corresponding, typically, to a binary number 0) or a relational state other than a low relational state. A SET VERIFY operation requires a correspondence between a resistive ratio of a combinational resistive change element and a model resistive ratio for a low relational state to determine the combinational resistive change element has a low relational state closer than a correspondence between a resistive ratio of a combinational resistive change element and a model resistive ratio for a low relational state to determine the combinational resistive change element has a low relational state for a READ operation. Additionally, a SET VERFIY operation is used to describe an operation where it is determined whether a relational state of at least one combinational resistive change element is a low relational state without significantly altering the relational state. A RESET VERIFY operation of a combinational resistive change element that is programmable between a low relational state and a high relational state is an operation to determine whether the combinational resistive change element has a high relational state (corresponding, typically, to a binary number 1) or a relational state other than a high relational state. A RESET VERIFY operation requires a correspondence between a resistive ratio of a combinational resistive change element and a model resistive ratio for a high relational state to determine the combinational resistive change element has a high relational state closer than a correspondence between a resistive ratio of a combinational resistive change element and a model resistive ratio for a high relational state to determine the combinational resistive change element has a high relational state for a READ operation. Additionally, a RESET VERFIY operation is used to describe an operation where it is determined whether a relational state of at least one combinational resistive change element is a high relational state without significantly altering the relational state.

FIG. 4 illustrates a flow chart 400 showing a method for programming at least one combination of resistive change elements. The method starts in step 402 with selecting at least one combination of resistive change elements from a plurality of combinations of resistive change elements, where each resistive change element is adjustable between at least two resistive states. The method continues in step 404 with applying conditions to inhibit change in relational states of unselected combinations of resistive change elements of the plurality of combinations of resistive change elements. The method proceeds in step 406 with applying electrical stimuli to each resistive change element of the at least one combination of resistive change elements to adjust a resistive state of each resistive change element of the at least one combination of resistive change elements to a resistive state of a combination of resistive states for that combination of resistive change elements. It is noted that the electrical stimuli applied to each resistive change element of the at least one combination of resistive change elements can be applied at the same time or can be applied one after the other. It is also noted that the steps of the method for programming at least one combination of resistive change elements are not limited to being performed in the order shown in FIG. 4. For example, the steps of applying conditions to inhibit change in relational states of unselected combinations of resistive change elements of the plurality of combinations of resistive change elements and applying electrical stimuli to each resistive change element of the at least one combination of resistive change elements to adjust a resistive state of each resistive change element of the at least one combination of resistive change elements to a resistive state of a combination of resistive states for that combination of resistive change elements can be performed at the same time.

A condition to inhibit change in a relational state of a combination of resistive change elements is applied to a combination of resistive change elements by limiting the voltage across each of the resistive change elements of the combination of resistive change elements to a voltage level less than a voltage level that would cause a resistive change element to change resistive states. It is noted that applying conditions to inhibit change in relational states of unselected combinations of resistive change elements of the plurality of combinations of resistive change elements may cause a voltage in accordance with a voltage limit to be applied to the unselected combinations of resistive change elements and the selected at least one combination of resistive change elements, however, causing a voltage in accordance with the voltage limit to be applied to the selected at least one combination of resistive change elements does not limit the voltage applied to the selected at least one combinations of resistive change elements. For example, when the selected combination of resistive change elements includes a first resistive change element and a second resistive change element and applying conditions to inhibit change in relational states of unselected combinations of resistive change elements of the plurality of combinations of resistive change elements causes a voltage in accordance with a voltage limit to be applied to the unselected combinations of resistive change elements and the selected at least one combination of resistive change elements, applying electrical stimuli to each resistive change element of the at least one combination of resistive change elements to adjust a resistive state of each resistive change element of the at least one combination of resistive change elements to a resistive state of a combination of resistive states for that combination of resistive change elements can apply an electrical stimulus to the first resistive change element while a voltage in accordance with the voltage limit is applied to the second resistive change element and an electrical stimulus to the second resistive change element while a voltage in accordance with a voltage level is applied to the first resistive change element.

The method for programming at least one combination of resistive change elements discussed above with respect to FIG. 4, will be discussed below with respect to PROGRAMMING operations of combinational resistive change element S11 in the exemplary architecture of FIGS. 3H-1 and 3H-2. Additionally, PROGRAMMING operations of combinational resistive change elements having resistive change elements in electrical communication with the same word line in the first plurality of word lines W1(0)-W1(y) and resistive change elements in electrical communication with the same word line in the second plurality of word lines W2(0)-W2(y) can be performed at the same time and in a similar manner to the PROGRAMMING operations of the combinational resistive change element S11 by driving voltages on the first plurality of word lines W1(0)-W1(y), the second plurality of word lines W2(0)-W2(y), and the plurality of bit lines B1(0)-B1(x) as required for performing PROGRAMMING operations of the combinational resistive change elements at the same time. Performing PROGRAMMING operations of combinational resistive change elements having resistive change elements in electrical communication with the same word lines at the same time can be highly desirable in certain applications where rapid data PROGRAMMING or page mode PROGRAMMING operations are required. It is noted that the method for programming at least one combination of resistive change elements is not limited to the exemplary architecture shown in FIGS. 3H-1 and 3H-2 and that the method for programming at least one combination of resistive change elements can be performed by other architectures and systems, such as the exemplary architecture shown in FIGS. 3I-1 and 3I-2, the exemplary architecture shown in FIGS. 6C-1 and 6C-2, the exemplary architecture shown in FIGS. 6D-1 and 6D-2, the exemplary architecture shown in FIG. 7C, the exemplary architecture shown in FIG. 7D, the memory system shown in FIG. 8, and the memory system shown in FIG. 9.

PROGRAMMING operations of combinational resistive change element S11 in the exemplary architecture of FIGS. 3H-1 and 3H-2 will be explained in detail below and PROGRAMMING operations of each combinational resistive change element in the exemplary architecture of FIGS. 3H-1 and 3H-2 can be performed in a similar manner to the PROGRAMMING operations of combinational resistive change element S11. FIGS. 3J-1 and 3J-2 illustrates a simplified schematic diagram showing current flow during a PROGRAMMING operation to adjust a relational state of combinational resistive change element S11 to a low relational state. FIGS. 3K-1 and 3K-2 illustrates a simplified schematic diagram showing current flow during a PROGRAMMING operation to adjust a relational state of combinational resistive change element S11 to a high relational state.

A PROGRAMMING operation to adjust a relational state of the combinational resistive change element S11 to a low relational state starts, as similarly discussed above in step 402 of flow chart 400, by selecting the combinational resistive change element S11 from the plurality of combinational resistive change elements S00-S$xy$. As discussed above, the combinational resistive change element array 300 is configured to include a plurality of combinational resistive change elements S00-S$xy$ using a correspondence where each combinational resistive change element in the plurality of combinational resistive change elements S00-S$xy$ includes a resistive change element from the plurality of resistive change elements S00$a$-S$xya$ located in section A and a resistive change element from the plurality of a resistive change elements S00$b$-S$xyb$ located in section B at matching locations in matrixes and a conductive structure providing an electrical communication path between the resistive change element from the plurality of resistive change elements S00$a$-S$xya$ located in section A and the resistive change element from the plurality of a resistive change elements S00$b$-S$xyb$ located in section B. The combinational resistive change element S11 is selected from the plurality of combinational resistive change elements S00-S$xy$ by control logic, such as a processor, a controller, and a microcontroller. The combinational resistive change elements S00-S$x$0, S01, S$x$1, S0$y$-S$xy$ in the plurality of combinational resistive change elements S00-S$xy$ that are not selected are referred to as unselected combinational resistive change elements.

The PROGRAMMING operation to adjust a relational state of the combinational resistive change element S11 to a low relational state proceeds, as similarly discussed above in step 404 of flow chart 400, by applying conditions to inhibit change in relational states of the unselected combinational resistive change elements S00-S$x$0, S01, S$x$1, S0$y$-S$xy$. A condition to inhibit change in a relational state of a combinational resistive change element is applied to a combinational resistive change element by limiting the voltage across each of the resistive change elements of the combinational resistive change element to a voltage level less than a voltage level that would cause a resistive change element to change resistive states. Conditions to inhibit change in relational states of the unselected combinational resistive change elements S00-S$x$0, S01, S$x$1, S0$y$-S$xy$ are applied to the unselected combinational resistive change elements S00-S$x$0, S01, S$x$1, S0$y$-S$xy$ by driving the word lines W1(0), W1($y$) to the inhibit voltage Vinhibit, driving the word lines W2(0), W2($y$) to the inhibit voltage Vinhibit, and driving the bit lines B1(0), B1($x$) to the inhibit voltage Vinhibit. The word lines W1(0), W1($y$) are driven to the inhibit voltage Vinhibit by turning on the first NMOS transistors 312$a$, 332$a$ in the word line driver circuits 310$a$, 330$a$. The word lines W2(0), W2($y$) are driven to the inhibit voltage Vinhibit by turning on the first NMOS transistors 312b, 332b in the word line driver circuits 310b, 330b. The bit lines B1(0), B1(x) are driven to the inhibit voltage Vinhibit by turning on the first NMOS transistors 342, 362 in the bit line driver circuits 340, 360.

The PROGRAMMING operation to adjust a relational state of the combinational resistive change element S11 to a low relational state continues, as similarly discussed above in step 406 of flow chart 400, by applying a bidirectional RESET electrical stimulus to the resistive change element S11a and a bidirectional SET electrical stimulus to the resistive change element S11b. As discussed above, the combinational resistive change element S11 has a low relational state that corresponds with the second combination of resistive states, where the resistive change element S11a has a high resistive state and the resistive change element S11b has a low resistive state. Thus, the combinational resistive change element S11 is adjusted (programmed) to the low relational state by applying a bidirectional RESET electrical stimulus to the resistive change element S11a to adjust a resistive state of the resistive change element S11a to a high resistive state and a bidirectional SET electrical stimulus to the resistive change element S11b to adjust a resistive state of the resistive change element S11b to a low resistive state. It is noted that a bidirectional RESET electrical stimulus and/or a bidirectional SET electrical stimulus can be repeatedly applied. For example, for combinational resistive change elements having at least one resistive change element that is stubborn about changing resistive states a bidirectional RESET electrical stimulus and/or a bidirectional SET electrical stimulus can be repeatedly applied.

The bidirectional RESET electrical stimulus is applied to the resistive change element S11a at the same time the bidirectional SET electrical stimulus is applied to the resistive change element S11b by driving word line W1(1) to the system voltage VDD, driving the word line W2(1) to the system voltage VDD, and driving the bit line B1(1) to 0 volts or ground. The word line W1(1) is driven to the system voltage VDD by turning on the PMOS transistor 321a in the word line driver circuit 320a. The word line W2(1) is driven to the system voltage VDD by turning on the PMOS transistor 321b in the word line driver circuit 320b. The bit line B1(1) is driven to 0 volts or ground by turning on the second NMOS transistor 353 in the bit line driver circuit 350. A current I11ar flows through the resistive change element S11a from the top electrode to the bottom electrode, as shown in FIG. 3J-2, because the top electrode of the resistive change element S11a is in electrical communication with the word line W1(1) driven to the system voltage VDD and the bottom electrode of the resistive change element S11a is in electrical communication with the bit line B1(1) driven to 0 volts or ground. A current I11bs flows through the resistive change element S11b from the bottom electrode to the top electrode, as shown in FIG. 3J-1, because the bottom electrode of the resistive change S11b is in electrical communication with the word line W2(1) driven to the system voltage VDD and the top electrode of the resistive change element S11b is in electrical communication with the bit line B1(1) driven to 0 volts or ground.

Alternatively, the bidirectional RESET electrical stimulus is applied to the resistive change element S11a and the bidirectional SET electrical stimulus is applied to the resistive change element S11b one after the other by driving word line W1(1) to the system voltage VDD, driving the bit line B1(1) to 0 volts or ground, driving the word line W2(1) to 0 volts or ground, and then driving word line W1(2) to the system voltage VDD, driving the bit line B1(1) to 0 volts or ground, driving the word line W1(1) to 0 volts or ground. The word line W1(1) is driven to the system voltage VDD by turning on the PMOS transistor 321a in the word line driver circuit 320a. The bit line B1(1) is driven to 0 volts or ground by turning on the second NMOS transistor 353 in the bit line driver circuit 350. The word line W2(1) is driven to 0 volts or ground by turning on the second NMOS transistor 324b in the word line driver circuit 320b. The word line W2(1) is driven to the system voltage VDD by turning on the PMOS transistor 321b in the word line driver circuit 320b. The bit line B1(1) is driven to 0 volts or ground by turning on the second NMOS transistor 353 in the bit line driver circuit 350. The word line W1(1) is driven to 0 volts or ground by turning on the third NMOS transistor 324a in the word line driver circuit 320a. It is noted that by applying a bidirectional RESET electrical stimulus to the resistive change element S11a and a bidirectional SET electrical stimulus to resistive change element S11b one after the other, the one or more programming pulses of the bidirectional RESET electrical stimulus and the one more programming pulses of the bidirectional SET electrical stimulus can be different numbers of programming pulses and/or can have different pulse widths.

FIGS. 3J-1 and 3J-2 also show leakage currents flowing through resistive change elements located in the same row or the same column as resistive change element S11a in the plurality of resistive change elements S00a-Sxya located in section A and leakage currents flowing through resistive change elements located in the same row or the same column as resistive change element S11b in the plurality of resistive change elements S00b-Sxyb located in section B. The leakage currents are shown using dashed lines in FIGS. 3J-1 and 3J-2. Leakage currents flow through resistive change elements S01a, Sx1a because the top electrodes of the resistive change elements S01a, Sx1a are at the system voltage VDD and the bottom electrodes of the resistive change elements S01a, Sx1a are the inhibit voltage Vinhibit. Leakage currents flow through resistive change elements S10a, S1ya because the top electrodes of the resistive change elements S10a, S1ya are at the inhibit voltage Vinhbit and the bottom electrodes of the resistive change elements S10a, S1ya are at 0 volts or ground. Leakage currents flow through resistive change elements S01b, Sx1b because the bottom electrodes of the resistive change elements S01b, Sx1b are at the system voltage VDD and the top electrodes of resistive change elements S01b, Sx1b are at the inhibit voltage Vinhibit. Leakage currents flow through resistive change elements S10b, S1yb because the bottom electrodes of the resistive change elements S10b, S1yb are at the inhibit voltage Vinhbit and the top electrodes of resistive change elements S10b, S1yb are at 0 volts or ground. It is noted that the voltage level of the system voltage VDD is greater than the voltage level of the inhibit voltage Vinhibit and that the voltage level of the inhibit voltage Vinhibit is greater than 0 volts or ground. It is also noted that the inhibit voltage Vinhibit is a design variable selected by a circuit designer. It is further noted that leakage currents do not prevent the PROGRAMMING operation of the combinational resistive change element S11 when the leakage currents are much less than the amount of the current I11ar and when the leakage currents are much less than the amount of the current I11bs.

A PROGRAMMING operation to adjust a relational state of the combinational resistive change element S11 to a high relational state starts, as similarly discussed above in step 402 of flow chart 400, by selecting the combinational resistive change element S11 from the plurality of combinational resistive change elements S00-S$xy$. As discussed above, the combinational resistive change element array 300 is configured to include a plurality of combinational resistive change elements S00-S$xy$ using a correspondence where each combinational resistive change element in the plurality of combinational resistive change elements S00-S$xy$ includes a resistive change element from the plurality of resistive change elements S00$a$-S$xya$ located in section A and a resistive change element from the plurality of a resistive change elements S00$b$-S$xyb$ located in section B at matching locations in matrixes and a conductive structure providing an electrical communication path between the resistive change element from the plurality of resistive change elements S00$a$-S$xya$ located in section A and the resistive change element from the plurality of a resistive change elements S00$b$-S$xyb$ located in section B. Combinational resistive change element S11 is selected from the plurality of combinational resistive change elements S00-S$xy$ by control logic, such as a processor, a controller, and a microcontroller. The combinational resistive change elements S00-S$x$0, S01, S$x$1, S0$y$-S$xy$ in the plurality of combinational resistive change elements S00-S$xy$ that are not selected are referred to as unselected combinational resistive change elements.

The PROGRAMMING operation to adjust a relational state of the combinational resistive change element S11 to a high relational state proceeds, as similarly discussed above in step 404 of flow chart 400, by applying conditions to inhibit change in relational states of the unselected combinational resistive change elements S00-S$x$0, S01, S$x$1, S0$y$-S$xy$. A condition to inhibit change in a relational state of a combinational resistive change element is applied to a combinational resistive change element by limiting the voltage across each of the resistive change elements of the combinational resistive change element to a voltage level less than a voltage level that would cause a resistive change element to change resistive states. Conditions to inhibit change in relational states of the unselected combinational resistive change elements S00-S$x$0, S01, S$x$1, S0$y$-S$xy$ are applied to the unselected combinational resistive change elements S00-S$x$0, S01, S$x$1, S0$y$-S$xy$ by driving the word lines W1(0), W1($y$) to the inhibit voltage Vinhibit, driving the word lines W2(0), W2($y$) to the inhibit voltage Vinhibit, and driving the bit lines B1(0), B1($x$) to the inhibit voltage Vinhibit. The word lines W1(0), W1($y$) are driven to the inhibit voltage Vinhibit by turning on the first NMOS transistors 312$a$, 332$a$ in the word line driver circuits 310$a$, 330$a$. The word lines W2(0), W2($y$) are driven to the inhibit voltage Vinhibit by turning on the first NMOS transistors 312$b$, 332$b$ in the word line driver circuits 310$b$, 330$b$. The bit lines B1(0), B1($x$) are driven to the inhibit voltage Vinhibit by turning on the first NMOS transistors 342, 362 in the bit line driver circuits 340, 360.

The PROGRAMMING operation to adjust a relational state of the combinational resistive change element S11 to a high relational state continues, as similarly discussed above in step 406 of flow chart 400, by applying a bidirectional SET electrical stimulus to the resistive change element S11$a$ and a bidirectional RESET electrical stimulus to the resistive change element S11$b$. As discussed above, the combinational resistive change element S11 has a high relational state that corresponds with the third combination of resistive states, where the resistive change element S11$a$ has a low resistive state and the resistive change element S11$b$ has a high resistive state. Thus, the combinational resistive change element S11 is adjusted (programmed) to the high relational state by applying a bidirectional SET electrical stimulus to the resistive change element S11$a$ to adjust a resistive state of the resistive change element S11$a$ to a low resistive state and a bidirectional RESET electrical stimulus to the resistive change element S11$b$ to adjust a resistive state of the resistive change element S11$b$ to a high resistive state. It is noted that a bidirectional SET electrical stimulus and/or a bidirectional RESET electrical stimulus can be repeatedly applied. For example, for combinational resistive change elements having at least one resistive change element that is stubborn about changing resistive states a bidirectional SET electrical stimulus and/or a bidirectional RESET electrical stimulus can be repeatedly applied.

The bidirectional SET electrical stimulus is applied to the resistive change element S11$a$ at the same time the bidirectional RESET electrical stimulus is applied to the resistive change element S11$b$ by driving word line W1(1) to 0 volts or ground, driving the word line W2(1) to 0 volts or ground, and driving the bit line B1(1) the system voltage VDD. The word line W1(1) is driven to 0 volts or ground by turning on the third NMOS transistor 324$a$ in the word line driver circuit 320$a$. The word line W2(1) is driven to 0 volts or ground by turning on the second NMOS transistor 324$b$ in the word line driver circuit 320$b$. The bit line B1(1) is driven to the system voltage VDD by turning on the PMOS transistor 351 in the bit line driver circuit 350. A current I11$as$ flows through the resistive change element S11$a$ from the bottom electrode to the top electrode, as shown in FIG. 3K-2, because the top electrode of the resistive change element S11$a$ is in electrical communication with the word line W1(1) driven to 0 volts or ground and the bottom electrode of the resistive change element S11$a$ is in electrical communication with the bit line B1(1) driven to the system voltage VDD. A current I11$br$ flows through the resistive change element S11$b$ from the top electrode to the bottom electrode, as shown in FIG. 3K-1, because the bottom electrode of the resistive change S11$b$ is in electrical communication with the word line W2(1) driven to 0 volts or ground and the top electrode of the resistive change element S11$b$ is in electrical communication with the bit line B1(1) driven to the system voltage VDD.

Alternatively, the bidirectional SET electrical stimulus is applied to the resistive change element S11$a$ and the bidirectional RESET electrical stimulus is applied to the resistive change element S11$b$ one after the other by driving word line W1(1) to 0 volts or ground, driving the bit line B1(1) to the system voltage VDD, driving the word line W2(1) to the system voltage VDD, and then driving word line W1(2) to 0 volts or ground, driving the bit line B1(1) to the system voltage VDD, driving the word line W1(1) to the system voltage VDD. The word line W1(1) is driven to 0 volts or ground by turning on the third NMOS transistor 324$a$ in the word line driver circuit 320$a$. The bit line B1(1) is driven to the system voltage VDD by turning on the PMOS transistor 351 in the bit line driver circuit 350. The word line W2(1) is driven to the system voltage VDD by turning on the PMOS transistor 321$b$ in the word line driver circuit 320$b$. The word line W2(1) is driven to 0 volts or ground by turning on the second NMOS transistor 324$b$ in the word line driver circuit 320$b$. The bit line B1(1) is driven to the system voltage VDD by turning on the PMOS transistor 351 in the bit line driver circuit 350. The word line W1(1) is driven to the system voltage VDD by turning on the PMOS transistor 321$a$ in the word line driver circuit 320$a$. It is noted that by applying a bidirectional SET electrical stimulus to the resistive change element S11$a$ and a bidirectional RESET electrical stimulus to resistive change element S11$b$ one after the other, the one or more programming pulses of the bidirectional SET electrical stimulus and the one more programming pulses of the bidirectional RESET electrical stimulus can be different numbers of programming pulses and/or can have different pulse widths.

FIGS. 3K-1 and 3K-2 also shows leakage currents flowing through resistive change elements located in the same row or the same column as resistive change element S11$a$ in the plurality of resistive change elements S00$a$-S$xy$$a$ located in section A and leakage currents flowing through resistive change elements located in the same row or the same column as resistive change element S11$b$ in the plurality of resistive change elements S00$b$-S$xy$$b$ located in section B. The leakage currents are shown using dashed lines in FIGS. 3K-1 and 3K-2. Leakage currents flow through resistive change elements S01$a$, S$x$1$a$ because the top electrodes of the resistive change elements S01$a$, S$x$1$a$ are at 0 volts or ground and the bottom electrodes of resistive change elements S01$a$, S$x$1$a$ are the inhibit voltage Vinhibit. Leakage currents flow through resistive change elements S10$a$, S1$y$$a$ because the top electrodes of the resistive change elements S10$a$, S1$y$$a$ are at the inhibit voltage Vinhbit and the bottom electrodes of resistive change elements S10$a$, S1$y$$a$ are at the system voltage VDD. Leakage currents flow through resistive change elements S01$b$, S$x$1$b$ because the bottom electrodes of the resistive change elements S01$a$, S$x$1$b$ are at 0 volts or ground and the top electrodes of resistive change elements S01$b$, S$x$1$b$ are at the inhibit voltage Vinhibit. Leakage currents flow through resistive change elements S10$b$, S1$y$$b$ because the bottom electrodes of the resistive change elements S10$b$, S1$y$$b$ are at the inhibit voltage Vinhibit and the top electrodes of resistive change elements S10$b$, S1$y$$b$ are at the system voltage VDD. It is noted that the voltage level of the system voltage VDD is greater than the voltage level of the inhibit voltage Vinhibit and that the voltage level of the inhibit voltage Vinhibit is greater than 0 volts or ground. It is also noted that the inhibit voltage Vinhibit is a design variable selected by a circuit designer. It is further noted that leakage currents do not prevent the PROGRAMMING operation of the combinational resistive change element S11 when the leakage currents are much less than the amount of the current I00$as$ and when the leakage currents are much less than the amount of the current I00$br$.

PROGRAMMING operations of combinational resistive change elements adjustable (programmable) between more than two relational states can be performed in a similar manner to the PROGRAMMING operations of the combinational resistive change element S11 discussed above. However, for combinational resistive change elements having resistive change elements adjustable between more than two resistive states more electrical stimuli than the bidirectional SET electrical stimulus and the bidirectional RESET electrical stimulus are required to adjust the resistive change elements between the more than two resistive states. For example, to adjust a resistive change element that can be adjusted between a low resistive state, an intermediate resistive state, and a high resistive state, requires an electrical stimulus to adjust a resistive state of the resistive change element to a low resistive state, an electrical stimulus to adjust a resistive state of the resistive change element to an intermediate resistive state, and an electrical stimulus to adjust a resistive state of the resistive change element to a high resistive state.

FIG. 5 illustrates a flow chart 500 showing a method for accessing at least one combination of resistive change elements. The method starts in step 502 with selecting at least one combination of resistive change elements from a plurality of combinations of resistive change elements, where each resistive change element is adjustable between at least two resistive states. The method continues in step 504 with applying conditions to inhibit change in relational states of unselected combinations of resistive change elements of the plurality of combinations of resistive change elements. The method proceeds in step 506 with applying an electrical stimulus to each combination of resistive change elements of the at least one combination of resistive change elements such that resistive change elements of each combination of resistive change elements of the at least one combination of resistive change elements form a resistor divider for that combination of resistive change elements. The method continues in step 508 with determining a relational state of each combination of resistive change elements of the at least one combination of resistive change elements based on a resistive ratio of the resistor divider for that combination of resistive change elements. Additionally, as discussed below, the method for accessing at least one combination of resistive change elements can include selecting a boundary resistive ratio for determining a relational state of the at least one combination of resistive change elements. It is noted that the steps of the method for accessing at least one combination of resistive change elements are not limited to being performed in the order shown in FIG. 5. For example, the steps of applying conditions to inhibit change in relational states of unselected combinations of resistive change elements of the plurality of combinations of resistive change elements and applying an electrical stimulus to each combination of resistive change elements of the at least one combination of resistive change elements such that resistive change elements of each combination of resistive change elements of the at least one combination of resistive change elements form a resistor divider for that combination of resistive change elements can be performed at the same time.

The method for accessing at least one combination of resistive change elements discussed above with respect to FIG. 5, will be discussed below with respect to READ operations, SET VERIFY operations, and RESET VERIFY operations of combinational resistive change element S11 in the exemplary architecture of FIGS. 3H-1 and 3H-2. Additionally, READ operations, SET VERIFY operations, and RESET VERIFY operations of combinational resistive change elements having resistive change elements in electrical communication with the same word line in the first plurality of word lines W1(0)-W1($y$) and resistive change elements in electrical communication with the same word line in the second plurality of word lines W2(0)-W2($y$) can be performed at the same time and in a similar manner to the READ operations, SET VERIFY operations, and RESET VERIFY operations of the combinational resistive change element S11 by driving voltages on the first plurality of word lines W1(0)-W1($y$), the second plurality of word lines W2(0)-W2($y$), and the plurality of bit lines B1(0)-B1($x$) as required for performing READ operations, SET VERIFY operations, and RESET VERIFY operations of the combinational resistive change elements at the same time. Performing READ operations, SET VERIFY operations, and RESET VERIFY operations of combinational resistive change elements having resistive change elements in electrical communication with the same word lines at the same time can be highly desirable in certain applications where rapid data READ operations, rapid data SET VERIFY operations, rapid data RESET VERIFY operations, page mode READ operations, page mode SET VERIFY operations, or page mode RESET VERIFY operations are required. It is noted that the method for accessing at least one combination of resistive change elements is not limited to the exemplary architecture shown in FIGS. 3H-1 and 3H-2 and that the method for accessing at least one combination of resistive change elements can be performed by other architectures and systems, such as the exemplary architecture shown in FIGS. 3I-1 and 3I-2, the exemplary architecture shown in FIGS. 6C-1 and 6C-2, the exemplary architecture shown in FIGS. 6D-1 and 6D-2, the exemplary architecture shown in FIG. 7C, the exemplary architecture shown in FIG. 7D, the memory system shown in FIG. 8, and the memory system shown in FIG. 9.

READ operations, SET VERIFY operations, and RESET VERIFY operations of combinational resistive change elements use boundary resistive ratios to separate resistive ratios of resistive dividers formed by resistive change elements of combinational resistive change elements into groups of resistive ratios whose members are separated by the boundary resistive ratios. READ operations, SET VERIFY operations, and RESET VERIFY operations of combinational resistive change elements use different boundary resistive ratios because READ operations, SET VERIFY operations, and RESET VERIFY operations of combinational resistive change elements make different determinations. Boundary resistive ratios for READ operations, SET VERIFY operations, and RESET VERIFY operations of combinational resistive change elements are design variables selected by a circuit designer.

READ operations of combinational resistive change elements adjustable (programmable) between relational states that correspond with combinations of resistive states of resistive change elements having different resistive ratios when a combinational resistive change element is accessed in a manner such that the resistive change elements form a resistive divider use at least one boundary resistive ratio to separate resistive ratios of resistive dividers formed by resistive change elements of the combinational resistive change elements into groups of resistive ratios that correspond with relational states. The number of boundary resistive ratios for READ operations of the combinational resistive change elements generally relates to the number of relational states the combinational resistive change elements are adjustable (programmable) between and the number of boundary resistive ratios for READ operations is generally the number of relational states the combinational resistive change elements are adjustable (programmable) between minus one. A circuit designer typically selects boundary resistive ratios for READ operations of the combinational resistive change elements at a midpoint or near a midpoint between adjacent model resistive ratios for relational states. However, boundary resistive ratios for READ operations are not limited to being at a midpoint or near a midpoint between adjacent model resistive ratios for relational states but rather boundary resistive ratios for READ operations can be closer to one of the adjacent model resistive ratios for relational states.

READ operations of combinational resistive change elements in the plurality of combinational resistive change elements S00-S$xy$ use a boundary resistive ratio to separate resistive ratios of resistive dividers formed by resistive change elements of combinational resistive change elements into a group of resistive ratios that correspond with a low relational state for READ operations and a group of resistive ratios that correspond with a high relational state for READ operations. A circuit designer typically selects a boundary resistive ratio for READ operations of combinational resistive change elements in the plurality of combinational resistive change elements S00-S$xy$ that is at a midpoint or near a midpoint between a model resistive ratio for a low relational state and a model resistive ratio for a high relational state. However, a boundary resistive ratio for READ operations of combinational resistive change elements in the plurality of combinational resistive change elements S00-S$xy$ is not limited to being at a midpoint or near a midpoint between a model resistive ratio for a low relational state and a model resistive ratio for a high relational state, but rather the boundary resistive ratio for READ operations can be closer to a model resistive ratio for a low relational state or closer to a model resistive ratio for a high relational state. A circuit designer also typically selects a boundary resistive ratio for READ operations of combinational resistive change elements in the plurality of combinational resistive change elements S00-S$xy$ greater than a boundary resistive ratio for SET VERIFY operations and less than a boundary resistive ratio for RESET VERIFY operations. A model resistive ratio for a low relational state and a model resistive ratio for a high relational state are based on resistive dividers using a model resistance for a low resistive state of a resistive change element and a model resistance for a high resistive state of a resistive change element.

For example, when a model resistance for a low resistive state of a resistive change element is 1 MΩ, a model resistance for a high resistive state of a resistive change element is 10 MΩ, a model resistive ratio for a low relational state is ratio=1 MΩ/(10 MΩ+1 MΩ)=$\frac{1}{11}$, and a model resistive ratio for a high relational state is ratio=10 MΩ/(10 MΩ+1 MΩ)=$\frac{10}{11}$, a circuit designer selects a boundary resistive ratio for READ operations as ratio=$\frac{1}{2}$, the midpoint between the model resistive ratio of the low relational state and the model resistive ratio of the high relational state. In the above example, resistive ratios of resistive dividers formed by resistive change elements of combinational resistive change elements less than or equal to the boundary resistive ratio for READ operations of $\frac{1}{2}$ are determined to have a low relational state during READ operations and resistive ratios of resistive dividers formed by resistive change elements of combinational resistive change elements greater than the boundary resistive ratio for READ operations of $\frac{1}{2}$ are determined to have a high relational state during READ operations.

SET VERIFY operations of combinational resistive change elements in the plurality of combinational resistive change elements S00-S$xy$ use a boundary resistive ratio to separate resistive ratios of resistive dividers formed by resistive change elements of combinational resistive change elements into a group of resistive ratios that correspond with a low relational state for SET VERIFY operations and a group of resistive ratios that correspond with a relational state other than a low relational state for SET VERIFY operations. A circuit designer typically selects a boundary resistive ratio for SET VERIFY operations of combinational resistive change elements in the plurality of combinational resistive change elements S00-S$xy$ such that the boundary resistive ratio for SET VERIFY operations is less than the boundary resistive ratio for READ operations, and thus, SET VERIFY operations require a closer correspondence between resistive ratios of resistive dividers formed by resistive change elements of combinational resistive change elements and a model resistive ratio for a low relational state than READ operations.

For example, when a model resistance for a low resistive state of a resistive change element is 1 MΩ, a model resistance for a high resistive state of a resistive change element is 10 MΩ, a model resistive ratio for a low relational state is ratio=1 MΩ/(10 MΩ+1 MΩ)=$\frac{1}{11}$, and a boundary resistive ratio for READ operations is ½, a circuit designer selects a boundary resistive ratio for SET VERIFY operations as ratio=¼. In the above example, resistive ratios of resistive dividers formed by resistive change elements of combinational resistive change elements less than or equal to the boundary resistive ratio for SET VERIFY operations of ¼ are determined to have a low relational state during SET VERIFY operations and resistive ratios of resistive dividers formed by resistive change elements of combinational resistive change elements greater than the boundary resistive ratio for SET VERIFY operations of ¼ are determined to have a relational state other than a low relational state during SET VERIFY operations. Further, in the above example, the boundary resistive ratio for SET VERIFY operations requires a closer correspondence with the model resistive ratio for a low relational state than the boundary resistive ratio for READ operations because the boundary resistive ratio for SET VERIFY operations is closer to the model resistive ratio for a low relational state. It is noted that the circuit designer typically selects a boundary resistive ratio for SET VERIFY operations of combinational resistive change elements in the plurality of combinational resistive change elements S00-S$xy$ greater than a model resistive ratio for a low relational state so that resistive ratios of resistive dividers formed by resistive change elements of combinational resistive change elements can be greater than the model resistive ratio for the low relational state and be determined to have a low relational state during SET VERIFY operations.

RESET VERIFY operations of combinational resistive change elements in the plurality of combinational resistive change elements S00-S$xy$ use a boundary resistive ratio to separate resistive ratios of resistive dividers formed by resistive change elements of combinational resistive change elements into a group of resistive ratios that correspond with a high relational state for RESET VERIFY operations and a group of resistive ratios that correspond with a relational state other than a high relational state for RESET VERIFY operations. A circuit designer typically selects a boundary resistive ratio for RESET VERIFY operations of combinational resistive change elements in the plurality of combinational resistive change elements S00-S$xy$ such that the boundary resistive ratio for RESET VERIFY operations is greater than the boundary resistive ratio for READ operations, and thus, RESET VERIFY operations require a closer correspondence between resistive ratios of resistive dividers formed by resistive change elements of combinational resistive change elements and a model resistive ratio for a high relational state than READ operations.

For example, when a model resistance for a low resistive state of a resistive change element is 1 MΩ, a model resistance for a high resistive state of a resistive change element is 10 MΩ, a model resistive ratio for a high relational state is ratio=10 MΩ/(1 MΩ+10 MΩ)=10/11, and a boundary resistive ratio for READ operations is ½, a circuit designer selects a boundary resistive ratio for RESET VERIFY operations as ratio=¾. In the above example, resistive ratios of resistive dividers formed by resistive change elements of combinational resistive change elements less than or equal to the boundary resistive ratio for RESET VERIFY operations of ¾ are determined to have a relational state other than a high relational state during RESET VERIFY operations and resistive ratios of resistive dividers formed by resistive change elements of combinational resistive change elements greater than the boundary resistive ratio for RESET VERIFY operations of ¾ are determined to have a high relational state during RESET VERIFY operations. Further, in the above example, the boundary resistive ratio for RESET VERIFY operations requires a closer correspondence with the model resistive ratio for a high relational state than the boundary resistive ratio for READ operations because the boundary resistive ratio for RESET VERIFY operations is closer to the model resistive ratio for a high relational state. It is noted that the circuit designer typically selects a boundary resistive ratio for RESET VERIFY operations of combinational resistive change elements in the plurality of combinational resistive change elements S00-S$xy$ less than a model resistive ratio for a high relational state so that resistive ratios of resistive dividers formed by resistive change elements of combinational resistive change elements can be less than the model resistive ratio for the high relational state and be determined to have a high relational state during RESET VERIFY operations.

Additionally, selecting a boundary resistive ratio for SET VERIFY operations less than a boundary resistive ratio for READ operations and selecting a boundary resistive ratio for RESET VERIFY operations greater than a boundary resistive ratio for READ operations creates a buffer between resistive ratios that correspond with a low relational state during SET VERIFY operations and resistive ratios that correspond with a high relational state during RESET VERIFY operations. Resistive ratios in the buffer are determined to correspond with a low relational state during READ operations or a high relational state during READ operations. However, resistive ratios in the buffer are determined to correspond with a relational state other than a low relational state during SET VERIFY operations or are determined to correspond with a relational state other than a high relational state during RESET VERIFY operations.

For example, when the boundary resistive ratio for SET VERIFY operation is ¼, the boundary resistive ratio for READ operations is ½, and the boundary resistive ratio for RESET VERIFY operations is ¾, the boundary resistive ratio for SET VERIFY operations and the boundary resistive ratio for RESET VERIFY operations create a buffer between approximately ¼ and approximately ¾. In the above example, resistive ratios of resistive dividers formed by resistive change elements of combinational resistive change elements from approximately ¼ to approximately ½ are determined to have a low relational state during READ operations but are determined to have a relational state other than a low relational state during SET VERIFY operations. Additionally, in the above example, resistive ratios of resistive dividers formed by resistive change elements of combinational resistive change elements from approximately ½ to approximately ¾ are determined to have a high relational state during READ operations but are determined to have a relational state other than a high relational state during RESET VERIFY operations. A circuit designer can adjust the buffer by adjusting the boundary resistive ratio for SET VERIFY operations and/or the boundary resistive ratio for RESET VERIFY operations. It is noted that the boundary resistive ratio for SET VERIFY operations and the boundary resistive ratio for RESET VERIFY operations are not required to be equal distances from the boundary resistive ratio for READ operations. For example, the boundary resistive ratio for SET VERIFY operations can be closer to the boundary resistive ratio for READ operations or the boundary resistive ratio for RESET VERIFY operations can be closer to the boundary resistive ratio for READ operations.

READ operations of combinational resistive change elements adjustable (programmable) between at least three relational states that correspond with combinations of resistive states of resistive change elements having different resistive ratios when a combinational resistive change element is accessed in a manner such that the resistive change elements form a resistive divider use at least two boundary resistive ratios to separate resistive ratios of resistive dividers formed by resistive change elements of the combinational resistive change elements into groups of resistive ratios that correspond with relational states. A circuit designer typically selects the at least two boundary resistive ratios for READ operations of the combinational resistive change elements adjustable (programmable) between at least three relational states such that each boundary resistive ratio is at a midpoint or near a midpoint between adjacent model resistive ratios for relational states. It is noted that each of the at least two boundary resistive ratios for READ operations is not limited to being at a midpoint or near a midpoint between adjacent model resistive ratios for relational states, but rather each of the at least two boundary resistive ratios for READ operations can be closer to one of the adjacent model resistive ratios for relational states that the boundary resistive ratio for READ operations is between. It is further noted that VERIFY operations of the combinational resistive change elements adjustable (programmable) between at least three relational states require a closer correspondence between resistive ratios of resistive dividers formed by resistive change elements of combinational resistive change elements and model resistive ratios than READ operations.

READ operations of the combinational resistive change element S11 in the exemplary architecture of FIGS. 3H-1 and 3H-2 will be explained in detail below and READ operations of each combinational change resistive change element in the exemplary architecture of FIGS. 3H-1 and 3H-2 can be performed in a similar manner to the READ operations of the combinational resistive change element S11. FIGS. 3L-1 and 3L-2 illustrate a simplified schematic diagram showing current flow during a READ operation of the combinational resistive change element S11 in the exemplary architecture of FIGS. 3H-1 and 3H-2 when the combinational resistive change element S11 has a low relational state. FIGS. 3M-1 and 3M-2 illustrate a simplified schematic diagram showing current flow during a READ operation of the combinational resistive change element S11 in the exemplary architecture of FIGS. 3H-1 and 3H-2 when the combinational resistive change element S11 has a high relational state.

A READ operation of the combinational resistive change element S11 starts, as similarly discussed above in step 502 of flow chart 500, by selecting the combinational resistive change element S11 from the plurality of combinational resistive change elements S00-S$xy$. As discussed above, the combinational resistive change element array 300 is configured to include a plurality of combinational resistive change elements S00-S$xy$ using a correspondence where each combinational resistive change element in the plurality of combinational resistive change elements S00-S$xy$ includes a resistive change element from the plurality of resistive change elements S00$a$-S$xya$ located in section A and a resistive change element from the plurality of a resistive change elements S00$b$-S$xyb$ located in section B at matching locations in matrices and a conductive structure providing an electrical communication path between the resistive change element from the plurality of resistive change elements S00$a$-S$xya$ located in section A and the resistive change element from the plurality of a resistive change elements S00$b$-S$xyb$ located in section B. The combinational resistive change element S11 is selected from the plurality of combinational resistive change elements S00-S$xy$ by control logic, such as a processor, a controller, and a microcontroller. The combinational resistive change elements S00-S$x$0, S01, S$x$1, S0$y$-S$xy$ in the plurality of combinational resistive change elements S00-S$xy$ that are not selected are referred to as unselected combinational resistive change elements.

The READ operation of the combinational resistive change element S11 continues, as similarly discussed above in step 504 of flow chart 500, by applying conditions to inhibit change in relational states of the unselected combinational resistive change elements S00-S$x$0, S01, S$x$1, S0$y$-S$xy$. A condition to inhibit change in a relational state of a combinational resistive change element is applied to a combinational resistive change element by limiting the voltage across each of the resistive change elements of the combinational resistive change element to a voltage level less than a voltage level that would cause a resistive change element to change resistive states. Conditions to inhibit change in relational states of the unselected combinational resistive change elements S00-S$x$0, S01, S$x$1, S0$y$-S$xy$ are applied to the unselected combinational resistive change elements S00-S$x$0, S01, S$x$1, S0$y$-S$xy$ by driving the word lines W1(0), W1($y$) to the inhibit voltage Vinhibit, driving the word lines W2(0), W2($y$) to the inhibit voltage Vinhibit, and driving the bit lines B1(0), B1($x$) to the inhibit voltage Vinhibit. The word lines W1(0), W1($y$) are driven to the inhibit voltage Vinhibit by turning on the first NMOS transistors 312$a$, 332$a$ in the word line driver circuits 310$a$, 330$a$. The word lines W2(0), W2($y$) are driven to the inhibit voltage Vinhibit by turning on the first NMOS transistors 312$b$, 332$b$ in the word line driver circuits 310$b$, 330$b$. The bit lines B1(0), B1($x$) are driven to the inhibit voltage Vinhibit by turning on the first NMOS transistors 342, 362 in the bit line driver circuits 340, 360.

The READ operation of the combinational resistive change element S11 proceeds, as similarly discussed above in step 506 of flow chart 500, by applying an electrical stimulus to the combinational resistive change element S11 such that the resistive change element S11$a$ and the resistive change element S11$b$ form a resistive divider where the resistive change element S11$a$ is a top resistive change element and the resistive change element S11$b$ is a bottom resistive change element. The electrical stimulus is applied to the combinational resistive change element S11 such that the resistive change element S11$a$ and the resistive change element S11$b$ form a resistive divider where the resistive change element S11$a$ is a top resistive change element and the resistive change element S11$b$ is a bottom resistive change element by driving the word line W1(1) to the read voltage Vread and driving the word line W2(1) to 0 volts or ground. The word line W1(1) is driven to the read voltage Vread by turning on the second NMOS transistor 323$a$ in the word line driver circuit 320$a$. The word line W2(1) is driven to 0 volts or ground by turning on the second NMOS transistor 324$b$ in the word line driver circuit 320$b$.

A resistive ratio of the resistive divider formed by the resistive change element S11$a$ and the resistive change element S11$b$ can be approximated as resistive ratio= (RS11$b$/RS11$a$+RS11$b$)), where RS11$a$ is the resistance of resistive change element S11$a$ and RS11$b$ is the resistance of the resistive change element S11$b$. The voltage VB1(1) on the bit line B1(1), ignoring leakage currents, can be approximated using the resistive ratio of the resistive divider formed the resistive change element S11$a$ and the resistive change element S11$b$ and the read voltage Vread as VB1(1)=Vread (RS11$b$/(RS11$a$+RS11$b$)). As shown by this equation, the voltage VB1(1) on the bit line B1(1) changes when the resistance of resistive change element S11a and/or the resistance of resistive change element S11b changes because the read voltage Vread is generally constant. When the combinational resistive change element S11 has a low relational state, as shown in FIGS. 3L-1 and 3L-2, the resistive change element S11a has a resistance of 10 MΩ, the resistive change element S11b has a resistance of 1 MΩ, and the read voltage Vread is 1 volt, the voltage VB1(1)=1V (1 MΩ/(10MΩ+1 MΩ))=$\frac{1}{11}$V. When the combinational resistive change element S11 has a high relational state, as shown in FIGS. 3M-1 and 3M-2, the resistive change element S11a has a resistance of 1 MΩ, the resistive change element S11b has a resistance of 10 MΩ, and the read voltage Vread is 1 volt, the voltage VB1(1)=1V (10 MΩ/(1 MΩ+10 MΩ))=$\frac{10}{11}$V.

The same amount of current, ignoring leakage currents, flows through the resistive change element S11a and the resistive change element S11b. A current I11 flows from the word line W1(1) through the resistive change element S11a into the bit line B1(1) and the current I11 flows from the bit line B1(1) through the resistive change element S11b into the word line W2(1), as shown in FIGS. 3L-1 and 3L-2 and FIGS. 3M-1 and 3M-2, because the word line W1(1) is driven to the read voltage Vread and the word line W2(1) is driven to 0 volts or ground. The amount of the current I11, ignoring leakage currents, can be approximated using Ohm's Law as I11=Vread/RS11, where RS11 is the resistance of the combinational resistive change element S11. The resistance of the combinational resistive change element S11 is approximated as the sum of the resistance of the resistive change element S11a and the resistance of the resistive change element S11b. When the combinational resistive change element S11 has a low relational state, as shown in FIGS. 3L-1 and 3L-2, the resistive change element S11a has a high resistive state of 10 MΩ, the resistive change element S11b has a low resistive state of 1 MΩ, and the read voltage Vread is 1 volt, the amount of the current I11, ignoring leakage currents, can be approximated using Ohm's Law as I11=1 V/11 MΩ=$\frac{1}{11}$ μA. When the combinational resistive change element S11 has a high relational state, as shown in FIGS. 3M-1 and 3M-2, the resistive change element S11a has a low resistive state of 1 MΩ, the resistive change element S11b has a high resistive state of 10 MΩ, and the read voltage Vread is 1 volt, the amount of the current I11, ignoring leakage currents, can be approximated using Ohm's Law as I11=1 V/11 MΩ=$\frac{1}{11}$ μA.

FIGS. 3L-1 and 3L-2 and FIGS. 3M-1 and 3M-2 also show leakage currents flowing through resistive change elements located in the same row or the same column as resistive change element S11a in the plurality of resistive change elements S00a-Sxya located in section A and leakage currents flowing through resistive change elements located in the same row or the same column as resistive change element S11b in the plurality of resistive change elements S00b-Sxyb located in section B. The leakage currents are shown using dashed lines in FIGS. 3L-1 and 3L-2 and FIGS. 3M-1 and 3M-2. When the voltage VB1(1) on the bit line B1(1) is less than the inhibit voltage Vinhibit leakage currents flow into the bit line B1(1) through the other resistive change elements located in the same columns as the resistive change element S11a and the resistive change element S11b, as shown in FIGS. 3L-1 and 3L-2, and pull up the voltage VB1(1) on the bit line B1(1). When the voltage VB1(1) on the bit line B1(1) is greater than the inhibit voltage Vinhibit leakage currents flow from the bit line B1(1) through the other resistive change elements in the same columns as the resistive change element S11a and the resistive change element S11b, as shown in FIGS. 3M-1 and 3M-2, and pull down the voltage VB1(1) on the bit line B1(1). It is noted that when the voltage VB1(1) on the bit line B1(1) is pulled up by leakage currents flowing into the bit line B1(1) and when the voltage VB1(1) on the bit line B1(1) is pulled down by leakage currents flowing from the bit line B1(1), the number of the word lines W1(0), W1(y), W2(0), W2(y) should be small enough to allow a margin to determine a relational state of the selected combinational resistive change element. Also, as shown in FIG. 3L-2 and FIG. 3M-2, leakage currents flow through other resistive change elements located in the same row as the resistive change element S11a because the read voltage Vread is greater than the inhibit voltage Vinhibit. Additionally, as shown in FIG. 3L-1 and FIG. 3M-1, leakage currents flow through other resistive change elements located in the same row as the resistive change element S11b because the inhibit voltage Vinhibit is greater than 0 volts or ground.

The READ operation of the combinational resistive change element S11 continues, as similarly discussed above in step 508 of flow chart 500, by determining a relational state of the combinational resistive change element S11 based on the resistive ratio of the resistive divider formed by the resistive change element S11a and the resistive change element S11b. The relational state of the combinational resistive change element S11 is determined by comparing a voltage indicative of the resistive ratio of the resistive divider formed by the resistive change element S11a and the resistive change element S11b with a voltage indicative of a boundary resistive ratio for READ operations. When the voltage indicative of the resistive ratio of the resistive divider formed by the resistive change element S11a and the resistive change element S11b is less than or equal to the voltage indicative of the boundary resistive ratio for READ operations the relational state of the combinational resistive change element S11 is determined to be a low relational state. When the voltage indicative of the resistive ratio of the resistive divider formed by the resistive change element S11a and the resistive change element S11b is greater than the voltage indicative of the boundary resistive ratio for READ operations the relational state of the combinational resistive change element S11 is determined to be a high relational state.

As discussed above, the voltage VB1(1) on the bit line B1(1) is based on the read voltage Vread and the resistive ratio of the resistive divider formed by the resistive change element S11a and the resistive change element S11b. The voltage VB1(1) on the bit line B1(1) is indicative of the relational state of the combinational resistive change element S11 because the voltage level of the read voltage Vread is the same for both a low relational state and a high relational state, while the resistive ratio of the resistive divider formed by the resistive change element S11a and the resistive change element S11b is different for a low relational state and a high relational state. A voltage indicative of a boundary resistive ratio for READ operations is determined by multiplying the boundary resistive ratio for READ operations and the read voltage Vread. For example, when the boundary resistive ratio for READ operations is ½ and the read voltage Vread is 1 volt, the voltage indicative of the boundary resistive ratio for READ operations is voltage= (½)×1V=½V. A voltage indicative of the boundary resistive ratio for READ operations can be supplied by a power supply, a voltage source, a driver circuit, a resistive divider, a control circuit such as a processor, a controller, and a microcontroller, or other device. Alternatively, a voltage indicative of the boundary resistive ratio for READ operations can be a voltage parameter of a component, such an input voltage level of an inverter where the inverter switches between outputting a low signal and a high signal. Alternatively, a voltage indicative of the boundary resistive ratio for READ operations can be a number stored in a logic circuit or a control circuit, such as a processor, a controller, and a microcontroller.

The boundary resistive ratio for the READ operations shown in FIGS. 3L-1 and 3L-2 and FIGS. 3M-1 and 3M-2 is boundary resistive ratio=½. FIG. 3L-2 and FIG. 3M-2 show the sense amplifier 372 receiving the voltage VB1(1) on the first input terminal and a voltage of ½ the read voltage Vread on the second input terminal. The sense amplifier 372 determines the relational state of the combinational resistive change element S11 by comparing the voltage VB1(1) on bit line B1(1), which is indicative of the resistive ratio of the resistive divider formed by the resistive change element S11$a$ and the resistive change element S11$b$, with the voltage of ½ the read voltage Vread, which is indicative of the boundary resistive ratio of ½. The sense amplifier 372 outputs a signal indicative of the relational state of the combinational resistive change element S11 on the output terminal. When the resistive ratio of the resistive divider formed by the resistive change element S11$a$ and the resistive change element S11$b$ is less than or equal to ½, the voltage VB1(1) on the bit line B1(1) is less than or equal to the voltage of ½ the read voltage Vread and the sense amplifier 372 outputs a signal indicating the combinational resistive change element S11 has a low relational state. When the combinational resistive change element S11 has a low relational state, as shown in FIGS. 3L-1 and 3L-2, RS11$a$=10 MΩ, RS11$b$=1 MΩ, the resistive ratio of the resistive divider formed by the resistive change element S11$a$ and the resistive change element S11$b$ is resistive ratio=$1/11$, Vread=1V, VB1(1)=$1/11$V, and ½(Vread)=½V, the sense amplifier 372 outputs a signal indicating that the combinational resistive change element S11 has a low relational state. When the resistive ratio of the resistive divider formed by the resistive change element S11$a$ and the resistive change element S11$b$ is greater than ½, the voltage VB1(1) on the bit line B1(1) is greater than the voltage of ½ the read voltage Vread and the sense amplifier 372 outputs a signal indicating the combinational resistive change element S11 has a high relational state. When the combinational resistive change element S11 has a high relational state, as shown in FIGS. 3M-1 and 3M-2, RS11$a$=1 MΩ, RS11$b$=10 MΩ, the resistive ratio of the resistive divider formed by the resistive change element S11$a$ and the resistive change element S11$b$ is resistive ratio=$10/11$, Vread=1V, VB1(1)=$10/11$V, and ½(Vread)=½V, the sense amplifier 372 outputs a signal indicating that the combinational resistive change element S11 has a high relational state.

Figures 1, 3I:
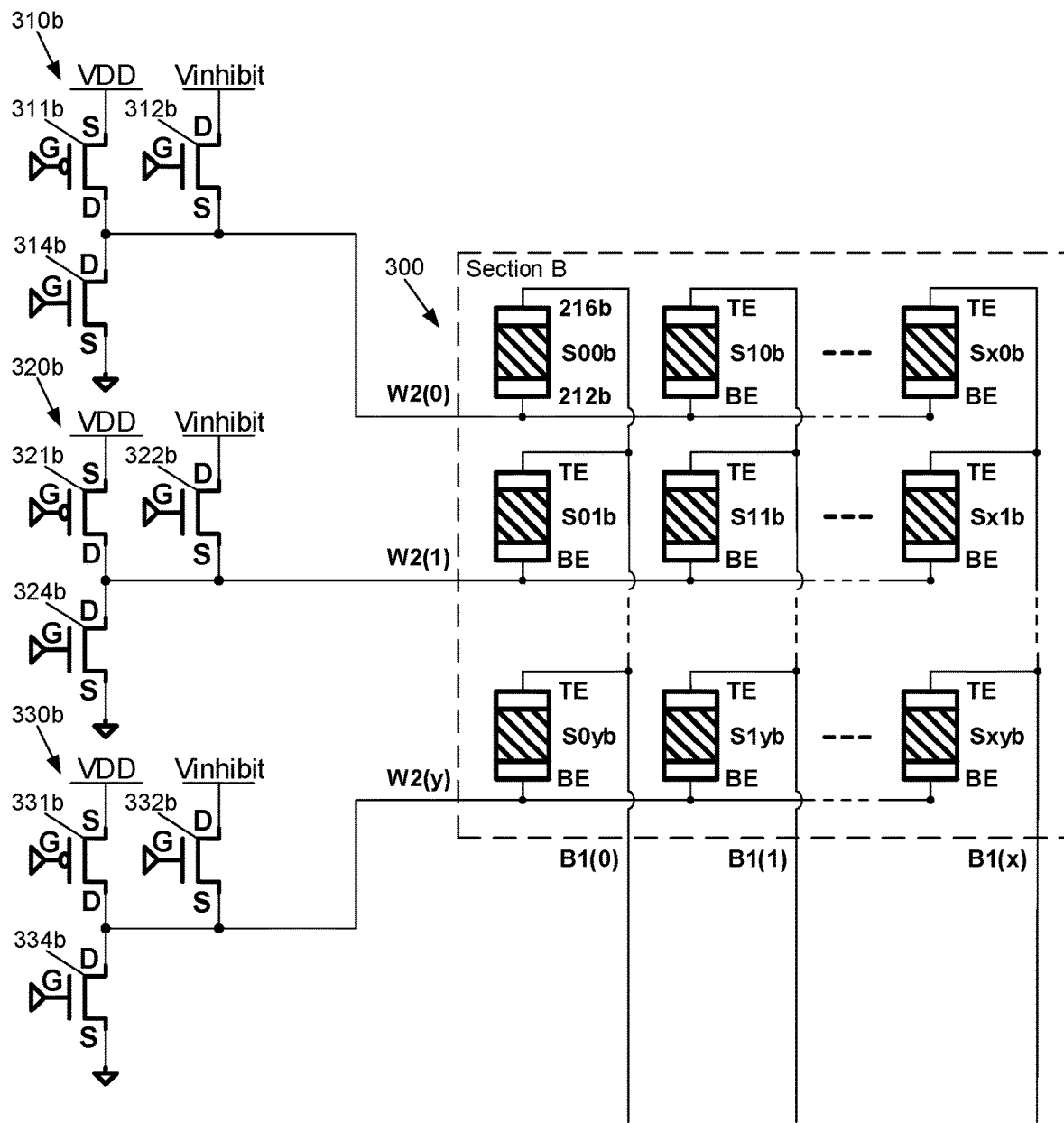
Figures 2, 3I:
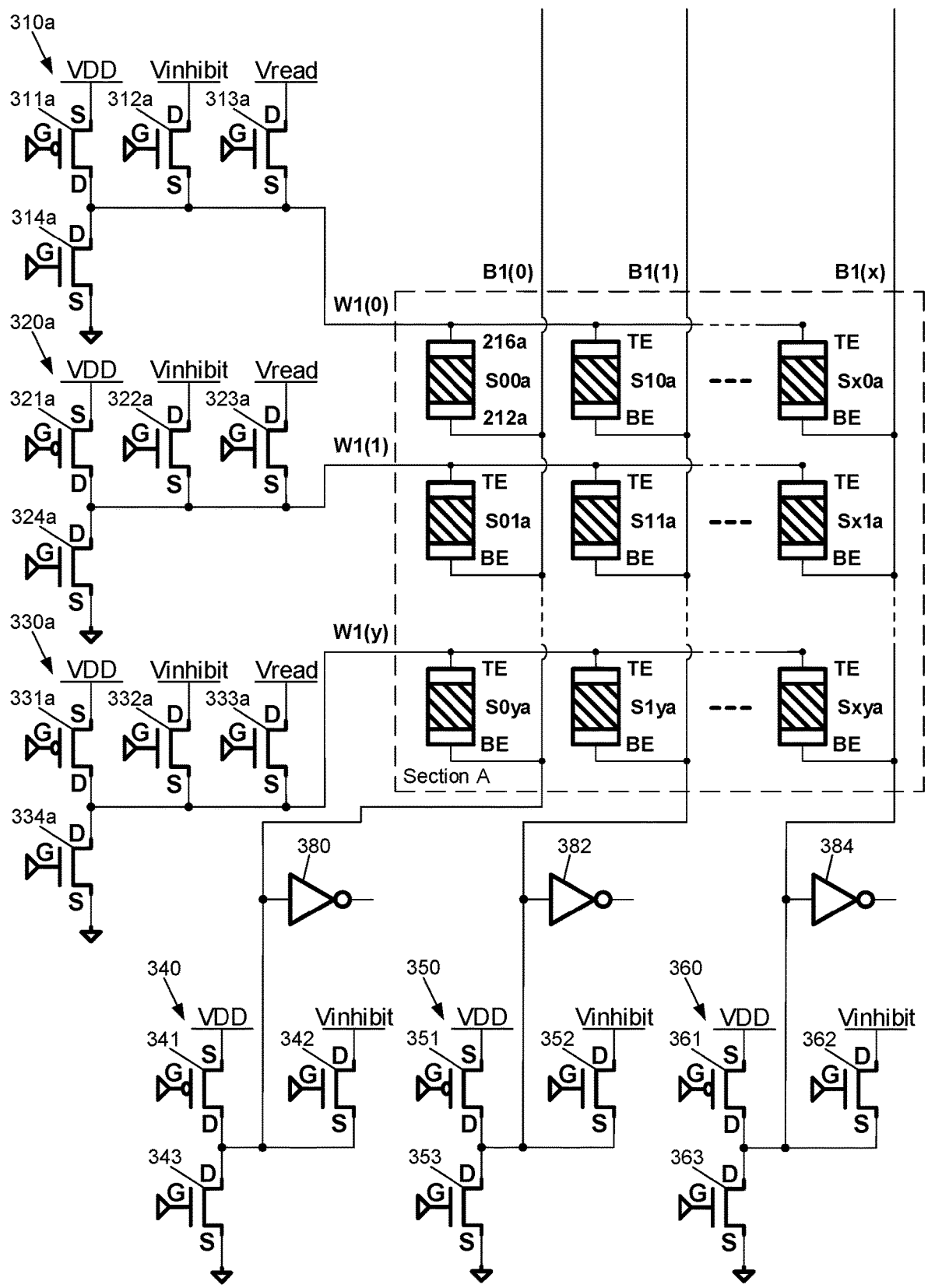
Figures 1, 3J:
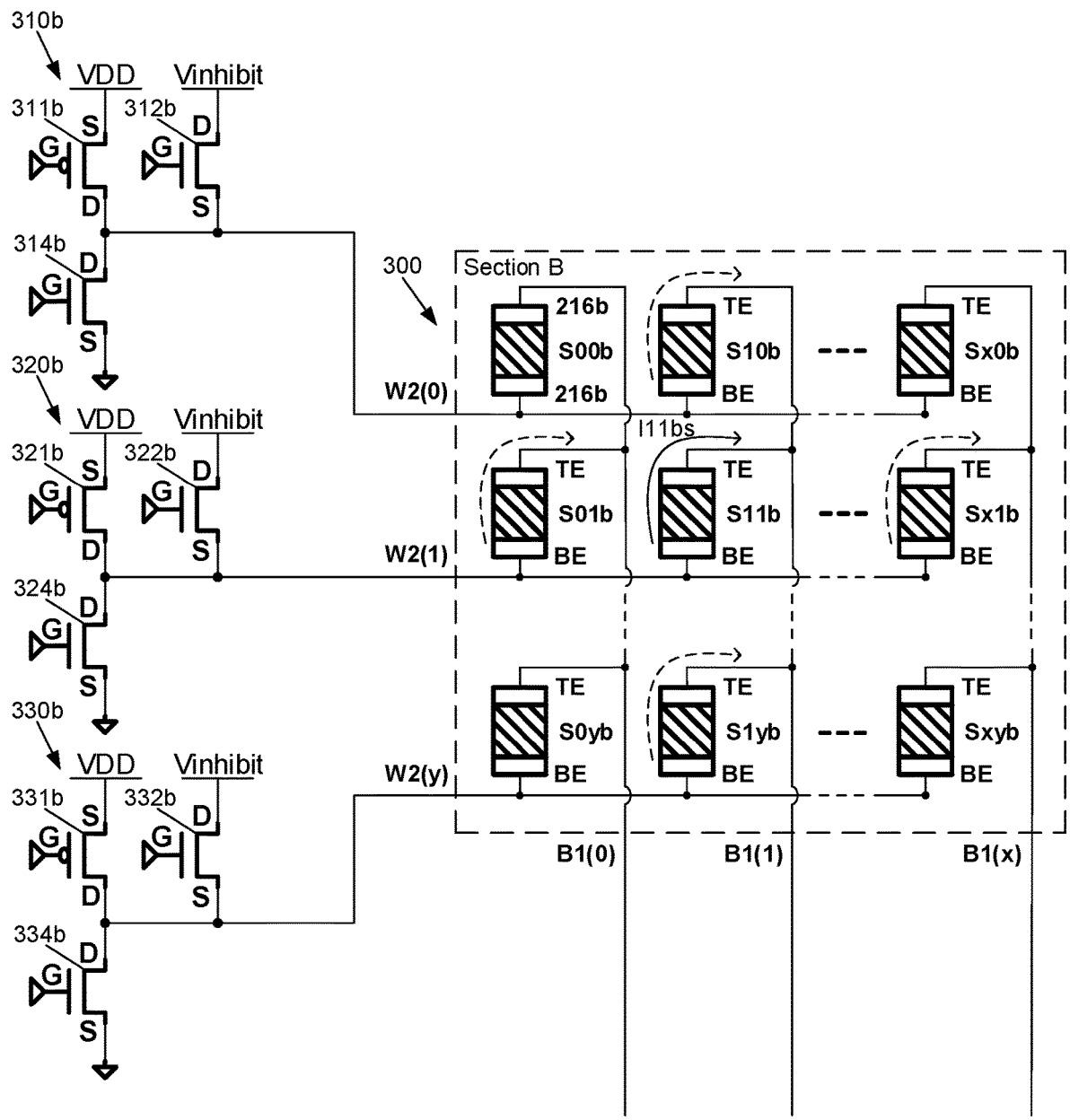
Figures 2, 3J:
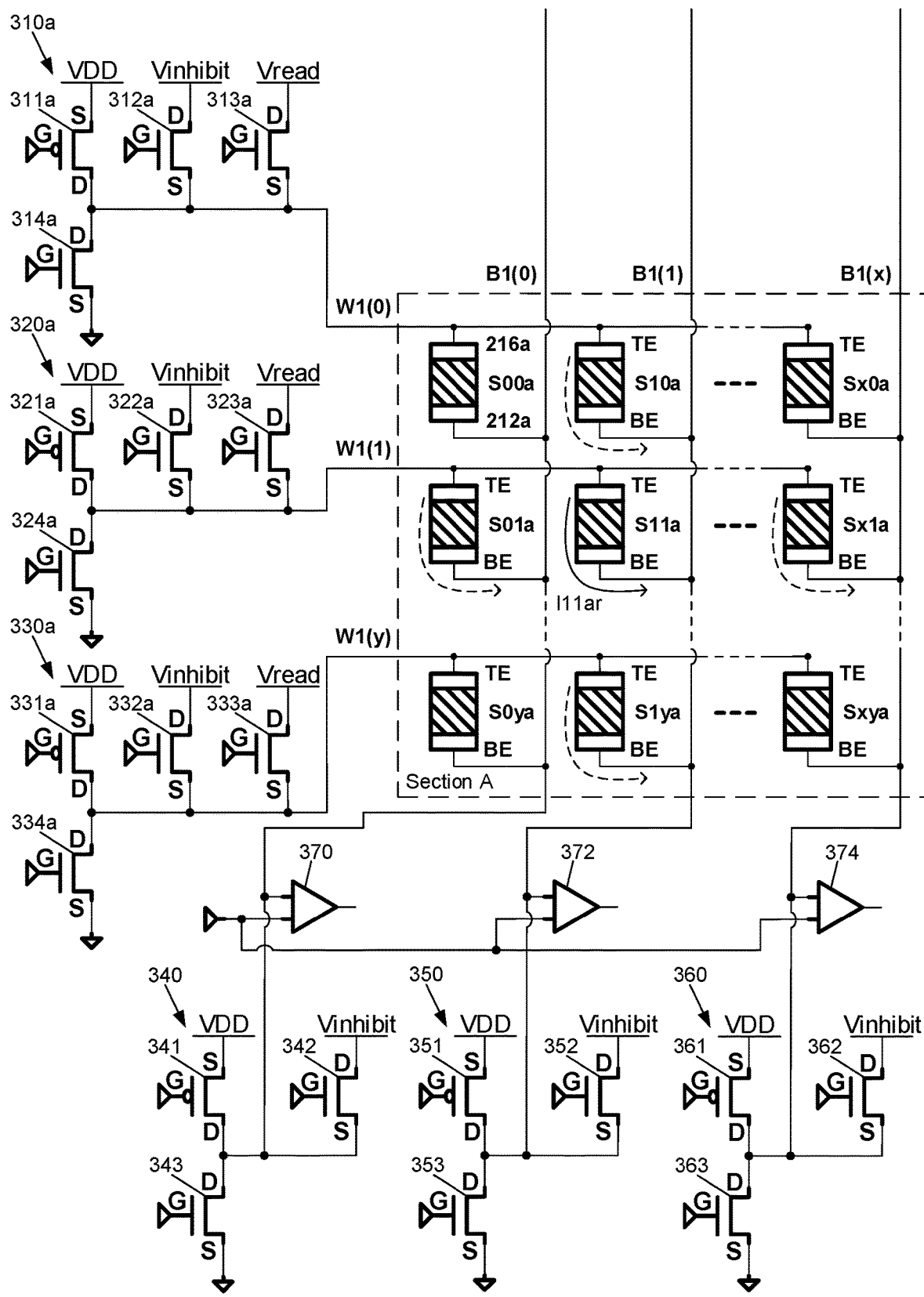
Figures 1, 3K:
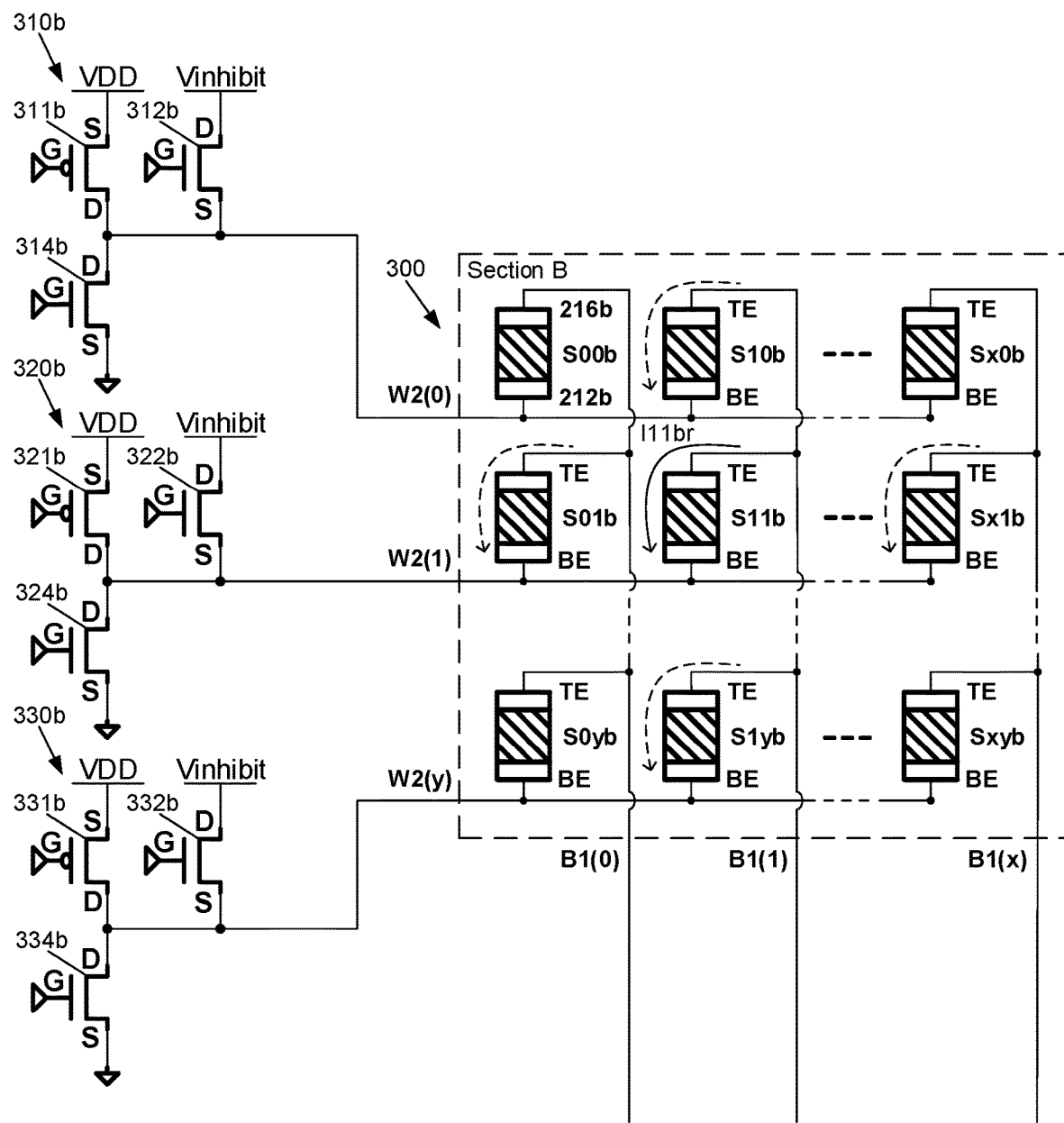
Figures 2, 3K:
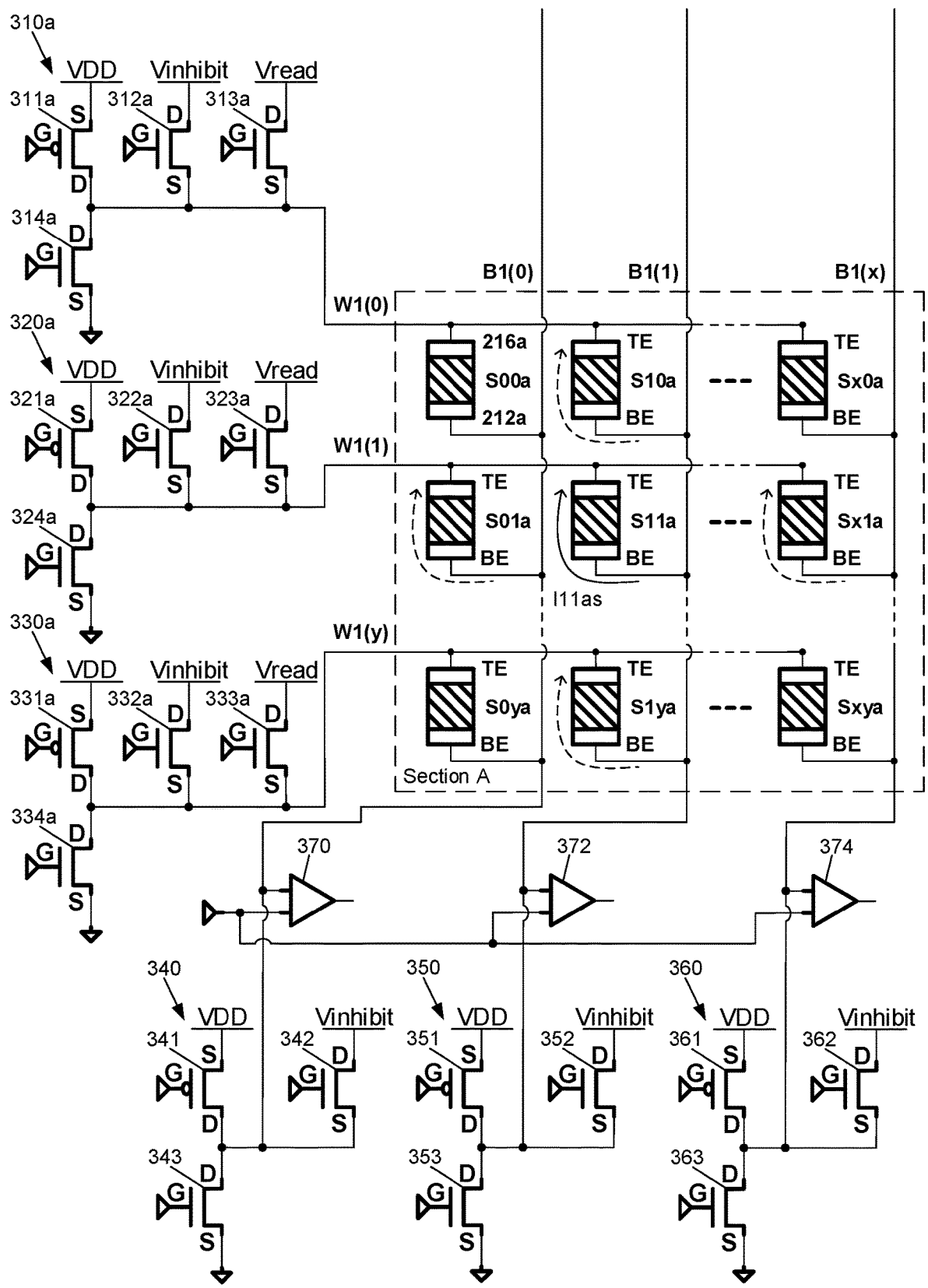
Figures 1, 3L:
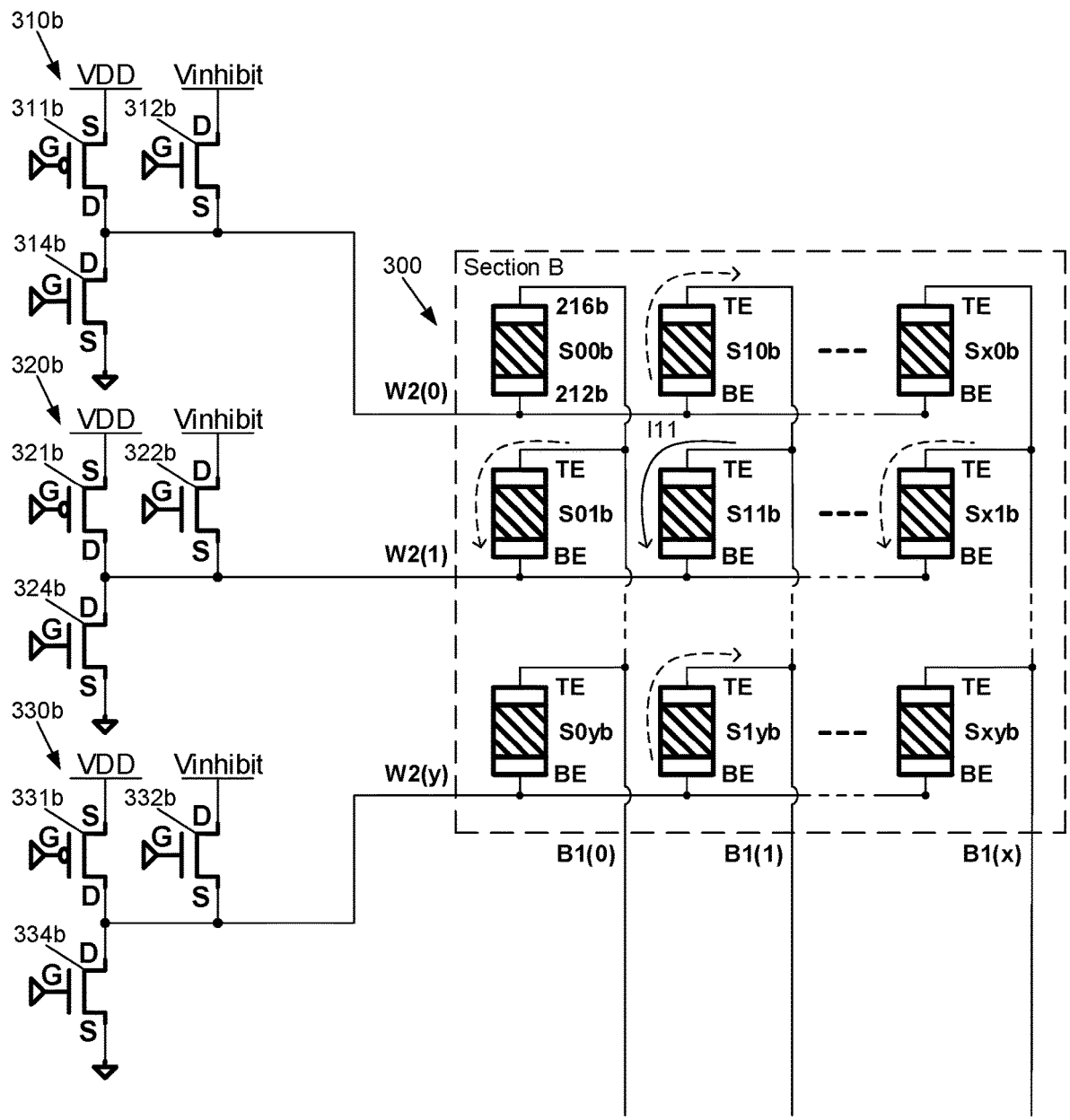
Figures 2, 3L:
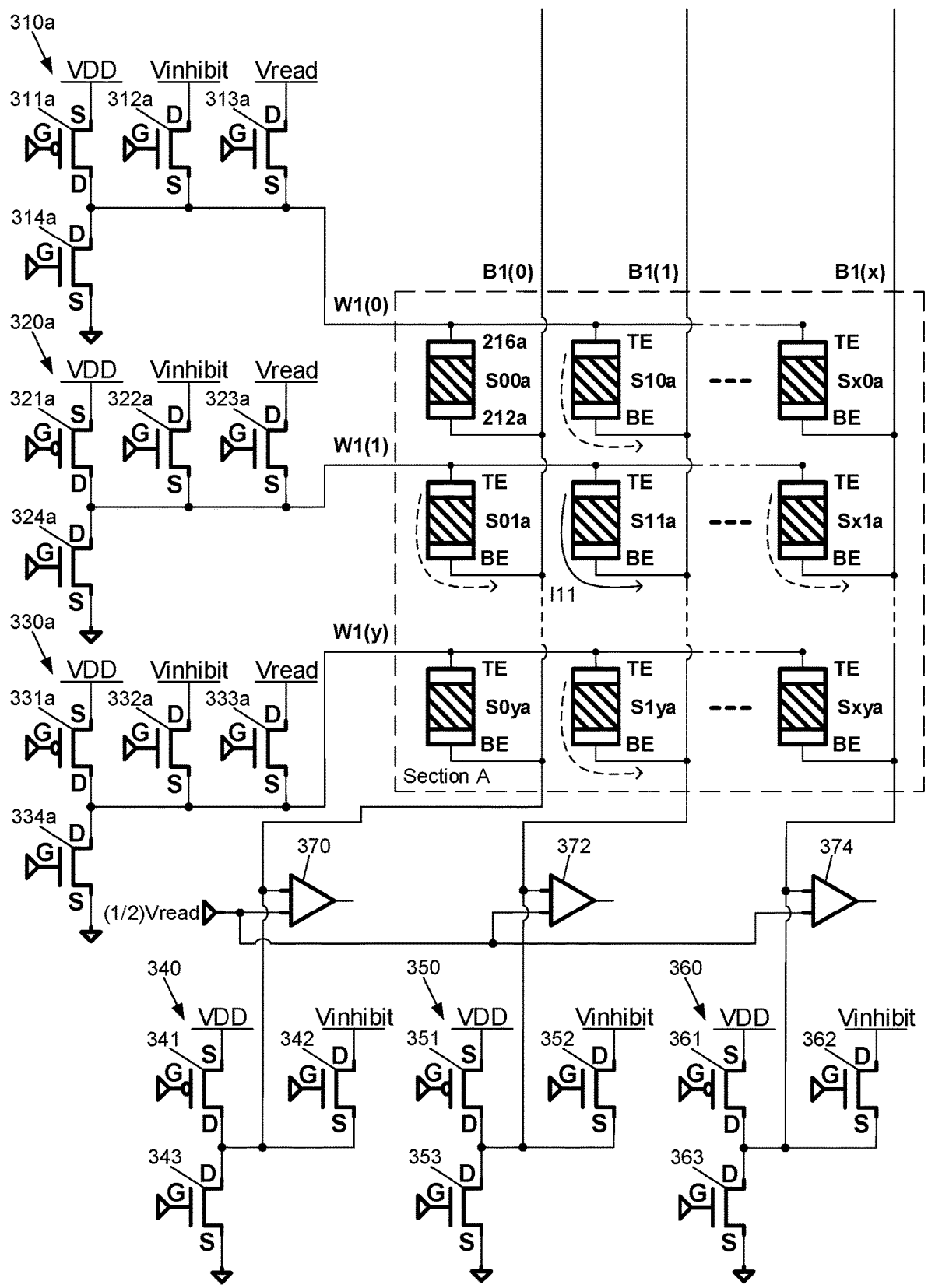
Figures 1, 3M:
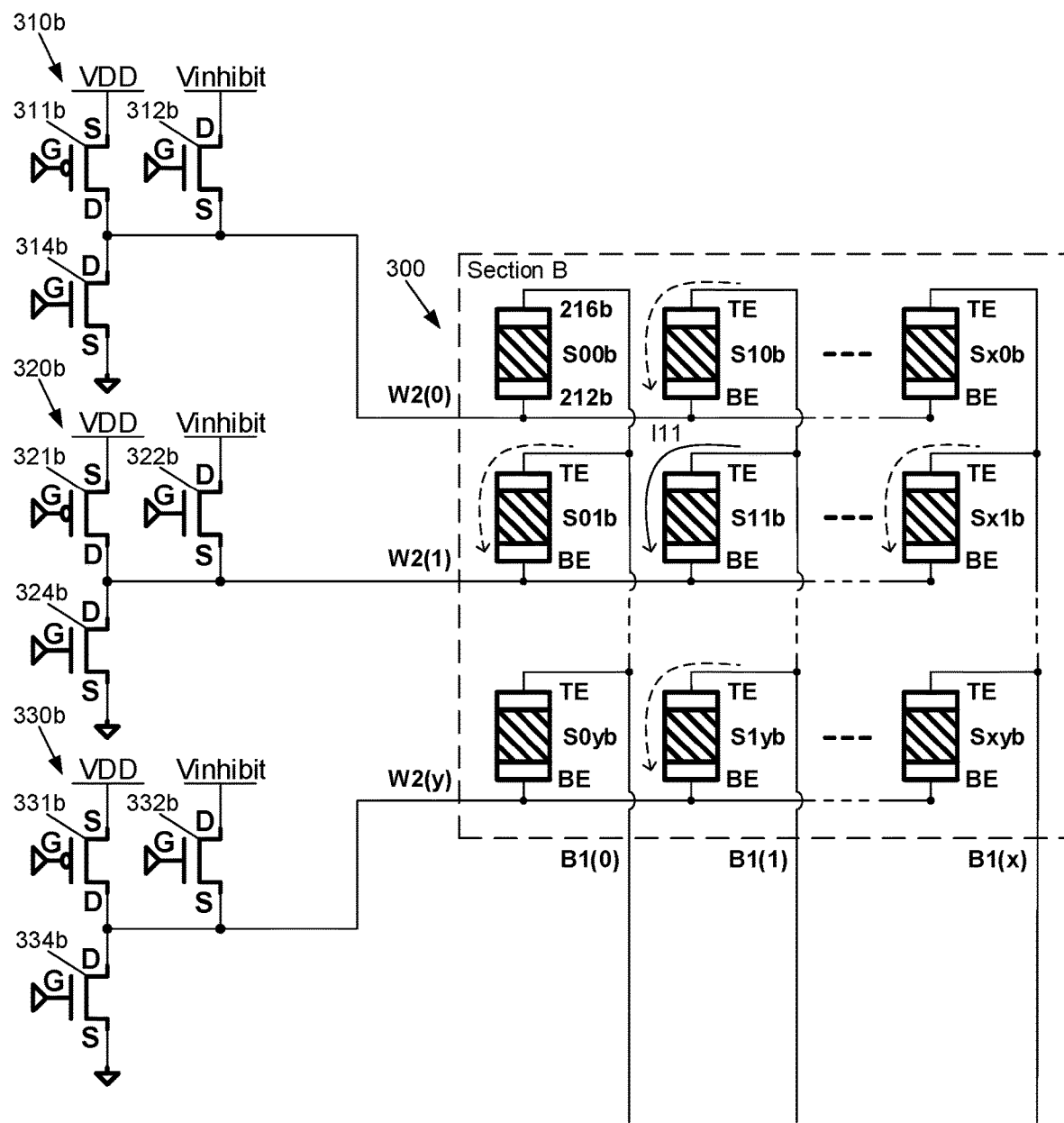
Figures 2, 3M:
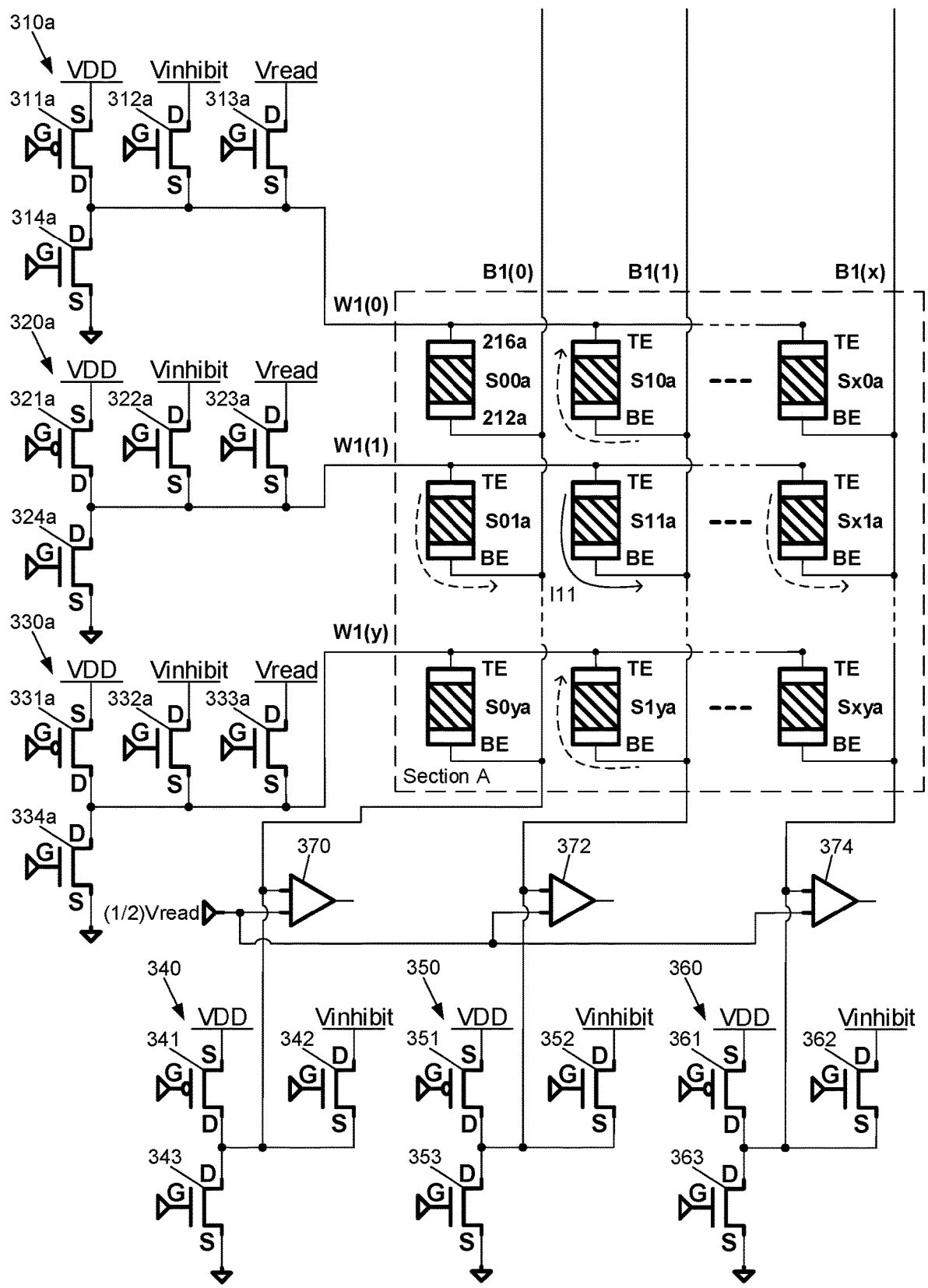

Alternatively, when the sense amplifiers 370, 372, 374 in the plurality of sense devices 306 are replaced with a plurality of inverters 380, 382, 384 as shown in the exemplary architecture of FIGS. 3I-1 and 3I-2, the input voltage level where each inverter in the plurality of inverters 380, 382, 384 switches between outputting a low signal and outputting a high signal can be used as a voltage indicative of a boundary resistive ratio for READ operations. For example, when an input voltage level where the inverter 382 switches between outputting a low signal and a high signal is ½V and the read voltage Vread is 1V, the input voltage level where the inverter 382 switches output signals is indicative of a boundary resistive ratio for READ operations of boundary resistive ratio=½.

Referring now to FIGS. 3I-1 and 3I-2, the inverter 382 receives the voltage VB1(1) on the bit line B1(1) on the input terminal. The inverter 382 determines the relational state of the combinational resistive change element S11 by comparing the voltage VB1(1) on the bit line B1(1), which is indicative of the resistive ratio of the resistive divider formed by the resistive change element S11$a$ and the resistive change element S11$b$, with the input voltage level where the inverter 382 switches between outputting a low signal and outputting a high signal, which is indicative of the boundary resistive ratio for READ operations. The inverter 382 outputs a signal indicative of the relational state of the combinational resistive change element S11 on the output terminal. When the resistive ratio of the resistive divider formed by the resistive change element S11$a$ and the resistive change element S11$b$ is less than or equal to a boundary resistive ratio for READ operations, the inverter 382 outputs a signal indicating the combinational resistive change element S11 has a low relational state. For example, when RS11$a$=10 MΩ, RS11$b$=1 MΩ, the resistive ratio of the resistive divider formed by the resistive change element S11$a$ and the resistive change element S11$b$ is resistive ratio=$1/11$, Vread=1V, VB1(1)=$1/11$V, and the voltage where the inverter 382 switches output signals is ½V, the inverter 382 outputs a signal indicating that the combinational resistive change element S11 has a low relational state. When the resistive ratio of the resistive divider formed by the resistive change element S11$a$ and the resistive change element S11$b$ is greater than a boundary resistive ratio for READ operations, the inverter 382 outputs a signal indicating the combinational resistive change element S11 has a high relational state. For example, when RS11$a$=1 MΩ, RS11$b$=10 MΩ, the resistive ratio of the resistive divider formed by the resistive change element R11$a$ and the resistive change element R11$b$ is resistive ratio=$10/11$, Vread=1V, VB1(1)=$10/11$V, and the voltage where the inverter 382 switches output signals is ½V, the inverter 382 outputs a signal indicating that the combinational resistive change element S11 has a high relational state.

Alternatively, when the plurality of sense amplifiers 370, 372, 374 are omitted from the exemplary architecture shown in FIGS. 3H-1 and 3H-2 and the plurality of bit lines B1(0)-B1($x$) are in electrical communication with a logic circuit, or a control circuit such as a processor, a controller, and a microcontroller, a voltage level indicative of a boundary resistive ratio for READ operations is stored in the logic circuit or the control circuit. The logic circuit or the control circuit determines the relational state of the combinational resistive change element S11 by comparing the voltage VB1(1) on bit line B1(1), which is indicative of the resistive ratio of the resistive divider formed by the resistive change element S11$a$ and the resistive change element S11$b$, with the voltage level indicative of a boundary resistive ratio for READ operations. Additionally, the logic circuit or the control circuit can output a signal indicative of the relational state of the combinational resistive change element S11.

Figures 1, 3N:
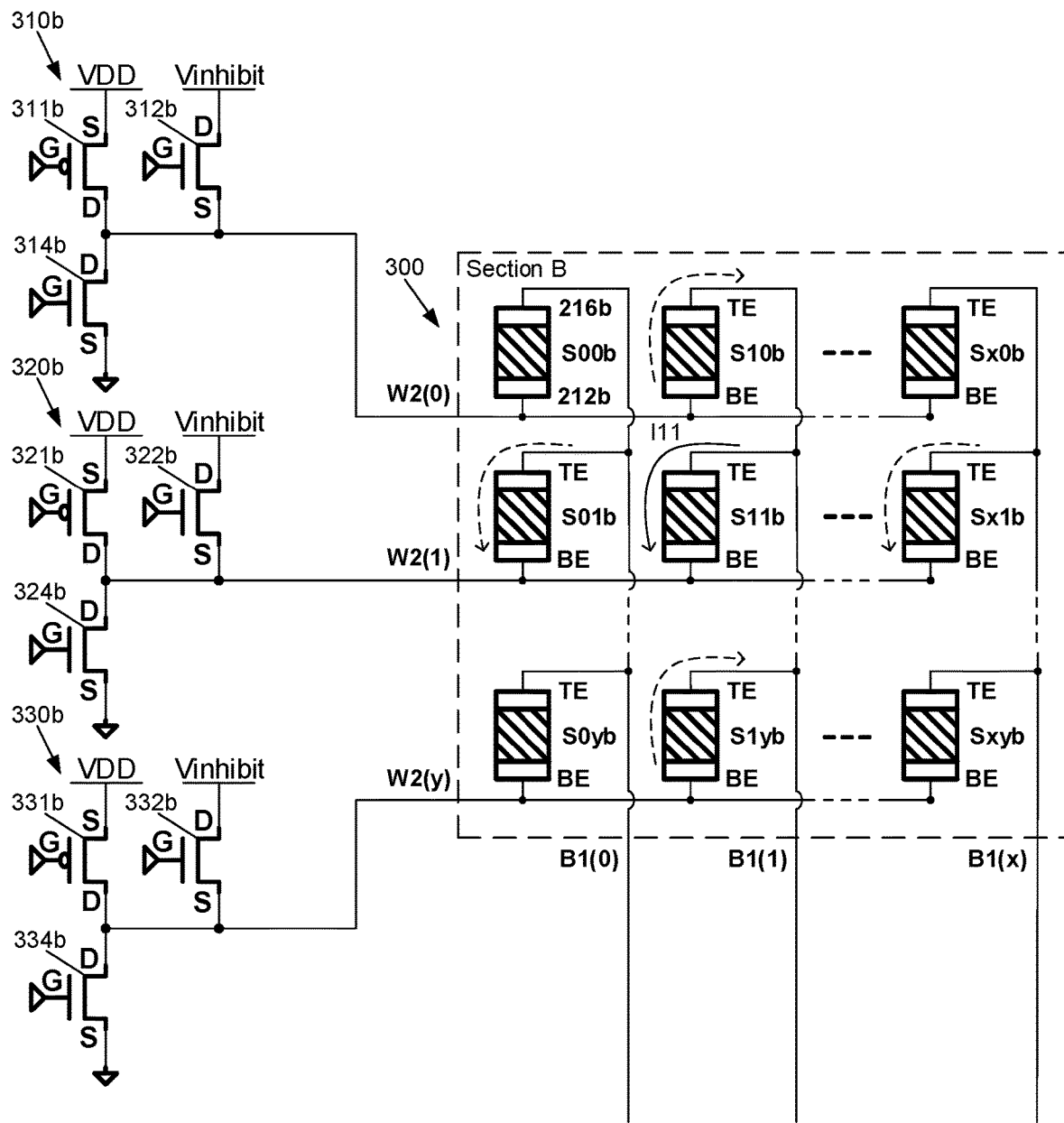
Figures 2, 3N:
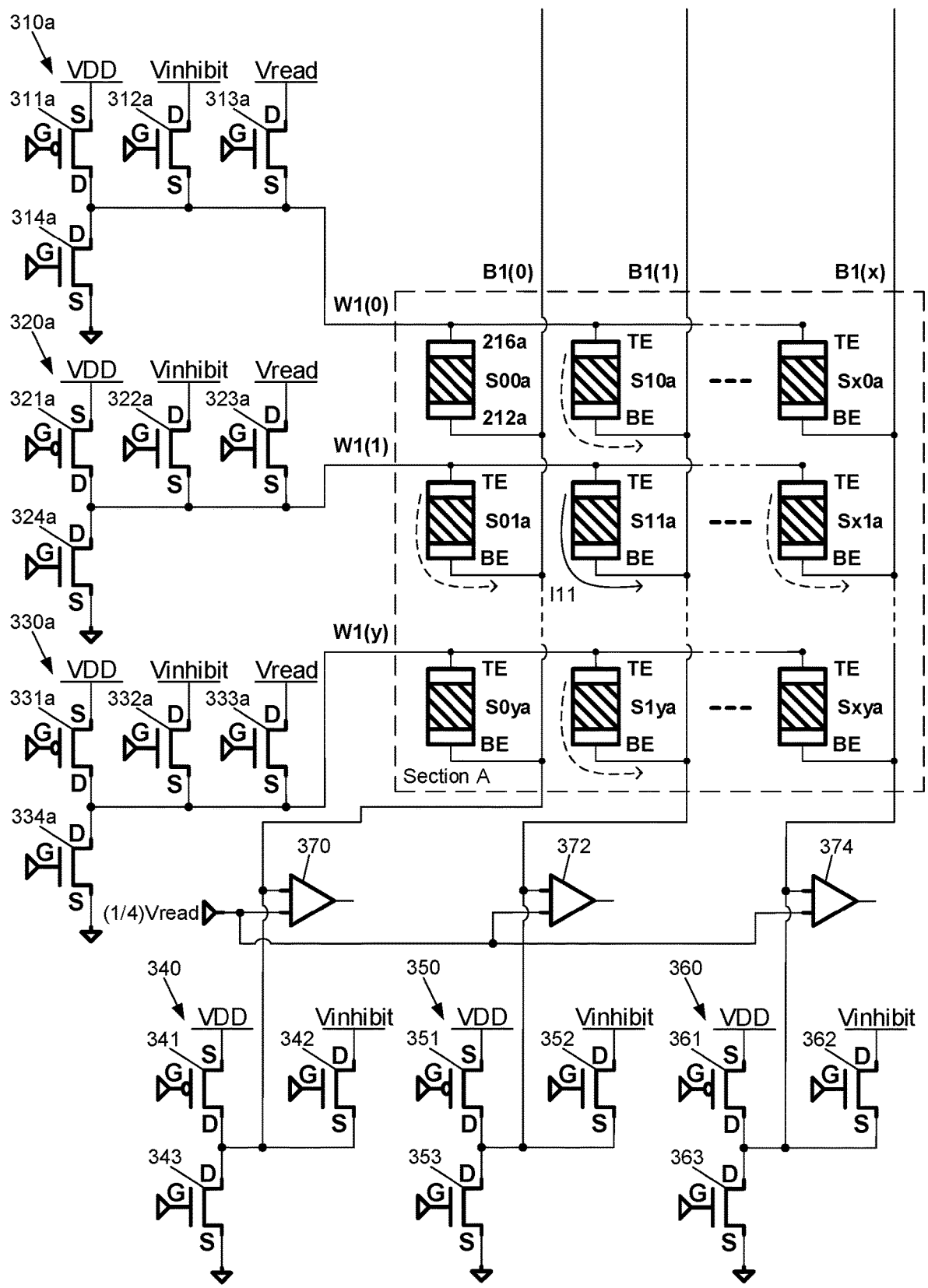

SET VERIFY operations of the combinational resistive change element S11 in the exemplary architecture of FIGS. 3H-1 and 3H-2 will be explained in detail below and SET VERIFY operations of each combinational change resistive change element in the exemplary architecture of FIGS. 3H-1 and 3H-2 can be performed in a similar manner to the SET VERIFY operations of the combinational resistive change element S11. FIGS. 3N-1 and 3N-2 illustrate a simplified schematic diagram showing current flow during a SET VERIFY operation of the combinational resistive change element S11 in the exemplary architecture of FIGS. 3H-1 and 3H-2 when the combinational resistive change element S11 has a low relational state.

A SET VERIFY operation of the combinational resistive change element S11 starts, as similarly discussed above in step 502 of flow chart 500, by selecting the combinational resistive change element S11 from the plurality of combinational resistive change elements S00-S$xy$. As discussed above, the combinational resistive change element array 300 is configured to include a plurality of combinational resistive change elements S00-S$xy$ using a correspondence where each combinational resistive change element in the plurality of combinational resistive change elements S00-S$xy$ includes a resistive change element from the plurality of resistive change elements S00$a$-S$xya$ located in section A and a resistive change element from the plurality of a resistive change elements S00$b$-S$xyb$ located in section B at matching locations in matrixes and a conductive structure providing an electrical communication path between the resistive change element from the plurality of resistive change elements S00$a$-S$xya$ located in section A and the resistive change element from the plurality of a resistive change elements S00$b$-S$xyb$ located in section B. The combinational resistive change element S11 is selected from the plurality of combinational resistive change elements S00-S$xy$ by control logic, such as a processor, a controller, and a microcontroller. The combinational resistive change elements S00-S$x$0, S01, S$x$1, S0$y$-S$xy$ in the plurality of combinational resistive change elements S00-S$xy$ that are not selected are referred to as unselected combinational resistive change elements.

The SET VERIFY operation of the combinational resistive change element S11 continues, as similarly discussed above in step 504 of flow chart 500, by applying conditions to inhibit change in relational states of the unselected combinational resistive change elements S00-S$x$0, S01, S$x$1, S0$y$-S$xy$. A condition to inhibit change in a relational state of a combinational resistive change element is applied to a combinational resistive change element by limiting the voltage across each of the resistive change elements of the combinational resistive change element to a voltage level less than a voltage level that would cause a resistive change element to change resistive states. Conditions to inhibit change in relational states of the unselected combinational resistive change elements S00-S$x$0, S01, S$x$1, S0$y$-S$xy$ are applied to the unselected combinational resistive change elements S00-S$x$0, S01, S$x$1, S0$y$-S$xy$ by driving the word lines W1(0), W1($y$) to the inhibit voltage Vinhibit, driving the word lines W2(0), W2($y$) to the inhibit voltage Vinhibit, and driving the bit lines B1(0), B1($x$) to the inhibit voltage Vinhibit. The word lines W1(0), W1($y$) are driven to the inhibit voltage Vinhibit by turning on the first NMOS transistors 312$a$, 332$a$ in the word line driver circuits 310$a$, 330$a$. The word lines W2(0), W2($y$) are driven to the inhibit voltage Vinhibit by turning on the first NMOS transistors 312$b$, 332$b$ in the word line driver circuits 310$b$, 330$b$. The bit lines B1(0), B1($x$) are driven to the inhibit voltage Vinhibit by turning on the first NMOS transistors 342, 362 in the bit line driver circuits 340, 360.

The SET VERIFY operation of the combinational resistive change element S11 proceeds, as similarly discussed above in step 506 of flow chart 500, by applying an electrical stimulus to the combinational resistive change element S11 such that the resistive change element S11$a$ and the resistive change element S11$b$ form a resistive divider where the resistive change element S11$a$ is a top resistive change element and the resistive change element S11$b$ is a bottom resistive change element. The electrical stimulus is applied to the combinational resistive change element S11 such that the resistive change element S11$a$ and the resistive change element S11$b$ form a resistive divider where the resistive change element S11$a$ is a top resistive change element and the resistive change element S11$b$ is a bottom resistive change element by driving the word line W1(1) to the read voltage Vread and driving the word line W2(1) to 0 volts or ground. The word line W1(1) is driven to the read voltage Vread by turning on the second NMOS transistor 323$a$ in the word line driver circuit 320$a$. The word line W2(1) is driven to 0 volts or ground by turning on the second NMOS transistor 324$b$ in the word line driver circuit 320$b$.

A resistive ratio of the resistive divider formed by the resistive change element S11$a$ and the resistive change element S11$b$ can be approximated as resistive ratio=(RS11$b$/(RS11$a$+RS11$b$)), where RS11$a$ is the resistance of resistive change element S11$a$ and RS11$b$ is the resistance of the resistive change element S11$b$. The voltage VB1(1) on the bit line B1(1), ignoring leakage currents, can be approximated using the resistive ratio of the resistive divider formed the resistive change element S11$a$ and the resistive change element S11$b$ and the read voltage Vread as VB1(1)=Vread (RS11$b$/(RS11$a$+RS11$b$)). As shown by this equation, the voltage VB1(1) on the bit line B1(1) changes when the resistance of resistive change element S11$a$ and/or the resistance of resistive change element S11$b$ changes because the read voltage Vread is generally constant. When the combinational resistive change element S11 has a low relational state, as shown in FIGS. 3N-1 and 3N-2, the resistive change element S11$a$ has a resistance of 10 MΩ, the resistive change element S11$b$ has a resistance of 1 MΩ, and the read voltage Vread is 1 volt, the voltage VB1(1) =1V(1 MΩ/(10 MΩ+1 MΩ))=$^{1}/_{11}$V. When the combinational resistive change element S11 has a high relational state, the resistive change element S11$a$ has a resistance of 1 MΩ, the resistive change element S11$b$ has a resistance of 10 MΩ, and the read voltage Vread is 1 volt, the voltage VB1(1)=1V(10 MΩ/(1 MΩ+10 MΩ))=$^{10}/_{11}$V.

The same amount of current, ignoring leakage currents, flows through the resistive change element S11$a$ and the resistive change element S11$b$. A current I11 flows from the word line W1(1) through the resistive change element S11$a$ into the bit line B1(1) and the current I11 flows from the bit line B1(1) through the resistive change element S11$b$ into the word line W2(1), as shown in FIGS. 3N-1 and 3N-2, because the word line W1(1) is driven to the read voltage Vread and the word line W2(1) is driven to 0 volts or ground. The amount of the current I11, ignoring leakage currents, can be approximated using Ohm's Law as I11=Vread/RS11, where RS11 is the resistance of the combinational resistive change element S11. The resistance of the combinational resistive change element S11 is approximated as the sum of the resistance of the resistive change element S11$a$ and the resistance of the resistive change element S11$b$. When the combinational resistive change element S11 has a low relational state, as shown in FIGS. 3N-1 and 3N-2, the resistive change element S11$a$ has a high resistive state of 10 MΩ, the resistive change element S11$b$ has a low resistive state of 1 MΩ, and the read voltage Vread is 1 volt, the amount of the current I11, ignoring leakage currents, can be approximated using Ohm's Law as I11=1 V/11 MΩ=$^{1}/_{11}$ μA. When the combinational resistive change element S11 has a high relational state, the resistive change element S11$a$ has a low resistive state of 1 MΩ, the resistive change element S11$b$ has a high resistive state of 10 MΩ, and the read voltage Vread is 1 volt, the amount of the current I11, ignoring leakage currents, can be approximated using Ohm's Law as I11=1 V/11 MΩ=$\frac{1}{11}$ μA.

FIGS. 3N-1 and 3N-2 also show leakage currents flowing through resistive change elements located in the same row or the same column as resistive change element S11a in the plurality of resistive change elements S00a-Sxya located in section A and leakage currents flowing through resistive change elements located in the same row or the same column as resistive change element S11b in the plurality of resistive change elements S00b-Sxyb located in section B. The leakage currents are shown using dashed lines in FIGS. 3N-1 and 3N-2. When the voltage VB1(1) on the bit line B1(1) is less than the inhibit voltage Vinhibit leakage currents flow into the bit line B1(1) through the other resistive change elements located in the same columns as the resistive change element S11a and the resistive change element S11b, as shown in FIGS. 3N-1 and 3N-2, and pull up the voltage VB1(1) on the bit line B1(1). When the voltage VB1(1) on the bit line B1(1) is greater than the inhibit voltage Vinhibit leakage currents flow from the bit line B1(1) through the other resistive change elements in the same columns as the resistive change element S11a and the resistive change element S11b and pull down the voltage VB1(1) on the bit line B1(1). It is noted that when the voltage VB1(1) on the bit line B1(1) is pulled up by leakage currents flowing into the bit line B1(1) and when the voltage VB1(1) on the bit line B1(1) is pulled down by leakage currents flowing from the bit line B1(1), the number of the word lines W1(0), W1(y), W2(0), W2(y) should be small enough to allow a margin to determine a relational state of the selected combinational resistive change element. Also, as shown in FIG. 3N-1, leakage currents flow through other resistive change elements located in the same row as the resistive change element S11a because the read voltage Vread is greater than the inhibit voltage Vinhibit. Additionally, as shown in FIG. 3N-2, leakage currents flow through other resistive change elements located in the same row as the resistive change element S11b because the inhibit voltage Vinhibit is greater than 0 volts or ground.

The SET VERIFY operation of the combinational resistive change element S11 continues, as similarly discussed above in step 508 of flow chart 500, by determining a relational state of the combinational resistive change element S11 based on the resistive ratio of the resistive divider formed by the resistive change element S11a and the resistive change element S11b. The relational state of the combinational resistive change element S11 is determined by comparing a voltage indicative of the resistive ratio of the resistive divider formed by the resistive change element S11a and the resistive change element S11b with a voltage indicative of a boundary resistive ratio for SET VERIFY operations. When the voltage indicative of the resistive ratio of the resistive divider formed by the resistive change element S11a and the resistive change element S11b is less than or equal to the voltage indicative of the boundary resistive ratio for SET VERIFY operations the relational state of the combinational resistive change element S11 is determined to be a low relational state. When the voltage indicative of the resistive ratio of the resistive divider formed by the resistive change element S11a and the resistive change element S11b is greater than the voltage indicative of the boundary resistive ratio for SET VERIFY operations the relational state of the combinational resistive change element S11 is determined to be a relational state other than a low relational state.

As discussed above, the voltage VB1(1) on the bit line B1(1) is based on the read voltage Vread and the resistive ratio of the resistive divider formed by the resistive change element S11a and the resistive change element S11b. The voltage VB1(1) on the bit line B1(1) is indicative of the relational state of the combinational resistive change element S11 because the voltage level of the read voltage Vread is the same for both a low relational state and a relational state other than a low relational state, while the resistive ratio of the resistive divider formed by the resistive change element S11a and the resistive change element S11b is different for a low relational state and a relational state other than a low relational state. A voltage indicative of a boundary resistive ratio for SET VERIFY operations is determined by multiplying the boundary resistive ratio for SET VERIFY operations and the read voltage Vread. For example, when the boundary resistive ratio for SET VERIFY operations is ¼ and the read voltage Vread is 1 volt, the voltage indicative of the boundary resistive ratio for SET VERIFY operations is voltage=(¼)×1V=¼V. A voltage indicative of the boundary resistive ratio for SET VERIFY operations can be supplied by a power supply, a voltage source, a driver circuit, a resistive divider, a control circuit such as a processor, a controller, and a microcontroller, or other device. Alternatively, a voltage indicative of the boundary resistive ratio for SET VERIFY operations can be a voltage parameter of a component, such an input voltage level of an inverter where the inverter switches between outputting a low signal and a high signal. Alternatively, a voltage indicative of the boundary resistive ratio for SET VERIFY operations can be a number stored in a logic circuit, or a control circuit such as a processor, a controller, and a microcontroller.

The boundary resistive ratio for the SET VERFIY operations shown in FIGS. 3N-1 and 3N-2 is boundary resistive ratio=¼. FIG. 3N-2 shows the sense amplifier 372 receiving the voltage VB1(1) on the first input terminal and a voltage of ¼ the read voltage Vread on the second input terminal. The sense amplifier 372 determines the relational state of the combinational resistive change element S11 by comparing the voltage VB1(1) on bit line B1(1), which is indicative of the resistive ratio of the resistive divider formed by the resistive change element S11a and the resistive change element S11b, with the voltage of ¼ the read voltage Vread, which is indicative of the boundary resistive ratio for a SET VERIFY operation. The sense amplifier 372 outputs a signal indicative of the relational state of the combinational resistive change element S11 on the output terminal. When the resistive ratio of the resistive divider formed by the resistive change element S11a and the resistive change element S11b is less than or equal to ¼, the voltage VB1(1) on the bit line B1(1) is less than or equal to the voltage of ¼ the read voltage Vread and the sense amplifier 372 outputs a signal indicating the combinational resistive change element S11 has a low relational state. When the combinational resistive change element S11 has a low relational state, as shown in FIGS. 3N-1 and 3N-2, RS11a=10 MΩ, RS11b=1 MΩ, the resistive ratio of the resistive divider formed by the resistive change element S11a and the resistive change element S11b is resistive ratio=$\frac{1}{11}$, Vread=1V, VB1(0)=$\frac{1}{11}$V, and ¼(Vread)=¼V, the sense amplifier 372 outputs a signal indicating that the combinational resistive change element S11 has a low relational state. When the resistive ratio of the resistive divider formed by the resistive change element S11a and the resistive change element S11b is greater than ¼, the voltage VB1(1) on the bit line B1(1) is greater than the voltage of ¼ the read voltage Vread and the sense amplifier 372 outputs a signal indicating the combinational resistive change element S11 has a relational state other than a low relational state. For example, when the combinational resistive change element S11 has a high relational state, RS11$a$=1 MΩ, RS11$b$=10 MΩ, the resistive ratio of the resistive change element S11$a$ and the resistive change element S11$b$ is resistive ratio=$^{10}/_{11}$, Vread=1V, VB1(0)=$^{10}/_{11}$V, and ¼(Vread)=¼V, the sense amplifier 372 outputs a signal indicating that the combinational resistive change element S11 has a relational state other than a low relational state.

Alternatively, when the sense amplifiers 370, 372, 374 in the plurality of sense devices 306 are replaced with a plurality of inverters 380, 382, 384 as shown in the exemplary architecture of FIGS. 3I-1 and 3I-2, the input voltage level where each inverter in the plurality of inverters 380, 382, 384 switches between outputting a low signal and outputting a high signal can be used as a voltage indicative of a boundary resistive ratio for SET VERIFY operations. For example, when an input voltage level where the inverter 382 switches between outputting a low signal and a high signal is ¼V and the read voltage Vread is 1V, the input voltage level where the inverter 382 switches output signals is indicative of a boundary resistive ratio for SET VERIFY operations of boundary resistive ratio =¼.

Referring now to FIGS. 3I-1 and 3I-2, the inverter 382 receives the voltage VB1(1) on the bit line B1(1) on the input terminal. The inverter 382 determines the relational state of the combinational resistive change element S11 by comparing the voltage VB1(1) on bit line B1(1), which is indicative of the resistive ratio of the resistive divider formed by the resistive change element S11$a$ and the resistive change element S11$b$, with the input voltage level where the inverter 382 switches between outputting a low signal and outputting a high signal, which is indicative of the boundary resistive ratio for SET VERIFY operations. The inverter 382 outputs a signal indicative of the relational state of the combinational resistive change element S11 on the output terminal. When the resistive ratio of the resistive divider formed by the resistive change element S11$a$ and the resistive change element S11$b$ is less than or equal to a boundary resistive ratio for SET VERIFY operations, the inverter 382 outputs a signal indicating the combinational resistive change element S11 has a low relational state. For example, when RS11$a$=10 MΩ, RS11$b$=1 MΩ, the resistive ratio of the resistive divider formed by the resistive change element S11$a$ and the resistive change element S11$b$ is resistive ratio=$^{1}/_{11}$, Vread=1V, VB1(1)=$^{1}/_{11}$V, and the voltage where the inverter 382 switches output signals is ¼V, the inverter 382 outputs a signal indicating that the combinational resistive change element S11 has a low relational state. When the resistive ratio of the resistive divider formed by the resistive change element S11$a$ and the resistive change element S11$b$ is greater than a boundary resistive ratio for SET VERIFY operations, the inverter 382 outputs a signal indicating the combinational resistive change element S11 has a relational state other than a low relational state. For example, when RS11$a$=1 MΩ, RS11$b$=10 MΩ, the resistive ratio of the resistive divider formed by the resistive change element S11$a$ and the resistive change element S11$b$ is resistive ratio=$^{10}/_{11}$, Vread=1V, VB1(1)=$^{10}/_{11}$V, and the voltage where the inverter 382 switches output signals is ¼V, the inverter 382 outputs a signal indicating that the combinational resistive change element S11 has a relational state other than a low relational state.

Alternatively, when the plurality of sense amplifiers 370, 372, 374 are omitted from the exemplary architecture shown in FIGS. 3H-1 and 3H-2 and the plurality of bit lines B1(0)-B1($x$) are in electrical communication with a logic circuit or a control circuit such as a processor, a controller, and a microcontroller, a voltage level indicative of a boundary resistive ratio for SET VERIFY operations is stored in the logic circuit or the control circuit. The logic circuit or the control circuit determines the relational state of the combinational resistive change element S11 by comparing the voltage VB1(1) on bit line B1(1), which is indicative of the resistive ratio of the resistive divider formed by the resistive change element S11$a$ and the resistive change element S11$b$, with the voltage level indicative of a boundary resistive ratio for SET VERIFY operations. Additionally, the logic circuit or the control circuit can output a signal indicative of the relational state of the combinational resistive change element S11.

Figures 1, 3O:
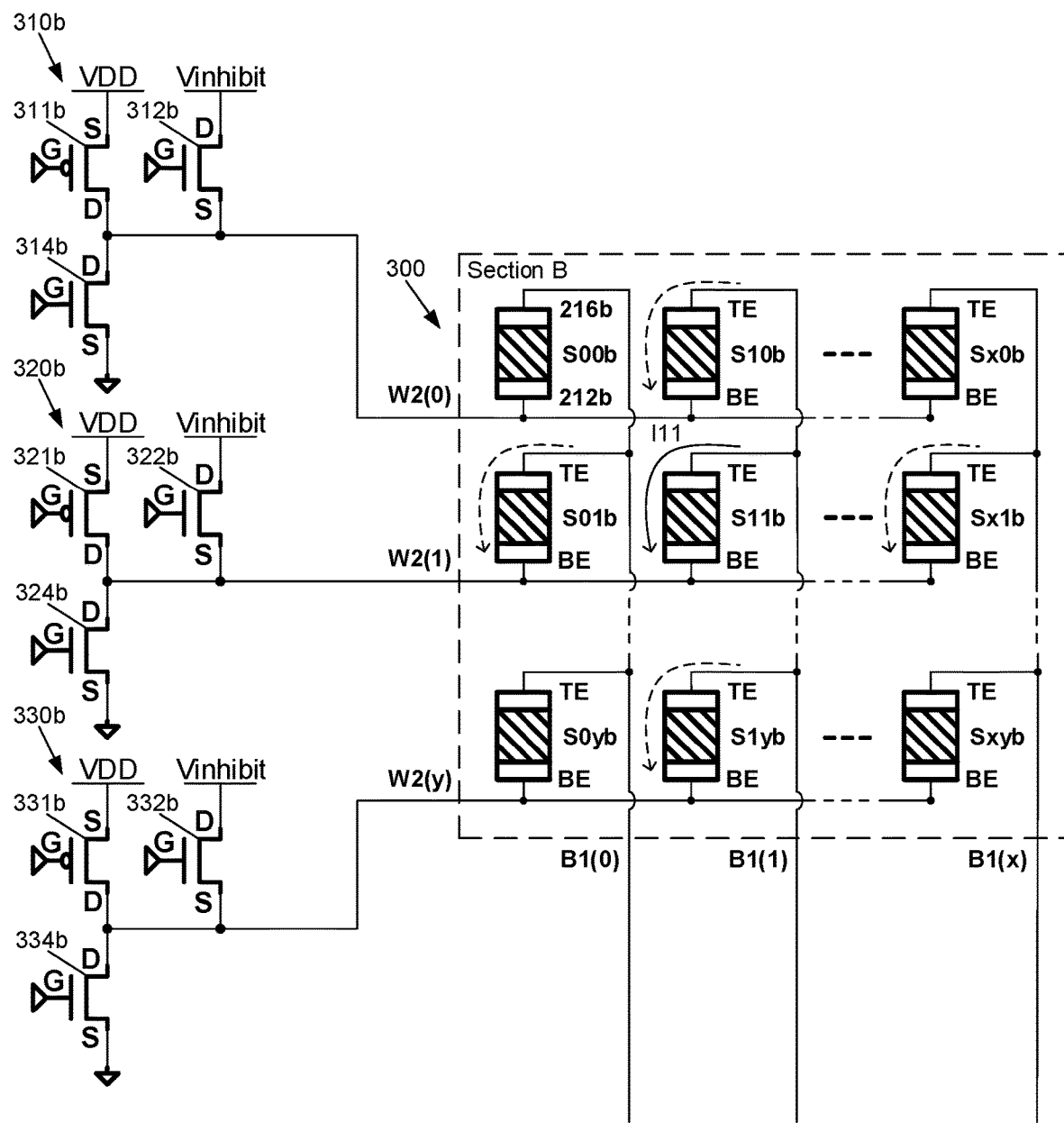
Figures 2, 3O:
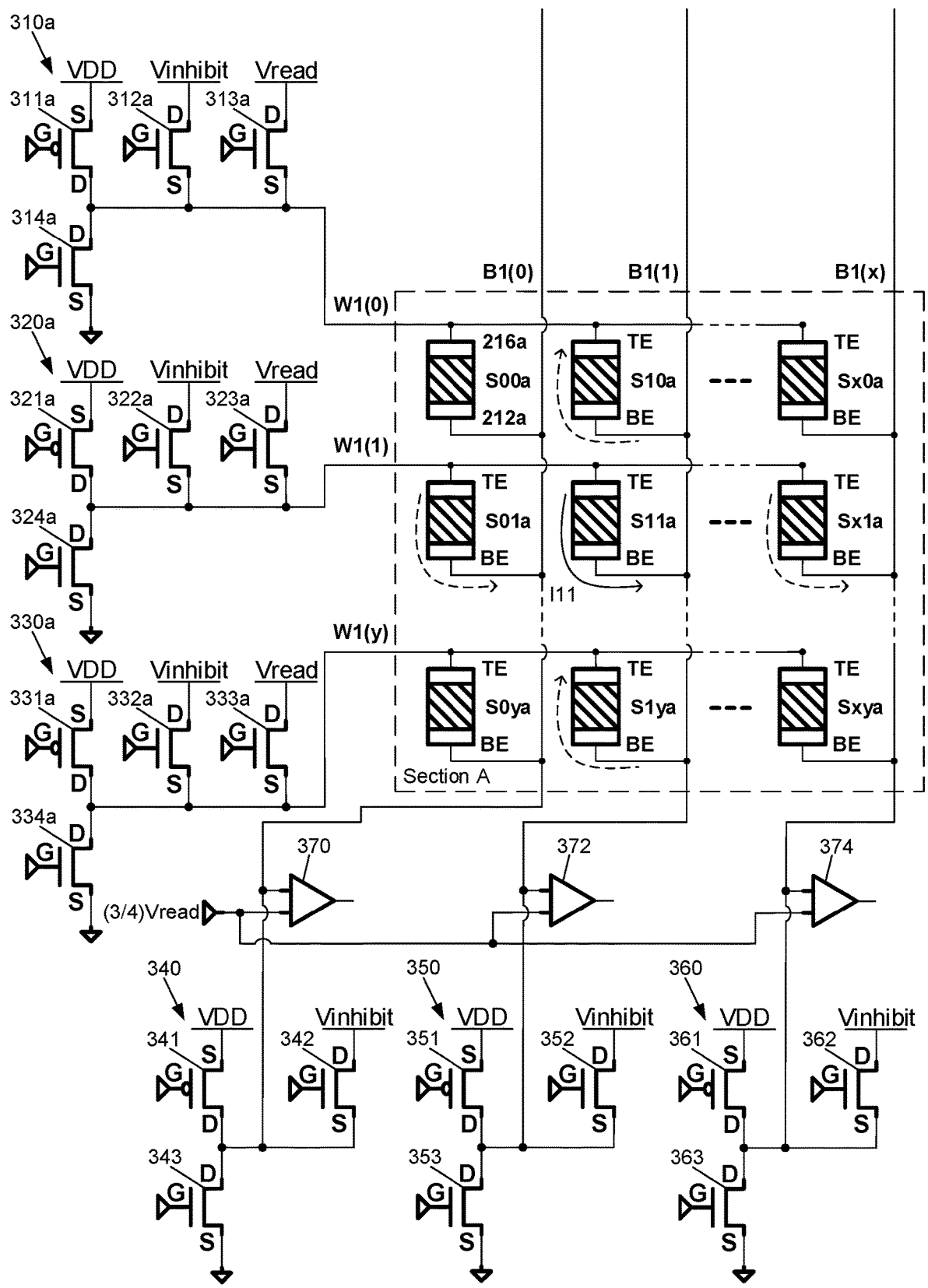

RESET VERIFY operations of the combinational resistive change element S11 in the exemplary architecture of FIGS. 3H-1 and 3H-2 will be explained in detail below and RESET VERIFY operations of each combinational resistive change element in the exemplary architecture of FIGS. 3H-1 and 3H-2 can be performed in a similar manner to the RESET VERIFY operations of the combinational resistive change element S11. FIGS. 3O-1 and 3O-2 illustrate a simplified schematic diagram showing current flow during a RESET VERIFY operation of the combinational resistive change element S11 in the exemplary architecture of FIGS. 3H-1 and 3H-2 when the combinational resistive change element S11 has a high relational state.

A RESET VERIFY operation of the combinational resistive change element S11 starts, as similarly discussed above in step 502 of flow chart 500, by selecting the combinational resistive change element S11 from the plurality of combinational resistive change elements S00-S$xy$. As discussed above, the combinational resistive change element array 300 is configured to include a plurality of combinational resistive change elements S00-S$xy$ using a correspondence where each combinational resistive change element in the plurality of combinational resistive change elements S00-S$xy$ includes a resistive change element from the plurality of resistive change elements S00$a$-S$xy$$a$ located in section A and a resistive change element from the plurality of a resistive change elements S00$b$-S$xy$$b$ located in section B at matching locations in matrixes and a conductive structure providing an electrical communication path between the resistive change element from the plurality of resistive change elements S00$a$-S$xy$$a$ located in section A and the resistive change element from the plurality of a resistive change elements S00$b$-S$xy$$b$ located in section B. The combinational resistive change element S11 is selected from the plurality of combinational resistive change elements S00-S$xy$ by control logic, such as a processor, a controller, and a microcontroller. The combinational resistive change elements S00-S$x$0, S01, S$x$1, S0$y$-S$xy$ in the plurality of combinational resistive change elements S00-S$xy$ that are not selected are referred to as unselected combinational resistive change elements.

The RESET VERIFY operation of the combinational resistive change element S11 continues, as similarly discussed above in step 504 of flow chart 500, by applying conditions to inhibit change in relational states of the unselected combinational resistive change elements S00-S$x$0, S01, S$x$1, S0$y$-S$xy$. A condition to inhibit change in a relational state of a combinational resistive change element is applied to a combinational resistive change element by limiting the voltage across each of the resistive change elements of the combinational resistive change element to a voltage level less than a voltage level that would cause a resistive change element to change resistive states. Conditions to inhibit change in relational states of the unselected combinational resistive change elements S00-S$x$0, S01, S$x$1, S0$y$-S$xy$ are applied to the unselected combinational resistive change elements S00-S$x$0, S01, S$x$1, S0$y$-S$xy$ by driving the word lines W1(0), W1($y$) to the inhibit voltage Vinhibit, driving the word lines W2(0), W2($y$) to the inhibit voltage Vinhibit, and driving the bit lines B1(0), B1($x$) to the inhibit voltage Vinhibit. The word lines W1(0), W1($y$) are driven to the inhibit voltage Vinhibit by turning on the first NMOS transistors 312$a$, 332$a$ in the word line driver circuits 310$a$, 330$a$. The word lines W2(0), W2($y$) are driven to the inhibit voltage Vinhibit by turning on the first NMOS transistors 312$b$, 332$b$ in the word line driver circuits 310$b$, 330$b$. The bit lines B1(0), B1($x$) are driven to the inhibit voltage Vinhibit by turning on the first NMOS transistors 342, 362 in the bit line driver circuits 340, 360.

The RESET VERIFY operation of the combinational resistive change element S11 proceeds, as similarly discussed above in step 506 of flow chart 500, by applying an electrical stimulus to the combinational resistive change element S11 such that the resistive change element S11$a$ and the resistive change element S11$b$ form a resistive divider where the resistive change element S11$a$ is a top resistive change element and the resistive change element S11$b$ is a bottom resistive change element. The electrical stimulus is applied to the combinational resistive change element S11 such that the resistive change element S11$a$ and the resistive change element S11$b$ form a resistive divider where the resistive change element S11$a$ is a top resistive change element and the resistive change element S11$b$ is a bottom resistive change element by driving the word line W1(1) to the read voltage Vread and driving the word line W2(1) to 0 volts or ground. The word line W1(1) is driven to the read voltage Vread by turning on the second NMOS transistor 323$a$ in the word line driver circuit 320$a$. The word line W2(1) is driven to 0 volts or ground by turning on the second NMOS transistor 324$b$ in the word line driver circuit 320$b$.

A resistive ratio of the resistive divider formed by the resistive change element S11$a$ and the resistive change element S11$b$ can be approximated as resistive ratio= (RS11$b$/(RS11$a$=RS11$b$)), where RS11$a$ is the resistance of resistive change element S11$a$ and RS11$b$ is the resistance of the resistive change element S11$b$. The voltage VB1(1) on the bit line B1(1), ignoring leakage currents, can be approximated using the resistive ratio of the resistive divider formed the resistive change element S11$a$ and the resistive change element S11$b$ and the read voltage Vread as VB1(1)=Vread (RS11$b$/(RS11$a$+RS11$b$)). As shown by this equation, the voltage VB1(1) on the bit line B1(1) changes when the resistance of resistive change element S11$a$ and/or the resistance of resistive change element S11$b$ changes because the read voltage Vread is generally constant. When the combinational resistive change element S11 has a low relational state, the resistive change element S11$a$ has a resistance of 10 MΩ, the resistive change element S11$b$ has a resistance of 1 MΩ, and the read voltage Vread is 1 volt, the voltage VB1(1)=1V(1 MΩ/(10 MΩ+1 MΩ))=$\frac{1}{11}$V. When the combinational resistive change element S11 has a high relational state, as shown in FIGS. 3O-1 and 3O-2, the resistive change element S11$a$ has a resistance of 1 MΩ, the resistive change element S11$b$ has a resistance of 10 MΩ, and the read voltage Vread is 1 volt, the voltage VB1(1) =1V(10 MΩ/(1 MΩ+10 MΩ))=$\frac{10}{11}$V.

The same amount of current, ignoring leakage currents, flows through the resistive change element S11$a$ and the resistive change element S11$b$. A current I11 flows from the word line W1(1) through the resistive change element S11$a$ into the bit line B1(1) and the current I11 flows from the bit line B1(1) through the resistive change element S11$b$ into the word line W2(1), as shown in FIGS. 3O-1 and 3O-2, because the word line W1(1) is driven to the read voltage Vread and the word line W2(1) is driven to 0 volts or ground. The amount of the current I11, ignoring leakage currents, can be approximated using Ohm's Law as I11=Vread/RS11, where RS11 is the resistance of the combinational resistive change element S11. The resistance of the combinational resistive change element S11 is approximated as the sum of the resistance of the resistive change element S11$a$ and the resistance of the resistive change element S11$b$. When the combinational resistive change element S11 has a low relational state, the resistive change element S11$a$ has a high resistive state of 10 MΩ, the resistive change element S11$b$ has a low resistive state of 1 MΩ, and the read voltage Vread is 1 volt, the amount of the current I11, ignoring leakage currents, can be approximated using Ohm's Law as I11=1 V/11 MΩ=$\frac{1}{11}$ μA. When the combinational resistive change element S11 has a high relational state, as shown in FIGS. 3O-1 and 3O-2, the resistive change element S11$a$ has a low resistive state of 1 MΩ, the resistive change element S11$b$ has a high resistive state of 10 MΩ, and the read voltage Vread is 1 volt, the amount of the current I11, ignoring leakage currents, can be approximated using Ohm's Law as I11=1 V/11 MΩ=$\frac{1}{11}$ μA.

FIGS. 3O-1 and 3O-2 also show leakage currents flowing through resistive change elements located in the same row or the same column as resistive change element S11$a$ in the plurality of resistive change elements S00$a$-S$xy$$a$ located in section A and leakage currents flowing through resistive change elements located in the same row or the same column as resistive change element S11$b$ in the plurality of resistive change elements S00$b$-S$xy$$b$ located in section B. The leakage currents are shown using dashed lines in FIGS. 3O-1 and 3O-2. When the voltage VB1(1) on the bit line B1(1) is less than the inhibit voltage Vinhibit leakage currents flow into the bit line B1(1) through the other resistive change elements located in the same columns as the resistive change element S11$a$ and the resistive change element S11$b$ and pull up the voltage VB1(1) on the bit line B1(1). When the voltage VB1(1) on the bit line B1(1) is greater than the inhibit voltage Vinhibit leakage currents flow from the bit line B1(1) through the other resistive change elements in the same columns as the resistive change element S11$a$ and the resistive change element S11$b$, as shown in FIGS. 3O-1 and 3O-2, and pull down the voltage VB1(1) on the bit line B1(1). It is noted that when the voltage VB1(1) on the bit line B1(1) is pulled up by leakage currents flowing into the bit line B1(1) and when the voltage VB1(1) on the bit line B1(1) is pulled down by leakage currents flowing from the bit line B1(1), the number of the word lines W1(0), W1($y$), W2(0), W2($y$) should be small enough to allow a margin to determine a relational state of the selected combinational resistive change element. Also, as shown in FIG. 3O-2, leakage currents flow through other resistive change elements located in the same row as the resistive change element S11$a$ because the read voltage Vread is greater than the inhibit voltage Vinhibit. Additionally, as shown in FIG. 3O-1, leakage currents flow through other resistive change elements located in the same row as the resistive change element S11$b$ because the inhibit voltage Vinhibit is greater than 0 volts or ground.

The RESET VERIFY operation of the combinational resistive change element S11 continues, as similarly discussed above in step 508 of flow chart 500, by determining a relational state of the combinational resistive change element S11 based on the resistive ratio of the resistive divider formed by the resistive change element S11a and the resistive change element S11b. The relational state of the combinational resistive change element S11 is determined by comparing a voltage indicative of the resistive ratio of the resistive divider formed by the resistive change element S11a and the resistive change element S11b with a voltage indicative of a boundary resistive ratio for RESET VERIFY operations. When the voltage indicative of the resistive ratio of the resistive divider formed by the resistive change element S11a and the resistive change element S11b is less than or equal to the voltage indicative of the boundary resistive ratio for RESET VERIFY operations the relational state of the combinational resistive change element S11 is determined to be a relational state other than a high relational state. When the voltage indicative of the resistive ratio of the resistive divider formed by the resistive change element S11a and the resistive change element S11b is greater than the voltage indicative of the boundary resistive ratio for RESET VERIFY operations the relational state of the combinational resistive change element S11 is determined to be a high relational state.

As discussed above, the voltage VB1(1) on the bit line B1(1) is based on the read voltage Vread and the resistive ratio of the resistive divider formed by the resistive change element S11a and the resistive change element S11b. The voltage VB1(1) on the bit line B1(1) is indicative of the relational state of the combinational resistive change element S11 because the voltage level of the read voltage Vread is the same for both a high relational state and a relational state other than a high relational state, while the resistive ratio of the resistive divider formed by the resistive change element S11a and the resistive change element S11b is different for a high relational state and a relational state other than a high relational state. A voltage indicative of a boundary resistive ratio for RESET VERIFY operations is determined by multiplying the boundary resistive ratio for RESET VERIFY operations and the read voltage Vread. For example, when the boundary resistive ratio for RESET VERIFY operations is ¾ and the read voltage Vread is 1 volt, the voltage indicative of the boundary resistive ratio for RESET VERIFY operations is voltage=(¾)×1V=¾V. A voltage indicative of the boundary resistive ratio for RESET VERIFY operations can be supplied by a power supply, a voltage source, a driver circuit, a resistive divider, a control circuit such as a processor, a controller, and a microcontroller, or other device. Alternatively, a voltage indicative of the boundary resistive ratio for RESET VERIFY operations can be a voltage parameter of a component, such an input voltage level of an inverter where the inverter switches between outputting a low signal and a high signal. Alternatively, a voltage indicative of the boundary resistive ratio for RESET VERIFY operations can be a number stored in a logic circuit or a control circuit such as a processor, a controller, and a microcontroller.

The boundary resistive ratio for the RESET VERFIY operation shown in FIGS. 3O-1 and 3O-2 is boundary resistive ratio=¾. FIG. 3O-2 shows the sense amplifier 372 receiving the voltage VB1(1) on the first input terminal and a voltage of ¾ the read voltage Vread on the second input terminal. The sense amplifier 372 determines the relational state of the combinational resistive change element S11 by comparing the voltage VB1(1) on bit line B1(1), which is indicative of the resistive ratio of the resistive divider formed by the resistive change element S11a and the resistive change element S11b, with the voltage of ¾ the read voltage Vread, which is indicative of the boundary resistive ratio for RESET VERIFY operations. The sense amplifier 372 outputs a signal indicative of the relational state of the combinational resistive change element S11 on the output terminal. When the resistive ratio of the resistive divider formed by the resistive change element S11a and the resistive change element S11b is less than or equal to ¾, the voltage VB1(1) on the bit line B1(1) is less than or equal to the voltage of ¾ the read voltage Vread and the sense amplifier 372 outputs a signal indicating the combinational resistive change element S11 has a relational state other than a high relational state. For example, when the combinational resistive change element S11 has a low relational state, RS11a=10 MΩ, RS11b=1 MΩ, the resistive ratio of the resistive divider formed by the resistive change element S11a and the resistive change element S11b is resistive ratio=1/11, Vread=1V, VB1(1)=1/11V, and ¾(Vread)=¾V, the sense amplifier 372 outputs a signal indicating that the combinational resistive change element S11 has a relational state other than a high relational state. When the resistive ratio of the resistive divider formed by the resistive change element S11a and the resistive change element S11b is greater than ¾, the voltage VB1(1) on the bit line B1(1) is greater than the voltage of ¾ the read voltage Vread and the sense amplifier 372 outputs a signal indicating the combinational resistive change element S11 has a high relational state. When the combinational resistive change element S11 has a high relational state, as shown in FIGS. 3O-1 and 3O-2, RS11a=1 MΩ, RS11b=10 MΩ, the resistive ratio of the resistive divider formed by the resistive change element S11a and the resistive change element S11b is resistive ratio=10/11, Vread=1V, VB1(0)=10/11V, and ¾(Vread)=¾V, the sense amplifier 372 outputs a signal indicating that the combinational resistive change element S11 has a high relational state.

Alternatively, when the sense amplifiers 370, 372, 374 in the plurality of sense devices 306 are replaced with a plurality of inverters 380, 382, 384 as shown in the exemplary architecture FIGS. 3I-1 and 3I-2, the input voltage level where each inverter in the plurality of inverters 380, 382, 384 switches between outputting a low signal and outputting a high signal can be used as a voltage indicative of a boundary resistive ratio for RESET VERIFY operations. For example, when an input voltage level where the inverter 382 switches between outputting a low signal and a high signal is ¾V and the read voltage Vread is 1V, the input voltage level where the inverter 382 switches output signals is indicative of a boundary resistive ratio for RESET VERIFY operations of boundary resistive ratio=¾.

Referring now to FIGS. 3I-1 and 3I-2, the inverter 382 receives the voltage VB1(1) on the bit line B1(1) on the input terminal. The inverter 382 determines the relational state of the combinational resistive change element S11 by comparing the voltage VB1(1) on bit line B1(1), which is indicative of the resistive ratio of the resistive divider formed by the resistive change element S11a and the resistive change element S11b, with the input voltage level where the inverter 382 switches between outputting a low signal and outputting a high signal, which is indicative of the boundary resistive ratio for RESET VERIFY operations. The inverter 382 outputs a signal indicative of the relational state of the combinational resistive change element S11 on the output terminal. When the resistive ratio of the resistive divider formed by the resistive change element S11a and the resistive change element S11b is less than or equal to a boundary resistive ratio for RESET VERIFY operations, the inverter 382 outputs a signal indicating the combinational resistive change element S11 has a relational state other than a high relational state. For example, when RS11a=10 MΩ, RS11$b$=1 MΩ, the resistive ratio of the resistive divider formed by the resistive change element S11$a$ and the resistive change element S11$b$ is resistive ratio=$1/11$, Vread=1V, VB1(1)=$1/11$V, and the voltage where the inverter 382 switches output signals is $3/4$V, the inverter 382 outputs a signal indicating that the combinational resistive change element S11 has a relational state other than a high relational state. When the resistive ratio of the resistive divider formed by the resistive change element S11$a$ and the resistive change element S11$b$ is greater than a boundary resistive ratio for RESET VERIFY operations, the inverter 382 outputs a signal indicating the combinational resistive change element S11 has a high relational state. For example, when RS11$a$=1 MΩ, RS11$b$=10 MΩ, the resistive ratio of the resistive divider formed by the resistive change element S11$a$ and the resistive change element S11$b$ is resistive ratio=$10/11$, Vread=1V, VB1(1)=$10/11$V, and the voltage where the inverter 382 switches output signals is $3/4$V, the inverter 382 outputs a signal indicating that the combinational resistive change element S11 has a high relational state.

Alternatively, when the plurality of sense amplifiers 370, 372, 374 are omitted from the exemplary architecture shown in FIGS. 3H-1 and 3H-2 and the plurality of bit lines B1(0)-B1($x$) are in electrical communication with a logic circuit or a control circuit such as a processor, a controller, and a microcontroller, a voltage level indicative of a boundary resistive ratio for RESET VERIFY operations is stored in the logic circuit or the control circuit. The logic circuit or the control circuit determines the relational state of the combinational resistive change element S11 by comparing the voltage VB1(1) on bit line B1(1), which is indicative of the resistive ratio of the resistive divider formed by the resistive change element S11$a$ and the resistive change element S11$b$, with the voltage level indicative of a boundary resistive ratio for RESET VERIFY operations. Additionally, the logic circuit or the control circuit can output a signal indicative of the relational state of the combinational resistive change element S11.

READ operations of combinational resistive change elements that have similar structures to the plurality of combinational resistive change elements S00-S$xy$ discussed above and that are adjustable (programmable) between more than two relational states that correspond with combinations of resistive states of resistive change elements having different resistive ratios when a combinational resistive change element is accessed in a manner such that the resistive change elements form a resistive divider, are performed in a similar manner to the READ operations of the combinational resistive change element S11 discussed above. However, for READ operations of the combinational resistive change elements adjustable (programmable) between more than two relational states, a voltage indicative of a resistive ratio of a resistive divider formed by resistive change elements in a combinational resistive change element is compared with more than one voltage indicative of a boundary resistive ratio for READ operations. The voltage indicative of the resistive ratio of the resistive divider formed by resistive change elements in the combinational resistive change element can be compared with a series of voltages indicative of boundary resistive ratios for READ operations to determine a relational state of the combinational resistive change element. Alternatively, the voltage indicative of the resistive ratio of the resistive divider formed by resistive change elements in the combinational resistive change element can be compared with multiple voltages indicative of boundary resistive ratios for READ operations at the same time to determine a relational state of the combinational resistive change element.

When the plurality of combinational resistive change elements S00-S$xy$ in the combinational resistive change element array 300 in the exemplary architecture of FIGS. 3H-1 and 3H-2 is replaced with a plurality of combinational resistive change elements that have similar structures to the plurality of combinational resistive change elements S00-S$xy$ and that are adjustable (programmable) between more than two relational states that correspond with combinations of resistive states of resistive change elements having different resistive ratios when a combinational resistive change element is accessed in a manner such that the resistive change elements form a resistive divider, READ operations of the combinational resistive change elements can be performed in a similar manner as discussed above with respect to combinational resistive change element S11, however, a voltage indicative of a resistive ratio of a resistive divider formed by resistive change elements in a combinational resistive change element is compared with a series of voltages indicative of boundary resistive ratios for READ operations instead of one voltage indicative of a boundary resistive ratio for READ operations. The sense amplifier 372 receives the voltage indicative of a resistive ratio of a resistive divider on the first terminal, receives the series of voltages indicative of boundary resistive ratios for READ operations on the second terminal, compares the voltage indicative of a resistive ratio of a resistive divider with the series of voltages indicative of boundary resistive ratios for READ operations, and outputs a series of signals based on the comparisons on the output terminal. The series of voltages indicative of boundary resistive ratios for READ operations are determined by a control circuit, such as a processor, a controller, and a microcontroller, and the series of signals output by the sense amplifier 372 are received by the control circuit. The series of voltages indicative of boundary resistive ratios for READ operations can be supplied by the control circuit or other device that supplies the series of voltages indicative of boundary resistive ratios for READ operations based on signals from the control circuit. The series of signals output by the sense amplifier 372 are indicative of a relational state of a combinational resistive change element. It is noted that when relational states of a combinational resistive change element correspond with binary numbers, each signal in the series of signals output by the sense amplifier 372 can correspond with a binary number with order of the signals in the series of signals being from the most significant digit to the least significant digit.

For example, for a READ operation of a combinational resistive change element adjustable between a low relational state having a resistive ratio=1 MΩ/(10 MΩ+1 MΩ)=$1/11$, an intermediate low relational state having a resistive ratio=5 MΩ/(10 MΩ+5 MΩ)=$1/3$, an intermediate high relational state having a resistive ratio=10 MΩ/(5 MΩ+10 MΩ)=$2/3$, and a high relational state having a resistive ratio=10 MΩ/(1 MΩ+10 MΩ)=$10/11$, the combinational resistive change element having a similar structure to the combinational resistive change element S11, and boundary resistive ratios for READ operations selected as $1/4$, $1/2$, and $3/4$, the READ operation is performed as discussed above with respect to the combinational resistive change element S11, however, the relational state of the combinational resistive change element is determined by comparing a voltage indicative of a resistive ratio of a resistive divider formed by resistive change elements of the combinational resistive change element with a series of voltages indicative of boundary resistive ratios for READ operations as discussed below. A control circuit supplies a voltage indicative of the boundary resistive ratio of ½ to the sense amplifier 372, the sense amplifier 372 receives a voltage indicative of a resistive ratio of a resistive divider, the sense amplifier 372 receives the voltage indicative of the boundary resistive ratio of ½, the sense amplifier 372 compares the voltage indicative of the resistive ratio of the resistive divider with the voltage indicative of the boundary resistive ratio of ½, and the sense amplifier 372 outputs a signal based on the comparison. The control circuit then receives the signal output by the sense amplifier 372. When the signal output by the sense amplifier 372 indicates the voltage indicative of the resistive ratio of the resistive divider is less than or equal to the voltage indicative of the boundary resistive ratio of ½, the control circuit then supplies a voltage indicative of the boundary resistive ratio of ¼ to the sense amplifier 372. When the signal output by the sense amplifier 372 indicates the voltage indicative of the resistive ratio of the resistive divider is greater than the voltage indicative of the boundary resistive ratio of ½, the control circuit then supplies a voltage indicative of the boundary resistive ratio of ¾ to the sense amplifier 372. Next, the sense amplifier 372 receives the voltage indicative of the boundary resistive ratio of ¼ or the voltage indicative of the boundary resistive ratio of ¾, the sense amplifier 372 compares the voltage indicative of the resistive ratio of the resistive divider with the voltage indicative of the boundary resistive ratio of ¼ or the voltage indicative of the boundary resistive ratio of ¾, and the sense amplifier 372 outputs a signal based on the comparison. The control circuit then receives the signal output by the sense amplifier 372 and interprets the signals output by the sense amplifier 372 indicating a relational state of the combinational resistive change element.

It is noted that, in the above example, resistive ratios of the resistive divider formed by the resistive change elements in the combinational resistive change element less than or equal to the boundary resistive ratio for READ operations of ¼ are determined to have a low relational state during a READ operation, resistive ratios of the resistive divider formed by the resistive change elements in the combinational resistive change element greater than the boundary resistive ratio for READ operations of ¼ and less than or equal to the boundary resistive ratio for READ operations of ½ are determined to have an intermediate low relational state during a READ operation, resistive ratios of the resistive divider formed by the resistive change elements in the combinational resistive change element greater than the boundary resistive ratio for READ operations of ½ and less than or equal to the boundary resistive ratio for READ operations of ¾ are determined to have an intermediate high relational state during a READ operation, and resistive ratios of the resistive divider formed by the resistive change elements in the combinational resistive change element greater than the boundary resistive ratio for READ operations of ¾ are determined to have a high relational state during a READ operation. It is also noted that, in the above example, a model resistive ratio for a low relational state is ratio=1 MΩ/(10 MΩ+1 MΩ)=1/11, a model resistive ratio for an intermediate low relational state is ratio=5 MΩ/(10 MΩ+5 MΩ)=⅓, a model resistive ratio for an intermediate high relational state is ratio=10 MΩ/(5 MΩ+10 MΩ)=⅔, and a model resistive ratio for a high relational state is ratio=10 MΩ/(1 MΩ+10 MΩ)=10/11. It is further noted that, in the above example, the boundary resistive ratio for READ operations between the model resistive ratio of the low relational state and the model resistive ratio of the intermediate low relational state was selected to be ratio=¼, the boundary resistive ratio for READ operations between the model resistive ratio of the intermediate low relational state and the model resistive ratio of the intermediate high relational state was selected to be ratio=½, and the boundary resistive ratio for READ operations between the model resistive ratio of the intermediate high relational state and the model resistive ratio of the high relational state was selected to be ratio=¾, however, other boundary resistive ratios between the model resistive ratios can be selected.

Figure 3P:
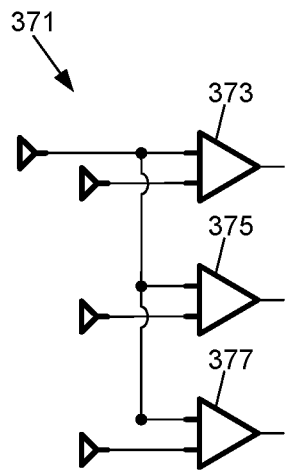
FIG. 3P illustrates a circuit for comparing a voltage indicative of a resistive ratio of a resistive divider formed by resistive change elements in a combinational resistive change element with multiple voltages indicative of boundary resistive ratios.

Referring now to FIG. 3P, a circuit 371 for comparing a voltage indicative of a resistive ratio of a resistive divider formed by resistive change elements in a combinational resistive change element with multiple voltages indicative of boundary resistive ratios is illustrated. The circuit 371 can determine a relational state of a combinational resistive change element by comparing a voltage indicative of a resistive ratio of a resistive divider formed by resistive change elements in the combinational resistive change element with multiple voltages indicative of boundary resistive ratios for READ operations and output a plurality of signals indicative of the relational state of the combinational resistive change element. The circuit 371 includes a plurality of amplifiers 373, 375, 377 where each amplifier in the plurality of amplifiers 373, 375, 377 has a first input terminal, a second input terminal, and an output terminal. The first input terminals of the amplifiers in the plurality of amplifiers 373, 375, 377 are in electrical communication. It is noted that the number of amplifiers in the plurality of amplifiers can be based on the number of boundary resistive ratios for READ operations, so that a voltage indicative of a resistive ratio of a resistive divider formed by resistive change elements in a combinational resistive change element can be compared with all of the boundary resistive ratios for READ operations at the same time.

When the plurality of combinational resistive change elements S00-Sxy in the combinational resistive change element array 300 in the exemplary architecture of FIGS. 3H-1 and 3H-2 is replaced with a plurality of combinational resistive change elements that have similar structures to the plurality of combinational resistive change elements S00-Sxy and that are adjustable (programmable) between four relational states that correspond with combination of resistive states of resistive change elements having different resistive ratios when a combinational resistive change element is accessed in a manner such that the resistive change elements form a resistive divider and each sense amplifier 370, 372, 374 in the plurality of sense devices 306 is replaced with a circuit 371, READ operations of the combinational resistive change elements adjustable (programmable) between four relational states can be performed in a similar manner as discussed above with respect to combinational resistive change element S11, however, a voltage indicative of a resistive ratio of a resistive divider formed by resistive change elements in a combinational resistive change element is compared with three voltages indicative of boundary resistive ratios for READ operations instead of one voltage indicative of a boundary resistive ratio for READ operations. Each amplifier in the plurality of amplifiers 373, 375, 377 in the circuit 371 receives a voltage indicative of the resistive ratio of the resistive divider on the first terminal, receives a voltage indicative of a boundary resistive ratio for READ operations on the second terminal, compares the voltage indicative of the resistive ratio of the resistive divider with the voltage indicative of a boundary resistive ratio for READ operations, and outputs a signal based on the comparison on the output terminal. The plurality of signals output by the plurality of amplifiers 373, 375, 377 in the circuit 371 is indicative of a relational state of the combinational resistive change element. For each circuit 371 that replaces a sense amplifier 370, 372, 374 in the plurality of sense devices 306, the first input terminal of each amplifier in the plurality of amplifiers 373, 375, 377 in circuit 371 is in electrical communication with a bit line to receive the voltage indicative of the resistive ratio of the resistive divider, the second input terminal of each amplifier in the plurality of amplifiers 373, 375, 377 in the circuit 371 is in electrical communication with a power supply, a voltage source, a driver circuit, a resistive divider, a control circuit such as a processor, a controller, and a microcontroller, or other device that supplies the voltage indicative of a boundary resistive ratio for a READ operation, and the output terminal of each amplifier in the plurality of amplifiers 373, 375, 377 in the circuit 371 is in electrical communication with a bus, a buffer, a level shift circuit, a logic circuit, or a control circuit such as a processor, a controller, and a microcontroller.

For example, for a READ operation of a combinational resistive change element adjustable between a low relational state having a resistive ratio=1 MΩ/(10 MΩ+1 MΩ)=$1/11$, an intermediate low relational state having a resistive ratio=5 MΩ/(10 MΩ+5 MΩ)=$1/3$, an intermediate high relational state having a resistive ratio=10 MΩ/(5 MΩ+10 MΩ)=$2/3$, and a high relational state having a resistive ratio=10 MΩ/(1 MΩ+10 MΩ)=$10/11$, the combinational resistive change element having a similar structure to the combinational resistive change element S11, each sense amplifier 370, 372, 374 in the plurality of sense devices 306 is replaced with a circuit 371, and boundary resistive ratios for READ operations selected as ¼, ½, and ¾, the READ operation is performed as discussed above with respect to the combinational resistive change element S11, however, the relational state of the combinational resistive change element is determined by comparing a voltage indicative of a resistive ratio of a resistive divider formed by resistive change elements of the combinational resistive change element with multiple voltages indicative of boundary resistive ratios for READ operations as discussed below. Amplifier 373 in the plurality of amplifiers 373, 375, 377 in the circuit 371 receives the voltage indicative of the resistive ratio of the resistive divider on the first input terminal, receives a voltage indicative of the boundary resistive ratio for READ operations of ½ on the second input terminal, compares the voltage indicative of the resistive ratio of the resistive divider with the voltage indicative of the boundary resistive ratio for READ operations of ½, and outputs a signal based on the comparison on the output terminal. Amplifier 375 in the plurality of amplifiers 373, 375, 377 in the circuit 371 receives the voltage indicative of the resistive ratio of the resistive divider on the first input terminal, receives a voltage indicative of the boundary resistive ratio for READ operations of ¼ on the second input terminal, compares the voltage indicative of the resistive ratio of the resistive divider with the voltage indicative of the boundary resistive ratio for READ operations of ¼, and outputs a signal based on the comparison on the output terminal. Amplifier 377 in the plurality of amplifiers 373, 375, 377 in the circuit 371 receives the voltage indicative of the resistive ratio of the resistive divider on the first input terminal, receives a voltage indicative of the boundary resistive ratio for READ operations of ¾ on the second input terminal, compares the voltage indicative of the resistive ratio of the resistive divider with the voltage indicative of the boundary resistive ratio for READ operations of ¾, and outputs a signal based on the comparison on the output terminal. The plurality of signals output the plurality of amplifiers 373, 375, 377 in the circuit 371 is indicative of the relational state of the combinational resistive change element.

It is noted that, in the above example, when resistive ratios of the resistive divider formed by the resistive change elements in the combinational resistive change element is less than or equal to the boundary resistive ratio for a READ operation of ¼, the plurality of signals output the plurality of amplifiers 373, 375, 377 in the circuit 371 indicates the combinational resistive change element has a low relational state. It is also noted that, in the above example, when resistive ratios of the resistive divider formed by the resistive change elements in the combinational resistive change element is greater than the boundary resistive ratio for a READ operation of ¼ and less than or equal to the boundary resistive ratio for a READ operation of ½, the plurality of signals output the plurality of amplifiers 373, 375, 377 in the circuit 371 indicates the combinational resistive change element has an intermediate low relational state. It is additionally noted that, in the above example, when resistive ratios of resistive divider formed by the resistive change elements in the combinational resistive change element is greater than the boundary resistive ratio for a READ operation of ½ and less than or equal to the boundary resistive ratio for a READ operation of ¾, the plurality of signals output the plurality of amplifiers 373, 375, 377 in the circuit 371 indicates the combinational resistive change element has an intermediate high relational state. It is further noted that, in the above example, when resistive ratios of the resistive divider formed by the resistive change elements in the combinational resistive change element is greater than the boundary resistive ratio for a READ operation of ¾, the plurality of signals output the plurality of amplifiers 373, 375, 377 in the circuit 371 indicates the combinational resistive change element has a high relational state. It is also noted that, in the above example, a model resistive ratio for a low relational state is ratio=1 MΩ/(10 MΩ+1 MΩ)=$1/11$, a model resistive ratio for an intermediate low relational state is ratio=5 MΩ/(10 MΩ+5 MΩ)=$1/3$, a model resistive ratio for an intermediate high relational state is ratio=10 MΩ/(5 MΩ+10 MΩ)=$2/3$, and a model resistive ratio for a high relational state is ratio=10 MΩ/(1 MΩ+10 MΩ)=$10/11$. It is further noted that, in the above example, the boundary resistive ratio for READ operations between the model resistive ratio of the low relational state and the model resistive ratio of the intermediate low relational state was selected to be ratio=¼, the boundary resistive ratio for READ operations between the model resistive ratio of the intermediate low relational state and the model resistive ratio of the intermediate high relational state was selected to be ratio=½, and the boundary resistive ratio for READ operations between the model resistive ratio of the intermediate high relational state and the model resistive ratio of the high relational state was selected to be ratio=¾, however, other boundary resistive ratios between the model resistive ratios can be selected.

Figure 3Q:
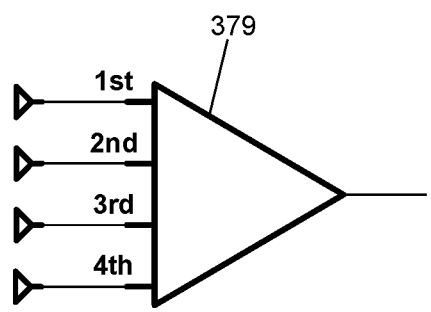
FIG. 3Q illustrates an amplifier for comparing a voltage indicative of a resistive ratio of a resistive divider formed by resistive change elements in a combinational resistive change element with multiple voltages indicative of boundary resistive ratios.

Referring now to FIG. 3Q, an amplifier 379 for comparing a voltage indicative of a resistive ratio of a resistive divider formed by resistive change elements in a combinational resistive change element with three voltages indicative of boundary resistive ratios is illustrated. The amplifier 379 can determine a relational state of a combinational resistive change element by comparing a voltage indicative of a resistive ratio of a resistive divider formed by resistive change elements in the combinational resistive change element with three voltages indicative of boundary resistive ratios for READ operations and output a signal indicative of the relational state of the combinational resistive change element. The amplifier 379 has a first input terminal, a second input terminal, a third input terminal, a fourth input terminal, and an output terminal. It is noted that amplifiers having three input terminals can be used for comparing a voltage indicative of a resistive ratio of a resistive divider formed by resistive change elements in a combinational resistive change element with two voltages indicative of boundary resistive ratios at the same time and amplifiers having more than four input terminals can be used for comparing a voltage indicative of a resistive ratio of a resistive divider formed by resistive change elements in a combinational resistive change element with more than three voltages indicative of boundary resistive ratios at the same time.

When the plurality of combinational resistive change elements S00-S$xy$ in the combinational resistive change element array 300 in the exemplary architecture of FIGS. 3H-1 and 3H-2 is replaced with a plurality of combinational resistive change elements that have similar structures to the plurality of combinational resistive change elements S00-S$xy$ and that are adjustable (programmable) between four relational states that correspond with combinations of resistive states of resistive change elements having different resistive ratios when a combinational resistive change element is accessed in a manner such that the resistive change elements form a resistive divider and each sense amplifier 370, 372, 374 in the plurality of sense devices 306 is replaced with an amplifier 379, READ operations of combinational resistive change elements can be performed in a similar manner as discussed above with respect to combinational resistive change element S11, however, a voltage indicative of a resistive ratio of a resistive divider formed by resistive change elements in a combinational resistive change element is compared with three voltages indicative of boundary resistive ratios for READ operations instead of one voltage indicative of a boundary resistive ratio for READ operations. The amplifier 379 receives a voltage indicative of the resistive ratio of the resistive divider on the first terminal, receives a voltage indicative of a boundary resistive ratio for READ operations on the second terminal, receives a voltage indicative of a boundary resistive ratio for READ operations on the third terminal, receives a voltage indicative of a boundary resistive ratio for READ operations on the fourth terminal, compares the voltage indicative of the resistive ratio of the resistive divider with the three voltages indicative of boundary resistive ratios for READ operations, and outputs a signal based on the comparison on the output terminal. The signal output by the amplifier 379 is indicative of a relational state of the combinational resistive change element. For each amplifier 379 that replaces a sense amplifier 370, 372, 374 in the plurality of sense devices 306, the first input terminal is in electrical communication with a bit line to receive a voltage indicative of a resistive ratio of a resistive divider formed by at resistive change elements in a combinational resistive change element, the second input terminal is in electrical communication with a power supply, a voltage source, a driver circuit, a resistive divider, a control circuit such as a processor, a controller, and a microcontroller, or other device that supplies a voltage indicative of a boundary resistive ratio for a READ operation, the third input terminal is in electrical communication with a power supply, a voltage source, a driver circuit, a resistive divider, a control circuit such as a processor, a controller, and a microcontroller, or other device that supplies a voltage indicative of a boundary resistive ratio for a READ operation, the fourth input terminal is in electrical communication with a power supply, a voltage source, a driver circuit, a resistive divider, a control circuit such as a processor, a controller, and a microcontroller, or other device that supplies a voltage indicative of a boundary resistive ratio for a READ operation, and the output terminal is in electrical communication with a bus, a buffer, a level shift circuit, a logic circuit, or a control circuit such as a processor, a controller, and a microcontroller.

For example, for a READ operation of a combinational resistive change element adjustable between a low relational state having a resistive ratio=1 MΩ/(10 MΩ+1 MΩ)=$\frac{1}{11}$, an intermediate low relational state having a resistive ratio=5 MΩ/(10 MΩ+5 MΩ)=$\frac{1}{3}$, an intermediate high relational state having a resistive ratio=10 MΩ/(5 MΩ+10 MΩ)=$\frac{2}{3}$, and a high relational state having a resistive ratio=10 MΩ/(1 MΩ+10 MΩ)=$\frac{10}{11}$, the combinational resistive change element having a similar structure to the combinational resistive change element S11, each sense amplifier 370, 372, 374 in the plurality of sense devices 306 is replaced with an amplifier 379, and boundary resistive ratios for READ operations selected as $\frac{1}{4}$, $\frac{1}{2}$, and $\frac{3}{4}$, the READ operation is performed as discussed above with respect to the combinational resistive change element S11, however, the relational state of the combinational resistive change element is determined by comparing a voltage indicative of a resistive ratio of a resistive divider formed by resistive change elements the combinational resistive change element with multiple voltages indicative of boundary resistive ratios for READ operations as discussed below. Amplifier 379 receives the voltage indicative of the resistive ratio of the resistive divider on the first input terminal, receives a voltage indicative of the boundary resistive ratio for READ operations of $\frac{1}{4}$ on the second input terminal, receives a voltage indicative of the boundary resistive ratio for READ operations of $\frac{1}{2}$ on the third input terminal, receives a voltage indicative of the boundary resistive ratio for READ operations of $\frac{3}{4}$ on the fourth input terminal, compares the voltage indicative of the resistive ratio of the resistive divider with the three voltages indicative of boundary resistive ratios for READ operations, and outputs a signal based on the comparison on the output terminal. The signal output by the amplifier 379 is indicative of the relational state of the combinational resistive change element.

It is noted that, in the above example, when resistive ratios of the resistive divider formed by the resistive change elements in the combinational resistive change element is less than or equal to the boundary resistive ratio for READ operations of $\frac{1}{4}$, the signal output by the amplifier 379 indicates the combinational resistive change element has a low relational state. It is also noted that, in the above example, when resistive ratios of the resistive divider formed by the resistive change elements in the combinational resistive change element is greater than the boundary resistive ratio for READ operations of $\frac{1}{4}$ and less than or equal to the boundary resistive ratio for READ operations of $\frac{1}{2}$, the signal output by the amplifier 379 indicates the combinational resistive change element has an intermediate low relational state. It is additionally noted that, in the above example, when resistive ratios of the resistive divider formed by the resistive change elements in the combinational resistive change element is greater than the boundary resistive ratio for READ operations of $\frac{1}{2}$ and less than or equal to the boundary resistive ratio for READ operations of $\frac{3}{4}$, the signal output by the amplifier 379 indicates the combinational resistive change element has an intermediate high relational state. It is further noted that, in the above example, when resistive ratios of the resistive divider formed by the resistive change elements in the combinational resistive change element is greater than the boundary resistive change ratio for READ operations of $3/4$, the signal output by the amplifier 379 indicates the combinational resistive change element has a high relational state. It is also noted that, in the above example, a model resistive ratio for a low relational state is ratio=1 MΩ/(10 MΩ+1 MΩ)=$1/11$, a model resistive ratio for an intermediate low relational state is ratio=5 MΩ/(10 MΩ+5 MΩ)=$1/3$, a model resistive ratio for an intermediate high relational state is ratio=10 MΩ/(5 MΩ+10 MΩ)=$2/3$, and a model resistive ratio for a high relational state is ratio=10 MΩ/(1 MΩ+10 MΩ)=$10/11$. It is further noted that, in the above example, the boundary resistive ratio for READ operations between the model resistive ratio of the low relational state and the model resistive ratio of the intermediate low relational state was selected to be ratio=$1/4$, the boundary resistive ratio for READ operations between the model resistive ratio of the intermediate low relational state and the model resistive ratio of the intermediate high relational state was selected to be ratio=$1/2$, and the boundary resistive ratio for READ operations between the model resistive ratio of the intermediate high relational state and the model resistive ratio of the high relational state was selected to be ratio=$3/4$, however, other boundary resistive ratios between the model resistive ratios can be selected.

Figure 6A:
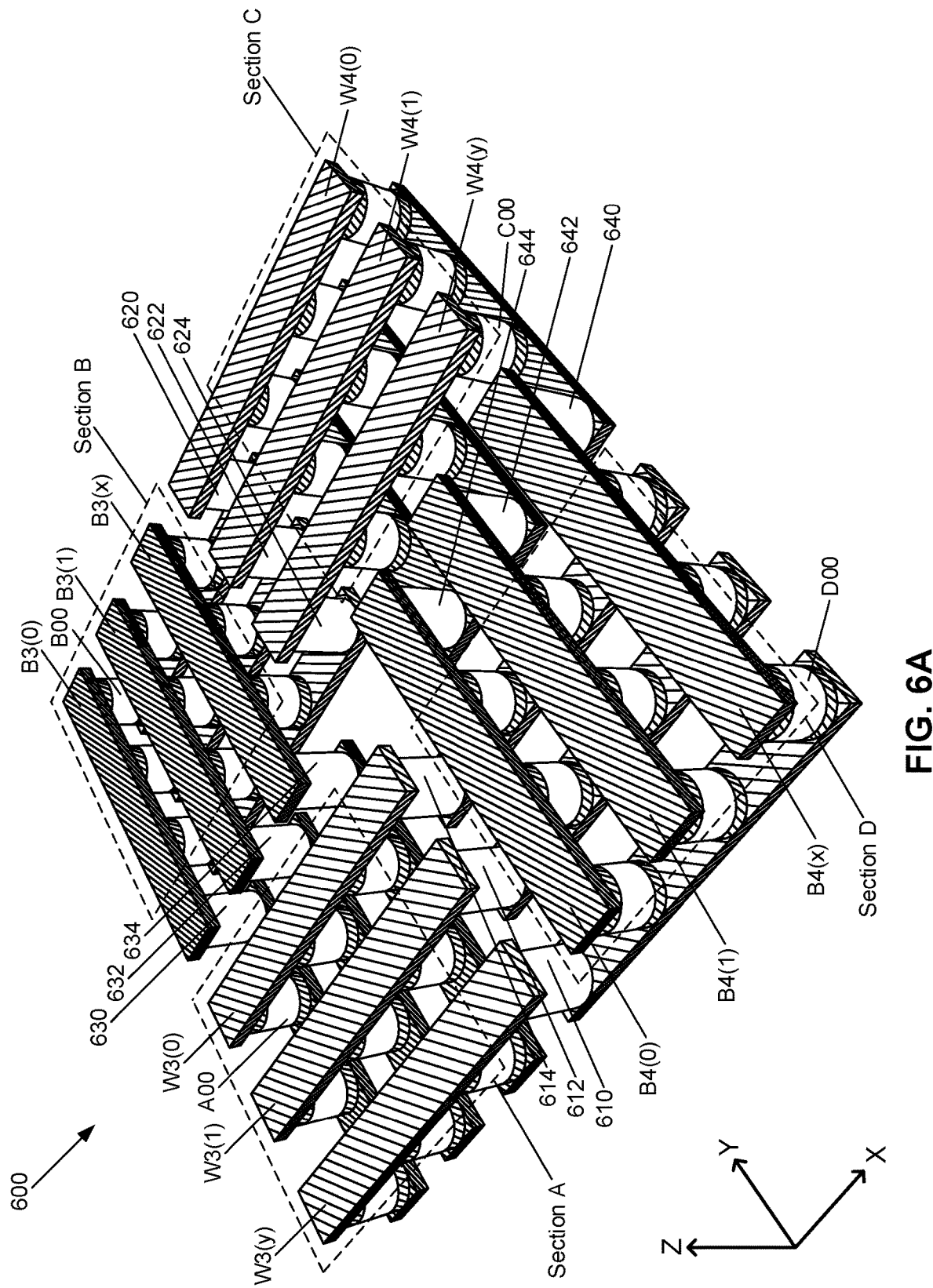
FIG. 6A illustrates a three-dimensional view of a combinational resistive change element array having four sections.

Referring now to FIG. 6A, a three-dimensional view of an exemplary combinational resistive change element array 600 is illustrated. The exemplary combinational resistive change element array 600 includes a plurality of resistive change elements A00-A$xy$ located in section A of the combinational resistive change element array 600, a plurality of resistive change elements B00-B$xy$ located in section B of the combinational resistive change element array 600, a plurality of resistive change elements C00-C$xy$ located in section C of the combinational resistive change element array 600, and a plurality of resistive change elements D00-D$xy$ located in section D of the combinational resistive change element array 600. The combinational resistive change element array 600 also includes a first plurality of word lines W3(0)-W3($y$), a second plurality of word lines W4(0)-W4($y$), a first plurality of bit lines B3(0)-B3($x$), and a second plurality of bit lines B4(0)-B4($x$). Each word line in the first plurality of word lines W3(0)-W3($y$) includes a segment located above segments of bit lines in the first plurality of bit lines B3(0)-B3($x$) and a segment located below segments of bit lines in the second plurality of bit lines B4(0)-B4($x$). Each word line in the second plurality of word lines W4(0)-W4($y$) includes a segment located below segments of bit lines in the first plurality of bit lines B3(0)-B3($x$) and a segment located above segments of bit lines in the second plurality of bit lines B4(0)-B4($x$). Each bit line in the first plurality of bit lines B3(0)-B3($x$) includes a segment located below segments of word lines in the first plurality of word lines W3(0)-W3($x$) and a segment located above segments of word lines in the second plurality of word lines W4(0)-W4($x$). Each bit line in the second plurality of bit lines B4(0)-B4($x$) includes a segment located above segments of word lines in the first plurality of word lines W3(0)-W3($x$) and a segment located below segments of word lines in the second plurality of word lines W4(0)-W4($x$). The combinational resistive change element array 600 further includes a first plurality of electrical communication conductive structures 610, 612, 614 where each electrical communication conductive structure in the first plurality of electrical communication conductive structures 610, 612, 614 provides an electrical communication path between a segment of a word line located above segments of bit lines in the first plurality of bit lines B3(0)-B3($x$) and a segment of a word line located below segments of bit lines in the second plurality of bit lines B4(0)-B4($x$), a second plurality of electrical communication conductive structures 620, 622, 624 where each electrical communication conductive structure in the second plurality of electrical communication conductive structures 620, 622, 624 provides an electrical communication path between a segment of a word line located below segments of bit lines in the first plurality of bit lines B3(0)-B3($x$) and a segment of a word line located above segments of bit lines in the second plurality of bit lines B4(0)-B4($x$), a third plurality of electrical communication conductive structures 630, 632, 634 where each electrical communication conductive structure in the third plurality of electrical communication conductive structures 630, 632, 634 provides an electrical communication path between a segment of a bit line located below segments of word lines in the first plurality of word lines W3(0)-W3($x$) and a segment of a bit line located above segments of word lines in the second plurality of word lines W4(0)-W4($x$), and a fourth plurality of electrical communication conductive structures 640, 642, 644 where each electrical communication conductive structure in the fourth plurality of electrical communication conductive structures 640, 642, 644 provides an electrical communication path between a segment of a bit line located above segments of word lines in the first plurality of word lines W3(0)-W3($x$) and a segment of a bit line located below segments of word lines in the second plurality of word lines W4(0)-W4($x$).

The first plurality of word lines W3(0)-W3($x$) are in electrical communication with the plurality of resistive change elements A00-A$xy$ located in section A and the plurality of resistive change elements D00-D$xy$ located in section D. The second plurality of word lines W4(0)-W4($x$) are in electrical communication with the plurality of resistive change elements B00-B$xy$ located in section B and the plurality of resistive change elements C00-C$xy$ located in section C. The first plurality of bit lines B3(0)-B3($x$) are in electrical communication with the plurality of resistive change elements A00-A$xy$ located in section A and the plurality of resistive change element B00-B$xy$ located in section B. The second plurality of bit lines B4(0)-B4($x$) are in electrical communication with the plurality of resistive change elements C00-C$xy$ located in section C and the plurality of resistive change elements D00-D$xy$ located in section D. It is noted that intervening interconnecting structures, such as plugs, filled vias, and studs, can be located between the resistive change elements in the plurality of resistive change elements A00-A$xy$ located in section A and word lines in the first plurality of word lines W3(0)-W3($y$) and/or intervening interconnecting structures, such as plugs, filled vias, and studs, can be located between the resistive change elements in the plurality of resistive change elements A00-A$xy$ located in section A and bit lines in the first plurality of bit lines B3(0)-B3($x$). It is noted that intervening interconnecting structures, such as plugs, filled vias, and studs, can be located between the resistive change elements in the plurality of resistive change elements B00-B$xy$ located in section B and bit lines in the first plurality of bit lines B3(0)-B3($x$) and/or intervening interconnecting structures, such as plugs, filled vias, and studs, can be located between the resistive change elements in the plurality of resistive change elements B00-B$xy$ located in section B and word lines in the second plurality of word lines W4(0)-W4($y$). It is noted that intervening interconnecting structures, such as plugs, filled vias, and studs, can be located between the resistive change elements in the plurality of resistive change elements C00-C$xy$ located in section C and word lines in the second plurality of word lines W4(0)-W4($y$) and/or intervening interconnecting structures, such as plugs, filled vias, and studs, can be located between the resistive change elements in the plurality of resistive change elements C00-C$xy$ located in section C and bit lines in the second plurality of bit lines B4(0)-B4($x$). It is noted that intervening interconnecting structures, such as plugs, filled vias, and studs, can be located between the resistive change elements in the plurality of resistive change elements D00-D$xy$ located in section D and bit lines in the second plurality of bit lines B4(0)-B4($x$) and/or intervening interconnecting structures, such as plugs, filled vias, and studs, can be located between the resistive change elements in the plurality of resistive change elements D00-D$xy$ located in section d and word lines in the first plurality of word lines W3(0)-W3($y$). It is further noted that intervening layers, such as barrier metal layers that provide a barrier to metal migration, can be included to provide a barrier to metal migration from the first plurality of word lines W3(0)-W3($y$), the second plurality of word lines W4(0)-W4($y$), the first plurality of bit lines B3(0)-B3($x$), and/or the second plurality of bit lines B4(0)-B4($x$).

Figures 1, 6B:
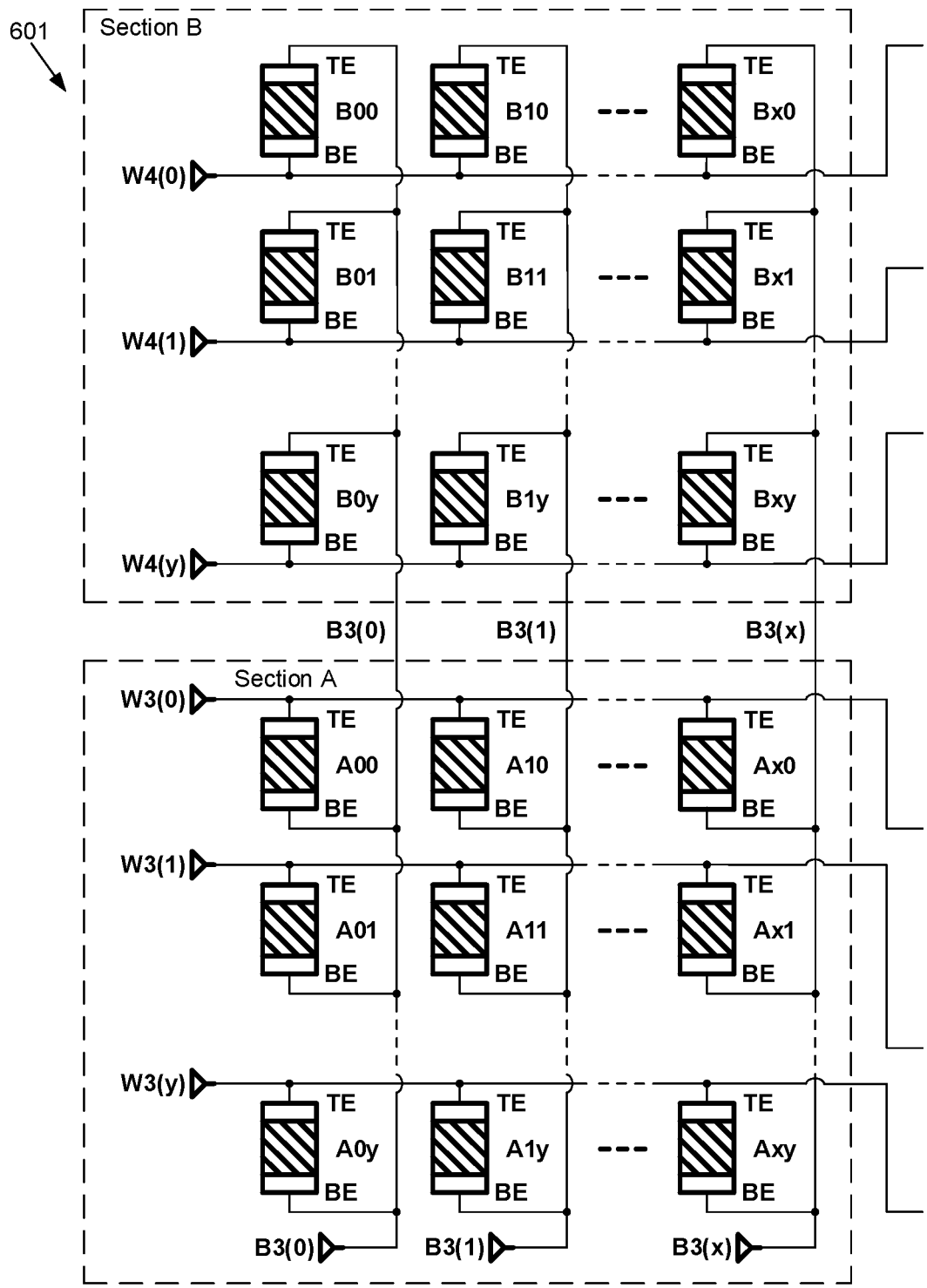
Figures 2, 6B:
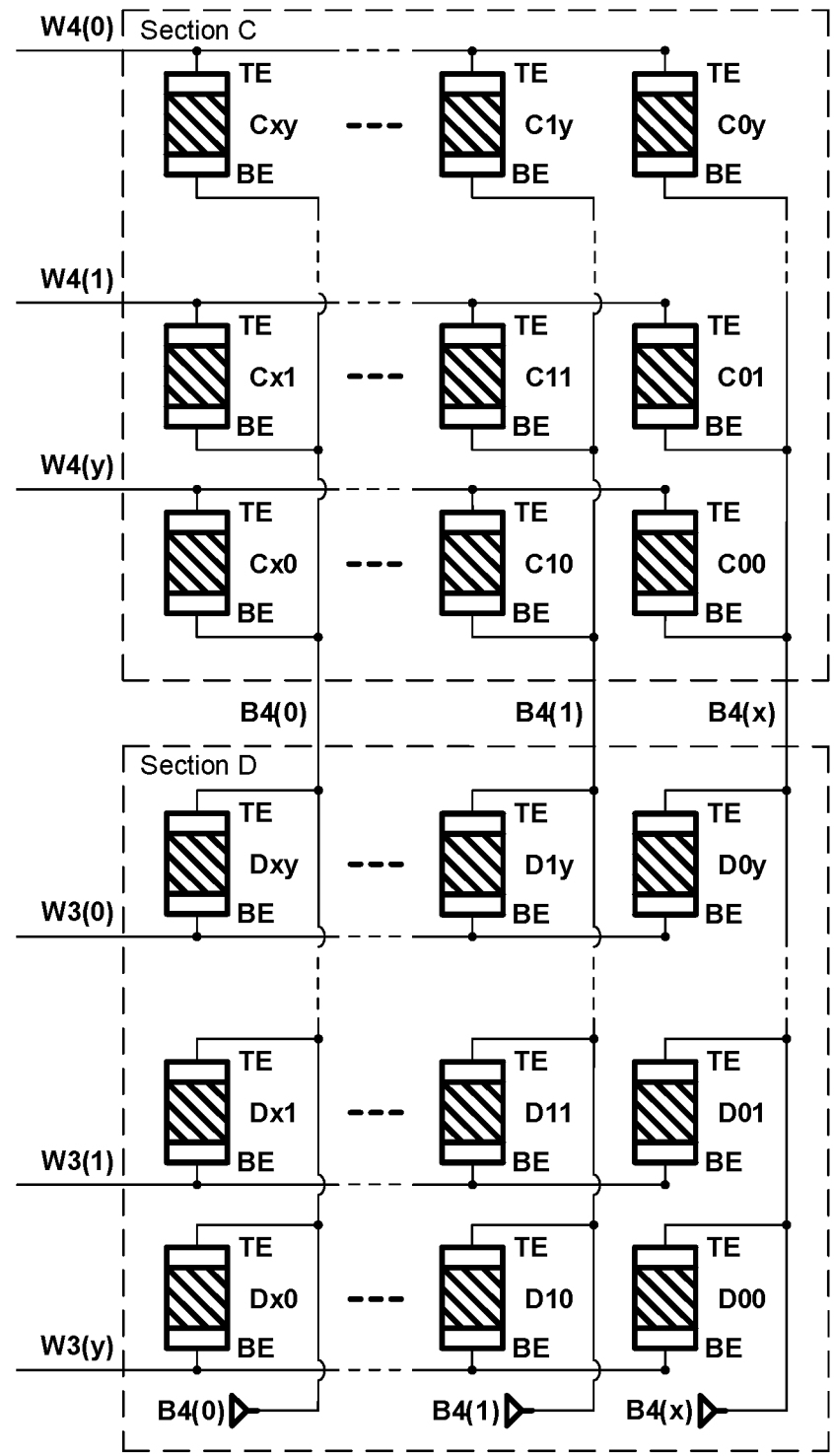

A simplified schematic diagram of the exemplary combinational resistive change element array of FIG. 6A is illustrated as exemplary combinational resistive change element array 601 in FIGS. 6B-1 and 6B-2. The resistive change elements in the plurality of resistive change elements A00-A$xy$ located in section A are labeled in the simplified schematic diagram of FIGS. 6B-1 and 6B-2 using the reference characters A00-A$xy$. The top electrodes TE and the bottom electrodes BE of the resistive change elements in the plurality of resistive change elements A00-A$xy$ located in section A are labeled in the simplified schematic diagram of FIGS. 6B-1 and 6B-2 using the reference characters TE and BE. The resistive change elements in the plurality of resistive change elements B00-B$xy$ located in section B are labeled in the simplified schematic diagram of FIGS. 6B-1 and 6B-2 using the reference characters B00-B$xy$. The top electrodes TE and the bottom electrodes BE of the resistive change elements in the plurality of resistive change elements B00-B$xy$ located in section B are labeled in the simplified schematic diagram of FIGS. 6B-1 and 6B-2 using the reference characters TE and BE. The resistive change elements in the plurality of resistive change elements C00-C$xy$ located in section C are labeled in the simplified schematic diagram of FIGS. 6B-1 and 6B-2 using the reference characters C00-C$xy$. The top electrodes TE and the bottom electrodes BE of the resistive change elements in the plurality of resistive change elements C00-C$xy$ located in section C are labeled in the simplified schematic diagram of FIGS. 6B-1 and 6B-2 using the reference characters TE and BE. The resistive change elements in the plurality of resistive change elements D00-D$xy$ located in section D are labeled in the simplified schematic diagram of FIGS. 6B-1 and 6B-2 using the reference characters D00-D$xy$. The top electrodes TE and the bottom electrodes BE of the resistive change elements in the plurality of resistive change elements D00-D$xy$ located in section D are labeled in the simplified schematic diagram of FIGS. 6B-1 and 6B-2 using the reference characters TE and BE. Additionally, the simplified schematic diagram of FIGS. 6B-1 and 6B-2 shows the resistive change material located between the top electrode TE and the bottom electrode BE for each resistive change element. The first plurality of electrical communication conductive structures 610, 612, 614 are shown in the simplified schematic diagram of FIGS. 6B-1 and 6B-2 as being incorporated into the first plurality of word lines W3(0)-W3($x$). The second plurality of electrical communication conductive structures 620, 622, 624 are shown in the simplified schematic diagram of FIGS. 6B-1 and 6B-2 as being incorporated into the second plurality of word lines W4(0)-W4($x$). The third plurality of electrical communication conductive structures 630, 632, 634 are shown in the simplified schematic diagram of FIGS. 6B-1 and 6B-2 as being incorporated into the first plurality of bit lines B3(0)-B3($x$). The fourth plurality of electrical communication conductive structures 640, 642, 644 are shown in the simplified schematic diagram of FIGS. 6B-1 and 6B-2 as being incorporated into the second plurality of bit lines B4(0)-B4($x$).

The combinational resistive change element array 600 is configurable to include an A-B plurality of combinational resistive change elements, a C-D plurality of combinational resistive change elements, a D-A plurality of combinational resistive change elements, and/or a B-C plurality of combinational resistive change elements. Each combinational resistive change element in the A-B plurality of combinational resistive change elements includes a resistive change element from the plurality of resistive change elements A00-A$xy$ located in section A, a resistive change element from the plurality of resistive change elements B00-B$xy$ located in section B where the resistive change element from the plurality of resistive change elements A00-A$xy$ located in section A and the resistive change element from the plurality of resistive change elements B00-B$xy$ located in section B are in electrical communication with the same bit line, and a conductive structure providing an electrical communication path between the resistive change element from the plurality of resistive change elements A00-A$xy$ located in section A and the resistive change element from the plurality of resistive change elements B00-B$xy$ located in section B. The resistive change element from the plurality of resistive change elements A00-A$xy$ located in section A and the resistive change element from the plurality of resistive change elements B00-B$xy$ located in section B are in electrical communication with the same bit line so that the bit line can provide access to a node between the resistive change elements. The conductive structure includes a portion of a bit line from the resistive change element from the plurality of resistive change elements A00-A$xy$ located in section A to an electrical communication conductive structure from the third plurality of electrical communication conductive structures 630, 632, 634, the electrical communication conductive structure, and a portion of the bit line from the electrical communication conductive structure to the resistive change element from the plurality of resistive change elements B00-B$xy$ located in section B. Thus, the conductive structure has a structure that varies based on the way the combinational resistive change element array 600 is configured to include the A-B plurality of combinational resistive change elements because the portion of a bit line from the resistive change element from the plurality of resistive change elements A00-A$xy$ located in section A to an electrical communication conductive structure from the third plurality of electrical communication conductive structures 630, 632, 634, the electrical communication conductive structure, and the portion of the bit line from the electrical communication conductive structure to the resistive change element from the plurality of resistive change elements B00-B$xy$ located in section B vary based on resistive change elements included in a combinational resistive change element.

Each combinational resistive change element in the C-D plurality of combinational resistive change elements includes a resistive change element from the plurality of resistive change elements C00-C$xy$ located in section C, a resistive change element from the plurality of resistive change elements D00-D$xy$ located in section D where the resistive change element from the plurality of resistive change elements C00-C$xy$ located in section C and the resistive change element from the plurality of resistive change elements D00-D$xy$ located in section D are in electrical communication with the same bit line, and a conductive structure providing an electrical communication path between the resistive change element from the plurality of resistive change elements C00-C$xy$ located in section C and the resistive change element from the plurality of resistive change elements D00-D$xy$ located in section D. The resistive change element from the plurality of resistive change elements C00-C$xy$ located in section C and the resistive change element from the plurality of resistive change elements D00-D$xy$ located in section D are in electrical communication with the same bit line so that the bit line can provide access to a node between the resistive change elements. The conductive structure includes a portion of a bit line from the resistive change element from the plurality of resistive change elements C00-C$xy$ located in section C to an electrical communication conductive structure from the fourth plurality of electrical communication conductive structures 640, 642, 644, the electrical communication conductive structure, and a portion of the bit line from the electrical communication conductive structure to the resistive change element from the plurality of resistive change elements D00-D$xy$ located in section D. Thus, the conductive structure has a structure that varies based on the way the combinational resistive change element array 600 is configured to include the C-D plurality of combinational resistive change elements because the portion of a bit line from the resistive change element from the plurality of resistive change elements C00-C$xy$ located in section C to an electrical communication conductive structure from the fourth plurality of electrical communication conductive structures 640, 642, 644, the electrical communication conductive structure, and the portion of the bit line from the electrical communication conductive structure to the resistive change element from the plurality of resistive change elements D00-D$xy$ located in section D vary based on resistive change elements included in a combinational resistive change element.

Each combinational resistive change element in the D-A plurality of combinational resistive change elements includes a resistive change element from the plurality of resistive change elements D00-D$xy$ located in section D, a resistive change element from the plurality of resistive change elements A00-A$xy$ located in section A where the resistive change element from the plurality of resistive change elements D00-D$xy$ located in section D and the resistive change element from the plurality of resistive change elements A00-A$xy$ located in section A are in electrical communication with the same word line, and a conductive structure providing an electrical communication path between the resistive change element from the plurality of resistive change elements D00-D$xy$ located in section D and the resistive change element from the plurality of resistive change elements A00-A$xy$ located in section A. The resistive change element from the plurality of resistive change elements D00-D$xy$ located in section D and the resistive change element from the plurality of resistive change elements A00-A$xy$ located in section A are in electrical communication with the same word line so that the word line can provide access to a node between the resistive change elements. The conductive structure includes a portion of a word line from the resistive change element from the plurality of resistive change elements D00-D$xy$ located in section D to an electrical communication conductive structure from the first plurality of electrical communication conductive structures 610, 612, 614, the electrical communication conductive structure, and a portion of the word line from the electrical communication conductive structure to the resistive change element from the plurality of resistive change elements A00-A$xy$ located in section A. Thus, the conductive structure has a structure that varies based on the way the combinational resistive change element array 600 is configured to include the D-A plurality of combinational resistive change elements because the portion of a word line from the resistive change element from the plurality of resistive change elements D00-D$xy$ located in section D to an electrical communication conductive structure from the first plurality of electrical communication conductive structures 610, 612, 614, the electrical communication conductive structure, and the portion of the word line from the electrical communication conductive structure to the resistive change element from the plurality of resistive change elements A00-A$xy$ located in section A vary based on resistive change elements included in a combinational resistive change element.

Each combinational resistive change element in the B-C plurality of combinational resistive change elements includes a resistive change element from the plurality of resistive change elements B00-B$xy$ located in section B, a resistive change element from the plurality of resistive change elements C00-C$xy$ located in section C where the resistive change element from the plurality of resistive change elements B00-B$xy$ located in section B and the resistive change element from the plurality of resistive change elements C00-C$xy$ located in section C are in electrical communication with the same word line, and a conductive structure providing an electrical communication path between the resistive change element from the plurality of resistive change elements B00-B$xy$ located in section B and the resistive change element from the plurality of resistive change elements C00-C$xy$ located in section C. The resistive change element from the plurality of resistive change elements B00-B$xy$ located in section B and the resistive change element from the plurality of resistive change elements C00-C$xy$ located in section C are in electrical communication with the same word line so that the word line can provide access to a node between the resistive change elements. The conductive structure includes a portion of a word line from the resistive change element from the plurality of resistive change elements B00-B$xy$ located in section B to an electrical communication conductive structure from the second plurality of electrical communication conductive structures 620, 622, 624, the electrical communication conductive structure, and a portion of the word line from the electrical communication conductive structure to the resistive change element from the plurality of resistive change elements C00-C$xy$ located in section C. Thus, the conductive structure has a structure that varies based on the way the combinational resistive change element array 600 is configured to include the B-C plurality of combinational resistive change elements because the portion of a word line from the resistive change element from the plurality of resistive change elements B00-B$xy$ located in section B to an electrical communication conductive structure from the second plurality of electrical communication conductive structures 620, 622, 624, the electrical communication conductive structure, and the portion of the word line from the electrical communication conductive structure to the resistive change element from the plurality of resistive change elements C00-C*xy* located in section C vary based on resistive change elements included in a combinational resistive change element.

The combinational resistive change element array 600 can be configured to include at least one of an A-B plurality of combinational resistive change elements, a C-D plurality of combinational resistive change elements, a D-A plurality of combinational resistive change elements, or a B-C plurality of combinational resistive change elements using an array correspondence. Each of the A-B plurality of combinational resistive change elements, the C-D plurality of combinational resistive change elements, the D-A plurality of combinational resistive change elements, and the B-C plurality of combinational resistive change elements is included the combinational resistive change element array 600 by including a correspondence for that plurality of combinational resistive change elements in the array correspondence. For example, the combinational resistive change array 600 is configured to include an A-B plurality of combinational resistive change elements and a D-A plurality of combinational resistive change elements using an array correspondence that includes a correspondence for the A-B plurality of combinational resistive change elements and a correspondence for the D-A plurality of combinational resistive change elements.

The array correspondence for configuring the combinational resistive change element array 600 to include at least one of an A-B plurality of combinational resistive change elements, a C-D plurality of combinational resistive change elements, a D-A plurality of combinational resistive change elements, or a B-C plurality of combinational resistive change elements can stored be in software, hardware, or a combination of software and hardware. The array correspondence is typically stored in support circuitry for the combinational resistive change element array 600. For example, for software on chip, the array correspondence for configuring the combinational resistive change element array 600 can be stored in software controllable control logic, such as a controller and a microcontroller, located on chip. For example, for hardware on chip, the array correspondence for configuring the combinational resistive change element array 600 can be stored in hardware, such as registers and multiplexers, located on chip. For example, for software off chip, the array correspondence for configuring the combinational resistive change element array 600 can be stored in software controllable control logic, such as a controller, a microcontroller, and a processor, located off chip.

The combinational resistive change element array 600 can be initially configured using an array correspondence, and subsequently the combinational resistive change element array 600 can be reconfigured using a different array correspondence. Additionally, the combinational resistive change element array 600 can be reconfigured multiple times using different array correspondences. For example, the combinational resistive change element array 600 can be configured using an array correspondence that includes a correspondence for a D-A plurality of combinational resistive change elements and a correspondence for a B-C plurality of combinational resistive change elements, the correspondence for a D-A plurality of combinational resistive change elements and/or the correspondence for a B-C plurality of combinational resistive change elements can be updated to replace defective resistive change elements and the combinational resistive change element array 600 can be reconfigured using an updated version of the array correspondence that includes an updated version of the correspondence for a D-A plurality of combinational resistive change elements and/or an updated version of the correspondence for a B-C plurality of combinational resistive change elements. For example, the combinational resistive change element array 600 can be configured using an array correspondence that includes a correspondence for a D-A plurality of combinational resistive change elements specifying a general rule of correspondence between the plurality of resistive change elements D00-D*xy* located in section D and the plurality of resistive change elements A00-A*xy* located in section A and a correspondence for a B-C plurality of combinational resistive change elements specifying a general rule of correspondence between the plurality of resistive change elements B00-B*xy* located in section B and the plurality of resistive change elements C00-C*xy* located in section C, a different array correspondence can have a correspondence for a D-A plurality of combinational resistive change elements specifying a different general rule of correspondence between the plurality of resistive change elements D00-D*xy* located in section D and the plurality of resistive change elements A00-A*xy* located in section A and/or a correspondence for a B-C plurality of combinational resistive change elements specifying a different general rule of correspondence between the plurality of resistive change elements B00-B*xy* located in section B and the plurality of resistive change elements C00-C*xy* located in section C and the combinational resistive change element array 600 can be reconfigured using the different array correspondence.

Further, the combinational resistive change element array 600 can be reconfigured using a different array correspondence to increase the amount of information that can be stored in the combinational resistive change element array 600. For example, the combinational resistive change element array 600 can be configured using an array correspondence that includes a correspondence for a D-A plurality of combinational resistive change elements and a correspondence for a B-C plurality of combinational resistive change elements and the combinational resistive change element array 600 can be reconfigured using an array correspondence that includes a correspondence for a D-A plurality of combinational resistive change elements and a correspondence for a B-C plurality of combinational resistive change elements and at least one of a correspondence for an A-B plurality of combinational resistive change elements or a correspondence for a C-D plurality of combinational resistive change elements. For example, the combinational resistive change element array 600 can be configured using an array correspondence where resistive change elements are not shared among combinational resistive change elements in the same plurality of combinational resistive change elements and the combinational resistive change element array 600 can be reconfigured using an array correspondence where resistive change elements are shared among combinational resistive change elements in the same plurality of combinational resistive change elements.

Additionally, the combinational resistive change element array 600 can be reconfigured using a different array correspondence to decrease the amount of information that can be stored in the combination resistive change element array 600. For example, the combinational resistive change element array 600 can be configured using an array correspondence that includes a correspondence for an D-A plurality of combinational resistive change elements and a correspondence for a B-C plurality of combinational resistive change elements and the combinational resistive change element array 600 can be reconfigured using an array correspondence including a correspondence for one of an A-B plurality of combinational resistive change elements, a C-D plurality of combinational resistive change elements, a D-A plurality of combinational resistive change elements, and a B-C plurality of combinational resistive change elements. For example, the combinational resistive change element array 600 can be configured using an array correspondence where resistive change elements are shared among combinational resistive change elements in the same plurality of combinational resistive change elements and the combinational resistive change element array 600 can be reconfigured using an array correspondence where resistive change elements are not shared among combinational resistive change elements in the same plurality of combinational resistive change elements.

Also, the combinational resistive change element array 600 can be reconfigured using a different array correspondence so that information is not stored in at least one section of the combinational resistive change element array 600. For example, the combinational resistive change element array 600 can be reconfigured using a different array correspondence so that information is not stored in at least one section of the combinational resistive change element array 600 that has a large number of defective resistive change elements. For example, the combinational resistive change element array 600 can be configured using an array correspondence that includes a correspondence for a D-A plurality of combinational resistive change elements and a correspondence for a B-C plurality of combinational resistive change elements and the combinational resistive change element array 600 can be reconfigured using an array correspondence including a correspondence for a B-C plurality of combinational resistive change elements and a correspondence for a C-D plurality of combinational resistive change elements so that information is not stored in section A. For example, the combinational resistive change element array 600 can be configured using an array correspondence that includes a correspondence for a D-A plurality of combinational resistive change elements and the combinational resistive change element array 600 can be reconfigured using an array correspondence including a correspondence for a B-C plurality of combinational resistive change elements so that information is not stored in section A and section D.

When the combinational resistive change element array 600 is configured to include at least one plurality of combinational resistive change elements that include combinational resistive change elements having resistive change elements located in the same column, such as the A-B plurality of combinational resistive change elements and the C-D plurality of combinational resistive change elements, and at least one plurality of combinational resistive change elements that include combinational resistive change elements having resistive change elements located in the same row, such the D-A plurality of combinational resistive change elements and the B-C plurality of combinational resistive change elements, at least one plurality of resistive change elements in a section of the combinational resistive change element array 600 is shared among the at least one plurality of combinational resistive change elements that include combinational resistive change elements having resistive change elements located in the same column and the at least one plurality of combinational resistive change elements that include combinational resistive change elements having resistive change elements located in the same row.

The combinational resistive change element array 600 can be configured to include an A-B plurality of combinational resistive change elements using a correspondence where each combinational resistive change element includes a resistive change element from the plurality of resistive change elements A00-A$xy$ located in section A and a resistive change element from the plurality of resistive change elements B00-B$xy$ located in section B in electrical communication with the same bit line. For example, the combinational resistive change element array 600 can be configured to include an A-B plurality of combinational resistive change elements using a correspondence where each combinational resistive change element includes a resistive change element from the plurality of resistive change elements A00-A$xy$ located in section A and a resistive change element from the plurality of resistive change elements B00-B$xy$ located in section B where the resistive change elements are located at matching locations in matrixes. For example, the combinational resistive change element array 600 can be configured to include an A-B plurality of combinational resistive change elements using a correspondence where each combinational resistive change element includes a resistive change element from the plurality of resistive change elements A00-A$xy$ located in section A and a resistive change element from the plurality of resistive change elements B00-B$xy$ located in section B where the resistive change elements are located at the same column and different rows in matrixes.

Additionally, the combinational resistive change element array 600 can be configured to include an A-B plurality of combinational resistive change elements using a correspondence where combinational resistive change elements share resistive change elements. For example, a resistive change element located in section A is shared between a first combinational resistive change element and a second combinational resistive change element when the resistive change element is included in both the first combinational resistive change element and the second combinational resistive change element. For example, a resistive change element located in section B is shared between a first combinational resistive change element and a second combinational resistive change element when the resistive change element is included in both the first combinational resistive change element and the second combinational resistive change element.

The combinational resistive change element array 600 can be configured to include a C-D plurality of combinational resistive change elements using a correspondence where each combinational resistive change element includes a resistive change element from the plurality of resistive change elements C00-C$xy$ located in section C and a resistive change element from the plurality of resistive change elements D00-D$xy$ located in section D in electrical communication with the same bit line. For example, the combinational resistive change element array 600 can be configured to include a C-D plurality of combinational resistive change elements using a correspondence where each combinational resistive change element includes a resistive change element from the plurality of resistive change elements C00-C$xy$ located in section C and a resistive change element from the plurality of resistive change elements D00-D$xy$ located in section D where the resistive change elements are located at matching locations in matrixes. For example, the combinational resistive change element array 600 can be configured to include a C-D plurality of combinational resistive change elements using a correspondence where each combinational resistive change element includes a resistive change element from the plurality of resistive change elements C00-C$xy$ located in section C and a resistive change element from the plurality of resistive change elements D00-D$xy$ located in section D where the resistive change elements are located at the same column and different rows in matrixes.

Additionally, the combinational resistive change element array 600 can be configured to include a C-D plurality of combinational resistive change elements using a correspondence where combinational resistive change elements share resistive change elements. For example, a resistive change element located in section C is shared between a first combinational resistive change element and a second combinational resistive change element when the resistive change element is included in both the first combinational resistive change element and the second combinational resistive change element. For example, a resistive change element located in section D is shared between a first combinational resistive change element and a second combinational resistive change element when the resistive change element is included in both the first combinational resistive change element and the second combinational resistive change element.

The combinational resistive change element array 600 can be configured to include a D-A plurality of combinational resistive change elements using a correspondence where each combinational resistive change element includes a resistive change element from the plurality of resistive change elements D00-D$xy$ located in section D and a resistive change element from the plurality of resistive change elements A00-A$xy$ located in section A in electrical communication with the same word line. For example, the combinational resistive change element array 600 can be configured to include a D-A plurality of combinational resistive change elements using a correspondence where each combinational resistive change element includes a resistive change element from the plurality of resistive change elements D00-D$xy$ located in section D and a resistive change element from the plurality of resistive change elements A00-A$xy$ located in section A where the resistive change elements are located at matching locations in matrixes. In the above example, matching locations in the matrixes are determined using the same numbering convention of both matrixes, such as a numbering convention beginning with column number 0 and row number 0 in the top left corner in each N×N matrix or a numbering convention beginning with column number 0 and row number 0 in the bottom right corner in each N×N matrix. For example, the combinational resistive change element array 600 can be configured to include a D-A plurality of combinational resistive change elements using a correspondence where each combinational resistive change element includes a resistive change element from the plurality of resistive change elements D00-D$xy$ located in section D and a resistive change element from the plurality of resistive change elements A00-A$xy$ located in section A where the resistive change elements are located at the same row and different columns in matrixes.

Additionally, the combinational resistive change element array 600 can be configured to include a D-A plurality of combinational resistive change elements using a correspondence where combinational resistive change elements share resistive change elements. For example, a resistive change element located in section D is shared between a first combinational resistive change element and a second combinational resistive change element when the resistive change element is included in both the first combinational resistive change element and the second combinational resistive change element. For example, a resistive change element located in section A is shared between a first combinational resistive change element and a second combinational resistive change element when the resistive change element is included in both the first combinational resistive change element and the second combinational resistive change element.

The combinational resistive change element array 600 can be configured to include a B-C plurality of combinational resistive change elements using a correspondence where each combinational resistive change element includes a resistive change element from the plurality of resistive change elements B00-B$xy$ located in section B and a resistive change element from the plurality of resistive change elements C00-C$xy$ located in section C in electrical communication with the same word line. For example, the combinational resistive change element array 600 can be configured to include a B-C plurality of combinational resistive change elements using a correspondence where each combinational resistive change element includes a resistive change element from the plurality of resistive change elements B00-B$xy$ located in section B and a resistive change element from the plurality of resistive change elements C00-C$xy$ located in section C where the resistive change elements are located at matching locations in matrixes. In the above example, matching locations in the matrixes are determined using the same numbering convention of both matrixes, such as a numbering convention beginning with column number 0 and row number 0 in the top left corner in each N×N matrix or a numbering convention beginning with column number 0 and row number 0 in the bottom right corner in each N×N matrix. For example, the combinational resistive change element array 600 can be configured to include a B-C plurality of combinational resistive change elements using a correspondence where each combinational resistive change element includes a resistive change element from the plurality of resistive change elements B00-B$xy$ located in section B and a resistive change element from the plurality of resistive change elements C00-C$xy$ located in section C where the resistive change elements are located at the same row and different columns in matrixes.

Additionally, the combinational resistive change element array 600 can be configured to include a B-C plurality of combinational resistive change elements using a correspondence where combinational resistive change elements share resistive change elements. For example, a resistive change element located in section B is shared between a first combinational resistive change element and a second combinational resistive change element when the resistive change element is included in both the first combinational resistive change element and the second combinational resistive change element. For example, a resistive change element located in section C is shared between a first combinational resistive change element and a second combinational resistive change element when the resistive change element is included in both the first combinational resistive change element and the second combinational resistive change element.

Further, although the combinational resistive change element array 600 is discussed above as being configured to include combinational resistive change elements having two resistive change elements, the combinational resistive change element array 600 is also configurable to include combinational resistive change elements having three resistive change elements. For example, the combinational resistive change element array 600 can be configured to include an A-B-C plurality of combinational resistive change elements using a correspondence where each combinational resistive change element includes a resistive change element from the plurality of resistive change elements A00-A$xy$ located in section A, a resistive change element from the plurality of resistive change elements B00-B$xy$ located in section B, and a resistive change element from the plurality of resistive change elements C00-C$xy$ located in section C. In the above example, each combinational resistive change element in the A-B-C plurality of combinational resistive change elements includes a resistive change element from the plurality of resistive change elements A00-A$xy$ located in section A, a resistive change element from the plurality of resistive change elements B00-B$xy$ located in section B, a resistive change element from the plurality of resistive change elements C00-C$xy$ in section C, where the resistive change element from the plurality of resistive change elements A00-A$xy$ located in section A and the resistive change element from the plurality of resistive change elements B00-B$xy$ located in section B are in electrical communication with the same bit line, where the resistive change element from the plurality of resistive change elements B00-B$xy$ located in section B and the resistive change element from the plurality of resistive change elements C00-C$xy$ located in section C are in electrical communication with the same word line, a conductive structure providing an electrical communication path between the resistive change element from the plurality of resistive change elements A00-A$xy$ located in section A and the resistive change element from the plurality of resistive change elements B00-B$xy$ located in section B, and a conductive structure providing an electrical communication path between the resistive change element from the plurality of resistive change elements B00-B$xy$ located in section B and the resistive change element from the plurality of resistive change elements C00-C$xy$ located in section C. Further, in the above example, the conductive structure providing an electrical communication path between the resistive change element from the plurality of resistive change elements A00-A$xy$ located in section A and the resistive change element from the plurality of resistive change elements B00-B$xy$ located in section B has a similar structure to the conductive structures discussed above with respect to the A-B plurality of combinational resistive change elements and the conductive structure providing an electrical communication path between the resistive change element from the plurality of resistive change elements B00-B$xy$ located in section B and the resistive change element from the plurality of resistive change elements C00-C$xy$ located in section C has a similar structure to the conductive structures discussed above with respect to the B-C plurality of combinational resistive change elements.

As shown in FIG. 6A, the plurality of resistive change elements A00-A$xy$ located in section A of the combinational resistive change element array 600 is arranged in a N×N matrix, the plurality of resistive change elements B00-B$xy$ located in section B of the combinational resistive change element array 600 is arranged in a N×N matrix, the plurality of resistive change elements C00-C$xy$ located in section C of the combinational resistive change element array 600 is arranged in a N×N matrix, and the plurality of resistive change elements D00-D$xy$ located in section D of the combinational resistive change element array 600 is arranged in a N×N matrix, where N is a positive integer. The numbering convention for the plurality of resistive change elements A00-A$xy$ located in section A begins with the letter A indicating the resistive change element is located in section A and includes a column number followed by a row number indicating the location of the resistive change element in the N×N matrix. The numbering convention for the plurality of resistive change elements B00-B$xy$ located in section B begins with the letter B indicating the resistive change element is located in section B and includes a column number followed by a row number indicating the location of the resistive change element in the N×N matrix. The numbering convention for the plurality of resistive change elements C00-C$xy$ located in section C begins with the letter C indicating the resistive change element is located in section C and includes a column number followed by a row number indicating the location of the resistive change element in the N×N matrix. The numbering convention for the plurality of resistive change elements D00-D$xy$ located in section D begins with the letter D indicating the resistive change element is located in section D and includes a column number followed by a row number indicating the location of the resistive change element in the N×N matrix. The column numbers and the row numbers for the plurality of resistive change elements A00-A$xy$ located in section A begin with column number 0 and row number 0 in the top left corner of the N×N matrix. The column numbers and the row numbers for the plurality of resistive change elements B00-B$xy$ located in section B begin with column number 0 and row number 0 in the top left corner of the N×N matrix. The column numbers and the row numbers for the plurality of resistive change elements C00-C$xy$ located in section C begin with column number 0 and row number 0 in the bottom right corner of the N×N matrix. The column numbers and the row numbers for the plurality of resistive change elements D00-D$xy$ located in section D begin with column number 0 and row number 0 in the bottom right corner of the N×N matrix. It is noted that although the plurality of resistive change elements A00-A$xy$ located in section A, the plurality of resistive change elements B00-B$xy$ located in section B, the plurality of resistive change elements C00-C$xy$ located in section C, and the plurality of resistive change elements D00-D$xy$ are arranged in square N×N matrixes, where N is a positive integer, each plurality of resistive change elements can be arranged in other layouts such as rectangular N×M matrixes, where N and M are different positive integers.

The number of resistive change elements in the plurality of resistive change elements A00-A$xy$ located in section A can be greater than the number of combinational resistive change elements the combinational resistive change element array 600 is configured to include using an array correspondence that includes resistive change elements from the plurality of resistive change elements A00-A$xy$ located in section A. For example, the number of resistive change elements in the plurality of resistive change elements A00-A$xy$ located in section A can be greater than the number of combinational resistive change elements the combinational resistive change element array 600 is configured to include using an array correspondence that includes resistive change elements from the plurality of resistive change elements A00-A$xy$ located in section A so that resistive change elements are available to replace defective resistive change elements. The number of resistive change elements in the plurality of resistive change elements B00-B$xy$ located in section B can be greater than the number of combinational resistive change elements the combinational resistive change element array 600 is configured to include using an array correspondence that includes resistive change elements from the plurality of resistive change elements B00-B$xy$ located in section B. For example, the number of resistive change elements in the plurality of resistive change elements B00-B$xy$ located in section B can be greater than the number of combinational resistive change elements the combinational resistive change element array 600 is configured to include using an array correspondence that includes resistive change elements from the plurality of resistive change elements B00-B$xy$ located in section B so that resistive change elements are available to replace defective resistive change elements. The number of resistive change elements in the plurality of resistive change elements C00-C$xy$ located in section C can be greater than the number of combinational resistive change elements the combinational resistive change element array 600 is configured to include using an array correspondence that includes resistive change elements from the plurality of resistive change elements C00-C$xy$ located in section C. For example, the number of resistive change elements in the plurality of resistive change elements C00-C$xy$ located in section C can be greater than the number of combinational resistive change elements the combinational resistive change element array 600 is configured to include using an array correspondence that includes resistive change elements from the plurality of resistive change elements C00-C$xy$ located in section C so that resistive change elements are available to replace defective resistive change elements. The number of resistive change elements in the plurality of resistive change elements D00-D$xy$ located in section D can be greater than the number of combinational resistive change elements the combinational resistive change element array 600 is configured to include using an array correspondence that includes resistive change elements from the plurality of resistive change elements D00-D$xy$ located in section D. For example, the number of resistive change elements in the plurality of resistive change elements D00-D$xy$ located in section D can be greater than the number of combinational resistive change elements the combinational resistive change element array 600 is configured to include using an array correspondence that includes resistive change elements from the plurality of resistive change elements D00-D$xy$ located in section D so that resistive change elements are available to replace defective resistive change elements. It is noted that the number of resistive change elements in the plurality of resistive change elements A00-A$xy$ located in section A, the number of resistive change elements in the plurality of resistive change elements B00-B$xy$ located in section B, the number of resistive change elements in plurality of resistive change elements C00-C$xy$ located in section C, and the number of resistive change elements in plurality of resistive change elements D00-D$xy$ located sin section D can differ from each other.

In the example, of FIG. 6A, the plurality of resistive change elements A00-A$xy$ located in section A, the plurality of resistive change elements B00-B$xy$ located in section B, the plurality of resistive change elements C00-C$xy$ located in section C, and the plurality of resistive change elements D00-D$xy$ located in section D can be adjusted (programmed) between resistive states in a bidirectional manner as similarly discussed above with respect to the resistive change elements in the combinational resistive change element array 200. Additionally, in the example, of FIG. 6A, the plurality of resistive change elements A00-A$xy$ located in section A, the plurality of resistive change elements B00-B$xy$ located in section B, the plurality of resistive change elements C00-C$xy$ located in section C, and the plurality of resistive change elements D00-D$xy$ located in section D have substantially the same structure as the resistive change elements in the combinational resistive change element array 200 discussed above. Also, in the example, of FIG. 6A, the plurality of resistive change elements A00-A$xy$ located in section A, the plurality of resistive change elements B00-B$xy$ located in section B, the plurality of resistive change elements C00-C$xy$ located in section C, and the plurality of resistive change elements D00-D$xy$ located in section D are located on the same level. However, the plurality of resistive change elements A00-A$xy$ located in section A, the plurality of resistive change elements B00-B$xy$ located in section B, the plurality of resistive change elements C00-C$xy$ located in section C, and the plurality of resistive change elements D00-D$xy$ located in section D are not limited to being located on the same level. Additionally, resistive change elements in the plurality of resistive change elements A00-A$xy$ located in section A are not limited to being located on the same level, resistive change elements in the plurality of resistive change elements B00-B$xy$ located in section B are not limited to being located on the same level, resistive change elements in the plurality of resistive change elements C00-C$xy$ located in section C are not limited to being located on the same level, and resistive change elements in the plurality of resistive change elements D00-D$xy$ located in section D are not limited to being located on the same level. Also, the plurality of resistive change elements A00-A$xy$ located in section A, the plurality of resistive change elements B00-B$xy$ located in section B, the plurality of resistive change elements C00-C$xy$ located in section C, and the plurality of resistive change elements D00-D$xy$ located in section D are not limited to having substantially the same structure.

Further, in the example, of FIG. 6A, the first plurality of electrical communication conductive structures 610, 612, 614, the second plurality of electrical communication conductive structures 620, 622, 624, the third plurality of electrical communication conductive structures 630, 632, 634, and the fourth plurality of electrical communication conductive structures 640, 642, 644 have structures as similarly discussed above with respect to the electrical communication conductive structures in the combinational resistive change element array 200. Also, the first plurality of electrical communication conductive structures 610, 612, 614, the second plurality of electrical communication conductive structures 620, 622, 624, the third plurality of electrical communication conductive structures 630, 632, 634, and the fourth plurality of electrical communication conductive structures 640, 642, 644 are not limited to having substantially the same structure. For example, when intervening interconnecting structures, such as plugs, filled vias, and studs, are located between the resistive change elements in at least one of the A-B plurality of combinational resistive change elements, the C-D plurality of combinational resistive change elements, the D-A plurality of combinational resistive change elements, or the B-C plurality of combinational resistive change elements and word lines in a plurality word lines and no intervening interconnecting structures, such as plugs, filled vias, and studs, are located between the resistive change elements in at least one of the A-B plurality of combinational resistive change elements, the C-D plurality of combinational resistive change elements, the D-A plurality of combinational resistive change elements, or the B-C plurality of combinational resistive change elements and word lines in a plurality of word lines and bit lines in a plurality of bit lines, at least one of the first plurality of electrical communication conductive structures 610, 612, 614, the second plurality of electrical communication conductive structures 620, 622, 624, the third plurality of electrical communication conductive structures 630, 632, 634, or the fourth plurality of electrical communication conductive structures 640, 642, 644 can have different structures from at least one of the first plurality of electrical communication conductive structures 610, 612, 614, the second plurality of electrical communication conductive structures 620, 622, 624, the third plurality of electrical communication conductive structures 630, 632, 634, or the fourth plurality of electrical communication conductive structures 640, 642, 644.

Additionally, as similarly discussed above with respect to the combinational resistive change element array 200, the regions around the plurality of resistive change elements A00-A$xy$ located in section A, the plurality of resistive change elements B00-B$xy$ located in section B, the plurality of resistive change elements C00-C$xy$ located in section C, the plurality of resistive change elements D00-D$xy$ located in section D, the first plurality of word lines W3(0)-W3($y$), the second plurality of word lines W4(0)-W4($y$), the first plurality of bit lines B3(0)-B3($x$), the second plurality of bit lines B4(0)-B4($x$), the first plurality of electrical communication conductive structures 610, 612, 614, the second plurality of electrical communication conductive structures 620, 622, 624, the third plurality of electrical communication conductive structures 630, 632, 634, and the fourth plurality of electrical communication conductive structures 640, 642, 644 can be filled with a dielectric. Further, as similarly discussed above with respect to the combinational resistive change element array 200, the plurality of resistive change elements A00-A$xy$ located in section A, the plurality of resistive change elements B00-B$xy$ located in section B, the plurality of resistive change elements C00-C$xy$ located in section C, and the plurality of resistive change elements D00-D$xy$ located in section D can be sealed by thin dielectric sidewall films, as described in U.S. Patent Application Publication No. 2018/0226578, prior to filling the regions around the plurality of resistive change elements A00-A$xy$ located in section A, the plurality of resistive change elements B00-B$xy$ located in section B, the plurality of resistive change elements C00-C$xy$ located in section C, and the plurality of resistive change elements D00-D$xy$ located in section D with a dielectric.

Figures 1, 6C:
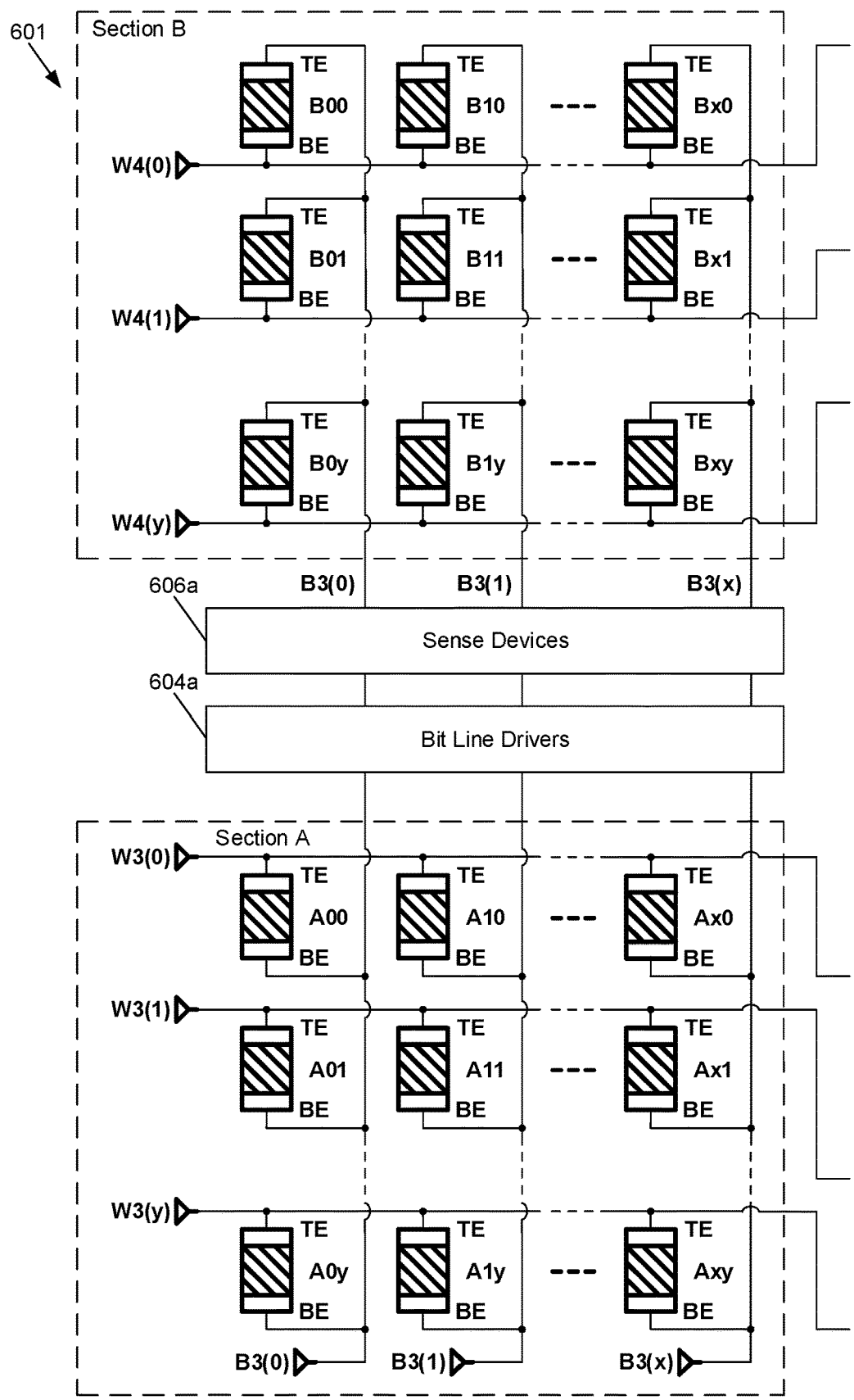
Figures 2, 6C:
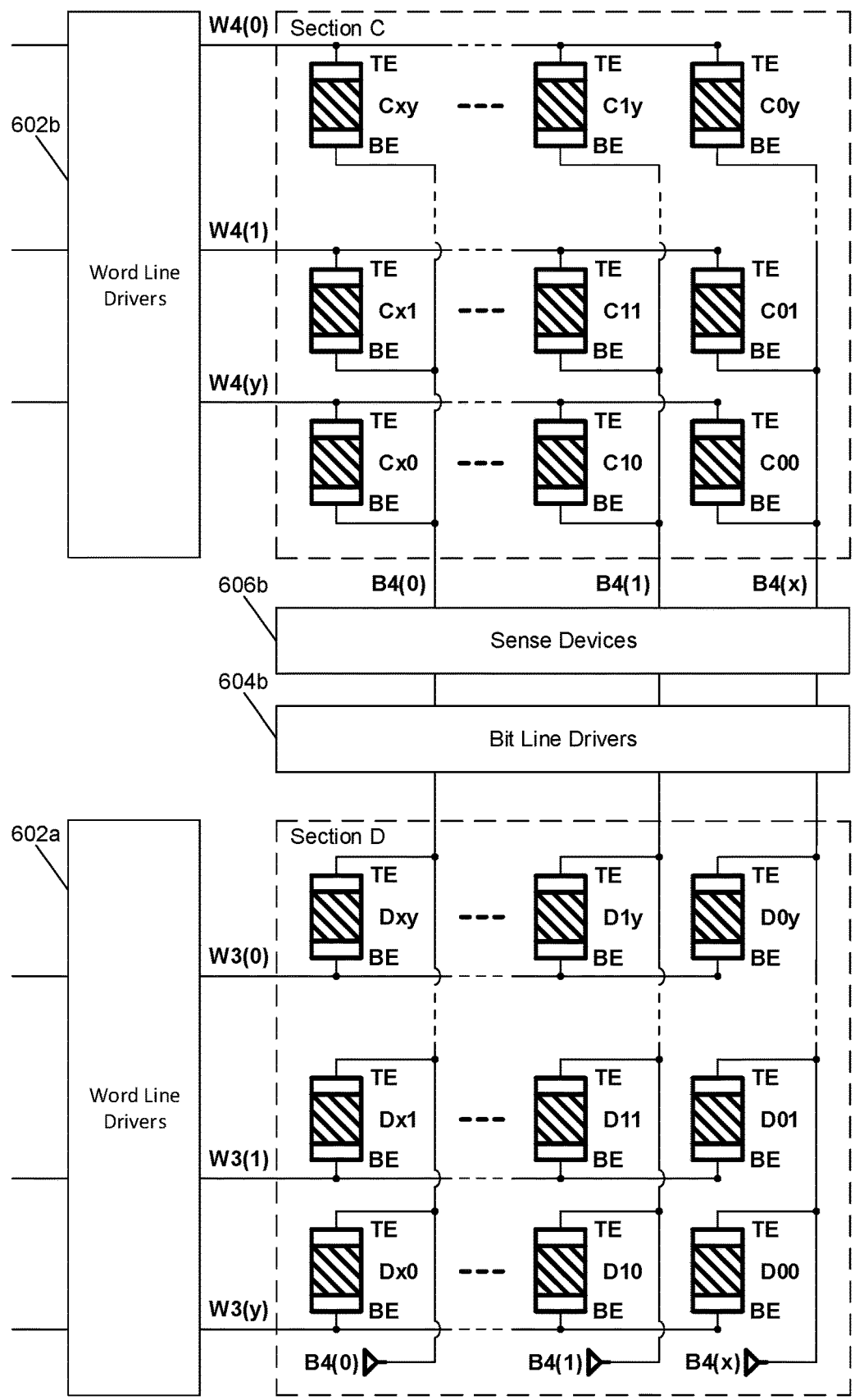

Referring now to FIGS. 6C-1 and 6C-2, an exemplary architecture for programming and accessing at least one combinational resistive change element in a combinational resistive change element array 601 where the combinational resistive change element array 601 is configured to include an A-B plurality of combinational resistive change elements and a C-D plurality of combinational resistive change elements is illustrated. The exemplary architecture shown in FIGS. 6C-1 and 6C-2 includes the combinational resistive change element array 601, a first plurality of word line driver circuits 602a in electrical communication with the first plurality of word lines W3(0)-W3($x$), a second plurality of word line driver circuits 602b in electrical communication with the second plurality of word lines W4(0)-W4($x$), a first plurality of bit line driver circuits 604a in electrical communication with the first plurality of bit lines B3(0)-B3($x$), a second plurality of bit line driver circuits 604b in electrical communication with the second plurality of bit lines B4(0)-B4($x$), a first plurality of sense devices 606a in electrical communication with the first plurality of bit lines B3(0)-B3($x$), and a second plurality of sense devices 606b in electrical communication with the second plurality of bit lines B4(0)-B4($x$). The first plurality of word line driver circuits 602a, the second plurality of word line driver circuits 602b, the first plurality of bit line driver circuits 604a, the second plurality of bit line driver circuits 604b, the first plurality of sense devices 606a, and the second plurality of sense devices 606b are located between the four sections of the combinational resistive change element array 601, as shown in FIGS. 6C-1 and 6C-2, to reduce the amount of chip area consumed. Alternatively, the first plurality of word line driver circuits 602a, the second plurality of word line driver circuits 602b, the first plurality of bit line driver circuits 604a, the second plurality of bit line driver circuits 604b, the first plurality of sense devices 606a, and/or the second plurality of sense devices 606b can be located outside the four sections of the combinational resistive change element array 601.

Exemplary driver circuits for the first plurality of word line driver circuits 602a, the second plurality of word line driver circuits 602b, the first plurality of bit line driver circuits 604a, and the second plurality of bit line driver circuits 604b are discussed above with respect to FIGS. 3C-3G. However, driver circuits for the first plurality of word line driver circuits 602a, the second plurality of word line driver circuits 602b, the first plurality of bit line driver circuits 604a, and the second plurality of bit line driver circuits 604b are not limited to the exemplary driver circuits discussed above with respect to FIGS. 3C-3G and the driver circuits for the first plurality of word line driver circuits 602a, the second plurality of word line driver circuits 602b, the first plurality of bit line driver circuits 604a, and the second plurality of bit line driver circuits 604b can be other driver circuits. Additionally, the first plurality of sense devices 606a and the second plurality of sense devices 606b can be components that generate an output voltage based on at least one input voltage, such as sense amplifiers, differential amplifiers, inverters, and analog to digital converters. Alternatively, the first plurality of sense devices 606a and the second plurality of sense device 606b can be omitted from the exemplary architecture and the first plurality of bit lines B3(0)-B3($x$) and the second plurality of bit lines B4(0)-B4($x$) can be in electrical communication with a logic circuit or a control circuit such as a processor, a controller, and a microcontroller.

PROGRAMMING operations, READ operations, SET VERIFY operations, and RESET VERIFY operations of individual combinational resistive change elements in the combinational resistive change element array 601 can be performed by driving voltages on the first plurality of word lines W3(0)-W3($y$), the second plurality of word lines W4(0)-W4($y$), the first plurality of bit lines B3(0)-B3($x$), and the second plurality of bit lines B4(0)-B4($x$) as required for PROGRAMMING operations, READ operations, SET VERIFY operations, and RESET VERIFY operations of individual combinational resistive change elements. PROGRAMMING operations, READ operations, SET VERIFY operations, and RESET VERIFY operations of combinational resistive change elements in the A-B plurality of combinational resistive change elements having resistive change elements in electrical communication with the same word line in the first plurality of word lines W3(0)-W3($y$) and resistive change elements in electrical communication with the same word line in the second plurality of word lines W4(0)-W4($y$) can be performed at the same time by driving voltages on the first plurality of word lines W3(0)-W3($y$), the second plurality of word lines W4(0)-W4($y$), the first plurality of bit lines B3(0)-B3($x$), and the second plurality of bit lines B4(0)-B4($x$) as required for performing PRO- GRAMMING operations, READ operations, SET VERIFY operations, and RESET VERIFY operations of the combinational resistive change elements at the same time. PROGRAMMING operations, READ operations, SET VERIFY operations, and RESET VERIFY operations of combinational resistive change elements in the C-D plurality of combinational resistive change elements having resistive change elements in electrical communication with the same word line in the second plurality of word lines W4(0)-W4(y) and resistive change elements in electrical communication with the same word line in the first plurality of word lines W3(0)-W3(y) can be performed at the same time by driving voltages on the first plurality of word lines W3(0)-W3(y), the second plurality of word lines W4(0)-W4(y), the first plurality of bit lines B3(0)-B3(x), and the second plurality of bit lines B4(0)-B4(x) as required for performing PROGRAMMING operations, READ operations, SET VERIFY operations, and RESET VERIFY operations of the combinational resistive change elements at the same time. Additionally, PROGRAMMING operations of combinational resistive change elements in the A-B plurality of combinational resistive change elements and combinational resistive change elements in the C-D plurality of combinational resistive change elements having resistive change elements in electrical communication with the same word line in the first plurality of word lines W3(0)-W3(y) and resistive change elements in electrical communication with the same word line in the second plurality of word lines W4(0)-W4(y) can be performed at the same time by driving voltages on the first plurality of word lines W3(0)-W3(y), the second plurality of word lines W4(0)-W4(y), the first plurality of bit lines B3(0)-B3(x), and the second plurality of bit lines B4(0)-B4(x) as required for performing PROGRAMMING operations of the combinational resistive change elements at the same time.

When the first plurality of word line driver circuits 602a are fifth driver circuits, as similarly discussed above with respect to the first plurality of word line driver circuits 302a shown in FIG. 3H-2, in electrical communication with first plurality of word lines W3(0)-W3(y), the second plurality of word line driver circuits 602b are fifth drivers circuits, as similarly discussed above with respect to the first plurality of word line driver circuits 302a shown in FIG. 3H-2, in electrical communication with second plurality of word lines W4(0)-W4(y), the first plurality of bit line driver circuits 604a are fifth driver circuits, as similarly discussed above with respect to the plurality of bit line driver circuits 304 shown in FIG. 3H-2, in electrical communication with the first plurality of bit lines B3(0)-B3(x), the second plurality of bit line driver circuits 604b are fifth driver circuits, as similarly discussed above with respect to the plurality of bit line driver circuits 304 in shown FIG. 3H-2, in electrical communication with the second plurality of bit lines B4(0)-B4(x), the first plurality of sense devices 606a are sense amplifiers, as similarly discussed above with respect to FIGS. 3H-1 and 3H-2, in electrical communication with the first plurality of bit lines B3(0)-B3(x) or the first plurality of sense devices 606a are inverters, as similarly discussed above with respect to FIGS. 3I-1 and 3I-2, in electrical communication with the first plurality of bit lines B3(0)-B3(x) or the first plurality of sense devices 606a are omitted, as similarly discussed above with respect to FIGS. 3H-1 and 3H-2, and the second plurality of sense devices 606b are sense amplifiers, as similarly discussed above with respect to FIGS. 3H-1 and 3H-2, in electrical communication with the second plurality of bit lines B4(0)-B4(x) or the second plurality of sense devices 606b are inverters, as similarly discussed above with respect to FIGS. 3I-1 and 3I-2, in electrical communication with the second plurality of bit lines B4(0)-B4(x) or the second plurality of sense devices 606b are omitted, as similarly discussed above with respect to FIGS. 3H-1 and 3H-2, PROGRAMMING operations, READ operations, SET VERIFY operations, and RESET VERIFY operations of combinational resistive change elements in the A-B plurality of combinational resistive change elements can be performed in a similar manner as discussed above with respect to combinational resistive change element S11. However, when a combinational resistive change element in the A-B plurality of combinational resistive change elements is selected, the unselected combinational resistive change elements include the combinational resistive change elements in the A-B plurality of combinational resistive change elements other than the selected combinational resistive change element and the combinational resistive change elements in the C-D plurality of combinational resistive change elements. Thus, applying conditions to inhibit change in relational states of unselected combinational resistive change elements applies conditions to inhibit change in relational states to the combinational resistive change elements in the A-B plurality of combinational resistive change elements other than the selected combinational resistive change element and the combinational resistive change elements in the C-D plurality of combinational resistive change elements. It is noted that PROGRAMMING operations, READ operations, SET VERIFY operations, and RESET VERIFY operations are performed treating the resistive change elements in the plurality of resistive change elements A00-Axy located in section A as top resistive change elements in resistive dividers and the resistive change elements in the plurality of resistive change elements B00-Bxy located in section B as bottom resistive change elements in resistive dividers.

For example, a PROGRAMMING operation to adjust a relational state of a combinational resistive change element including resistive change element A11 and resistive change element B11 to a low relational state, is performed as similarly discussed above with respect to the combinational resistive change element S11, however, the word lines W3(0), W3(y) in the first plurality of word lines W3(0)-W3(y), the word lines W4(0), W4(y) in the second plurality of word lines W4(0)-W4(y), the bit lines B3(0), B3(x) in the first plurality of bit lines B3(0)-B3(x) and the second plurality of bit lines B4(0)-B4(x) are driven to the inhibit voltage Vinhibit. Also, in the above example, the word line W3(1) is driven to the system voltage VDD, the bit line B3(1) is driven to ground or 0 volts, the word line W4(1) is driven to the system voltage VDD so that, ignoring leakage currents, a current flows from the top electrode to the bottom electrode of the resistive change element A11 and a current flows from the bottom electrode to the top electrode of the resistive change element B11.

For example, a PROGRAMMING operation to adjust a relational state of a combinational resistive change element including resistive change element A11 and resistive change element B11 to a high relational state, is performed as similarly discussed above with respect to the combinational resistive change element S11, however, the word lines W3(0), W3(y) in the first plurality of word lines W3(0)-W3(y), the word lines W4(0), W4(y) in the second plurality of word lines W4(0)-W4(y), the bit lines B3(0), B3(x) in the first plurality of bit lines B3(0)-B3(x), and the second plurality of bit lines B4(0)-B4(x) are driven to the inhibit voltage Vinhibit. Also, in the above example, the word line W3(1) is driven to 0 volts or ground, the bit line B3(1) is driven to the system voltage VDD, the word line W4(1) is driven to 0 volts or ground so that, ignoring leakage currents, a current flows from the bottom electrode to the top electrode of the resistive change element A11 and a current flows from the top electrode to the bottom electrode of the resistive change element B11.

For example, a READ operation, a SET VERIFY operation, and a RESET VERIFY operation of a combinational resistive change element including resistive change element A11 and resistive change element B11, are performed as similarly discussed above with respect to the combinational resistive change element S11, however, the word lines W3(0), W3(y) in the first plurality of word lines W3(0)-W3(y), the word lines W4(0), W4(y) in the second plurality of word lines W4(0)-W4(y), the bit lines B3(0), B3(x) in the first plurality of bit lines B3(0)-B3(x), and the second plurality of bit lines B4(0)-B4(x) are driven to the inhibit voltage Vinhibit. Also, in the above example, the word line W3(1) is driven to the read voltage Vread and the word line W4(1) is driven to 0 volts or ground, so that a current flows from the word line W3(1) through the resistive change element A11 into the bit line B3(1) and the current flows from the bit line B3(1) through the resistive change element B11 into the word line W4(1). Further, in the above example, the same amount of current, ignoring leakage currents, flows through the resistive change element A11 and the resistive change element B11. Additionally, in the above example, the voltage VB3(1) on the bit line B3(1) is indicative of a relational state of the combinational resistive change element including resistive change element A11 and resistive change element B11 because the voltage level of the read voltage Vread is the same for both a low relational state and a high relational state, while the resistive ratio of the resistive divider formed by the resistive change element A11 and the resistive change element B11 is different for a low relational state and a high relational state.

When the first plurality of word line driver circuits 602a are fifth driver circuits, as similarly discussed above with respect to the first plurality of word line driver circuits 302a shown in FIG. 3H-2, in electrical communication with first plurality of word lines W3(0)-W3(y), the second plurality of word line driver circuits 602b are fifth drivers circuits, as similarly discussed above with respect to the first plurality of word line driver circuits 302a shown in FIG. 3H-2, in electrical communication with second plurality of word lines W4(0)-W4(y), the first plurality of bit line driver circuits 604a are fifth driver circuits, as similarly discussed above with respect to the plurality of bit line driver circuits 304 shown in FIG. 3H-2, in electrical communication with the first plurality of bit lines B3(0)-B3(x), the second plurality of bit line driver circuits 604b are fifth driver circuits, as similarly discussed above with respect to the plurality of bit line driver circuits 304 in shown FIG. 3H-2, in electrical communication with the second plurality of bit lines B4(0)-B4(x), the first plurality of sense devices 606a are sense amplifiers, as similarly discussed above with respect to FIGS. 3H-1 and 3H-2, in electrical communication with the first plurality of bit lines B3(0)-B3(x) or the first plurality of sense devices 606a are inverters, as similarly discussed above with respect to FIGS. 3I-1 and 3I-2, in electrical communication with the first plurality of bit lines B3(0)-B3(x) or the first plurality of sense devices 606a are omitted, as similarly discussed above with respect to FIGS. 3H-1 and 3H-2, and the second plurality of sense devices 606b are sense amplifiers, as similarly discussed above with respect to FIGS. 3H-1 and 3H-2, in electrical communication with the second plurality of bit lines B4(0)-B4(x) or the second plurality of sense devices 606b are inverters, as similarly discussed above with respect to FIGS. 3I-1 and 3I-2, in electrical communication with the second plurality of bit lines B4(0)-B4(x) or the second plurality of sense devices 606b are omitted, as similarly discussed above with respect to FIGS. 3H-1 and 3H-2, PROGRAMMING operations, READ operations, SET VERIFY operations, and RESET VERIFY operations of combinational resistive change elements in the C-D plurality of combinational resistive change elements can be performed in a similar manner as discussed above with respect to combinational resistive change element S11. However, when a combinational resistive change element in the C-D plurality of combinational resistive change elements is selected, the unselected combinational resistive change elements include the combinational resistive change elements in the C-D plurality of combinational resistive change elements other than the selected combinational resistive change element and the combinational resistive change elements in the A-B plurality of combinational resistive change elements. Thus, applying conditions to inhibit change in relational states of unselected combinational resistive change elements applies conditions to inhibit change in relational states to the combinational resistive change elements in the C-D plurality of combinational resistive change elements other than the selected combinational resistive change element and the combinational resistive change elements in the A-B plurality of combinational resistive change elements. It is noted that PROGRAMMING operations, READ operations, SET VERIFY operations, and RESET VERIFY operations are performed treating resistive change elements in the plurality of resistive change elements C00-Cxy located in section C as top resistive change elements in resistive dividers and resistive change elements in the plurality of resistive change elements D00-Dxy located in section D as bottom resistive change elements in resistive dividers.

For example, a PROGRAMMING operation to adjust a relational state of a combinational resistive change element including resistive change element C11 and resistive change element D11 to a low relational state, is performed as similarly discussed above with respect to the combinational resistive change element S11, however, the word lines W3(0), W3(y) in the first plurality of word lines W3(0)-W3(y), the word lines W4(0), W4(y) in the second plurality of word lines W4(0)-W4(y), the first plurality of bit lines B3(0)-B3(x), and the bit lines B4(0), B4(x) in the second plurality of bit lines B4(0)-B4(x) are driven to the inhibit voltage Vinhibit. Also, in the above example, the word line W3(1) is driven to the system voltage VDD, the bit line B4(1) is driven to ground or 0 volts, the word line W4(1) is driven to the system voltage VDD so that, ignoring leakage currents, a current flows from the top electrode to the bottom electrode of the resistive change element C11 and a current flows from the bottom electrode to the top electrode of the resistive change element D11.

For example, a PROGRAMMING operation to adjust a relational state of a combinational resistive change element including resistive change element C11 and resistive change element D11 to a high relational state, is performed as similarly discussed above with respect to the combinational resistive change element S11, however, the word lines W3(0), W3(y) in the first plurality of word lines W3(0)-W3(y), the word lines W4(0), W4(y) in the second plurality of word lines W4(0)-W4(y), the first plurality of bit lines B3(0)-B3(x), and bit lines B4(0), B4(x) in the second plurality of bit lines B4(0)-B4(x) are driven to the inhibit voltage Vinhibit. Also, in the above example, the word line W3(1) is driven to 0 volts or ground, the bit line B4(1) is driven to the system voltage VDD, the word line W4(1) is driven to 0 volts or ground so that, ignoring leakage currents, a current flows from the bottom electrode to the top electrode of the resistive change element C11 and a current flows from the top electrode to the bottom electrode of the resistive change element D11.

For example, a READ operation, a SET VERIFY operation, and a RESET VERIFY operation of a combinational resistive change element including resistive change element C11 and resistive change element D11, are performed as similarly discussed above with respect to the combinational resistive change element S11, however, the word lines W3(0), W3($y$) in the first plurality of word lines W3(0)-W3($y$), the word lines W4(0), W4($y$) in the second plurality of word lines W4(0)-W4($y$), the first plurality of bit lines B3(0)-B3($x$), and the bit lines B4(0), B4($x$) in the second plurality of bit lines B4(0)-B4($x$) are driven to the inhibit voltage Vinhibit. Also, in the above example, the word line W4(1) is driven to the read voltage Vread and the word line W3(1) is driven to 0 volts or ground, so that a current flows from the word line W4(1) through the resistive change element C11 into the bit line B4(1) and the current flows from the bit line B4(1) through the resistive change element D11 into the word line W3(1). Further, in the above example, the same amount of current, ignoring leakage currents, flows through the resistive change element C11 and the resistive change element D11. Additionally, in the above example, the voltage VB4(1) on the bit line B4(1) is indicative of a relational state of the combinational resistive change element including resistive change element C11 and resistive change element D11 because the voltage level of the read voltage Vread is the same for both a low relational state and a high relational state, while the resistive ratio of the resistive divider formed by the resistive change element C11 and the resistive change element D11 is different for a low relational state and a high relational state.

Figures 1, 6D:
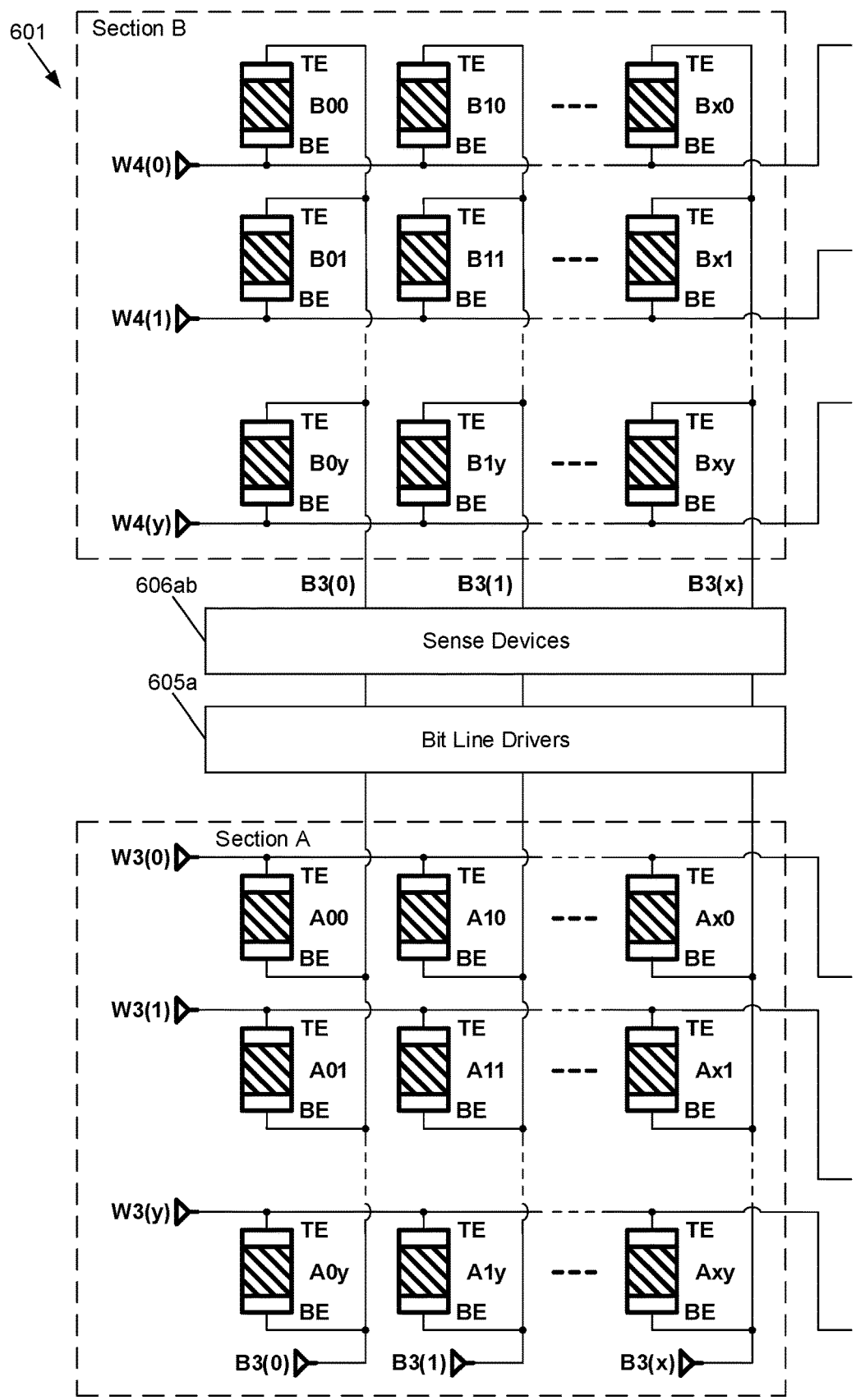
Figures 2, 6D:
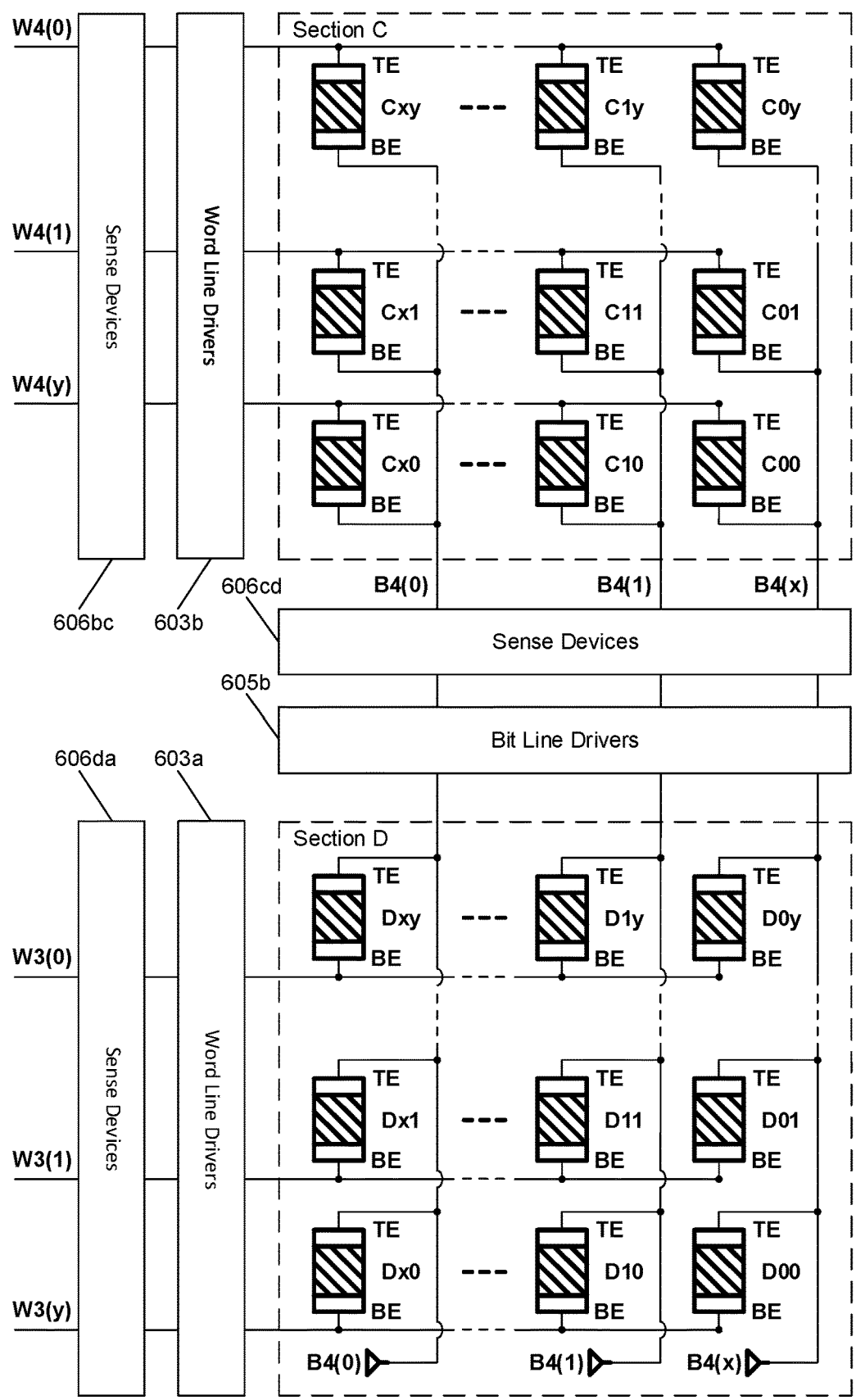

Referring now to FIGS. 6D-1 and 6D-2, an exemplary architecture for programming and accessing at least one combinational resistive change element in a combinational resistive change element array 601 where the combinational resistive change element array 601 is configured to include an A-B plurality of combinational resistive change elements, a C-D plurality of combinational resistive change elements, a D-A plurality of combinational resistive change elements, and a B-C plurality of combinational resistive change elements is illustrated. The A-B plurality of combinational resistive change elements and the D-A plurality of combinational resistive change elements share resistive change elements in the plurality of resistive change elements A00-A$xy$ located in section A of the combinational resistive change element array 601. The A-B plurality of combinational resistive change elements and the B-C plurality of combinational resistive change elements share resistive change elements in the plurality of resistive change elements B00-B$xy$ located in section B of the combinational resistive change element array 601. The B-C plurality of combinational resistive change elements and the C-D plurality of combinational resistive change elements share resistive change elements in the plurality of resistive change elements C00-C$xy$ located in section C of the combinational resistive change element array 601. The C-D plurality of combinational resistive change elements and the D-A plurality of combinational resistive change elements share resistive change elements in the plurality of resistive change elements D00-D$xy$ located in section D of the combinational resistive change element array 601.

The exemplary architecture shown in FIGS. 6D-1 and 6D-2 includes the combinational resistive change element array 601, a first plurality of word line driver circuits 603$a$ in electrical communication with the first plurality of word lines W3(0)-W3($x$), a second plurality of word line driver circuits 603$b$ in electrical communication with the second plurality of word lines W4(0)-W4($x$), a first plurality of bit line driver circuits 605$a$ in electrical communication with the first plurality of bit lines B3(0)-B3($x$), a second plurality of bit line driver circuits 605$b$ in electrical communication with the second plurality of bit lines B4(0)-B4($x$), a first plurality of sense devices 606$ab$ in electrical communication with the first plurality of bit lines B3(0)-B3($x$), a second plurality of sense devices 606$cd$ in electrical communication with the second plurality of bit lines B4(0)-B4$x$), a third plurality of sense devices 606$da$ in electrical communication with the first plurality of word lines W3(0)-W3($y$), and a fourth plurality of sense devices 606$bc$ in electrical communication with the second plurality of word lines W4(0)-W4($y$). The first plurality of word line driver circuits 603$a$, the second plurality of word line driver circuits 603$b$, the first plurality of bit line driver circuits 605$a$, the second plurality of bit line driver circuits 605$b$, the first plurality of sense devices 606$ab$, the second plurality of sense devices 606$cd$, the third plurality of sense devices 606$da$, and the fourth plurality of sense devices 606$bc$ can be located between the four sections of the combinational resistive change element array 601, as shown in FIGS. 6D-1 and 6D-2, to reduce the amount of chip area consumed. Alternatively, the first plurality of word line driver circuits 603$a$, the second plurality of word line driver circuits 603$b$, the first plurality of bit line driver circuits 605$a$, the second plurality of bit line driver circuits 605$b$, the first plurality of sense devices 606$ab$, the second plurality of sense devices 606$cd$, the third plurality of sense devices 606$da$, and/or the fourth plurality of sense devices 606$bc$ can be located outside the four sections of the combinational resistive change element array 601.

Exemplary driver circuits for the first plurality of word line driver circuits 603$a$, the second plurality of word line driver circuits 603$b$, the first plurality of bit line driver circuits 605$a$, and the second plurality of bit line driver circuits 605$b$ are discussed above with respect to FIGS. 3C-3G. However, driver circuits for the first plurality of word line driver circuits 603$a$, the second plurality of word line driver circuits 603$b$, the first plurality of bit line driver circuits 605$a$, and the second plurality of bit line driver circuits 605$b$ are not limited to the exemplary driver circuits discussed above with respect to FIGS. 3C-3G and the driver circuits for the first plurality of word line driver circuits 603$a$, the second plurality of word line driver circuits 603$b$, the first plurality of bit line driver circuits 605$a$, and the second plurality of bit line driver circuits 605$b$ can be other driver circuits. Additionally, the first plurality of sense devices 606$ab$, the second plurality of sense devices 606$cd$, the third plurality of sense devices 606$da$, and the fourth plurality of sense devices 606$bc$ can be components that generate an output voltage based on at least one input voltage, such as sense amplifiers, differential amplifiers, inverters, and analog to digital converters. Alternatively, the first plurality of sense devices 606$ab$, the second plurality of sense devices 606$cd$, the third plurality of sense devices 606$da$, and the fourth plurality of sense devices 606$bc$ can be omitted from the exemplary architecture and the first plurality of bit lines B3(0)-B3($x$) and the second plurality of bit lines B4(0)-B4($x$) can be in electrical communication with a logic circuit or a control circuit such as a processor, a controller, and a microcontroller.

PROGRAMMING operations, READ operations, SET VERIFY operations, and RESET VERIFY operations of individual combinational resistive change elements in the combinational resistive change element array 601 can be performed by driving voltages on the first plurality of word lines W3(0)-W3(y), the second plurality of word lines W4(0)-W4(y), the first plurality of bit lines B3(0)-B3(x), and the second plurality of bit lines B4(0)-B4(x) as required for PROGRAMMING operations, READ operations, SET VERIFY operations, and RESET VERIFY operations of individual combinational resistive change elements. PROGRAMMING operations, READ operations, SET VERIFY operations, and RESET VERIFY operations of combinational resistive change elements in the A-B plurality of combinational resistive change elements having resistive change elements in electrical communication with the same word line in the first plurality of word lines W3(0)-W3(y) and resistive change elements in electrical communication with the same word line in the second plurality of word lines W4(0)-W4(y) can be performed at the same time by driving voltages on the first plurality of word lines W3(0)-W3(y), the second plurality of word lines W4(0)-W4(y), the first plurality of bit lines B3(0)-B3(x), and the second plurality of bit lines B4(0)-B4(x) as required for performing PROGRAMMING operations, READ operations, SET VERIFY operations, and RESET VERIFY operations of the combinational resistive change elements at the same time. PROGRAMMING operations, READ operations, SET VERIFY operations, and RESET VERIFY operations of combinational resistive change elements in the C-D plurality of combinational resistive change elements having resistive change elements in electrical communication with the same word line in the second plurality of word lines W4(0)-W4(y) and resistive change elements in electrical communication with the same word line in the first plurality of word lines W3(0)-W3(y) can be performed at the same time by driving voltages on the first plurality of word lines W3(0)-W3(y), the second plurality of word lines W4(0)-W4(y), the first plurality of bit lines B3(0)-B3(x), and the second plurality of bit lines B4(0)-B4(x) as required for performing PROGRAMMING operations, READ operations, SET VERIFY operations, and RESET VERIFY operations of the combinational resistive change elements at the same time. PROGRAMMING operations, READ operations, SET VERIFY operations, and RESET VERIFY operations of combinational resistive change elements in the D-A plurality of combinational resistive change elements having resistive change elements in electrical communication with the same bit line in the second plurality of bit lines B4(0)-B4(x) and resistive change elements in electrical communication with the same bit line in the first plurality of bit lines B3(0)-B3(x) can be performed at the same time by driving voltages on the first plurality of word lines W3(0)-W3(y), the second plurality of word lines W4(0)-W4(y), the first plurality of bit lines B3(0)-B3(x), and the second plurality of bit lines B4(0)-B4(x) as required for performing PROGRAMMING operations, READ operations, SET VERIFY operations, and RESET VERIFY operations of the combinational resistive change elements at the same time. PROGRAMMING operations, READ operations, SET VERIFY operations, and RESET VERIFY operations of combinational resistive change elements in the B-C plurality of combinational resistive change elements having resistive change elements in electrical communication with the same bit line in the first plurality of bit lines B3(0)-B3(x) and resistive change ele-
ments in electrical communication with the same bit line in the second plurality of bit lines B4(0)-B4(x) can be performed at the same time by driving voltages on the first plurality of word lines W3(0)-W3(y), the second plurality of word lines W4(0)-W4(y), the first plurality of bit lines B3(0)-B3(x), and the second plurality of bit lines B4(0)-B4(x) as required for performing PROGRAMMING operations, READ operations, SET VERIFY operations, and RESET VERIFY operations of the combinational resistive change elements at the same time.

Additionally, PROGRAMMING operations of combinational resistive change elements in the A-B plurality of combinational resistive change elements and combinational resistive change elements in the C-D plurality of combinational resistive change elements having resistive change elements in electrical communication with the same word line in the first plurality of word lines W3(0)-W3(y) and resistive change elements in electrical communication with the same word line in the second plurality of word lines W4(0)-W4(y) can be performed at the same time by driving voltages on the first plurality of word lines W3(0)-W3(y), the second plurality of word lines W4(0)-W4(y), the first plurality of bit lines B3(0)-B3(x), and the second plurality of bit lines B4(0)-B4(x) as required for performing PROGRAMMING operations of the combinational resistive change elements at the same time. Further, PROGRAMMING operations of combinational resistive change elements in the D-A plurality of combinational resistive change elements and combinational resistive change elements in the B-C plurality of combinational resistive change elements having resistive change elements in electrical communication with the same bit line in the first plurality of bit lines B3(0)-B3(x) and resistive change elements in electrical communication with the same bit line in the second plurality of bit lines B4(0)-B4(x) can be performed at the same time by driving voltages on the first plurality of word lines W3(0)-W3(y), the second plurality of word lines W4(0)-W4(y), the first plurality of bit lines B3(0)-B3(x), and the second plurality of bit lines B4(0)-B4(x) as required for performing PROGRAMMING operations of the combinational resistive change elements at the same time.

When the first plurality of word line driver circuits 603a are fifth driver circuits, as similarly discussed above with respect to the first plurality of word line driver circuits 302a shown in FIG. 3H-2, in electrical communication with first plurality of word lines W3(0)-W3(y), the second plurality of word line driver circuits 603b are fifth drivers circuits, as similarly discussed above with respect to the first plurality of word line driver circuits 302a shown in FIG. 3H-2, in electrical communication with second plurality of word lines W4(0)-W4(y), the first plurality of bit line driver circuits 605a are fifth driver circuits, as similarly discussed above with respect to the first plurality of word line driver circuits 302a shown in FIG. 3H-2, in electrical communication with the first plurality of bit lines B3(0)-B3(x), the second plurality of bit line driver circuits 605b are fifth driver circuits, as similarly discussed above with respect to the first plurality of word line driver circuits 302a in shown FIG. 3H-2, in electrical communication with the second plurality of bit lines B4(0)-B4(x), the first plurality of sense devices 606ab are sense amplifiers, as similarly discussed above with respect to FIGS. 3H-1 and 3H-2, in electrical communication with the first plurality of bit lines B3(0)-B3(x) or the first plurality of sense devices 606ab are inverters, as similarly discussed above with respect to FIGS. 3I-1 and 3I-2, in electrical communication with the first plurality of bit lines B3(0)-B3(x) or the first plurality of sense devices 606ab are omitted, as similarly discussed above with respect to FIGS. 3H-1 and 3H-2, and the second plurality of sense devices 606cd are sense amplifiers, as similarly discussed above with respect to FIGS. 3H-1 and 3H-2, in electrical communication with the second plurality of bit lines B4(0)-B4(x) or the second plurality of sense devices 606cd are inverters, as similarly discussed above with respect to FIGS. 3I-1 and 3I-2, in electrical communication with the second plurality of bit lines B4(0)-B4(x) or the second plurality of sense devices 606cd are omitted, as similarly discussed above with respect to FIGS. 3H-1 and 3H-2, PROGRAMMING operations, READ operations, SET VERIFY operations, and RESET VERIFY operations of combinational resistive change elements in the A-B plurality of combinational resistive change elements can be performed in a similar manner as discussed above with respect to combinational resistive change element S11. However, when a combinational resistive change element in the A-B plurality of combinational resistive change elements is selected, the unselected combinational resistive change elements include the combinational resistive change elements in the A-B plurality of combinational resistive change elements other than the selected combinational resistive change element and the combinational resistive change elements in the C-D plurality of combinational resistive change elements. Thus, applying conditions to inhibit change in relational states of unselected combinational resistive change elements applies conditions to inhibit change in relational states to the combinational resistive change elements in the A-B plurality of combinational resistive change elements other than the selected combinational resistive change element and the combinational resistive change elements in the C-D plurality of combinational resistive change elements. It is noted that PROGRAMMING operations, READ operations, SET VERIFY operations, and RESET VERIFY operations are performed treating the resistive change elements in the plurality of resistive change elements A00-Axy located in section A as top resistive change elements in resistive dividers and the resistive change elements in the plurality of resistive change elements B00-Bxy located in section B as bottom resistive change elements in resistive dividers.

For example, a PROGRAMMING operation to adjust a relational state of a combinational resistive change element including resistive change element A11 and resistive change element B11 to a low relational state, is performed as similarly discussed above with respect to the combinational resistive change element S11, however, the word lines W3(0), W3(y) in the first plurality of word lines W3(0)-W3(y), the word lines W4(0), W4(y) in the second plurality of word lines W4(0)-W4(y), the bit lines B3(0), B3(x) in the first plurality of bit lines B3(0)-B3(x) and the second plurality of bit lines B4(0)-B4(x) are driven to the inhibit voltage Vinhibit. Also, in the above example, the word line W3(1) is driven to the system voltage VDD, the bit line B3(1) is driven to ground or 0 volts, the word line W4(1) is driven to the system voltage VDD so that, ignoring leakage currents, a current flows from the top electrode to the bottom electrode of the resistive change element A11 and a current flows from the bottom electrode to the top electrode of the resistive change element B11.

For example, a PROGRAMMING operation to adjust a relational state of a combinational resistive change element including resistive change element A11 and resistive change element B11 to a high relational state, is performed as similarly discussed above with respect to the combinational resistive change element S11, however, the word lines W3(0), W3(y) in the first plurality of word lines W3(0)-W3(y), the word lines W4(0), W4(y) in the second plurality of word lines W4(0)-W4(y), the bit lines B3(0), B3(x) in the first plurality of bit lines B3(0)-B3(x), and the second plurality of bit lines B4(0)-B4(x) are driven to the inhibit voltage Vinhibit. Also, in the above example, the word line W3(1) is driven to 0 volts or ground, the bit line B3(1) is driven to the system voltage VDD, the word line W4(1) is driven to 0 volts or ground so that, ignoring leakage currents, a current flows from the bottom electrode to the top electrode of the resistive change element A11 and a current flows from the top electrode to the bottom electrode of the resistive change element B11.

For example, a READ operation, a SET VERIFY operation, and a RESET VERIFY operation of a combinational resistive change element including resistive change element A11 and resistive change element B11, are performed as similarly discussed above with respect to the combinational resistive change element S11, however, the word lines W3(0), W3(y) in the first plurality of word lines W3(0)-W3(y), the word lines W4(0), W4(y) in the second plurality of word lines W4(0)-W4(y), the bit lines B3(0), B3(x) in the first plurality of bit lines B3(0)-B3(x), and the second plurality of bit lines B4(0)-B4(x) are driven to the inhibit voltage Vinhibit. Also, in the above example, the word line W3(1) is driven to the read voltage Vread and the word line W4(1) is driven to 0 volts or ground, so that a current flows from the word line W3(1) through the resistive change element A11 into the bit line B3(1) and the current flows from the bit line B3(1) through the resistive change element B11 into the word line W4(1). Further, in the above example, the same amount of current, ignoring leakage currents, flows through the resistive change element A11 and the resistive change element B11. Additionally, in the above example, the voltage VB3(1) on the bit line B3(1) is indicative of a relational state of the combinational resistive change element including resistive change element A11 and resistive change element B11 because the voltage level of the read voltage Vread is the same for both a low relational state and a high relational state, while the resistive ratio of the resistive divider formed by the resistive change element A11 and the resistive change element B11 is different for a low relational state and a high relational state.

When the first plurality of word line driver circuits 603a are fifth driver circuits, as similarly discussed above with respect to the first plurality of word line driver circuits 302a shown in FIG. 3H-2, in electrical communication with first plurality of word lines W3(0)-W3(y), the second plurality of word line driver circuits 603b are fifth drivers circuits, as similarly discussed above with respect to the first plurality of word line driver circuits 302a shown in FIG. 3H-2, in electrical communication with second plurality of word lines W4(0)-W4(y), the first plurality of bit line driver circuits 605a are fifth driver circuits, as similarly discussed above with respect to the first plurality of word line driver circuits 302a shown in FIG. 3H-2, in electrical communication with the first plurality of bit lines B3(0)-B3(x), the second plurality of bit line driver circuits 605b are fifth driver circuits, as similarly discussed above with respect to the first plurality of word line driver circuits 302a in shown FIG. 3H-2, in electrical communication with the second plurality of bit lines B4(0)-B4(x), the first plurality of sense devices 606ab are sense amplifiers, as similarly discussed above with respect to FIGS. 3H-1 and 3H-2, in electrical communication with the first plurality of bit lines B3(0)-B3(x) or the first plurality of sense devices 606ab are inverters, as similarly discussed above with respect to FIGS. 3I-1 and 3I-2, in electrical communication with the first plurality of bit lines B3(0)-B3(x) or the first plurality of sense devices 606ab are omitted, as similarly discussed above with respect to FIGS. 3H-1 and 3H-2, and the second plurality of sense devices 606cd are sense amplifiers, as similarly discussed above with respect to FIGS. 3H-1 and 3H-2, in electrical communication with the second plurality of bit lines B4(0)-B4(x) or the second plurality of sense devices 606cd are inverters, as similarly discussed above with respect to FIGS. 3I-1 and 3I-2, in electrical communication with the second plurality of bit lines B4(0)-B4(x) or the second plurality of sense devices 606cd are omitted, as similarly discussed above with respect to FIGS. 3H-1 and 3H-2, PROGRAMMING operations, READ operations, SET VERIFY operations, and RESET VERIFY operations of combinational resistive change elements in the C-D plurality of combinational resistive change elements can be performed in a similar manner as discussed above with respect to combinational resistive change element S11. However, when a combinational resistive change element in the C-D plurality of combinational resistive change elements is selected, the unselected combinational resistive change elements include the combinational resistive change elements in the C-D plurality of combinational resistive change elements other than the selected combinational resistive change element and the combinational resistive change elements in the A-B plurality of combinational resistive change elements. Thus, applying conditions to inhibit change in relational states of unselected combinational resistive change elements applies conditions to inhibit change in relational states to the combinational resistive change elements in the C-D plurality of combinational resistive change elements other than the selected combinational resistive change element and the combinational resistive change elements in the A-B plurality of combinational resistive change elements. It is noted that PROGRAMMING operations, READ operations, SET VERIFY operations, and RESET VERIFY operations are performed treating resistive change elements in the plurality of resistive change elements C00-Cxy located in section C as top resistive change elements in resistive dividers and resistive change elements in the plurality of resistive change elements D00-Dxy located in section D as bottom resistive change elements in resistive dividers.

For example, a PROGRAMMING operation to adjust a relational state of a combinational resistive change element including resistive change element C11 and resistive change element D11 to a low relational state, is performed as similarly discussed above with respect to the combinational resistive change element S11, however, the word lines W3(0), W3(y) in the first plurality of word lines W3(0)-W3(y), the word lines W4(0), W4(y) in the second plurality of word lines W4(0)-W4(y), the first plurality of bit lines B3(0)-B3(x), and the bit lines B4(0), B4(x) in the second plurality of bit lines B4(0)-B4(x) are driven to the inhibit voltage Vinhibit. Also, in the above example, the word line W3(1) is driven to the system voltage VDD, the bit line B4(1) is driven to ground or 0 volts, the word line W4(1) is driven to the system voltage VDD so that, ignoring leakage currents, a current flows from the top electrode to the bottom electrode of the resistive change element C11 and a current flows from the bottom electrode to the top electrode of the resistive change element D11.

For example, a PROGRAMMING operation to adjust a relational state of a combinational resistive change element including resistive change element C11 and resistive change element D11 to a high relational state, is performed as similarly discussed above with respect to the combinational resistive change element S11, however, the word lines W3(0), W3(y) in the first plurality of word lines W3(0)-W3(y), the word lines W4(0), W4(y) in the second plurality of word lines W4(0)-W4(y), the first plurality of bit lines B3(0)-B3(x), and bit lines B4(0), B4(x) in the second plurality of bit lines B4(0)-B4(x) are driven to the inhibit voltage Vinhibit. Also, in the above example, the word line W3(1) is driven to 0 volts or ground, the bit line B4(1) is driven to the system voltage VDD, the word line W4(1) is driven to 0 volts or ground so that, ignoring leakage currents, a current flows from the bottom electrode to the top electrode of the resistive change element C11 and a current flows from the top electrode to the bottom electrode of the resistive change element D11.

For example, a READ operation, a SET VERIFY operation, and a RESET VERIFY operation of a combinational resistive change element including resistive change element C11 and resistive change element D11, are performed as similarly discussed above with respect to the combinational resistive change element S11, however, the word lines W3(0), W3(y) in the first plurality of word lines W3(0)-W3(y), the word lines W4(0), W4(y) in the second plurality of word lines W4(0)-W4(y), the first plurality of bit lines B3(0)-B3(x), and the bit lines B4(0), B4(x) in the second plurality of bit lines B4(0)-B4(x) are driven to the inhibit voltage Vinhibit. Also, in the above example, the word line W4(1) is driven to the read voltage Vread and the word line W3(1) is driven to 0 volts or ground, so that a current flows from the word line W4(1) through the resistive change element C11 into the bit line B4(1) and the current flows from the bit line B4(1) through the resistive change element D11 into the word line W3(1). Further, in the above example, the same amount of current, ignoring leakage currents, flows through the resistive change element C11 and the resistive change element D11. Additionally, in the above example, the voltage VB4(1) on the bit line B4(1) is indicative of a relational state of the combinational resistive change element including resistive change element C11 and resistive change element D11 because the voltage level of the read voltage Vread is the same for both a low relational state and a high relational state, while the resistive ratio of the resistive divider formed by the resistive change element C11 and the resistive change element D11 is different for a low relational state and a high relational state.

When the first plurality of word line driver circuits 603a are fifth driver circuits, as similarly discussed above with respect to the first plurality of word line driver circuits 302a shown in FIG. 3H-2, in electrical communication with first plurality of word lines W3(0)-W3(y), the second plurality of word line driver circuits 603b are fifth drivers circuits, as similarly discussed above with respect to the first plurality of word line driver circuits 302a shown in FIG. 3H-2, in electrical communication with second plurality of word lines W4(0)-W4(y), the first plurality of bit line driver circuits 605a are fifth driver circuits, as similarly discussed above with respect to the first plurality of word line driver circuits 302a shown in FIG. 3H-2, in electrical communication with the first plurality of bit lines B3(0)-B3(x), the second plurality of bit line driver circuits 605b are fifth driver circuits, as similarly discussed above with respect to the first plurality of word line driver circuits 302a in shown FIG. 3H-2, in electrical communication with the second plurality of bit lines B4(0)-B4(x), the third plurality of sense devices 606da are sense amplifiers, as similarly discussed above with respect to FIGS. 3H-1 and 3H-2, in electrical communication with the first plurality of word lines W3(0)-W3(y) or the third plurality of sense devices 606da are inverters, as similarly discussed above with respect to FIGS. 3I-1 and 3I-2, in electrical communication with the third plurality of word lines W3(0)-W3(y) or the third plurality of sense devices 606da are omitted, as similarly discussed above with respect to FIGS. 3H-1 and 3H-2, and the fourth plurality of sense devices 606bc are sense amplifiers, as similarly discussed above with respect to FIGS. 3H-1 and 3H-2, in electrical communication with the second plurality of word lines W4(0)-W4(y) or the fourth plurality of sense devices 606bc are inverters, as similarly discussed above with respect to FIGS. 3I-1 and 3I-2, in electrical communication with the second plurality of word lines W4(0)-W4(y) or the fourth plurality of sense devices 606bc are omitted, as similarly discussed above with respect to FIGS. 3H-1 and 3H-2, PROGRAMMING operations, READ operations, SET VERIFY operations, and RESET VERIFY operations of combinational resistive change elements in the D-A plurality of combinational resistive change elements can be performed in a similar manner as discussed above with respect to combinational resistive change element S11. However, when a combinational resistive change element in the D-A plurality of combinational resistive change elements is selected, the unselected combinational resistive change elements include the combinational resistive change elements in the D-A plurality of combinational resistive change elements other than the selected combinational resistive change element and the combinational resistive change elements in the B-C plurality of combinational resistive change elements. Thus, applying conditions to inhibit change in relational states of unselected combinational resistive change elements applies conditions to inhibit change in relational states to the combinational resistive change elements in the D-A plurality of combinational resistive change elements other than the selected combinational resistive change element and the combinational resistive change elements in the B-C plurality of combinational resistive change elements. It is noted that PROGRAMMING operations, READ operations, SET VERIFY operations, and RESET VERIFY operations are performed treating resistive change elements in the plurality of resistive change elements D00-Dxy located in section D as top resistive change elements in resistive dividers and resistive change elements in the plurality of resistive change elements A00-Axy located in section A as bottom resistive change elements in resistive dividers. It is further noted that for READ operations, SET VERIFY operations, and RESET VERIFY operations, voltages on the first plurality of word lines W3(0)-W3(y) are indicative of relational states of combinational resistive change elements in the D-A plurality of combinational resistive change elements because nodes between resistive change elements in the plurality of resistive change elements D00-Dxy and resistive change elements in the plurality of resistive change elements A00-Axy are accessed by word lines in the first plurality of word lines W3(0)-W3(y).

For example, a PROGRAMMING operation to adjust a relational state of a combinational resistive change element including resistive change element D11 and resistive change element A11 to a low relational state, is performed as similarly discussed above with respect to the combinational resistive change element S11, however, the bit lines B4(0), B4(x) in the second plurality of bit lines B4(0)-B4(x), the bit lines B3(0), B3(x) in the first plurality of bit lines B3(0)-B3(x), the word lines W3(0), W3(y) in first plurality of word lines W3(0)-W3(y), and the second plurality of word lines W4(0)-W4(y) are driven to the inhibit voltage Vinhibit. Also, in the above example, the bit line B4(1) is driven to the system voltage VDD, the word line W3(1) is driven to ground or 0 volts, the bit line B3(1) is driven to the system voltage VDD so that, ignoring leakage currents, a current flows from the top electrode to the bottom electrode of the resistive change element D11 and a current flows from the bottom electrode to the top electrode of the resistive change element A11.

For example, a PROGRAMMING operation to adjust a relational state of a combinational resistive change element including resistive change element D11 and resistive change element A11 to a high relational state, is performed as similarly discussed above with respect to the combinational resistive change element S11, however, the bit lines B4(0), B4(x) in the second plurality of bit lines B4(0)-B4(x), the bit lines B3(0), B3(x) in the first plurality of bit lines B3(0)-B3(x), the word lines W3(0), W3(y) in first plurality of word lines W3(0)-W3(y), and the second plurality of word lines W4(0)-W4(y) are driven to the inhibit voltage Vinhibit. Also, in the above example, the bit line B4(1) is driven to 0 volts or ground, the word line W3(1) is driven to the system voltage VDD, the bit line B3(1) is driven to 0 volts or ground so that, ignoring leakage currents, a current flows from the bottom electrode to the top electrode of the resistive change element D11 and a current flows from the top electrode to the bottom electrode of the resistive change element A11.

For example, a READ operation, a SET VERIFY operation, and a RESET VERIFY operation of a combinational resistive change element including resistive change element D11 and resistive change element A11, are performed as similarly discussed above with respect to the combinational resistive change element S11, however, the bit lines B4(0), B4(x) in the second plurality of bit lines B4(0)-B4(x), the bit lines B3(0), B3(x) in the first plurality of bit lines B3(0)-B3(x), the word lines W3(0), W3(y) in first plurality of word lines W3(0)-W3(y), and the second plurality of word lines W4(0)-W4(y) are driven to the inhibit voltage Vinhibit. Also, in the above example, the bit line B4(1) is driven to the read voltage Vread and the bit line B3(1) is driven to 0 volts or ground, so that a current flows from the bit line B4(1) through the resistive change element D11 into the word line W3(1) and the current flows from the word line W3(1) through the resistive change element A11 into the bit line B3(1). Further, in the above example, the same amount of current, ignoring leakage currents, flows through the resistive change element D11 and the resistive change element A11. Additionally, in the above example, the voltage VW3(1) on the word line W3(1) is indicative of a relational state of the combinational resistive change element including resistive change element D11 and resistive change element A11 because the voltage level of the read voltage Vread is the same for both a low relational state and a high relational state, while the resistive ratio of the resistive divider formed by the resistive change element D11 and the resistive change element A11 is different for a low relational state and a high relational state.

When the first plurality of word line driver circuits 603a are fifth driver circuits, as similarly discussed above with respect to the first plurality of word line driver circuits 302a shown in FIG. 3H-2, in electrical communication with first plurality of word lines W3(0)-W3(y), the second plurality of word line driver circuits 603b are fifth drivers circuits, as similarly discussed above with respect to the first plurality of word line driver circuits 302a shown in FIG. 3H-2, in electrical communication with second plurality of word lines W4(0)-W4(y), the first plurality of bit line driver circuits 605a are fifth driver circuits, as similarly discussed above with respect to the first plurality of word line driver circuits 302a shown in FIG. 3H-2, in electrical communication with the first plurality of bit lines B3(0)-B3(x), the second plurality of bit line driver circuits 605b are fifth driver circuits, as similarly discussed above with respect to the first plurality of word line driver circuits 302a in shown FIG. 3H-2, in electrical communication with the second plurality of bit lines B4(0)-B4(x), the third plurality of sense devices 606da are sense amplifiers, as similarly discussed above with respect to FIGS. 3H-1 and 3H-2, in electrical communication with the first plurality of word lines W3(0)-W3(y) or the third plurality of sense devices 606da are inverters, as similarly discussed above with respect to FIGS. 3I-1 and 3I-2, in electrical communication with the third plurality of word lines W3(0)-W3(y) or the third plurality of sense devices 606da are omitted, as similarly discussed above with respect to FIGS. 3H-1 and 3H-2, and the fourth plurality of sense devices 606bc are sense amplifiers, as similarly discussed above with respect to FIGS. 3H-1 and 3H-2, in electrical communication with the second plurality of word lines W4(0)-W4(y) or the fourth plurality of sense devices 606bc are inverters, as similarly discussed above with respect to FIGS. 3I-1 and 3I-2, in electrical communication with the second plurality of word lines W4(0)-W4(y) or the fourth plurality of sense devices 606bc are omitted, as similarly discussed above with respect to FIGS. 3H-1 and 3H-2, PROGRAMMING operations, READ operations, SET VERIFY operations, and RESET VERIFY operations of combinational resistive change elements in the B-C plurality of combinational resistive change elements can be performed in a similar manner as discussed above with respect to combinational resistive change element S11. However, when a combinational resistive change element in the B-C plurality of combinational resistive change elements is selected, the unselected combinational resistive change elements include the combinational resistive change elements in the B-C plurality of combinational resistive change elements other than the selected combinational resistive change element and the combinational resistive change elements in the D-A plurality of combinational resistive change elements. Thus, applying conditions to inhibit change in relational states of unselected combinational resistive change elements applies conditions to inhibit change in relational states to the combinational resistive change elements in the B-C plurality of combinational resistive change elements other than the selected combinational resistive change element and the combinational resistive change elements in the D-A plurality of combinational resistive change elements. It is noted that PROGRAMMING operations, READ operations, SET VERIFY operations, and RESET VERIFY operations are performed treating resistive change elements in the plurality of resistive change elements B00-Bxy located in section B as top resistive change elements in resistive dividers and resistive change elements in the plurality of resistive change elements C00-Cxy located in section C as bottom resistive change elements in resistive dividers. It is further noted that for READ operations, SET VERIFY operations, and RESET VERIFY operations, voltages on the second plurality of word lines W4(0)-W4(y) are indicative of relational states of combinational resistive change elements in the B-C plurality of combinational resistive change elements because nodes between resistive change elements in the plurality of resistive change elements B00-Bxy and resistive change elements in the plurality of resistive change elements C00-Cxy are accessed by word lines in the second plurality of word lines W4(0)-W4(y).

For example, a PROGRAMMING operation to adjust a relational state of a combinational resistive change element including resistive change element B11 and resistive change element C11 to a low relational state, is performed as similarly discussed above with respect to the combinational resistive change element S11, however, the bit lines B3(0), B3(x) in the first plurality of bit lines B3(0)-B3(x), the bit lines B4(0), B4(x) in the second plurality of bit lines B4(0)-B4(x), the first plurality of word lines W3(0)-W3(y), and the word lines W4(0), W4(y) in second plurality of word lines W4(0)-W4(y) are driven to the inhibit voltage Vinhibit. Also, in the above example, the bit line B3(1) is driven to the system voltage VDD, the word line W4(1) is driven to ground or 0 volts, the bit line B4(1) is driven to the system voltage VDD so that, ignoring leakage currents, a current flows from the top electrode to the bottom electrode of the resistive change element B11 and a current flows from the bottom electrode to the top electrode of the resistive change element C11.

For example, a PROGRAMMING operation to adjust a relational state of a combinational resistive change element including resistive change element B11 and resistive change element C11 to a high relational state, is performed as similarly discussed above with respect to the combinational resistive change element S11, however, the bit lines B3(0), B3(x) in the first plurality of bit lines B3(0)-B3(x), the bit lines B4(0), B4(x) in the second plurality of bit lines B4(0)-B4(x), the first plurality of word lines W3(0)-W3(y), and the word lines W4(0), W4(y) in second plurality of word lines W4(0)-W4(y) are driven to the inhibit voltage Vinhibit. Also, in the above example, the bit line B3(1) is driven to 0 volts or ground, the word line W4(1) is driven to the system voltage VDD, the bit line B4(1) is driven to 0 volts or ground so that, ignoring leakage currents, a current flows from the bottom electrode to the top electrode of the resistive change element B11 and a current flows from the top electrode to the bottom electrode of the resistive change element C11.

For example, a READ operation, a SET VERIFY operation, and a RESET VERIFY operation of a combinational resistive change element including resistive change element B11 and resistive change element C11, are performed as similarly discussed above with respect to the combinational resistive change element S11, however, the bit lines B3(0), B3(x) in the first plurality of bit lines B3(0)-B3(x), the bit lines B4(0), B4(x) in the second plurality of bit lines B4(0)-B4(x), the first plurality of word lines W3(0)-W3(y), and the word lines W4(0), W4(y) in second plurality of word lines W4(0)-W4(y) are driven to the inhibit voltage Vinhibit. Also, in the above example, the bit line B3(1) is driven to the read voltage Vread and the bit line B4(1) is driven to 0 volts or ground, so that a current flows from the bit line B3(1) through the resistive change element B11 into the word line W4(1) and the current flows from the word line W4(1) through the resistive change element C11 into the bit line B4(1). Further, in the above example, the same amount of current, ignoring leakage currents, flows through the resistive change element B11 and the resistive change element C11. Additionally, in the above example, the voltage VW4(1) on the word line W4(1) is indicative of a relational state of the combinational resistive change element including resistive change element B11 and resistive change element C11 because the voltage level of the read voltage Vread is the same for both a low relational state and a high relational state, while the resistive ratio of the resistive divider formed by the resistive change element B11 and the resistive change element C11 is different for a low relational state and a high relational state.

Figure 7A:
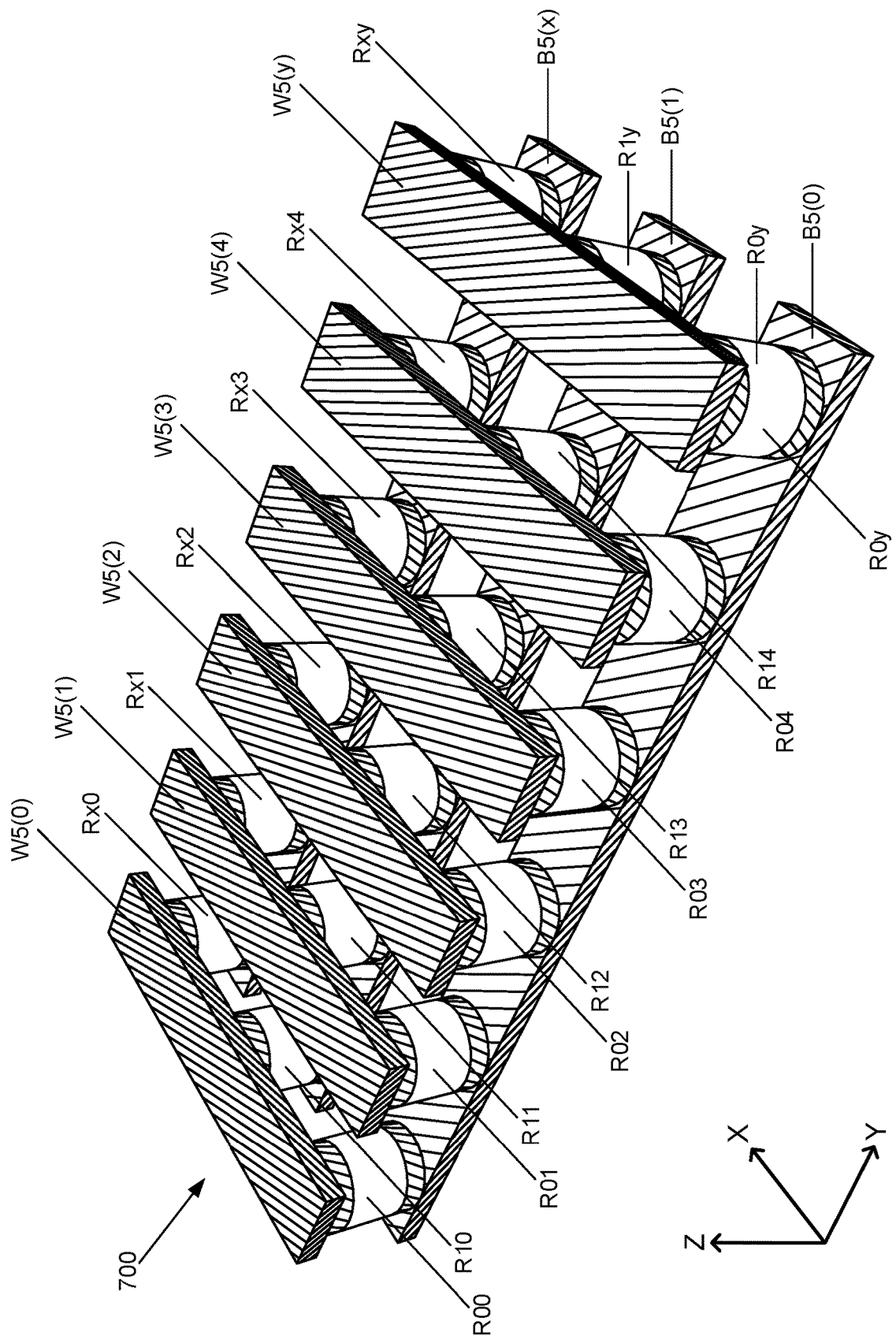
FIG. 7A illustrates a three-dimensional view of a resistive change element array of resistive change elements arranged in a cross point configuration.

Referring now to FIG. 7A, a three-dimensional view of a resistive change element array 700 of resistive change elements arranged in a cross point configuration is illustrated. The resistive change element array 700 includes a plurality of resistive change elements R00-Rxy, a plurality of word lines W5(0)-W5(y), and a plurality of bit lines B5(0)-B5(x). The plurality of word lines W5(0)-W5(y) are in electrical communication with the plurality of resistive change elements R00-Rxy and the plurality of bit lines B5(0)-B5(x) are in electrical communication with to the plurality of resistive change elements R00-Rxy.

The resistive change element array 700 can be configured include a plurality of combinations of resistive change elements using a correspondence where each combination of resistive change elements includes two resistive change elements. Each combination of resistive change elements in the plurality of combinations of resistive change elements can store information as relational states as similarly discussed above with respect to combinational resistive change elements. Also, as similarly discussed above with respect to combinational resistive change elements, a relational state of a combination of resistive change elements corresponds with a specified combination of resistive states of resistive change elements of the combination of resistive change elements. Additionally, as similarly discussed above with respect to combinational resistive change elements, a relational state of a combination of resistive change elements is non-volatile because resistive states of resistive change elements of the combination of resistive change elements are non-volatile. For storing information in the form of binary numbers, relational states of a combination of resistive change elements also correspond with binary numbers and in this way a combination of resistive change elements can be used to store at least one bit of information, as similarly discussed above with respect to combinational resistive change elements. For storing information in forms other than binary numbers, relational states of a combination of resistive change elements also correspond with characters, such as numbers, letters, symbols, and operators, of a character set and in this way a combination of resistive change elements can be used to store information in forms other than binary numbers, as similarly discussed above with respect to combinational resistive change elements. It is noted that a circuit designer can specify combinations of resistive states of resistive change elements that correspond with relational states of a combination of resistive change elements and the circuit designer can specify relational states of a combination of resistive change elements that correspond with binary numbers or characters of a character set. It is also noted that each possible combination of resistive states of resistive change elements may not correspond with a relational state of a combination of resistive change elements because some combinations of resistive states of resistive change elements cannot be easily identified and/or some combinations of resistive states of resistive change elements are not needed to store information. It is further noted that combinations of resistive change elements adjustable (programmable) between more than two relational states are well suited for use in applications that use more than two states such as neural networks and artificial intelligence.

The resistive change element array 700 can be configured to include a plurality of combinations of resistive change elements using a correspondence where each combination of resistive change elements includes two resistive change elements in electrical communication with the same word line. The resistive change element array 700 can be configured to include a plurality of combinations of resistive change elements using a correspondence where each combination of resistive change elements includes two resistive change elements in electrical communication with the same bit line. The resistive change element array 700 can be configured to include a plurality of combinations of resistive change elements using a correspondence where each combination of resistive change elements includes two resistive change elements that are not limited to two resistive change elements in electrical communication with the same bit line or the same word line. The resistive change element array 700 can be configured to include a plurality of combinations of resistive change elements using a correspondence where at least two combinations of resistive change elements share resistive change elements. A resistive change element is shared between combinations of resistive change elements when the resistive change element is included in more than one combination of resistive change elements. For example, a resistive change element is shared between a first combination of resistive change elements and a second combination of resistive change elements when the resistive change element is included in both the first combination of resistive change elements and the second combination of resistive change elements. Sharing resistive change elements between combinations of resistive change elements can increase memory density of a resistive change element array configured to include a plurality of combinations of resistive change elements because fewer resistive change elements are required for combinations of resistive change elements when combinations of resistive change elements share resistive change elements. For example, when two combinations of resistive change elements that each include two resistive change elements share a resistive change element the two combinations of resistive change elements include a total of three resistive change elements, whereas, when two combinations of resistive change elements that each include two resistive change elements do not share a resistive change element, the two combinations of resistive change elements include a total of four resistive change elements.

The correspondence for configuring the resistive change element array 700 to include a plurality of combinations of resistive change elements can be stored in software, hardware, or a combination of software and hardware. The correspondence for configuring the resistive change element array 700 to include a plurality of combinations of resistive change elements is typically stored in support circuitry for the resistive change element array 700. For example, for software on chip, the correspondence for configuring the resistive change element array 700 to include a plurality of combinations of resistive change elements can be stored in software controllable control logic, such as a controller and a microcontroller, located on chip. For example, for hardware on chip, the correspondence for configuring the resistive change element array 700 to include a plurality of combinations of resistive change elements can be stored in hardware, such as registers and multiplexers, located on chip. For example, for software off chip, the correspondence for configuring the resistive change element array 700 to include a plurality of combinations of resistive change elements can be stored in software controllable control logic, such as a controller, a microcontroller, and a processor, located off chip.

Additionally, the resistive change element array 700 can be initially configured using a correspondence, and subsequently the resistive change element array 700 can be reconfigured using a different correspondence. Further, the resistive change element array 700 can be reconfigured multiple times using different correspondences. For example, the resistive change element array 700 can be configured using a correspondence, the correspondence can be updated to replace defective resistive change elements and the resistive change element array 700 can be reconfigured using an updated version of the correspondence. For example, the resistive change element array 700 can be configured using a correspondence specifying each combination of resistive change elements includes two resistive change elements in electrical communication with the same word line and the resistive change element array 700 can be reconfigured using a correspondence where each combination of resistive change elements includes two resistive change elements in electrical communication with the same bit line.

Also, the resistive change element array 700 can be reconfigured using a different correspondence to increase the amount of information that can be stored in the resistive change element array 700. For example, the resistive change element array 700 can be configured using a correspondence where combinations of resistive change elements include two resistive change elements and resistive change elements are not shared between combinations of resistive change elements and the resistive change element array 700 can be reconfigured using a correspondence where combinations of resistive change elements include two resistive change elements and resistive change elements are shared between combinations of resistive change elements Additionally, the resistive change element array 700 can be reconfigured using a different correspondence to decrease the amount of information that can be stored in the resistive change element array 700. For example, the resistive change element array 700 can be configured using a correspondence where combinations of resistive change elements include two resistive change elements and resistive change elements are shared between combinations of resistive change elements and the resistive change element array 700 can be reconfigured using a correspondence where combinations of resistive change elements include two resistive change elements and resistive change elements are not shared between combinations of resistive change elements.

When the resistive change element array 700 is configured to include a plurality of combinations of resistive change elements where each combination of resistive change elements includes two resistive change elements in electrical communication with the same word line, electrical stimuli for operations of a combination of resistive change elements can be applied to the two resistive change elements at the same time or one after the other. When the resistive change element array 700 is configured to include a plurality of combinations of resistive change elements where each combination of resistive change elements includes two resistive change elements in electrical communication with the same bit line, electrical stimuli for operations of a combination of resistive change elements can be applied the two resistive change elements at the same time or one after the other. When the resistive change element array 700 is configured to include a plurality of combinations of resistive change elements where each combination of resistive change elements includes two resistive change elements not limited to two resistive change elements in electrical communication with the same bit line or the same word line, electrical stimuli for operations of a combination of resistive change elements are applied to the two resistive change elements one after the other.

As shown in FIG. 7A, the plurality of resistive change elements R00-R$xy$ is arranged in rectangular N×M matrix, where N and M are different positive integers. The numbering convention for the plurality of resistive change elements R00-R$xy$ includes a column number followed by a row number indicating the location of the resistive change element in the N×M matrix. The column numbers and the row numbers for the plurality of resistive change elements R00-R$xy$ begin with column number 0 and row number 0 in the top left corner of the N×M matrix. It is noted that although the plurality of resistive change elements R00-R$xy$ is arranged in a rectangular N×M matrix, where N and M are different positive integers, the plurality of resistive change elements R00-R$xy$ can be arranged in other layouts such as a square N×N matrix, where N is a positive integer. Additionally, the number of resistive change elements in the plurality of resistive change elements R00-R$xy$ can be greater than the number of combinations of resistive change elements. For example, the number of resistive change elements in the plurality of resistive change elements R00-R$xy$ can be greater than the number of combinations of resistive change elements so that resistive change elements are available to replace defective resistive change elements.

In the example, of FIG. 7A, the plurality of resistive change elements R00-R$xy$ have substantially the same structure as the resistive change elements in the combinational resistive change element array 200 discussed above. Also, in the example, of FIG. 7A, the plurality of resistive change elements R00-R$xy$ are located on the same level. However, the resistive change elements in the plurality of resistive change elements R00-R$xy$ are not limited to being located on the same level. Additionally, resistive change elements in the plurality of resistive change elements R00-R$xy$ are not limited to having substantially the same structure. Further, the plurality of combinations of resistive change elements are not limited to combinations of resistive change elements having two resistive change elements with substantially the same structure and located on the same level but rather the plurality of combinations of resistive change elements can include combinations of resistive change elements having resistive change elements with different structures and/or resistive change elements located on different levels.

As shown in FIG. 7A, the word lines in the plurality of word lines W5(0)-W5($y$) are arranged generally along the X-axis and generally in parallel with respect to each other. The bit lines in the plurality of bit lines B5(0)-B5($x$) are arranged generally along the Y-axis and generally in parallel with respect to each other. The plurality of bit lines B5(0)-B5($x$) are located below the plurality of word lines W5(0)-W5($y$) and the plurality of bit lines B5(0)-B5($x$) are generally orthogonal to the plurality of word lines W5(0)-W5($y$). Each resistive change element in the plurality of resistive change elements R00-R$xy$ is located where a word line in the plurality of word lines W5(0)-W5($y$) crosses a bit line in the plurality of bit lines B5(0)-B5($x$). The top electrode TE of each resistive change element in the plurality of resistive change elements R00-R$xy$ is in electrical communication with a word line in the plurality of word lines W5(0)-W5($y$) and the bottom electrode BE of each resistive change element in the plurality of resistive change elements R00-R$xy$ is in electrical communication with a bit line in the plurality of bit lines B5(0)-B5($x$). It is noted that intervening interconnecting structures, such as plugs, filled vias, and studs, can be located between the resistive change elements in the plurality of resistive change elements R00-R$xy$ and word lines in the plurality of word lines W5(0)-W5($y$) and/or intervening interconnecting structures, such as plugs, filled vias, and studs, can be located between the resistive change elements in the plurality of resistive change elements R00-R$xy$ and bit lines in the plurality of bit lines B5(0)-B5($x$). It is further noted that intervening layers, such as barrier metal layers that provide a barrier to metal migration, can be included to provide a barrier to metal migration from the plurality of word lines W5(0)-W5($y$) and/or the plurality of bit lines B5(0)-B5(x). It is noted that the word lines in the plurality of word lines W5(0)-W5(y) are described as being generally in parallel with respect to each other and the bit lines in the plurality of bit lines B5(0)-B5(x) are described as being generally in parallel with respect to each other to allow for variations from exactly parallel due to the fabrication process.

The regions around the plurality of resistive change elements R00-Rxy, the plurality of word lines W5(0)-W5(y), and the plurality of bit lines B5(0)-B5(x) can be filled with a dielectric. Further, the plurality of resistive change elements R00-Rxy can be sealed by thin dielectric sidewall films, as described in U.S. Patent Application Publication No. 2018/0226578, prior to filling the regions around the plurality of resistive change elements R00-Rxy with a dielectric.

Additionally, in the example, of FIG. 7A, each resistive change element in the plurality of resistive change elements R00-Rxy can be adjusted (programmed) between two non-volatile resistive states, a low resistive state, for example a resistance on the order of 1 MΩ (also referred to as a SET state), and a high resistive state, for example a resistance on the order of 10 MΩ (also referred to as a RESET state). As similarly discussed above with respect to when the resistive change element 100 is adjusted (programmed) between resistive states in a bidirectional manner, when each resistive change element in the plurality of resistive change elements R00-Rxy is adjusted (programmed) between resistive states in a bidirectional manner, each resistive change element is adjusted to the low resistive state by applying a bidirectional SET electrical stimulus to the resistive change element and is adjusted to the high resistive state by applying a bidirectional RESET electrical stimulus to the resistive change element. As similarly discussed above with respect to when the resistive change element 100 is adjusted (programmed) between resistive states in a unidirectional manner, when each resistive change element in the plurality of resistive change elements R00-Rxy is adjusted (programmed) between resistive states in a unidirectional manner, each resistive change element is adjusted to the low resistive state by applying a unidirectional SET electrical stimulus to the resistive change element and is adjusted to the high resistive state by applying a unidirectional RESET electrical stimulus to the resistive change element. Alternatively, each resistive change element in the plurality of resistive change elements R00-Rxy can be adjusted (programmed) between more than two non-volatile resistive states where each non-volatile resistive state corresponds with a different resistance value.

Figure 7B:
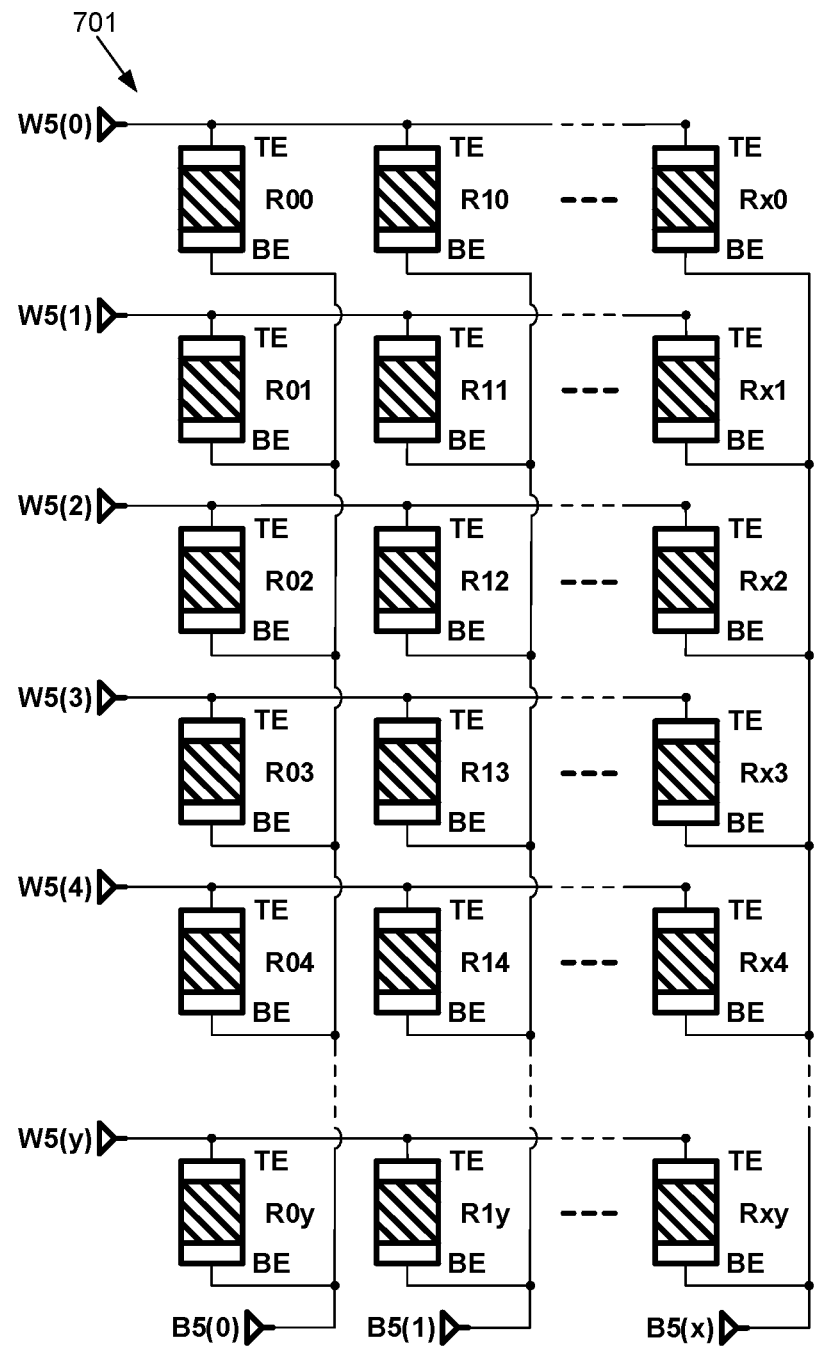
FIG. 7B illustrates a simplified schematic diagram of the resistive change element array of FIG. 7A.

Referring now to FIG. 7B, a simplified schematic diagram of the exemplary resistive change element array of FIG. 7A is illustrated as exemplary resistive change element array 701. The top electrodes TE and the bottom electrodes BE of the resistive change elements in the plurality of resistive change elements R00-Rxy are labeled in the simplified schematic diagram of FIG. 7B using the reference characters TE and BE. Additionally, the simplified schematic of FIG. 7B shows the resistive change material located between the top electrode TE and the bottom electrode BE for each resistive change element.

In the exemplary architecture shown in FIG. 7C and discussed below, the resistive change element array 701 is configured to include a plurality of combinations of resistive change elements where each combination of resistive change elements includes two resistive change elements in electrical communication with the same bit line. In the exemplary architecture shown in FIG. 7D and discussed below, the resistive change element array 701 is configured to include a plurality of combinations of resistive change elements where each combination of resistive change elements includes two resistive change elements in electrical communication with the same word line.

Figure 7C:
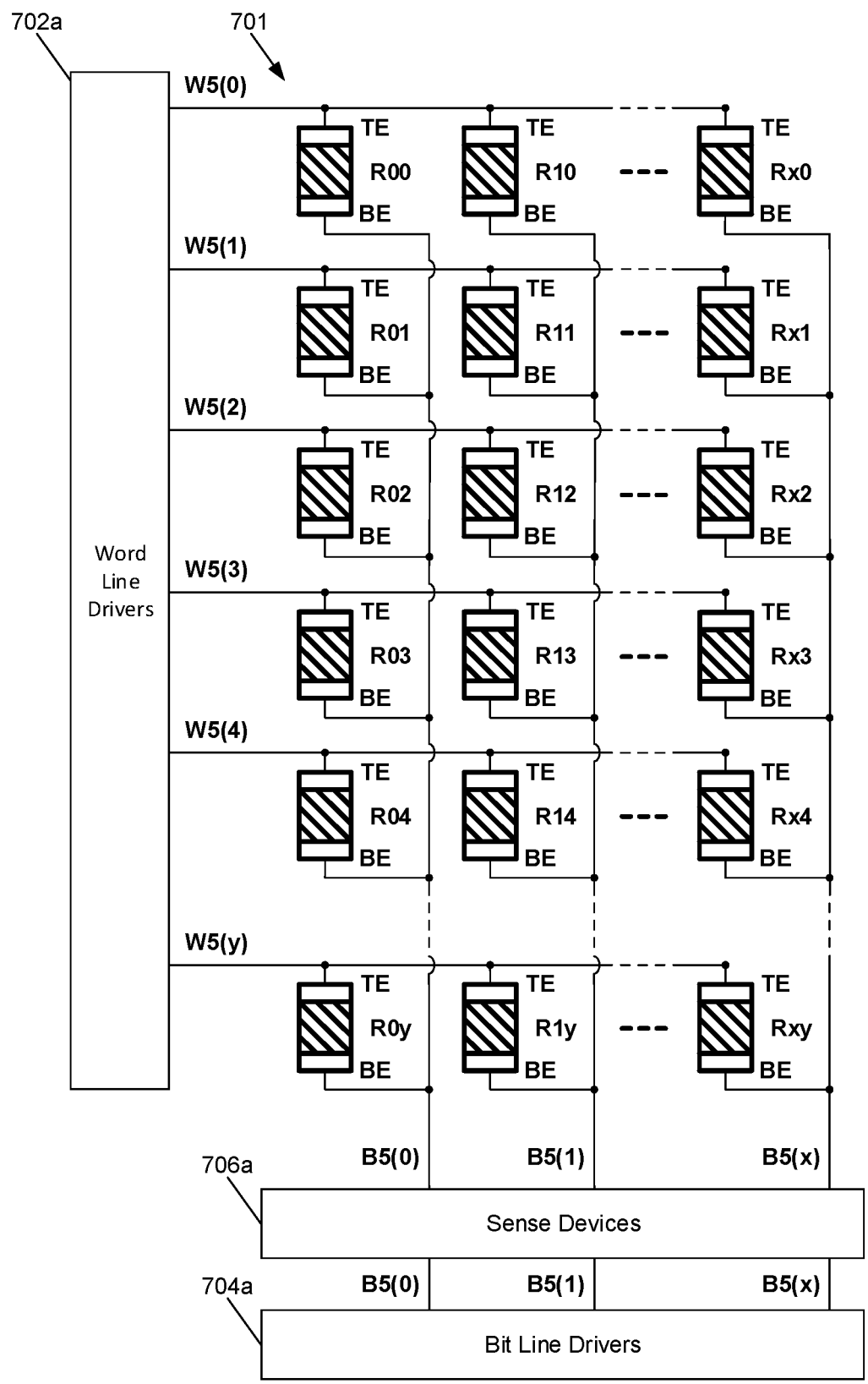
FIG. 7C illustrates a simplified schematic diagram of an exemplary architecture for programming and accessing at least one combination of resistive change elements in a resistive change element array of resistive change elements arranged in a cross point configuration, where the at least one combination of resistive change elements has resistive change elements in electrical communication with the same bit line.

Referring now to FIG. 7C, a simplified schematic diagram of an exemplary architecture for programming and accessing at least one combination of resistive change elements in the resistive change element array 701 when the resistive change element array 701 is configured to include a plurality of combinations of resistive change elements where each combination of resistive change elements includes two resistive change elements in electrical communication with the same bit line is illustrated. The exemplary architecture shown in FIG. 7C includes the resistive change element array 701, a plurality of word line driver circuits 702a in electrical communication with the plurality of word lines W5(0)-W5(x), a plurality of bit line driver circuits 704a in electrical communication with the plurality of bit lines B5(0)-B5(x), and a plurality of sense devices 706a in electrical communication with the plurality of bit lines B5(0)-B5(x). Exemplary driver circuits for the plurality of word line driver circuits 702a and the plurality of bit line driver circuits 704a are discussed above with respect to FIGS. 3C-3G. However, driver circuits for the plurality of word line driver circuits 702a and the plurality of bit line driver circuits 704a are not limited to the exemplary driver circuits discussed above with respect to FIGS. 3C-3G and the driver circuits for the plurality of word line driver circuits 702a and the plurality of bit line driver circuits 704a can be other driver circuits. Additionally, the plurality of sense devices 706a can be components that generate an output voltage based on at least one input voltage, such as sense amplifiers, differential amplifiers, inverters, and analog to digital converters. Alternatively, the plurality of sense devices 706a can be omitted from the exemplary architecture and the plurality of bit lines B5(0)-B5(x) can be in electrical communication with a logic circuit or a control circuit such as a processor, a controller, and a microcontroller.

PROGRAMMING operations, READ operations, SET VERIFY operations, and RESET VERIFY operations of individual combinations of resistive change elements in the resistive change element array 701 can be performed by driving voltages on the plurality of word lines W5(0)-W5(y) and the plurality of bit lines B5(0)-B5(x) as required for PROGRAMMING operations, READ operations, SET VERIFY operations, and RESET VERIFY operations of individual combinations of resistive change elements. PROGRAMMING operations, READ operations, SET VERIFY operations, and RESET VERIFY operations of combinations of resistive change elements in the resistive change element array 701 having resistive change elements in electrical communication with the same bit line can be performed at the same time by driving voltages on the plurality of word lines W5(0)-W5(y) and the plurality of bit lines B5(0)-B5(x) as required for performing PROGRAMMING operations, READ operations, SET VERIFY operations, and RESET VERIFY operations of the combinations of resistive change elements at the same time.

PROGRAMMING operations, READ operations, SET VERIFY operations, and RESET VERIFY operations of combinations of resistive change elements in the resistive change element array 701 can be performed in a similar manner as discussed above with respect to combinational resistive change element S11, however, PROGRAMMING operations, READ operations, SET VERIFY operations, and RESET VERIFY operations are of combinations of resistive change elements rather than combinational resistive change elements. It is noted that the plurality of word lines W5(0)-W5(y) and the plurality of bit lines B5(0)-B5(x) are driven differently for PROGRAMMING operations of combinations of resistive change elements where resistive change elements of combinations of resistive change elements are adjusted (programmed) between resistive states in a unidirectional manner and for PROGRAMMING operations of combinations of resistive change elements where resistive change elements of combinations of resistive change elements are adjusted (programmed) between resistive states in a bidirectional manner. It is further noted that PROGRAMMING operations, READ operations, SET VERIFY operations, and RESET VERIFY operations of a combination of resistive change elements R11 and R14 are discussed below treating resistive change element R11 as a top resistive change element in a resistive divider and resistive change element R14 as a bottom resistive change element in a resistive divider.

For example, when the plurality of resistive change elements R00-Rxy are adjusted (programmed) between resistive states in a unidirectional manner, a PROGRAMMING operation to adjust a relational state stored in a combination of resistive change elements R11 and R14 to a low relational state is performed as similarly discussed above with respect to the combinational resistive change element S11, however, an unidirectional RESET electrical stimulus is applied to the resistive change element R11 and an unidirectional SET electrical stimulus is applied to the resistive change element R14. In the above example, the unidirectional RESET electrical stimulus can be applied to the resistive change element R11 by driving a voltage on the word line W5(1) to a voltage for the unidirectional RESET electrical stimulus and the bit line B5(1) to 0 volts or ground and the unidirectional SET electrical stimulus can be applied to the resistive change element R14 by driving a voltage on the word line W5(4) to a voltage for the unidirectional SET electrical stimulus and the bit line B5(1) to 0 volts or ground.

For example, when the plurality of resistive change elements R00-Rxy are adjusted (programmed) between resistive states in a unidirectional manner, a PROGRAMMING operation to adjust a relational state stored in a combination of resistive change elements R11 and R14 to a high relational state is performed as similarly discussed above with respect to the combinational resistive change element S11, however, an unidirectional SET electrical stimulus is applied to the resistive change element R11 and an unidirectional RESET electrical stimulus is applied to the resistive change element R14. In the above example, the unidirectional SET electrical stimulus can be applied to the resistive change element W11 by driving a voltage on the word line W5(1) to a voltage for the unidirectional SET electrical stimulus and the bit line B5(1) to 0 volts or ground and the unidirectional RESET electrical stimulus can be applied to the resistive change element R14 by driving a voltage on the word line W5(4) to a voltage for the unidirectional RESET electrical stimulus and the bit line B5(1) to 0 volts or ground.

For example, when the plurality of resistive change elements R00-Rxy are adjusted (programmed) between resistive states in a bidirectional manner, a PROGRAMMING operation to adjust a relational state stored in a combination of resistive change elements R11 and R14 to a low relational state is performed as similarly discussed above with respect to the combinational resistive change element S11, however, a bidirectional RESET electrical stimulus is applied to the resistive change element R11 and a bidirectional SET electrical stimulus is applied to the resistive change element R14. In the above example, the bidirectional RESET electrical stimulus can be applied to the resistive change element R11 and the bidirectional SET electrical stimulus can be applied to resistive change element R14 by driving the word line W5(1) to a system voltage VDD, the word line W5(4) to 0 volts or ground, and the bit line B5(1) with a square wave having an amplitude of the system voltage VDD so that, ignoring leakage currents, a current flows from the top electrode to the bottom electrode of the resistive change element R11 and a current flows from the bottom electrode to the top electrode of the resistive change element R14.

For example, when the plurality of resistive change elements R00-Rxy are adjusted (programmed) between resistive states in a bidirectional manner, a PROGRAMMING operation to adjust a relational state stored in a combination of resistive change elements R11 and R14 to a high relational state is performed as similarly discussed above with respect to the combinational resistive change element S11, however, a bidirectional SET electrical stimulus is applied to the resistive change element R11 and a bidirectional RESET electrical stimulus is applied to the resistive change element R14. In the above example, the bidirectional SET electrical stimulus can be applied to the resistive change element R11 and the bidirectional RESET electrical stimulus can be applied to resistive change element R14 by driving the word line W5(1) to 0 volts or ground, the word line W5(4) to the system voltage VDD, and the bit line B5(1) with a square wave having an amplitude of the system voltage VDD so that, ignoring leakage currents, a current flows from the bottom electrode to the top electrode of the resistive change element R11 and a current flows from the top electrode to the bottom electrode of the resistive change element R14.

For example, a READ operation, a SET VERIFY operation, and a RESET VERIFY operation of a combination of resistive change elements R11 and R14, are performed as similarly discussed above with respect to the combinational resistive change element S11, however, the word line W5(1) to is driven to the read voltage Vread and the word line W5(4) is driven to ground or 0 volts, so that, ignoring leakage currents, a current flows from the word line W5(1) through the resistive change element R11 into the bit line B5(1) and a current flows from the bit line B5(1) through the resistive change element R14 into the word line W5(4). In the above example, the voltage VB5(1) on the bit line B5(1) is indicative of the relational state stored in the combination of resistive change elements R11 and R14 because the voltage level of the read voltage Vread is the same for both a low relational state and a high relational state, while the resistive ratio of the resistive divider formed by the resistive change element R11 and the resistive change element R14 is different for a low relational state and a high relational state.

Figure 7D:
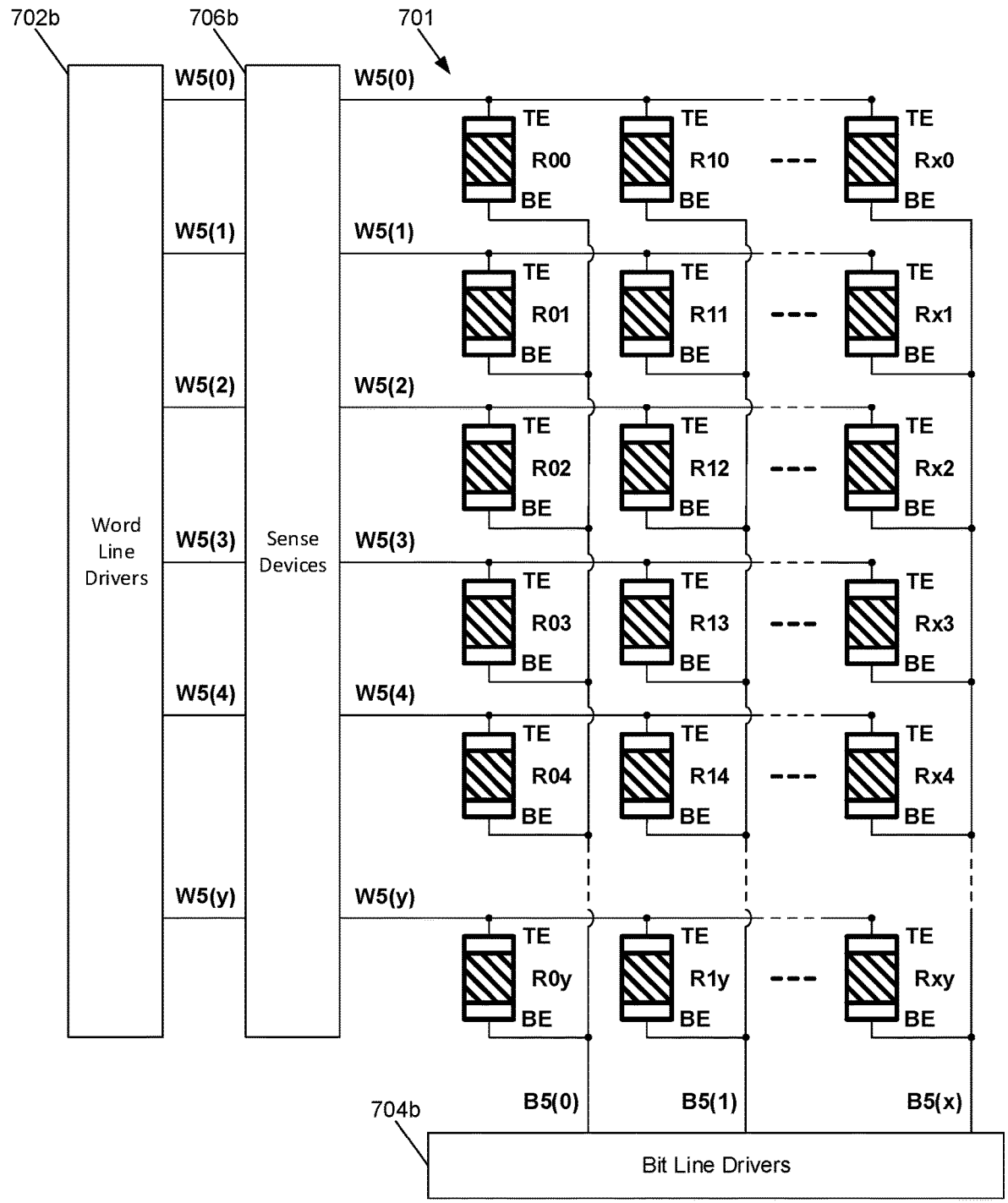
FIG. 7D illustrates a simplified schematic diagram of an exemplary architecture for programming and accessing at least one combination of resistive change elements in a resistive change element array of resistive change elements arranged in a cross point configuration, where the at least one combination of resistive change elements has resistive change elements in electrical communication with the same word line.

Referring now to FIG. 7D, a simplified schematic diagram of an exemplary architecture for programming and accessing at least one combination of resistive change elements in the resistive change element array 701 when the resistive change element array 701 is configured to include a plurality of combinations of resistive change elements where each combination of resistive change elements includes two resistive change elements in electrical communication with the same word line is illustrated. The exemplary architecture shown in FIG. 7D includes the resistive change element array 701, a plurality of word line driver circuits 702b in electrical communication with the plurality of word lines W5(0)-W5(x), a plurality of bit line driver circuits 704b in electrical communication with the plurality of bit lines B5(0)-B5(x), and a plurality of sense devices 706b in electrical communication with the plurality of word lines W5(0)-W5(y). Exemplary driver circuits for the plurality of word line driver circuits 702b and the plurality of bit line driver circuits 704b are discussed above with respect to FIGS. 3C-3G. However, driver circuits for the plurality of word line driver circuits 702b and the plurality of bit line driver circuits 704b are not limited to the exemplary driver circuits discussed above with respect to FIGS. 3C-3G and the driver circuits for the plurality of word line driver circuits 702b and the plurality of bit line driver circuits 704b can be other driver circuits. Additionally, the plurality of sense devices 706b can be components that generate an output voltage based on at least one input voltage, such as sense amplifiers, differential amplifiers, inverters, and analog to digital converters. Alternatively, the plurality of sense devices 706b can be omitted from the exemplary architecture and the plurality of word lines W5(0)-W5(y) can be in electrical communication with a logic circuit or a control circuit such as a processor, a controller, and a microcontroller.

PROGRAMMING operations, READ operations, SET VERIFY operations, and RESET VERIFY operations of individual combinations of resistive change elements in the resistive change element array 701 can be performed by driving voltages on the plurality of word lines W5(0)-W5(y) and the plurality of bit lines B5(0)-B5(x) as required for PROGRAMMING operations, READ operations, SET VERIFY operations, and RESET VERIFY operations of individual combinations of resistive change elements. PROGRAMMING operations, READ operations, SET VERIFY operations, and RESET VERIFY operations of combinations of resistive change elements in the resistive change element array 701 having resistive change elements in electrical communication with the same word line can be performed at the same time by driving voltages on the plurality of word lines W5(0)-W5(y) and the plurality of bit lines B5(0)-B5(x) as required for performing PROGRAMMING operations, READ operations, SET VERIFY operations, and RESET VERIFY operations of the combinations of resistive change elements at the same time.

PROGRAMMING operations, READ operations, SET VERIFY operations, and RESET VERIFY operations of combinations of resistive change elements in the resistive change element array 701 can be performed in a similar manner as discussed above with respect to combinational resistive change element S11, however, PROGRAMMING operations, READ operations, SET VERIFY operations, and RESET VERIFY operations are of combinations of resistive change elements rather than combinational resistive change elements. It is noted that the plurality of word lines W5(0)-W5(y) and the plurality of bit lines B5(0)-B5(x) are driven differently for PROGRAMMING operations of combinations of resistive change elements where resistive change elements of combinations of resistive change elements are adjusted (programmed) between resistive states in a unidirectional manner and for PROGRAMMING operations of combinations of resistive change elements where resistive change elements of combinations of resistive change elements are adjusted (programmed) between resistive states in a bidirectional manner. It is also noted that for READ operations, SET VERIFY operations, and RESET VERIFY operations, voltages on the plurality of word lines W5(0)-W5(y) are indicative of relational states of combinations of resistive change elements in the plurality of combinations of resistive change elements because nodes between combinations of resistive change elements in the plurality of combinations of resistive change elements are accessed by word lines in the plurality of word lines W5(0)-W5(y). It is further noted that PROGRAMMING operations, READ operations, SET VERIFY operations, and RESET VERIFY operations of a combination of resistive change elements R01 and Rx1 are discussed below treating resistive change element R01 as a top resistive change element in a resistive divider and resistive change element Rx1 as a bottom resistive change element in a resistive divider.

For example, when the plurality of resistive change elements R00-Rxy are adjusted (programmed) between resistive states in a unidirectional manner, a PROGRAMMING operation to adjust a relational state stored in a combination of resistive change elements R01 and Rx1 to a low relational state is performed as similarly discussed above with respect to the combinational resistive change element S11, however, an unidirectional RESET electrical stimulus is applied to the resistive change element R01 and an unidirectional SET electrical stimulus is applied to the resistive change element Rx1. In the above example, the unidirectional RESET electrical stimulus can be applied to the resistive change element R01 by driving a voltage on the word line W5(1) to a voltage for the unidirectional RESET electrical stimulus and the bit line B5(0) to a voltage for the unidirectional RESET electrical stimulus and the unidirectional SET electrical stimulus can be applied to the resistive change element Rx1 by driving a voltage on the word line W5(1) to a voltage for the unidirectional SET electrical stimulus and the bit line B5(x) to a voltage for the unidirectional SET electrical stimulus. It is noted that, in the above example, the voltage on the word line W5(1) for the unidirectional RESET electrical stimulus and the voltage on the word line W5(1) for the unidirectional SET electrical stimulus can be the same voltage so that the unidirectional RESET electrical stimulus and the unidirectional SET electrical stimulus can be applied at the same time.

For example, when the plurality of resistive change elements R00-Rxy are adjusted (programmed) between resistive states in a unidirectional manner, a PROGRAMMING operation to adjust a relational state stored in a combination of resistive change elements R01 and Rx1 to a high relational state is performed as similarly discussed above with respect to the combinational resistive change element S11, however, an unidirectional SET electrical stimulus is applied to the resistive change element R01 and an unidirectional RESET electrical stimulus is applied to the resistive change element Rx1. In the above example, the unidirectional SET electrical stimulus can be applied to the resistive change element R01 by driving a voltage on the word line W5(1) to a voltage for the unidirectional SET electrical stimulus and the bit line B5(0) to a voltage for the unidirectional SET electrical stimulus and the unidirectional RESET electrical stimulus can be applied to the resistive change element Rx1 by driving a voltage on the word line W5(1) to a voltage for the unidirectional RESET electrical stimulus and the bit line B5(x) to a voltage for the unidirectional RESET electrical stimulus. It is noted that, in the above example, the voltage on the word line W5(1) for the unidirectional SET electrical stimulus and the voltage on the word line W5(1) for the unidirectional RESET electrical stimulus can be the same voltage so that the unidirectional SET electrical stimulus and the unidirectional RESET electrical stimulus can be applied at the same time.

For example, when the plurality of resistive change elements R00-Rxy are adjusted (programmed) between resistive states in a bidirectional manner, a PROGRAMMING operation to adjust a relational state stored in a combination of resistive change elements R01 and Rx1 to a low relational state is performed as similarly discussed above with respect to the combinational resistive change element S11, however, a bidirectional RESET electrical stimulus is applied to the resistive change element R01 and a bidirectional SET electrical stimulus is applied to the resistive change element R$x$1. In the above example, the bidirectional RESET electrical stimulus can be applied to the resistive change element R01 and the bidirectional SET electrical stimulus can be applied to resistive change element R$x$1 by driving the bit line B5(0) to 0 volts or ground, the bit line B5($x$) to a system voltage VDD, and the word line W5(1) with a square wave having an amplitude of the system voltage VDD so that, ignoring leakage currents, a current flows from the top electrode to the bottom electrode of the resistive change element R01 and a current flows from the bottom electrode to the top electrode of the resistive change element R$x$1.

For example, when the plurality of resistive change elements R00-R$xy$ are adjusted (programmed) between resistive states in a bidirectional manner, a PROGRAMMING operation to adjust a relational state stored in a combination of resistive change elements R01 and R$x$1 to a high relational state is performed as similarly discussed above with respect to the combinational resistive change element S11, however, a bidirectional SET electrical stimulus is applied to the resistive change element R01 and a bidirectional RESET electrical stimulus is applied to the resistive change element R$x$1. In the above example, the bidirectional SET electrical stimulus can be applied to the resistive change element R01 and the bidirectional RESET electrical stimulus can be applied to resistive change element R$x$1 by driving the bit line B5(0) to the system voltage VDD, the bit line B5($x$) to 0 volts or ground, and the word line W5(1) with a square wave having an amplitude of the system voltage VDD so that, ignoring leakage currents, a current flows from the bottom electrode to the top electrode of the resistive change element R01 and a current flows from the top electrode to the bottom electrode of the resistive change element R$x$1.

For example, a READ operation, a SET VERIFY operation, and a RESET VERIFY operation of a combination of resistive change elements R01 and R$x$1, are performed as similarly discussed above with respect to the combinational resistive change element S11, however, the bit line B5(0) to is driven to the read voltage Vread and the bit line B5($x$) is driven to ground or 0 volts, so that, ignoring leakage currents, a current flows from the bit line B(0) through the resistive change element R11 into the word line W5(1) and a current flows from the word line W5(1) through the resistive change element R$x$1 into the bit line B5($x$). In the above example, the voltage VW5(1) on the word line W5(1) is indicative of the relational state stored in the combination of resistive change elements R11 and R$x$1 because the voltage level of the read voltage Vread is the same for both a low relational state and a high relational state, while the resistive ratio of the resistive divider formed by the resistive change element R11 and the resistive change element R$x$1 is different for a low relational state and a high relational state.

Figure 8:
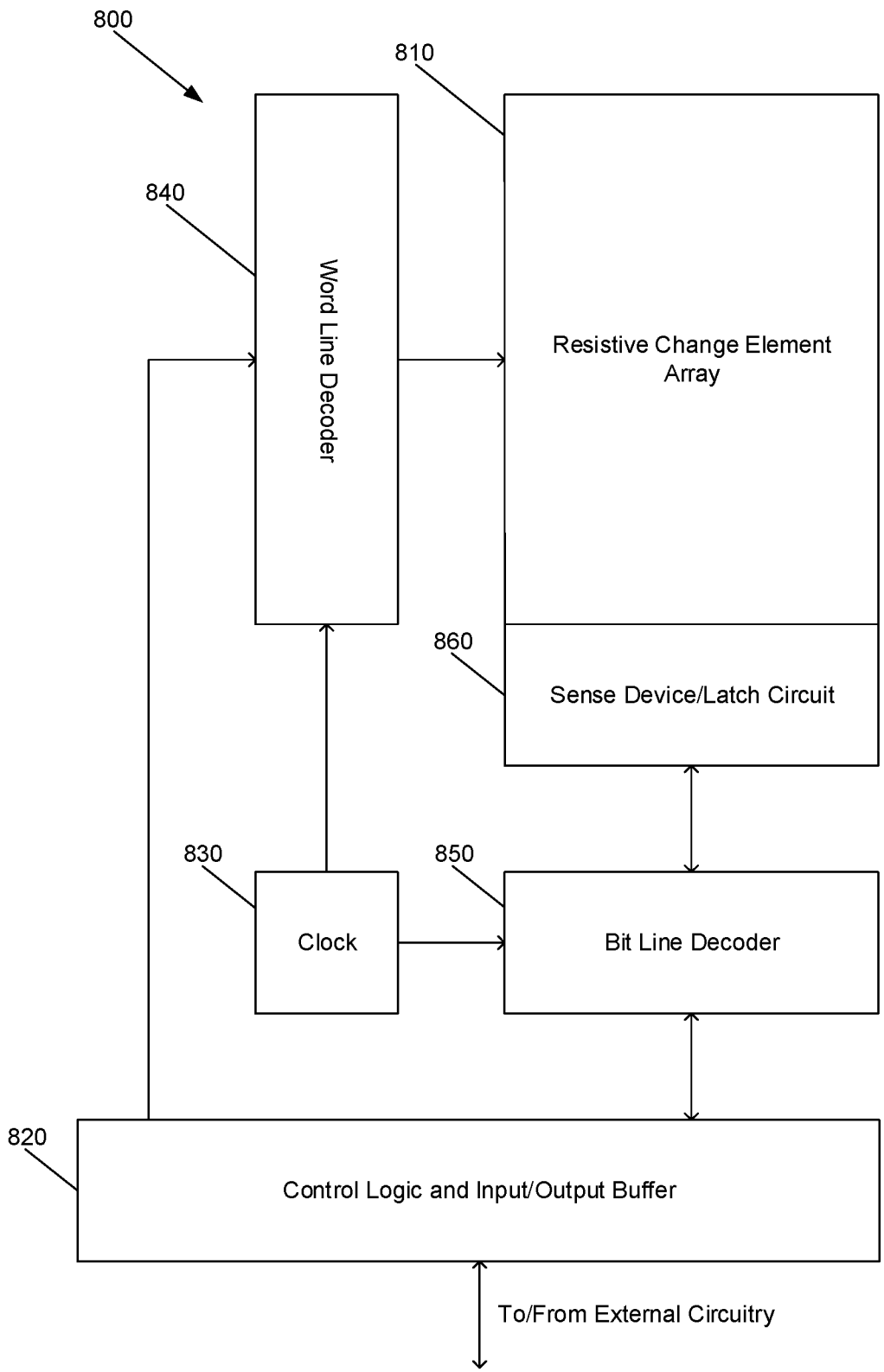
FIG. 8 illustrates a memory system for storing information as relational states of combinations of resistive change elements where the memory system is configured to access combinations of resistive change elements such that resistive change elements of combinations of resistive change elements form resistive dividers.

Referring now to FIG. 8, a memory system 800 for storing information as relational states of combinations of resistive change elements where the memory system 800 is configured to access combinations of resistive change elements such that resistive change elements of combinations of resistive change elements form resistive dividers is illustrated. The memory system 800 includes a resistive change element array 810, a control logic and input/output buffer 820, a clock 830, a word line decoder 840, a bit line decoder 850, and a sense device/latch circuit 860. The resistive change element array 810 is configurable to include a plurality of combinations of resistive change elements where each combination of resistive change elements can be accessed such that resistive change elements of combinations of resistive change elements form resistive dividers. For example, the resistive change element array 810 can be a combinational resistive change element array, such as discussed above with respect to the combinational resistive change element array 200 and the combinational resistive change element array 600. For example, the resistive change element array 810 can be a resistive change element array of resistive change elements arranged in a cross point configuration, such as discussed above with respect to the resistive change element array 700. For example, the resistive change element array 810 can be a resistive change element array of resistive change elements arranged in a three dimensional cross point configuration. A correspondence for configuring the resistive change element array 810 to include a plurality of combinations of resistive change elements where each combination of resistive change elements can be accessed such that resistive change elements of combinations of resistive change elements form resistive dividers can be stored in external circuitry or the control logic and input/output buffer circuit 820. It is also noted that for discussion of FIG. 8, combinational resistive change elements and combinations of resistive change elements are used interchangeably.

For writing data to the resistive change element array 810, the control logic and input/output buffer circuit 820 receives data to be written to the resistive change element array 810 and an address where the data is to be written, the control logic and input/output buffer circuit 820 decodes the received data, transmits an address signal and a command signal to the word line decoder 840 on an address bus, and transmits an address signal and a command signal to the bit line decoder 850 on a bidirectional bus. The address signals specify the combination of resistive change elements and the command signals specify whether a relational state of the combination of resistive change elements is to be adjusted (programmed) to a low relational state or a high relational state. The clock 830 supplies a clock signal to the word line decoder circuit 840 and the bit line decoder 850 so that array lines of the resistive change element array 810 are driven to desired voltage levels at the desired time. It is noted that when the control logic and input/output buffer circuit 820 stores a correspondence for configuring the resistive change element array 810 to include a plurality of combinations of resistive change elements, the address received from the external circuitry can be mapped to different a combination of resistive change elements based on the correspondence stored in the control logic and input/output buffer circuit 820.

For reading data from the resistive change element array 810, the control logic and input/output buffer circuit 820 receives data indicating that data is be read from the resistive change element array 810 and an address where the data is stored, the control logic and input/output buffer circuit 820 decodes the received data, transmits an address signal and a command signal on the address bus to the word line decoder circuit 840 and an address signal and a command signal on the bidirectional bus to the bit line decoder circuit 850. The address signals specify the combination of resistive change elements and the command signals specify that data is being read. The data read from the resistive change element array 810 is determined by the sense amplifier/latch circuit 860 and is temporarily stored in the sense amplifier/latch circuit 860. The data is then transmitted from the sense device/latch circuit 860 to the control logic and input/output buffer 820 on the bidirectional bus. The control logic and input/output buffer 820 then transmits data read from the resistive change element array 810 to the external circuitry. The clock 830 supplies a clock signal to the word line decoder circuit 840 and the bit line decoder 850 so that array lines of the resistive change element array 810 are driven to desired voltage levels at the desired time. It is noted that when the control logic and input/output buffer circuit 820 stores a correspondence for configuring the resistive change element array 810 to include a plurality of combinations of resistive change elements, the address received from the external circuitry can be mapped to different a combination of resistive change elements based on the correspondence stored in the control logic and input/output buffer circuit 820. It is also noted that verifying data from the resistive change element array 810 can be performed in a similar manner to reading data from the resistive change element array 810.

When the resistive change element array 810 is a combinational resistive change element array, such as discussed above with respect to the combinational resistive change element array 300, PROGRAMMING operations, READ operations, SET VERIFY operations, and RESET VERIFY operations of combinational resistive change elements are performed as similarly discussed above with respect to the combinational resistive change element array 300. When the resistive change element array 810 is a combinational resistive change element array, such as discussed above with respect to the combinational resistive change element array 600, PROGRAMMING operations, READ operations, SET VERIFY operations, and RESET VERIFY operations of combinational resistive change elements are performed as similarly discussed above with respect to the combinational resistive change element array 600. When the resistive change element array 810 is a resistive change element array of resistive change elements arranged in a cross point configuration, such as discussed above with respect to the resistive change element array 700, PROGRAMMING operations, READ operations, SET VERIFY operations, and RESET VERIFY operations of combinations of resistive change elements are performed as similarly discussed above with respect to the combinational resistive change element array 700.

Figure 9:
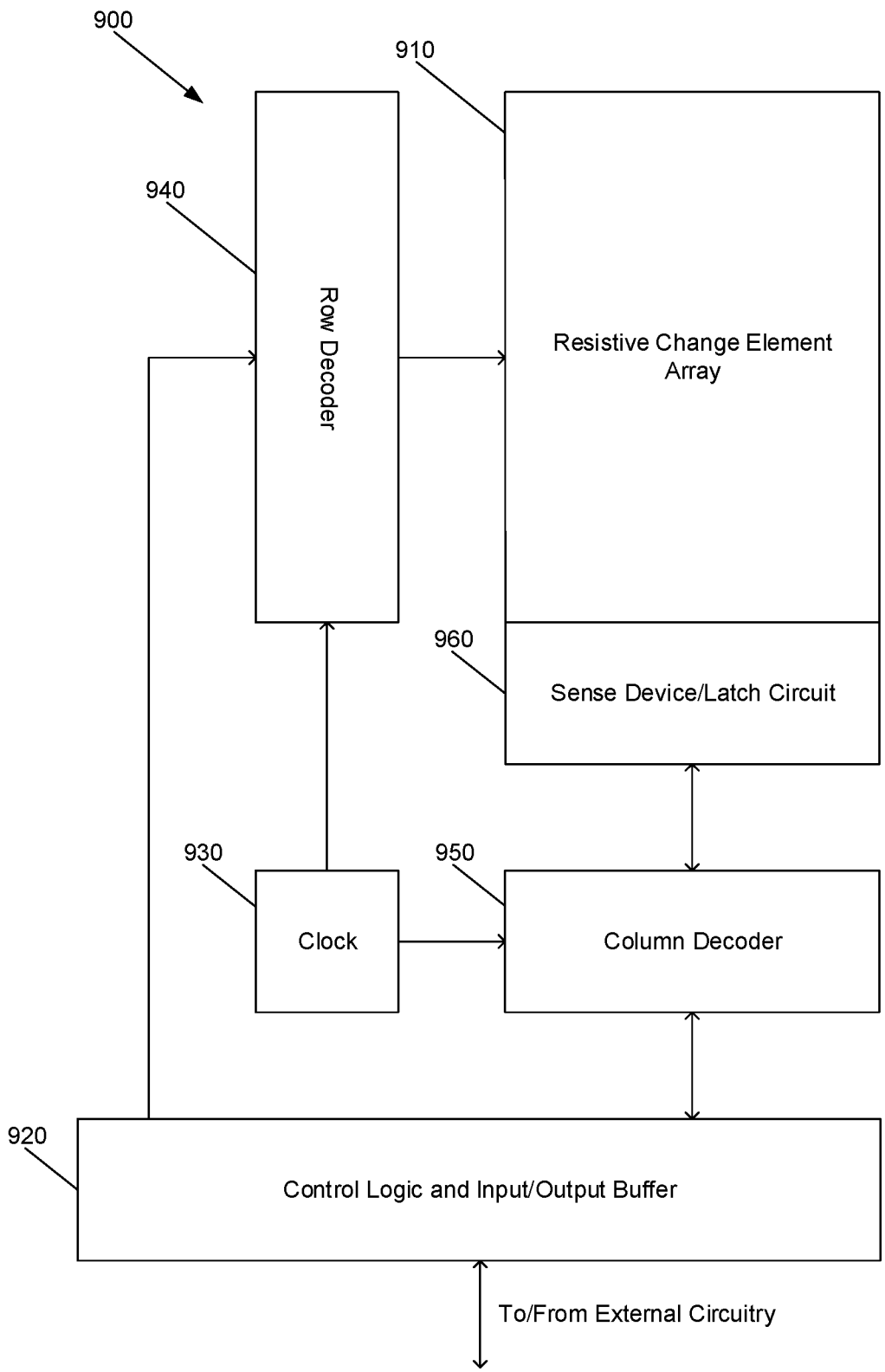
FIG. 9 illustrates a memory system for storing information as relational states of combinations of resistive change elements where the memory system is configured to access combinations of resistive change elements such that resistances of resistive change elements of combinations of resistive change elements are used to form calculated resistive dividers.

Referring now to FIG. 9, a memory system 900 for storing information as relational states of combinations of resistive change elements, where the memory system 900 is configured to access combinations of resistive change elements such that resistances of resistive change elements of combinations of resistive change elements are used to form calculated resistive dividers. The memory system 900 includes a resistive change element array 910, a control logic and input/output buffer 920, a clock 930, a row decoder 940, a column decoder 950, and a sense device/latch circuit 960. The resistive change element array 910 is configurable to include a plurality of combinations of resistive change elements where each combination of resistive change elements can be accessed such that resistances of resistive change elements of combinations of resistive change elements are used to form calculated resistive dividers. For example, the resistive change element array 910 can be a resistive change element array of resistive change elements arranged in a cross point configuration, such as discussed above with respect to the resistive change element array 700. For example, the resistive change element array 910 can be a resistive change element array of resistive change elements arranged in a three dimensional cross point configuration. For example, the resistive change element array 910 can be a resistive change element array including a plurality of 1T1R resistive change memory cells where each 1T1R resistive change element cell includes a transistor to provide a selectability function and a resistive change element. For example, the resistive change element array 910 can be a resistive change element array including a plurality of resistive change element cells and a plurality of selection devices arranged in a group of resistive change element cells sharing a selection device configuration such as a 1TNR configuration where 1T refers to the one selection device and NR refers to the number of resistive change element cells in the group of resistive change element cells. For example, the resistive change element array 910 can be a resistive change element array including a plurality of 1D1R resistive change memory cells where each resistive change memory cells includes a diode to provide a selectability function and a resistive change element. A correspondence for configuring the resistive change element array 910 to include a plurality of combinations of resistive change elements where each combination of resistive change elements can be accessed such that resistances of resistive change elements of combinations of resistive change elements are used to form calculated resistive dividers can be stored in external circuitry or the control logic and input/output buffer circuit 920.

For writing data to the resistive change element array 910, the control logic and input/output buffer circuit 920 receives data to be written to the resistive change element array 910 and an address where the data is to be written, the control logic and input/output buffer circuit 920 decodes the received data, transmits an address signal and a command signal to the row decoder 940 on an address bus, and transmits an address signal and a command signal to the column decoder circuit 950 on a bidirectional bus. The address signals specify the combination of resistive change elements and the command signals specify whether a relational state of the combination of resistive change elements is to be adjusted (programmed) a low relational state or a high relational state. The clock 930 supplies a clock signal to the row decoder circuit 940 and the column decoder 950 so that array lines of the resistive change element array 910 are driven to desired voltage levels at the desired time. It is noted that when the control logic and input/output buffer circuit 920 stores a correspondence for configuring the resistive change element array 910 to include a plurality of combinations of resistive change elements, the address received from the external circuitry can be mapped to different a combination of resistive change elements based on the correspondence stored in the control logic and input/output buffer circuit 920.

For reading data from the resistive change element array 910, the control logic and input/output buffer circuit 920 receives data indicating that data is be read from the resistive change element array 910 and an address where the data is stored, the control logic and input/output buffer circuit 920 decodes the received data, transmits an address signal and a command signal on the address bus to the row decoder circuit 940 and an address signal and a command signal on the bidirectional bus to the column decoder circuit 950. The address signals specify the combination of resistive change elements and the command signals specify that data is being read. The data read from the resistive change element array 910 is temporarily stored in the sense device/latch circuit 960. The data is then transmitted from the sense device/latch circuit 960 to the control logic and input/output buffer 920 on the bidirectional bus. The control logic and input/output buffer 920 determines the data read from the resistive change element array 910. The control logic and input/output buffer 920 then transmits data read from the resistive change element array 910 to the external circuitry. The clock 930 supplies a clock signal to the row decoder circuit 940 and the column decoder 950 so that array lines of the resistive change element array 910 are driven to desired voltage levels at the desired time. It is noted that when the control logic and input/output buffer circuit 920 stores a correspondence for configuring the resistive change element array 910 to include a plurality of combinations of resistive change elements, the address received from the external circuitry can be mapped to a different combination of resistive change elements based on the correspondence stored in the control logic and input/output buffer circuit 920. It is also noted that verifying data from the resistive change element array 910 can be performed in a similar manner to reading data from the resistive change element array 910.

PROGRAMMING operations of combinations of resistive change elements in the resistive change element array 910 are discussed below. Additionally, READ operations, SET VERIFY operations, and RESET VERIFY operations of combinations of resistive change elements in the resistive change element array 910 are discussed below.

A PROGRAMMING operation to adjust a relational state of a combination of resistive change elements in the resistive change element array 910 to a low relational state starts, as similarly discussed above in step 402 of flow chart 400, by selecting a combination of resistive change elements from a plurality of combinations of resistive change elements. The resistive change element array 910 is configured to include a plurality of combinations of resistive change elements using a correspondence for configuring the resistive change element array 910 to include a plurality of combinations of resistive change elements. When the correspondence is stored in external circuitry, the external circuitry selects the combination of resistive change elements from the plurality of resistive change elements. When the correspondence is stored in the control logic and input/output buffer circuit 920 and an address received from external circuity is mapped to a different combination of resistive change elements based on the correspondence stored in the control logic and input/output buffer circuit 920, the control logic and input/output buffer circuit 920 selects the combination of resistive change elements from the plurality of combinations of resistive change elements. The combinations of resistive change elements in the plurality of combinations of resistive change elements that are not selected are referred to as unselected combinations of resistive change elements.

The PROGRAMMING operation to adjust a relational state of the combination of resistive change elements to a low relational state proceeds, as similarly discussed above in step 404 of flow chart 400, by applying conditions to inhibit change in relational states of the unselected combinations of resistive change elements. A condition to inhibit change in a relational state of a combination of resistive change elements is applied to a combination of resistive change elements by limiting the voltage across each of the resistive change elements of the combination of resistive change elements to a voltage level less than a voltage level that would cause a resistive change element to change resistive states. It is noted that conditions to inhibit change in relational states of unselected combinations of resistive change elements in resistive change element arrays having different structures are applied in different ways. For example, when the resistive change element array 910 is a resistive change element array of resistive change elements arranged in a cross point configuration, conditions to inhibit change in relational states of unselected combinations of resistive change elements are applied to unselected combinations of resistive change elements by driving bit lines and word lines to an inhibit voltage Vinhibit. For example, when the resistive change element array 910 is a resistive change element array including a plurality of 1T1R resistive change memory cells, conditions to inhibit change in relational states of unselected combinations of resistive change elements are applied to unselected combinations of resistive change elements by driving bit lines, word lines, and source lines to voltages for applying conditions to inhibit change in relational states of unselected combinations of resistive change elements.

The PROGRAMMING operation to adjust a relational state of the combination of resistive change elements to a low relational state continues, as similarly discussed above in step 406 of flow chart 400, by applying an electrical stimulus to a resistive change element to adjust a resistive state of the resistive change element to a high resistive state and an electrical stimulus to a resistive change element to adjust a resistive state of the resistive change element to a low resistive state. For example, when the resistive change element array 910 is a resistive change element array of resistive change elements arranged in a cross point configuration as shown in FIG. 7A and the plurality of resistive change elements R00-R$xy$ are adjusted (programmed) between resistive states in a unidirectional manner, a PROGRAMMING operation to adjust a relational state stored in a combination of resistive change elements R00 and R$x$3 to a low relational state is performed by applying an unidirectional RESET electrical stimulus to the resistive change element R00 and an unidirectional SET electrical stimulus to the resistive change element R$x$3 one after the other. For example, when the resistive change element array 910 is a resistive change element array of resistive change elements arranged in a cross point configuration as shown in FIG. 7A and the plurality of resistive change elements R00-R$xy$ are adjusted (programmed) between resistive states in a bidirectional manner, a PROGRAMMING operation to adjust a relational state stored in a combination of resistive change elements R00 and R$x$3 to a low relational state is performed by applying an bidirectional RESET electrical stimulus to the resistive change element R00 and an bidirectional SET electrical stimulus to the resistive change element R$x$3 one after the other. It is noted that, in the above examples, resistive change element R00 is treated as a top resistive change element in a resistive divider and resistive change element R$x$3 is treated as a bottom resistive change element in a resistive divider.

A PROGRAMMING operation to adjust a relational state of a combination of resistive change elements in the resistive change element array 910 to a high relational state starts, as similarly discussed above in step 402 of flow chart 400, by selecting a combination of resistive change elements from the plurality of combinations of resistive change elements. The resistive change element array 910 is configured to include a plurality of combinations of resistive change elements using a correspondence for configuring the resistive change element array 910 to include a plurality of combinations of resistive change elements. When the correspondence is stored in external circuitry, the external circuitry selects the combination of resistive change elements from the plurality of resistive change elements. When the correspondence is stored in the control logic and input/output buffer circuit 920 and an address received from external circuitry is mapped to a different combination of resistive change elements based on the correspondence stored in the control logic and input/output buffer circuit 920, the control logic and input/output buffer circuit 920 selects the combination of resistive change elements from the plurality of combinations of resistive change elements. The combinations of resistive change elements in the plurality of combinations of resistive change elements that are not selected are referred to as unselected combinations of resistive change elements.

The PROGRAMMING operation to adjust a relational state of the combination of resistive change elements to a high relational state proceeds, as similarly discussed above in step 404 of flow chart 400, by applying conditions to inhibit change in relational states of the unselected combinations of resistive change elements. A condition to inhibit change in a relational state of a combination of resistive change elements is applied to a combination of resistive change elements by limiting the voltage across each of the resistive change elements of the combination of resistive change elements to a voltage level less than a voltage level that would cause a resistive change element to change resistive states. It is noted that conditions to inhibit change in relational states of unselected combinations of resistive change elements in resistive change element arrays having different structures are applied in different ways. For example, when the resistive change element array 910 is a resistive change element array of resistive change elements arranged in a cross point configuration, conditions to inhibit change in relational states of unselected combinations of resistive change elements are applied to unselected combinations of resistive change elements by driving bit lines and word lines to an inhibit voltage Vinhibit. For example, when the resistive change element array 910 is a resistive change element array including a plurality of 1T1R resistive change memory cells, conditions to inhibit change in relational states of unselected combinations of resistive change elements are applied to unselected combinations of resistive change elements by driving bit lines, word lines, and source lines to voltages for applying conditions to inhibit change in relational states of unselected combinations of resistive change elements.

The PROGRAMMING operation to adjust a relational state of the combination of resistive change elements to a high relational state continues, as similarly discussed above in step 406 of flow chart 400, by applying an electrical stimulus to a resistive change element to adjust a resistive state of the resistive change element to a low resistive state and an electrical stimulus to a resistive change element to adjust a resistive state of the resistive change element to a high resistive state. For example, when the resistive change element array 910 is a resistive change element array of resistive change elements arranged in a cross point configuration as shown in FIG. 7A and the plurality of resistive change elements R00-R$xy$ are adjusted (programmed) between resistive states in a unidirectional manner, a PROGRAMMING operation to adjust a relational state stored in a combination of resistive change elements R00 and R$x$3 to a high relational state is performed by applying an unidirectional SET electrical stimulus to the resistive change element R00 and an unidirectional RESET electrical stimulus to the resistive change element R$x$3 one after the other. For example, when the resistive change element array 910 is a resistive change element array of resistive change elements arranged in a cross point configuration as shown in FIG. 7A and the plurality of resistive change elements R00-R$xy$ are adjusted (programmed) between resistive states in a bidirectional manner, a PROGRAMMING operation to adjust a relational state stored in a combination of resistive change elements R00 and R$x$3 to a high relational state is performed by applying an bidirectional SET electrical stimulus to the resistive change element R00 and an bidirectional RESET electrical stimulus to the resistive change element R$x$3 one after the other. It is noted that, in the above examples, resistive change element R00 is treated as a top resistive change element in a resistive divider and resistive change element R$x$3 is treated as a bottom resistive change element in a resistive divider.

PROGRAMMING operations of combinations of resistive change elements adjustable (programmable) between more than two relational states can be performed in a similar manner to the PROGRAMMING operations of the combinations of resistive change elements discussed above. However, for combinations of resistive change elements having resistive change elements adjustable between more than two resistive states more electrical stimuli than the unidirectional SET electrical stimulus and the unidirectional RESET electrical stimulus or the bidirectional SET electrical stimulus and the bidirectional RESET electrical stimulus are required to adjust the resistive change elements between the more than two resistive states. For example, a resistive change element that can be adjusted between a low resistive state, an intermediate resistive state, and a high resistive state, requires an electrical stimulus to adjust a resistive state of the resistive change element to a low resistive state, an electrical stimulus to adjust a resistive state of the resistive change element to an intermediate resistive state, and an electrical stimulus to adjust a resistive state of the resistive change element to a high resistive state.

A READ operation of a combination of resistive change elements in the resistive change element array 910 starts, as similarly discussed above in step 502 of flow chart 500, by selecting a combination of resistive change elements from a plurality of combinations of resistive change elements. The resistive change element array 910 is configured to include a plurality of combinations of resistive change elements using a correspondence for configuring the resistive change element array 910 to include a plurality of combinations of resistive change elements. When the correspondence is stored in external circuitry, the external circuitry selects the combination of resistive change elements from the plurality of resistive change elements. When the correspondence is stored in the control logic and input/output buffer circuit 920 and an address received from external circuitry is mapped to a different combination of resistive change elements based on the correspondence stored in the control logic and input/output buffer circuit 920, the control logic and input/output buffer circuit 920 selects the combination of resistive change elements from the plurality of combinations of resistive change elements. The combinations of resistive change elements in the plurality of combinations of resistive change elements that are not selected are referred to as unselected combinations of resistive change elements.

The READ operation of a combination of resistive change elements continues, as similarly discussed above in step 504 of flow chart 500, by applying conditions to inhibit change in relational states of the unselected combinations of resistive change elements. A condition to inhibit change in a relational state of a combination of resistive change elements is applied to a combination of resistive change elements by limiting the voltage across each of the resistive change elements of the combination of resistive change elements to a voltage level less than a voltage level that would cause a resistive change element to change resistive states. It is noted that conditions to inhibit change in relational states of unselected combinations of resistive change elements in resistive change element arrays having different structures are applied in different ways. For example, when the resistive change element array 910 is a resistive change element array of resistive change elements arranged in a cross point configuration, conditions to inhibit change in relational states of unselected combinations of resistive change elements are applied to unselected combinations of resistive change elements by driving bit lines and word lines to an inhibit voltage Vinhibit. For example, when the resistive change element array 910 is a resistive change element array including a plurality of 1T1R resistive change memory cells, conditions to inhibit change in relational states of unselected combinations of resistive change elements are applied to unselected combinations of resistive change elements by driving bit lines, word lines, and source lines to voltages for applying conditions to inhibit change in relational states of unselected combinations of resistive change elements.

The READ operation of the combination of resistive change elements proceeds, as similarly discussed above in step 506 of flow chart 500, by applying an electrical stimulus to the resistive change elements in the combination of resistive change elements one after the other so that a resistance of each resistive change element in the combination of resistive change elements is determined and a resistive divider is formed by calculating a resistive ratio of the two resistive change elements. The resistive ratio of the two resistive change elements is calculated by the control logic and input/output buffer 920. It is noted that the resistive ratio of the resistive divider formed by the resistive change elements in the combination of resistive change elements can be calculated as resistive ratio=(Rbottom/(Rtop+Rbottom)), where Rtop is the resistance of the top resistive change element and Rbottom is the resistance of the bottom resistive change element. It is also noted that the resistance each resistive change element change in the combination of resistive change elements can be determined to be within a range of resistances rather than determining the resistance of each resistive change element in order to increase speed of a READ operation. For example, when a combination of resistive change elements has a top resistive change element with a resistance determined to be in a range of 8 MΩ-12 MΩ and a bottom resistive change element with a resistance determined to be in a range of 0.8 MΩ-1.2 MΩ, the combination of resistive change elements has a range of resistive ratios 0.0625-0.1304. For example, when a combination of resistive change elements has a top resistive change element with a resistance determined to be in a range of 0.8 MΩ-1.2MΩ and a bottom resistive change element with a resistance determined to be in a range of 8 MΩ-12 MΩ, the combination of resistive change elements has a range of resistive ratios 0.8696-0.9375.

The READ operation of the combination of resistive change elements continues, as similarly discussed above in step 508 of flow chart 500, by determining a relational state of the combination of resistive change elements based on the resistive ratio of the resistive divider for the two resistive change elements of the combination of resistive change elements. The relational state of the combination of resistive change elements is determined by comparing the resistive ratio of the calculated resistive divider for the two resistive change elements with a boundary resistive ratio for READ operations. When the resistive ratio of the calculated resistive divider is less than or equal to the boundary resistive ratio for READ operations the relational state of the combination of resistive change elements is determined to be a low relational state. When the resistive ratio of the calculated resistive divider is greater than the boundary resistive ratio for READ operations the relational state of the combination of resistive change elements is determined to be a high relational state. The boundary resistive ratio for READ operations is a number stored in the control logic and input/output buffer 920. The control logic and input/output buffer 920 determines the relational state of the combination of resistive change elements by comparing the resistive ratio of the calculated resistive divider with the boundary resistive ratio for READ operations. When the resistive ratio of the calculated resistive divider is less than or equal to the boundary resistive ratio for READ operations, the control logic and input/output buffer 920 determines the combination of resistive change elements has a low relational state and outputs a signal indicating the selected combination of resistive change elements has a low relational state. When the resistive ratio of the calculated resistive divider is greater than the boundary resistive ratio for READ operations, the control logic and input/output buffer 920 determines the combination of resistive change elements has a high relational state and outputs a signal indicating the selected combination of resistive change elements has a high relational state.

It is noted that when the resistance of each resistive change element change in the combination of resistive change elements is determined to be in a range of resistances, the combination of resistive change elements is determined to have a low relational state when the entire range of resistive ratios is less than or equal the boundary resistive ratio for READ operations and the combination of resistive change elements is determined to have a high relational state when the entire range of resistive ratios is greater than the boundary resistive ratio for READ operations. For example, when a combination of resistive change elements has a top resistive change element with a resistance determined to be in a range of 8 MΩ-12 MΩ, a bottom resistive change element with a resistance determined to be in a range of 0.8 MΩ-1.2MΩ, a range of resistive ratios 0.0625-0.1304, and a boundary resistive ratio for READ operations is ½, the combination of resistive change elements is determined to have a low relational state because the range of resistive ratios 0.0625-0.1304 is less than the boundary resistive ratio for READ operations. For example, when a combination of resistive change elements has a top resistive change element with a resistance determined to be in a range of 0.8 MΩ-1.2 MΩ, a bottom resistive change element with a resistance determined to be in a range of 8 MΩ-12 MΩ, the combination of resistive change elements has a range of resistive ratios 0.8696-0.9375, and a boundary resistive ratio for READ operations is ½, the combination of resistive change elements is determined to have a high relational state because the range of resistive ratios 0.8696-0.9375 greater than the boundary resistive ratio for READ operations.

A SET VERIFY operation of a combination of resistive change elements in the resistive change element array 910 can be performed in a similar manner to a READ operation of a combination of resistive change elements in the resistive change element array 910, however, a SET VERIFY operation uses a boundary resistive ratio for SET VERIFY operations instead of a boundary resistive ratio for READ operations. A RESET VERIFY operation of a combination of resistive change elements in the resistive change element array 910 can be performed in a similar manner to a READ operation of a combination of resistive change elements in the resistive change element array 910, however, a RESET VERIFY operation uses a boundary resistive ratio for RESET VERIFY operations instead of a boundary resistive ratio for READ operations.

Although the present disclosure has been described in relation to particular embodiments thereof, many other variations and modification and other uses will become apparent to those skilled in the art. It is preferred, therefore, that the present disclosure not be limited by the specific disclosure herein.

What is claimed is:

1. A combinational resistive change element comprising:
   a first resistive change element, wherein said first resistive change element is adjustable between at least two resistive states;
   a second resistive change element, wherein said second resistive change element is adjustable between at least two resistive states;
   a conductive structure providing an electrical communication path between said first resistive change element and said second resistive change element, wherein said conductive structure comprises a first portion in electrical communication with said first resistive change element, a second portion in electrical communication with said second resistive change element, and an electrical communication conductive structure providing an electrical communication path between said first portion and said second portion, wherein said first portion and said second portion are portions of a same array line, wherein said first portion is located lower than said second portion, and wherein said electrical communication conductive structure is located between said first resistive change element and said second resistive change element; and
   wherein said combinational resistive change element is adjustable between multiple relational states involving ratios of resistances of resistive states of said first resistive change element and said second resistive change element.

2. The combinational resistive change element of claim 1, wherein said combinational resistive change element is capable of storing at least one bit of information as relational states.

3. The combinational resistive change element of claim 1, wherein said combinational resistive change element is capable of storing information as characters of a character set as relational states.

4. The combinational resistive change element of claim 1, wherein possible combinations of resistive states of said first resistive change element and said second resistive change element is a number greater than a number of relational states of said multiple relational states.

5. The combinational resistive change element of claim 1, wherein said multiple relational states also involve sums of resistances of resistive states of said first resistive change element and said second resistive change element.

6. The combinational resistive change element of claim 1, wherein said first resistive change element is shareable with at least one other combinational resistive change element and wherein said second resistive change element is shareable with at least one other combinational resistive change element.

7. The combinational resistive change element of claim 1, wherein said first resistive change element and said second resistive change element are separated a distance of at least a minimum feature size multiplied by three.

8. The combinational resistive change element of claim 1, wherein said first resistive change element and said second resistive change element are located on a same level.

9. The combinational resistive change element of claim 1, wherein said first resistive change element and said second resistive change element are located on different levels.

10. The combinational resistive change element of claim 1, wherein said first resistive change element and said second resistive change element are adjustable between different resistive states at the same time.

11. The combinational resistive change element of claim 1, wherein said first resistive change element and said second resistive change element are adjustable between different resistive states one after the other.

12. The combinational resistive change element of claim 1, wherein said first resistive change element has a first electrode, a second electrode, and a first resistive change material between said first electrode and said second electrode and wherein said second resistive change element has a third electrode, a fourth electrode, and a second resistive change material between said third electrode and said fourth electrode.

13. The combinational resistive change element of claim 12, wherein at least one of said first resistive change material or said second resistive change material comprises a nanotube fabric.

14. The combinational resistive change element of claim 12, wherein at least one of said first resistive change material or said second resistive change material comprises buckyballs.

15. The combinational resistive change element of claim 12, wherein at least one of said first resistive change material or said second resistive change material comprises graphene flakes.

16. The combinational resistive change element of claim 12, wherein at least one of said first resistive change material or said second resistive change material comprises nanocapsules.

17. The combinational resistive change element of claim 12, wherein at least one of said first resistive change material or said second resistive change material comprises nanohorns.

18. The combinational resistive change element of claim 12, wherein said at least two resistive states of said first resistive change element includes a low resistive state and a high resistive state, wherein a resistance of said low resistive state of said first resistive change element is less than a resistance of said high resistive state of said first resistive change element, wherein said at least two resistive states of said second resistive change element includes a low resistive state and a high resistive state, and wherein a resistance of said low resistive state of said second resistive change element is less than a resistance of said high resistive state of said second resistive change element.

19. The combinational resistive change element of claim 18, wherein said first resistive change element is adjustable between said low resistive state and said high resistive state by electrical stimuli causing current flow in different directions relative to said first electrode and said second electrode and wherein said second resistive change element is adjustable between said low resistive state and said high resistive state by electrical stimuli causing current flow in different directions relative to said third electrode and said fourth electrode.

20. A combinational resistive change element comprising:
   a first resistive change element, wherein said first resistive change element is adjustable between at least two resistive states, and wherein said first resistive change element is shareable with at least one other combinational resistive change element;

a second resistive change element, wherein said second resistive change element is adjustable between at least two resistive states, and wherein said second resistive change element is shareable with at least one other combinational resistive change element; and a conductive structure providing an electrical communication path between said first resistive change element and said second resistive change element, wherein said conductive structure comprises a first portion in electrical communication with said first resistive change element, a second portion in electrical communication with said second resistive change element, and an electrical communication conductive structure providing an electrical communication path between said first portion and said second portion, wherein said first portion and said second portion are portions of a same array line, wherein said first portion is located lower than said second portion, and wherein said electrical communication conductive structure is located between said first resistive change element and said second resistive change element.

21. The combinational resistive change element of claim 20, wherein said first resistive change element and said second resistive change element are separated a distance of at least a minimum feature size multiplied by three.

22. The combinational resistive change element of claim 20, wherein said first resistive change element and said second resistive change element are located on a same level.

23. The combinational resistive change element of claim 20, wherein said first resistive change element and said second resistive change element are located on different levels.

24. The combinational resistive change element of claim 20, wherein said first resistive change element has a nanotube fabric and wherein said second resistive change element has a nanotube fabric.

\* \* \* \* \*